US009425416B2

(12) United States Patent
Jung et al.

(10) Patent No.: US 9,425,416 B2
(45) Date of Patent: Aug. 23, 2016

(54) CONDENSED CYCLIC COMPOUND AND ORGANIC LIGHT-EMITTING DEVICE INCLUDING THE SAME

(71) Applicant: Samsung Display Co., Ltd., Yongin, Gyeonggi-do (KR)

(72) Inventors: Hye-Jin Jung, Yongin (KR); Seok-Hwan Hwang, Yongin (KR); Young-Kook Kim, Yongin (KR); Jun-Ha Park, Yongin (KR); Eun-Young Lee, Yongin (KR); Jin-O Lim, Yongin (KR); Sang-Hyun Han, Yongin (KR); Eun-Jae Jeong, Yongin (KR); Soo-Yon Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 365 days.

(21) Appl. No.: 14/181,584

(22) Filed: Feb. 14, 2014

(65) Prior Publication Data

US 2014/0361266 A1 Dec. 11, 2014

(30) Foreign Application Priority Data

Jun. 7, 2013 (KR) ........................ 10-2013-0065468
Aug. 13, 2013 (KR) ........................ 10-2013-0096191

(51) Int. Cl.
*H01L 51/00* (2006.01)
*H01L 51/50* (2006.01)

(52) U.S. Cl.
CPC .......... *H01L 51/0094* (2013.01); *H01L 51/006* (2013.01); *H01L 51/0061* (2013.01); *H01L 51/0067* (2013.01); *H01L 51/0068* (2013.01);

(Continued)

(58) Field of Classification Search
None
See application file for complete search history.

(56) References Cited

U.S. PATENT DOCUMENTS 7,053,255 B2 * 5/2006 Ikeda .................... C07C 13/567 252/301.16
7,233,019 B2 6/2007 Ionkin et al.
2005/0156164 A1 7/2005 Sotoyama (Continued)

FOREIGN PATENT DOCUMENTS

JP 2007-45725 A 2/2007
JP 2007-119454 A 5/2007

(Continued)

OTHER PUBLICATIONS

KIPO Notice of Allowance dated Sep. 3, 2015, for corresponding Korean Patent application 10-2013-0096191, (7 pages).

*Primary Examiner* — Nathan T Leong
(74) *Attorney, Agent, or Firm* — Lewis Roca Rothgerber Christie LLP

(57) ABSTRACT

A condensed cyclic compound of Formula 1 is provided. An organic light-emitting device includes the same.

Formula 1

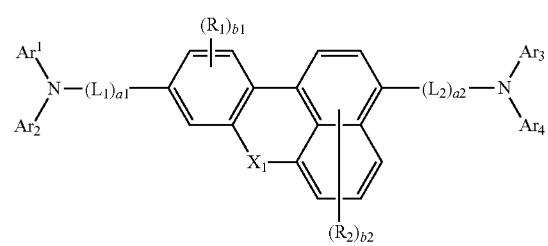

20 Claims, 1 Drawing Sheet

(52) U.S. Cl.
CPC ........ *H01L 51/0073* (2013.01); *H01L 51/0074* (2013.01); *H01L 51/5012* (2013.01)

(56) References Cited

U.S. PATENT DOCUMENTS

| | | | |
|---|---|---|---|
| 2007/0029927 | A1 | 2/2007 | Kawamura et al. |
| 2008/0100208 | A1 | 5/2008 | Shin et al. |
| 2008/0220285 | A1 | 9/2008 | Vestweber et al. |
| 2009/0004485 | A1 | 1/2009 | Zheng et al. |
| 2009/0026930 | A1 | 1/2009 | Shin et al. |
| 2009/0134781 | A1 | 5/2009 | Jang et al. |
| 2013/0112946 | A1* | 5/2013 | Park .................... C07D 471/06 257/40 |
| 2013/0306958 | A1 | 11/2013 | Ito et al. |

FOREIGN PATENT DOCUMENTS

| | | | |
|---|---|---|---|
| JP | 2007-123863 | A | 5/2007 |
| KR | 10-2006-0006760 | A | 1/2006 |
| KR | 10-2008-0039763 | A | 5/2008 |
| KR | 10-2008-0071969 | A | 8/2008 |
| KR | 10-2009-0010763 | A | 1/2009 |
| KR | 10-2009-0040649 | A | 4/2009 |
| KR | 10-2011-0104765 | A | 9/2011 |
| KR | 10-2011-0112098 | A | 10/2011 |
| KR | 10-2013-0049075 | | 5/2013 |
| WO | WO 2006/122630 | A1 | 11/2006 |
| WO | WO 2011/115378 | A1 | 9/2011 |
| WO | WO 2011/126224 | A1 | 10/2011 |
| WO | WO 2012/070226 | A1 | 5/2012 |

* cited by examiner

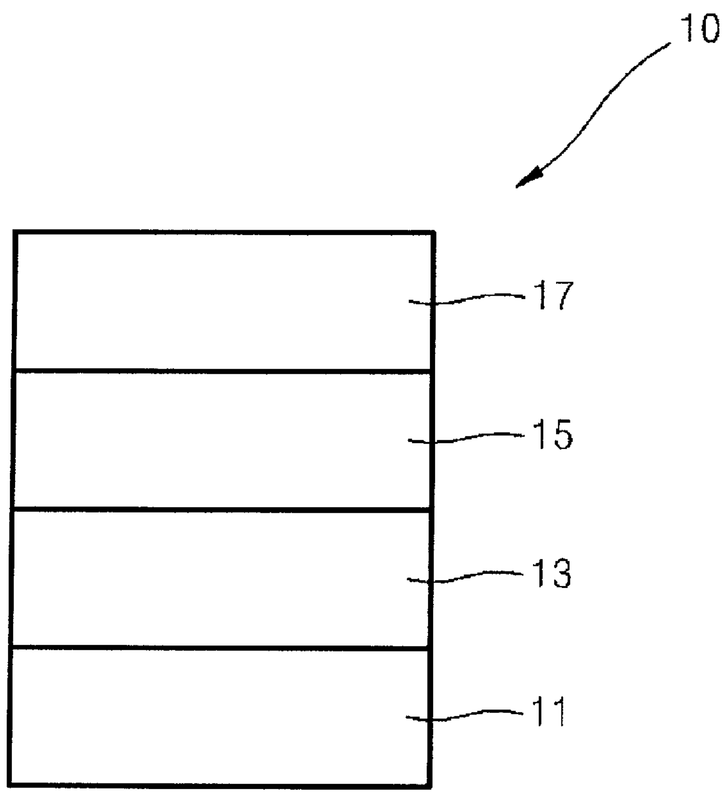
10
17
15
13
11

CONDENSED CYCLIC COMPOUND AND ORGANIC LIGHT-EMITTING DEVICE INCLUDING THE SAME

CROSS-REFERENCE TO RELATED APPLICATION

This application claims priority to and the benefit of Korean Patent Application Nos. 10-2013-0065468, filed on Jun. 7, 2013 and 10-2013-0096191, filed on Aug. 13, 2013 in the Korean Intellectual Property Office, the disclosures of which are incorporated herein in their entireties by reference.

BACKGROUND

1. Field

One or more embodiments of the present invention relate to a compound for an organic light-emitting device and an organic light-emitting device including the same.

2. Description of the Related Art

Organic light emitting devices are self-emission devices that have wide viewing angles a high contrast ratio, short response time, and excellent brightness, driving voltage, and response speed characteristics, and produce full-color images.

The organic light-emitting device may include a first electrode, a hole transport region, an emission layer, an electron transport region, and a second electrode, which are sequentially disposed in this stated order.

Holes provided from the first electrode may move toward the emission layer through the hole transport region, and electrons provided from the second electrode may move toward the emission layer through the electron transport region. Carriers, such as holes and electrons, are recombined in the emission layer to produce excitons. These excitons change from an excited state to a ground state, thereby generating light.

SUMMARY

One or more embodiments of the present invention relate to a novel condensed cyclic compound and an organic light-emitting device including the same.

An aspect of the present invention provides a condensed cyclic compound represented by Formula 1 below:

Formula 1

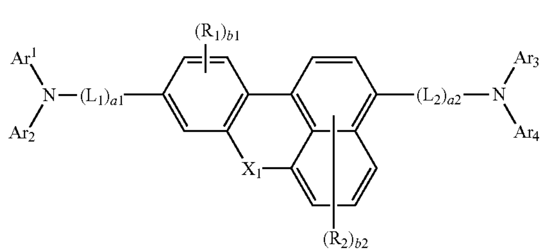

wherein in Formula 1, $X_1$ is O or S;

$L_1$ and $L_2$ are each independently selected from a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, or a substituted or unsubstituted $C_2$-$C_{60}$ heteroarylene group;

a1 and a2 are each independently an integer from 0 to 3;

$Ar_1$ to $Ar_4$ are each independently selected from a substituted or unsubstituted cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, or a substituted or unsubstituted $C_2$-$C_{60}$ heteroaryl group;

$R_1$ and $R_2$ are each independently selected from hydrogen, deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ heterocycloalkyl group, a substituted or unsubstituted $C_3$-$C_{10}$ cycloalkenyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, or a substituted or unsubstituted $C_2$-$C_{60}$ heteroaryl group, —$Si(Q_1)(Q_2)(Q_3)$ or —$N(Q_4)(Q_5)$ (wherein $Q_1$ to $Q_5$ are each independently a $C_1$-$C_{60}$ alkyl group, a $C_1$-$C_{60}$ alkoxy group, a $C_6$-$C_{60}$ aryl group, or a $C_2$-$C_{60}$ heteroaryl group);

b1 is an integer from 1 to 3; and b2 is an integer from 1 to 5.

For the substituted $C_3$-$C_{10}$ cycloalkylene group, the substituted $C_2$-$C_{10}$ heterocycloalkylene group, the substituted $C_3$-$C_{10}$ cycloalkenylene group, the substituted $C_2$-$C_{10}$ heterocycloalkenylene group, the substituted $C_6$-$C_{60}$ arylene group, the substituted $C_2$-$C_{60}$ heteroarylene group, the substituted $C_3$-$C_{10}$ cycloalkyl group, the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_2$-$C_{60}$ heteroaryl group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_6$-$C_{60}$ aryloxy group, and the substituted $C_6$-$C_{60}$ arylthio group, such groups may include one or more substituents selected from deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, or a substituted or unsubstituted $C_1$-$C_{60}$ alkoxy group; where for the substituted $C_1$-$C_{60}$ alkyl group, the substituted $C_2$-$C_{60}$ alkenyl group, the substituted $C_2$-$C_{60}$ alkynyl group, and the substituted $C_1$-$C_{60}$ alkoxy group, such substituted groups include at least one substituent selected from deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof; a substituted or unsubstituted $C_3$-$C_{10}$ cycloalkyl group, a substituted or unsubstituted $C_3$-$C_{10}$ heterocycloalkyl group, a substituted or unsubstituted $C_3$-$C_{10}$ cycloalkenyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group; —Si($Q_{11}$)($Q_{12}$)($Q_{13}$) or —N($Q_{14}$)($Q_{15}$) (wherein $Q_{11}$ to $Q_{15}$ are each independently selected from hydrogen, a $C_1$-$C_{60}$ alkyl group, a $C_1$-$C_{60}$ alkoxy group, a $C_6$-$C_{60}$ aryl group, or a $C_2$-$C_{60}$ heteroaryl group).

For the substituted $C_3$-$C_{10}$ cycloalkyl group, the substituted $C_3$-$C_{10}$ heterocycloalkyl group, the substituted $C_3$-$C_{10}$ cycloalkenyl group, the substituted $C_3$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, and the substituted $C_2$-$C_{60}$ heteroaryl group, such substituted groups include at least one substituent selected from deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, or a $C_2$-$C_{60}$ heteroaryl group.

According to another aspect, an organic light-emitting device includes a first electrode; a second electrode facing the first electrode; and an organic layer that is disposed between the first electrode and the second electrode and includes an emission layer, wherein the organic layer includes a hole transport region between the first electrode and the emission layer and an electron transport region between the emission layer and the second electrode, wherein the organic layer includes at least one of a condensed cyclic compound represented by Formula 1.

BRIEF DESCRIPTION OF THE DRAWINGS

These and/or other aspects will become apparent and more readily appreciated from the following description of the embodiments, taken in conjunction with the FIGURE being is a schematic view of an organic light-emitting device according to an embodiment of the present invention.

DETAILED DESCRIPTION

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the FIGURE, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that when a layer, region, or component is referred to as being "formed on" another layer, region, or component, it can be directly or indirectly formed on the other layer, region, or component. That is, for example, intervening layers, regions, or components may be present therebetween.

A condensed cyclic compound according to an embodiment of the present invention is represented by Formula 1 below:

Formula 1

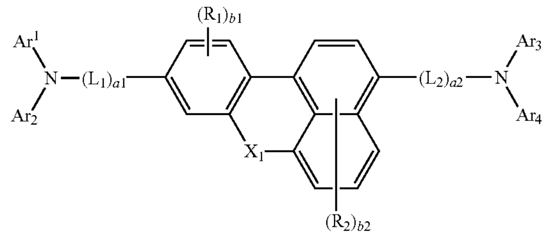

$X_1$ in Formula 1 may be O or S.

$L_1$ and $L_2$ in Formula 1 may be each independently selected from a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, or a substituted or unsubstituted $C_2$-$C_{60}$ heteroarylene group.

For example, $L_1$ and $L_2$ may be each independently selected from a substituted or unsubstituted phenylene group, a substituted or unsubstituted pentalenylene group, a substituted or unsubstituted indenylene group, a substituted or unsubstituted naphthylene group, a substituted or unsubstituted azulenylene group, a substituted or unsubstituted heptalenylene group, a substituted or unsubstituted indacenylene group, a substituted or unsubstituted acenaphthylene group, a substituted or unsubstituted fluorenylene group, a substituted or unsubstituted spiro-fluorenylene group, a substituted or unsubstituted phenalenylene group, a substituted or unsubstituted phenanthrenylene group, a substituted or unsubstituted anthracenylene group, a substituted or unsubstituted fluoranthenylene group, a substituted or unsubstituted triphenylenylene group, a substituted or unsubstituted pyrenylene group, a substituted or unsubstituted chrysenylene group, a substituted or unsubstituted naphthacenylene group, a substituted or unsubstituted picenylene group, a substituted or unsubstituted perylenylene group, a substituted or unsubstituted pentaphenylene group, a substituted or unsubstituted hexacenylene group, a substituted or unsubstituted pyrrolylene group, a substituted or unsubstituted imidazolylene group, a substituted or unsubstituted pyrazolylene group, a substituted or unsubstituted pyridinylene group, a substituted or unsubstituted pyrazinylene group, a substituted or unsubstituted pyrimidinylene group, a substituted or unsubstituted pyridazinylene group, a substituted or unsubstituted isoindolylene group, a substituted or unsubstituted indolylene group, a substituted or unsubstituted indazolylene group, a substituted or unsubstituted purinylene group, a substituted or unsubstituted quinolinylene group, a substituted or unsubstituted benzoquinolinylene group, a substituted or unsubstituted phthalazinylene phthalazinylene group, a substituted or unsubstituted naphthyridinylene naphthyridinylene group, a substituted or unsubstituted quinoxalinylene group, a substituted or unsubstituted quinazolinylene group, a substituted or unsubstituted cinnolinylene group, a substituted or unsubstituted carbazolylene group, a substituted or unsubstituted phenanthridinylene group, a substituted or unsubstituted acridinylene group, a substituted or unsubstituted phenanthrolinylene group, a substituted or unsubstituted phenazinylene group, a substituted or unsubstituted benzooxazolylene group, a substituted or unsubstituted benzoimidazolylene group, a substituted or unsubstituted furanylene group, a substituted or unsubstituted benzofuranylene group, a substituted or unsubstituted thiophenylene group, a substituted or unsubstituted benzothiophenylene group, a substituted or unsubstituted thiazolylene group, a substituted or unsubstituted isothiazolylene group, a substituted or unsubstituted benzothiazolylene group, a substituted or unsubstituted isoxazolylene group, a substituted or unsubstituted oxazolylene group, a substituted or unsubstituted triazolylene group, a substituted or unsubstituted tetrazolylene group, a substituted or unsubstituted oxadiazolylene group, a substituted or unsubstituted triazinylene group, a substituted or unsubstituted benzooxazolylene group, a substituted or unsubstituted dibenzofuranylene group, a substituted or unsubstituted dibenzothiophenylene group, a substituted or unsubstituted benzocarbazolylene group, or a substituted or unsubstituted dibenzosilolylene group.

For the substituted phenylene group, the substituted pentalenylene group, the substituted indenylene group, the substituted naphthylene group, the substituted azulenylene group, the substituted heptalenylene group, the substituted indacenylene group, the substituted acenaphthylene group, the substituted fluorenylene group, the substituted spiro-fluorenylene group, the substituted phenalenylene group, the substituted phenanthrenylene group, the substituted anthracenylene group, the substituted fluoranthenylene group, the substituted triphenylenylene group, the substituted pyrenylene group, the substituted chrysenylene group, the substituted naphthacenylene group, the substituted picenylene group, the substituted perylenylene group, the substituted pentaphenylene group, the substituted hexacenylene group, the substituted pyrrolylene group, the substituted imidazolylene group, the substituted pyrazolylene group, the substituted pyridinylene group, the substituted pyrazinylene group, the substituted pyrimidinylene group, the substituted pyridazinylene group, the substituted isoindolylene group, the substituted indolylene group, the substituted indazolylene group, the substituted purinylene group, the substituted quinolinylene group, the substituted benzoquinolinylene group, the substituted phthalazinylene group, the substituted naphthyridinylene group, the substituted quinoxalinylene group, the substituted quinazolinylene group, the substituted cinnolinylene group, the substituted carbazolylene group, the substituted phenanthridinylene group, the substituted acridinylene group, the substituted phenanthrolinylene group, the substituted phenazinylene group, the substituted benzooxazolylene group, the substituted benzoimidazolylene substituted furanylene group, the substituted benzofuranylene group, the substituted thiophenylene group, the substituted benzothiophenylene group, the substituted thiazolylene group, the substituted isothiazolylene group, the substituted benzothiazolylene group, the substituted isooxazolylene group, the substituted oxazolylene group, the substituted triazolylene group, the substituted tetrazolylene group, the substituted oxadiazolylene group, the substituted triazinylene group, the substituted benzooxazolylene group, the substituted dibenzofuranylene group, the substituted dibenzothiophenylene group, the substituted benzocarbazolylene and the substituted dibenzosilolylene, such substituted groups include at least one substituent selected from deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{20}$ alkyl group, or a substituted or unsubstituted $C_1$-$C_{20}$ alkoxy group, where for the substituted $C_1$-$C_{20}$ alkyl group and the substituted $C_1$-$C_{20}$ alkoxy group, each such substituted group includes at least one substituent selected from deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, or a phosphoric acid or a salt thereof; a substituted or unsubstituted $C_6$-$C_{20}$ aryl group or a substituted or unsubstituted $C_2$-$C_{20}$ heteroaryl group, where for the substituted $C_6$-$C_{20}$ aryl group and the substituted $C_2$-$C_{20}$ heteroaryl group, each such substituted group includes at least one substituent selected from deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group.

According to embodiments of the present invention, $L_1$ and $L_2$ are each independently represented by one of Formulae 2-1 to 2-28 below, but are not limited thereto:

Formula 2-1

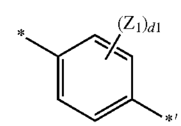

Formula 2-2

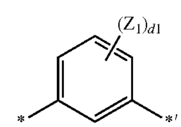

Formula 2-3

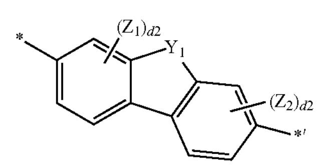

Formula 2-4

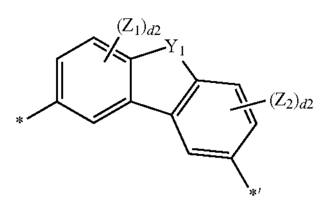

Formula 2-5

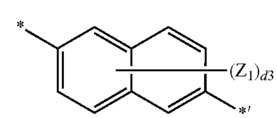

Formula 2-6

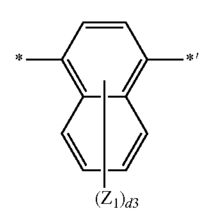

-continued
Formula 2-7
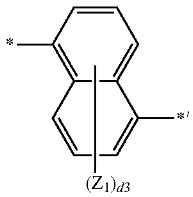
Formula 2-8
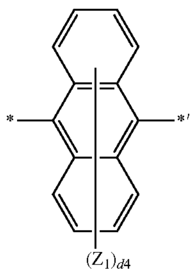
Formula 2-9
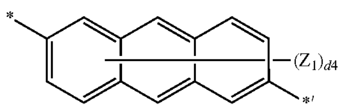
Formula 2-10
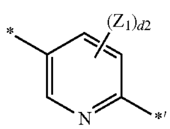
Formula 2-11
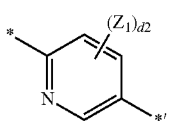
Formula 2-12
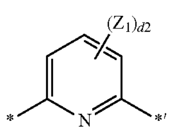
Formula 2-13
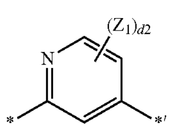
Formula 2-14
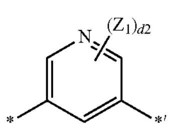
Formula 2-15
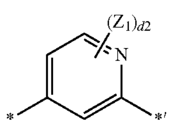
Formula 2-16
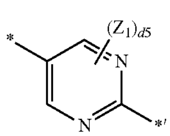
-continued
Formula 2-17
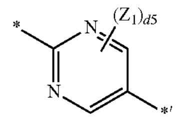
Formula 2-18
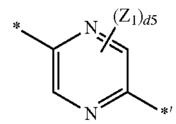
Formula 2-19
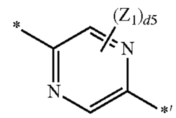
Formula 2-20
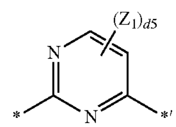
Formula 2-21
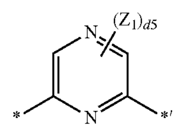
Formula 2-22
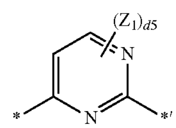
Formula 2-23
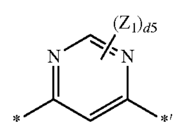
Formula 2-24
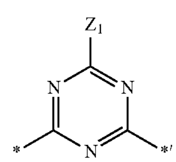
Formula 2-25
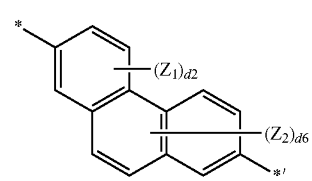
Formula 2-26
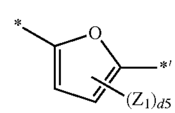
Formula 2-27
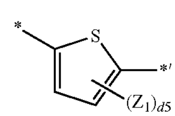

-continued

Formula 2-28

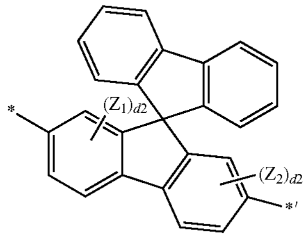

where: $Y_1$ is O, S, $C(Z_3)(Z_4)$, $N(Z_5)$, or $Si(Z_6)(Z_7)$;

$Z_1$ to $Z_7$ are each independently selected from hydrogen, deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{20}$ alkyl group, a substituted or unsubstituted $C_1$-$C_{20}$ alkoxy group, where for the substituted $C_1$-$C_{20}$ alkyl group, and the substituted $C_1$-$C_{20}$ alkoxy group, each such substituted group includes at least one substituent selected from deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, or a phosphoric acid or a salt thereof; a substituted or unsubstituted $C_6$-$C_{20}$ aryl group or a substituted or unsubstituted $C_2$-$C_{20}$ heteroaryl group, where for the substituted $C_6$-$C_{20}$ aryl group and the substituted $C_2$-$C_{20}$ heteroaryl group, each such substituted group includes at least one substituent selected from deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group; and each d1 may independently be an integer from 1 to 4; each d2 may independently be an integer from 1 to 3; each d3 may independently be an integer from 1 to 6; each d4 may independently be an integer from 1 to 8; each d5 may independently be the integer 1 or 2; each d6 may independently be an integer from 1 to 5; and * and *" each indicate a binding site to a neighboring atom.

For example, $Z_1$ to $Z_7$ in the Formulae 2-1 to 2-28 may be each independently selected from hydrogen, deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a methyl group, an ethyl group, a propyl group, a butyl group, a pentyl group, a hexyl group, a heptyl group, or an octyl group, but are not limited thereto.

According to another embodiment of the present invention, $L_1$ and $L_2$ in Formulae 1 and 2 may be each independently represented by one of Formulae 3-1 to 3-20 below:

Formula 3-1

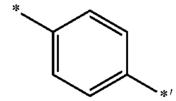

Formula 3-2

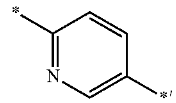

Formula 3-3

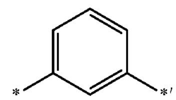

Formula 3-4

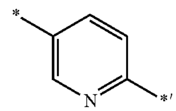

Formula 3-5

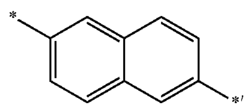

Formula 3-6

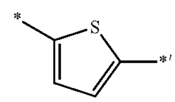

Formula 3-7

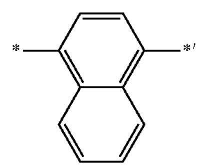

Formula 3-8

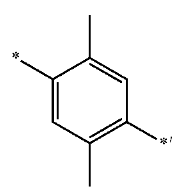

Formula 3-9

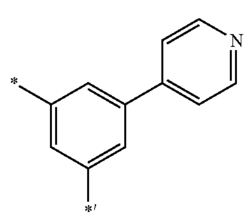

Formula 3-10

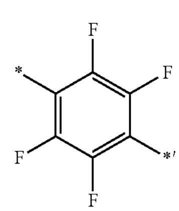

-continued

Formula 3-11

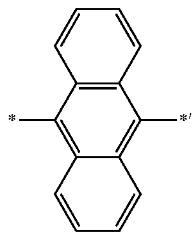

Formula 3-12

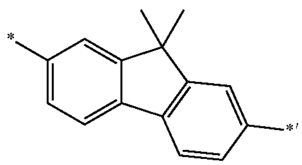

Formula 3-13

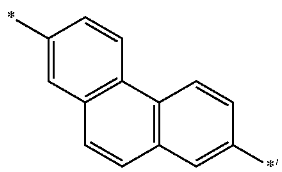

Formula 3-14

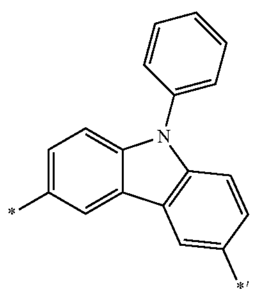

Formula 3-15

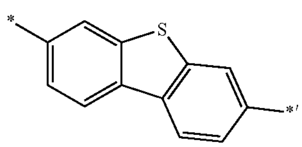

Formula 3-16

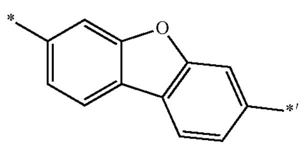

Formula 3-17

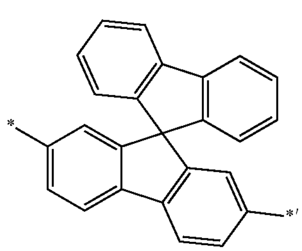

Formula 3-18

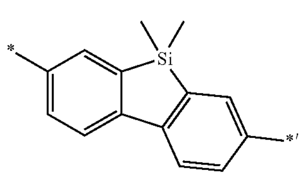

-continued

Formula 3-19

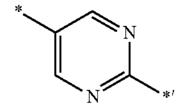

Formula 3-20

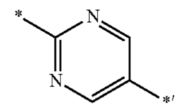

In Formulae 3-1 to 3-20, each of * and *' indicates a binding site to a neighboring atom.

In Formula 1, a1 and a2 indicate the number of $L_1$ and $L_2$, respectively, and each of a1 and a2 may independently be an integer from 1 to 3. When a1 is 0, —N($Ar_1$)($Ar_2$) may directly bind to the core of Formula 1. When a1 is 2 or more, a plurality of $L_1$s may be identical or different. When a2 is 0, —N($Ar_3$)($Ar_4$) may directly bind to the core of Formula 1. When a2 is 2 or more, a plurality of $L_2$s may be identical or different.

According to embodiments of the present invention, in Formula 1, a1 is 0 and a2 is 0; a1 is 0 and a2 is 1; a1 is 0 and a2 is 2; a1 is 0 and a2 is 3; a1 is 1 and a2 is 0; a1 is 1 and a2 is 1; a1 is 1 and a2 is 2; a1 is 1 and a2 is 3; a1 is 2 and a2 is 0; a1 is 2 and a2 is 1; or a1 is 2 and a2 is 2, but a1 and a2 are not limited thereto.

$Ar_1$ to $Ar_4$ are each independently selected from a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, or a substituted or unsubstituted $C_2$-$C_{60}$ heteroaryl group.

For example, $Ar_1$ to $Ar_4$ in Formula 1 may be each independently selected from a substituted or unsubstituted phenyl group, a substituted or unsubstituted pentalenyl group, a substituted or unsubstituted indenyl group, a substituted or unsubstituted naphthyl group, a substituted or unsubstituted azulenyl group, a substituted or unsubstituted heptalenyl group, a substituted or unsubstituted indacenyl, a substituted or unsubstituted acenaphthyl group, a substituted or unsubstituted fluorenyl group, a substituted or unsubstituted spiro-fluorenyl group, a substituted or unsubstituted phenalenyl group a substituted or unsubstituted phenanthrenyl group, a substituted or unsubstituted anthracenyl group, a substituted or unsubstituted fluoranthenyl group, a substituted or unsubstituted triphenylenyl group, a substituted or unsubstituted pyrenyl group, a substituted or unsubstituted chrysenyl group, a substituted or unsubstituted naphthacenyl group, a substituted or unsubstituted picenyl group, a substituted or unsubstituted perylenyl group, a substituted or unsubstituted pentaphenyl group, a substituted or unsubstituted hexacenyl group, a substituted or unsubstituted pyrrolyl group, a substituted or unsubstituted imidazolyl group, a substituted or unsubstituted pyrazolyl group, a substituted or unsubstituted pyridinyl group, a substituted or unsubstituted pyrazinyl group, a substituted or unsubstituted pyrimidinyl group, a substituted or unsubstituted pyridazinyl group, a substituted or unsubstituted isoindolyl group, a substituted or unsubstituted indolyl group, a substituted or unsubstituted indazolyl group, a substituted or unsubstituted purinyl group, a substituted or unsubstituted quinolinyl group, a substituted or unsubstituted benzoquinolinyl group, a substituted or unsubstituted phthalazinyl group, a substituted or unsubstituted naphthyridinyl group, a substituted or unsubstituted quinoxalinyl group, a substituted or unsubstituted quinazolinyl group, a substituted or unsubstituted cinnolinyl group, a substituted or unsubstituted carbazolyl group, a substituted or unsubstituted phenanthridinyl group, a substituted or unsubstituted acridinyl group, a substituted or unsubstituted phenanthrolinyl group, a substituted or unsubstituted phenazinyl group, a substituted or unsubstituted benzooxazolyl group, a substituted or unsubstituted benzoimidazolyl group, a substituted or unsubstituted (uranyl group, a substituted or unsubstituted benzofuranyl group, a substituted or unsubstituted thiophenyl group, a substituted or unsubstituted benzothiophenyl group, a substituted or unsubstituted thiazolyl group, a substituted or unsubstituted isothiazolyl thiazolyl group, a substituted or unsubstituted benzothiazolyl group, a substituted or unsubstituted isoxazolyl group, a substituted or unsubstituted oxazolyl group, a substituted or unsubstituted triazolyl group, a substituted or unsubstituted tetrazolyl group, a substituted or unsubstituted oxadiazolyl group, a substituted or unsubstituted triazinyl group, a substituted or unsubstituted benzooxazolyl group, a substituted or unsubstituted dibenzofuranyl group, a substituted or unsubstituted dibenzothiophenyl group, a substituted or unsubstituted benzocarbazolyl group, or a substituted or unsubstituted dibenzosilolylgroup.

For the substituted phenyl group, the substituted pentalenyl group, the substituted indenyl group, the substituted naphthyl group, the substituted azulenyl group, the substituted heptalenyl group, the substituted indacenyl group, the substituted acenaphthyl group, the substituted fluorenyl group, the substituted spiro-fluorenyl group, the substituted phenalenyl group, the substituted phenanthrenyl group, the substituted anthracenyl group, the substituted fluoranthenyl group, the substituted triphenylenyl group, the substituted pyrenyl group, the substituted chrysenyl group, the substituted naphthacenyl group, the substituted picenyl group, the substituted perylenyl group, the substituted pentaphenyl group, the substituted hexacenyl group, the substituted pyrrolyl group, the substituted imidazolyl group, the substituted pyrazolyl group, the substituted pyridinyl group, the substituted pyrazinyl group, the substituted pyrimidinyl group, the substituted pyridazinyl group, the substituted isoindolyl group, the substituted indolyl group, the substituted indazolyl group, the substituted purinyl group, the substituted quinolinyl group, the substituted benzoquinolinyl group, the substituted phthalazinyl group, the substituted naphthyridinyl group, the substituted quinoxalinyl group, the substituted quinazolinyl group, the substituted cinnolinyl group, the substituted carbazolyl group, the substituted phenanthridinyl group, the substituted acridinyl group, the substituted phenanthrolinyl group, the substituted phenazinyl group, the substituted benzooxazolyl group, the substituted benzoimidazolyl substituted furanyl group, the substituted benzofuranyl group, the substituted thiophenyl group, the substituted benzothiophenyl group, the substituted thiazolyl group, the substituted isothiazolyl group, the substituted benzothiazolyl group, the substituted isooxazolyl group, the substituted oxazolyl group, the substituted triazolyl group, the substituted tetrazolyl group, the substituted oxadiazolyl group, the substituted triazinyl group, the substituted benzooxazolyl group, the substituted dibenzofuranyl group, the substituted dibenzothiophenyl group, the substituted benzocarbazolyl group, and the substituted dibenzosilolyl group, each such substituted group includes at least one substituent selected from deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{20}$ alkyl group, a substituted or unsubstituted $C_1$-$C_{20}$ alkoxy group, where for the substituted $C_1$-$C_{20}$ alkyl group and the substituted $C_1$-$C_{20}$ alkoxy group, each such substituted group includes at least one substituent selected from deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, or a phosphoric acid or a salt thereof; a substituted or unsubstituted $C_6$-$C_{20}$ aryl group, or a substituted or unsubstituted $C_2$-$C_{20}$ heteroaryl group where for the substituted $C_6$-$C_{20}$ aryl group and the substituted $C_2$-$C_{20}$ heteroaryl group, each such substituted group includes at least one substituent selected from deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group.

For example, $Ar_1$ to $Ar_4$ may be each independently selected from Formulae 5-1 to 5-15.

Formula 5-1

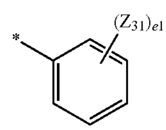

Formula 5-2

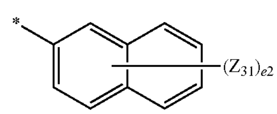

Formula 5-3

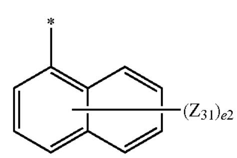

Formula 5-4

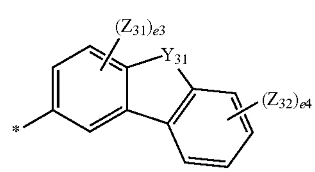

Formula 5-5

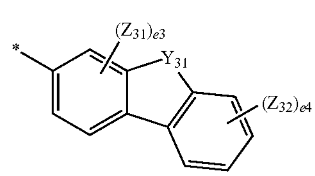

Formula 5-6

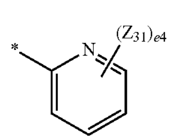

-continued

Formula 5-7

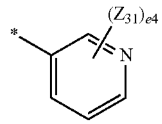

Formula 5-8

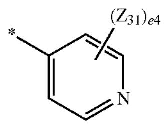

Formula 5-9

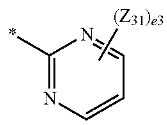

Formula 5-10

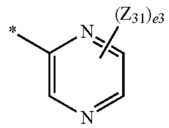

Formula 5-11

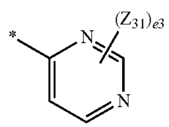

Formula 5-12

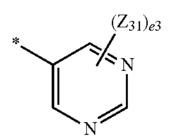

Formula 5-13

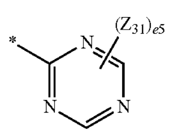

Formula 5-14

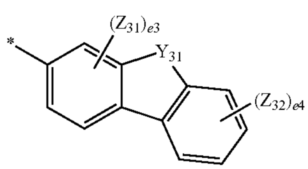

Formula 5-15

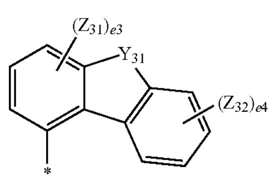

In Formulae 5-1 to 5-15:

$Y_{31}$ may be O, S, $C(Z_{33})(Z_{34})$, or $N(Z_{35})$;

$Z_{31}$ to $Z_{35}$ may be each independently selected from hydrogen, deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{20}$ alkyl group, or a substituted or unsubstituted $C_1$-$C_{20}$ alkoxy group where for the substituted $C_1$-$C_{20}$ alkyl group and the substituted $C_1$-$C_{20}$ alkoxy group, each such substituted group includes at least one substituent selected from deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, or a phosphoric acid or a salt thereof; a substituted or unsubstituted $C_6$-$C_{20}$ aryl group, a substituted or unsubstituted a substituted or unsubstituted $C_2$-$C_{20}$ heteroaryl group, where for the substituted $C_6$-$C_{20}$ aryl group and the substituted $C_2$-$C_{20}$ heteroaryl group, each such substituted group includes at least one substituent selected from deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group; or $Si(Q_{11})(Q_{12})(Q_{13})$ (wherein $Q_{11}$ to $Q_{13}$ are each independently a $C_1$-$C_{20}$ alkyl group, a phenyl group, a naphthyl group, or an anthracenyl group; and e1 may be an integer from 1 to 5; e2 may be an integer from 1 to 7; e3 may be an integer from 1 to 3; e4 may be an integer from 1 to 4; e5 may be an integer of 1 or 2; and * indicates a binding site to a neighboring atom.

According to an embodiment of the present invention, $Z_{31}$ to $Z_{35}$ in Formulae 5-1 to 5-15 may be each independently selected from hydrogen, deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a methyl group, an ethyl group, a propyl group, a butyl group, a pentyl group, a hexyl group, a heptyl group, an octyl group, a methoxy group, an ethoxy group, a propoxy group, a butoxy group, a pentoxy group; a substituted methyl group, a substituted ethyl group, a substituted propyl group, a substituted butyl group, a substituted pentyl group, a substituted hexyl group, a substituted heptyl group, a substituted octyl group, a substituted methoxy group, a substituted ethoxy group, a substituted propoxy group, a substituted butoxy group, or a substituted pentoxy group, where for these substituted groups, each includes at least one substituent selected from deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof; a phenyl group, a naphthyl group, an anthracenyl group, a phenanthrenyl group, a pyridinyl group, a pyrimidinyl group, a pyridazinyl group, a triazinyl group, a quinolinyl group, or an isoquinolinyl group; or $Si(Q_{11})(Q_{12})(Q_{13})$ (wherein $Q_{11}$ to $Q_{13}$ are each independently a $C_1$-$C_{20}$ alkyl group, a phenyl group, a naphthyl group, or an anthracenyl group, but are not limited thereto.)

According to another embodiment of the present invention, $Ar_1$ to $Ar_4$ may be each independently selected from Formulae 6-1 to 6-28.

Formula 6-1

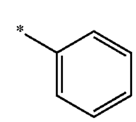

-continued
Formula 6-2
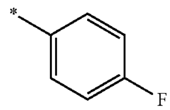
Formula 6-3
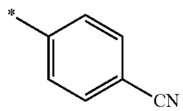
Formula 6-4
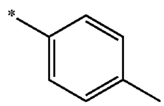
Formula 6-5
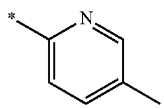
Formula 6-6
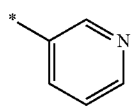
Formula 6-7
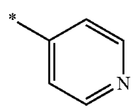
Formula 6-8
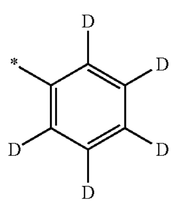
Formula 6-9
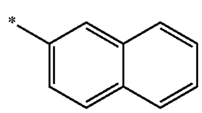
Formula 6-10
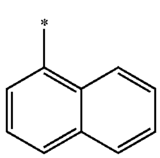
Formula 6-11
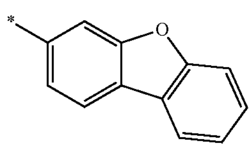
Formula 6-12
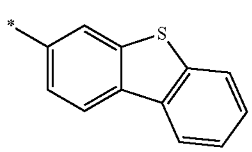
-continued
Formula 6-13
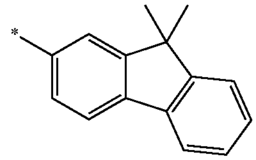
Formula 6-14
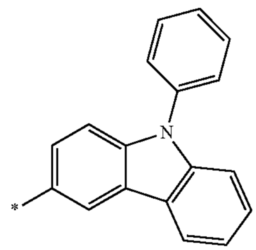
Formula 6-15
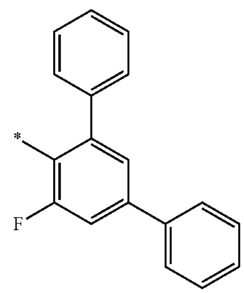
Formula 6-16
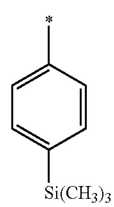
Formula 6-17
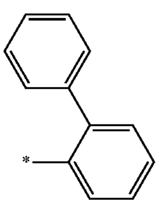
Formula 6-18
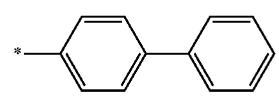
Formula 6-19
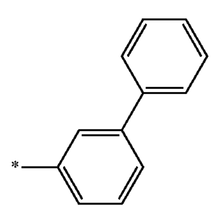

-continued

Formula 6-20

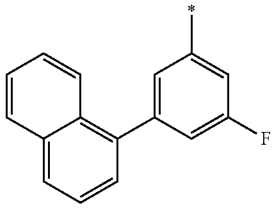

Formula 6-21

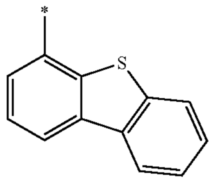

Formula 6-22

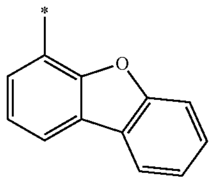

Formula 6-23

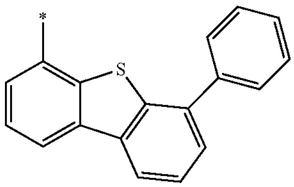

Formula 6-24

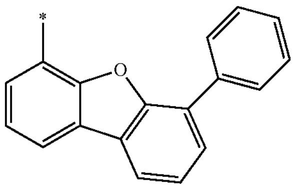

Formula 6-25

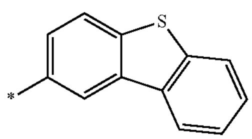

Formula 6-26

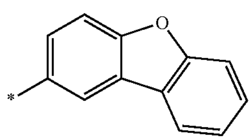

Formula 6-27

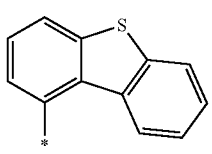

Formula 6-28

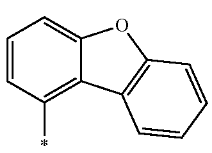

in Formulae 6-1 to 6-28, * indicates a binding site to a neighboring atom.

At least one of $Ar_1$ to $Ar_4$ in Formula 1 is represented by one of Formulae 5-4, 5-5, 5-14, or 5-15, and $Y_{31}$ in Formulae 5-4, 5-5, 5-14 and 5-15 may be O or S. $Z_{31}$, $Z_{32}$, e3, and e4 in Formulae 5-4, 5-5, 5-14, and 5-15 may be understood by referring to the description provided herein.

Formula 5-4

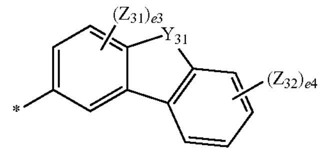

Formula 5-5

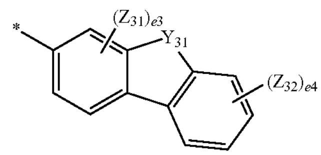

Formula 5-14

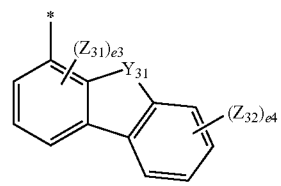

Formula 5-15

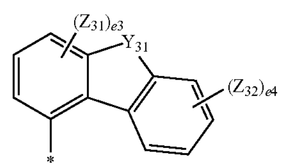

According to an embodiment of the present invention, at least one of $Ar_1$ to $Ar_4$ in Formula 1 is represented by one of Formulae 5-4 or 5-14, and $Y_{31}$ in Formulae 5-4 and 5-14 may be O or S. $Z_{31}$, $Z_{32}$, e3, and e4 in Formulae 5-4, and 5-14 may be understood by referring to the description provided herein.

For example, $Ar_1$ in Formula 1 is represented by one of Formulae 5-4, 5-5, 5-14, and 5-15, and $Y_{31}$ in Formulae 5-4, 5-5, 5-14 and 5-15 may be O or S. That is, Formula 1 may be represented by Formula 1(1) or 1(2) below, but is not limited thereto:

Formula 1(1)

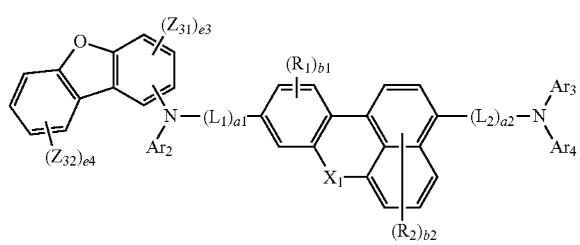

-continued

Formula 1(2)

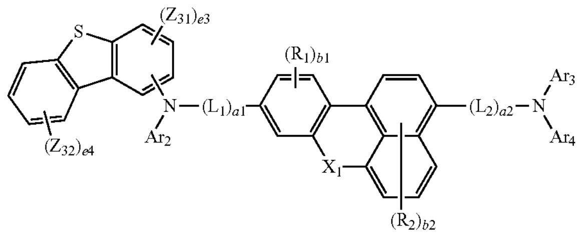

$X_1$, $L_1$, $L_2$, a1, a2, $R_1$, $R_2$, b1, b2, $Ar_2$, $Ar_3$, $Ar_4$, $Z_{31}$, $Z_{32}$, e3, and e4 in Formulae 1(1) and 1(2) may be understood by referring to the description provided herein.

According to embodiments of the present invention, the condensed cyclic compound represented by Formula 1 may be represented by Formula 1(1) or 1(2), $L_1$ and $L_2$ in Formulae 1(1) and 1(2) may be each independently represented by one of Formulae 2-1 to 2-28; a1 is 0 or 1; a2 is 0 or 1; $Ar_2$ to $Ar_4$ may be each independently represented by one of Formulae 5-1 to 5-15; and $R_1$ and $R_2$ may be each independently selected from hydrogen, deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a phenyl group, a naphthyl group, or an anthracenyl group; b1 may be 0 or 1; and b2 may be 0 or 1.

According to an embodiments of the present invention, in Formula 1:

$Ar_1$, $Ar_2$, $Ar_3$, and $Ar_4$ may all be the same;

$Ar_1$ may be the same as $Ar_3$ and $Ar_2$ may be the same as $Ar_4$, but $Ar_1$ and $Ar_2$ may be different from one another;

$Ar_1$ may be the same as $Ar_3$, and $Ar_1$, $Ar_2$, and $Ar_4$ may be different from one another; or $Ar_1$, $Ar_2$, $Ar_3$, and $Ar_4$ may all be different from one another.

In Formula 1, $R_1$ and $R_2$ are each independently selected from hydrogen, deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ heterocycloalkyl group, a substituted or unsubstituted $C_3$-$C_{10}$ cycloalkenyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, or a substituted or unsubstituted $C_2$-$C_{60}$ heteroaryl group, —Si($Q_1$)($Q_2$)($Q_3$) or —N($Q_4$)($Q_5$) (wherein $Q_1$ to $Q_5$ are each independently a $C_1$-$C_{60}$ alkyl group, a $C_1$-$C_{60}$ alkoxy group, a $C_6$-$C_{60}$ aryl group, or a $C_2$-$C_{60}$ heteroaryl group)

For example, $R_1$ and $R_2$ may be each independently selected from hydrogen, deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{20}$ alkyl group, or a substituted or unsubstituted $C_1$-$C_{20}$ alkoxy group, where for the substituted $C_1$-$C_{20}$ alkyl group and the substituted $C_1$-$C_{20}$ alkoxy group, each such substituted group includes at least one substituent selected from deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, or a phosphoric acid or a salt thereof; a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a fluoranthenyl group, a triphenylenylene group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzooxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a benzooxazolyl group, a dibenzofuranyl group, a dibenzothiophenyl group, a benzocarbazolyl group; a substituted phenyl group, a substituted pentalenyl group, a substituted indenyl group, a substituted naphthyl group, a substituted azulenyl group, a substituted heptalenyl group, a substituted indacenyl group, a substituted acenaphthyl group, a substituted fluorenyl group, a substituted spiro-fluorenyl group, a substituted phenalenyl group, a substituted phenanthrenyl group, a substituted anthracenyl group, a substituted fluoranthenyl group, a substituted triphenylenyl group, a substituted pyrenyl group, a substituted chrysenyl group, a substituted naphthacenyl group, a substituted picenyl group, a substituted perylenyl group, a substituted pentaphenyl group, a substituted hexacenyl group, a substituted pyrrolyl group, a substituted imidazolyl group, a substituted pyrazolyl group, a substituted pyridinyl group, a substituted pyrazinyl group, a substituted pyrimidinyl group, a substituted pyridazinyl group, a substituted isoindolyl group, a substituted indolyl group, a substituted indazolyl group, a substituted purinyl group, a substituted quinolinyl group, a substituted benzoquinolinyl group, a substituted phthalazinyl group, a substituted naphthyridinyl group, a substituted quinoxalinyl group, a substituted quinazolinyl group, a substituted cinnolinyl group, a substituted carbazolyl group, a substituted phenanthridinyl group, a substituted acridinyl group, a substituted phenanthrolinyl group, a substituted phenazinyl group, a substituted benzooxazolyl group, a substituted benzoimidazolyl group, a substituted furanyl group, a substituted benzofuranyl group, a substituted thiophenyl group, a substituted benzothiophenyl group, a substituted thiazolyl group, a substituted isothiazolyl group, a substituted benzothiazolyl group, a substituted isooxazolyl group, a substituted oxazolyl group, a substituted triazolyl group, a substituted tetrazolyl group, a substituted oxadiazolyl group, a substituted triazinyl group, a substituted benzooxazolyl group, a substituted dibenzofuranyl group, a substituted dibenzothiophenyl group, or a substituted benzocarbazolyl group, where such substituted groups include at least one substituent selected from deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a anthracenyl group, a fluorenyl group, a pyridinyl group, a pyrimidinyl group, a quinolinyl group, a isoquinolinyl group, or a triazinyl group.

For example, $R_1$ and $R_2$ in Formula 1 may be each independently selected from hydrogen, deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a phenyl group, a naphthyl group, or an anthracenyl group, but are not limited thereto.

According to an embodiment of the present invention, $R_1$ and $R_2$ in Formula 1 may both be hydrogen.

In Formula 1, b1 indicates the number of $R_1$s, and may be n integer from 1 to 3. When b1 is 2 or more, a plurality of $R_1$s may be identical or different. In certain embodiments, b1 may be 1 or 2.

In Formula 1, b2 indicates the number of $R_2$s and may be an integer from 1 to 5. When b1 is 2 or more, a plurality of $R_2$s may be identical or different. In certain embodiments, b2 may be 1 or 2.

According to an embodiment of the present invention, the condensed cyclic compound may be one of Formulae 1A to 1D below:

Formula 1A

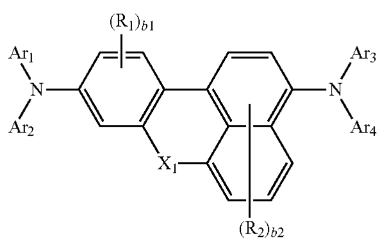

Formula 1B

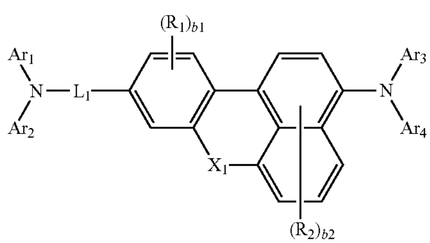

Formula 1C

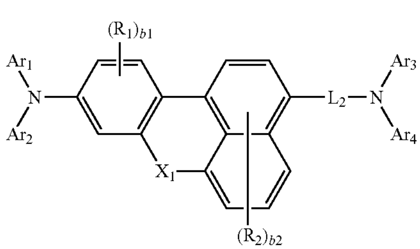

-continued

Formula 1D

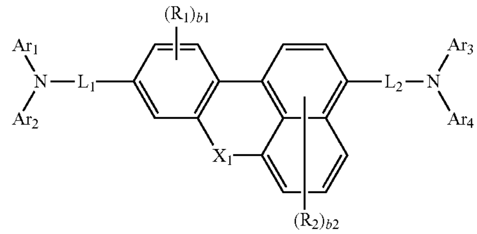

$X_1$, $L_1$, $L_2$, $Ar_1$ to $Ar_4$, $R_1$, $R_2$, b1, and b2 in Formulae 1A to 1D may be understood by referring to the description provided herein.

For example, in Formulae 1A to 1D, $X_1$ is O or S;

$L_1$ and $L_2$ may be each independently represented by one of Formulae 2-1 to 2-28 below:

$Ar_1$ and $Ar_4$ may be each independently selected from Formulae 5-1 to 5-15 herein;

$R_1$ and $R_2$ may be each independently selected from hydrogen, deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a phenyl group, a naphthyl group, or an anthracenyl group;

b1 and b2 may each be 1 or 2.

According another embodiment of the present invention, in Formulae 1A to 1D, $X_1$ is O or S;

$L_1$ and $L_2$ are each independently selected from Formulae 3-1 to 3-20;

$Ar_1$ and $Ar_4$ may be each independently selected from Formulae 6-1 to 6-28 below;

$R_1$ and $R_2$ may be each independently selected from hydrogen, deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a phenyl group, a naphthyl group, or an anthracenyl group;

b1 and b2 may each be 1 or 2.

According to an embodiment of the present invention, at least one of $Ar_1$ to $Ar_4$ in Formulae 1A to 1D is represented by one of Formulae 5-4, 5-5, 5-14, and 5-15, and $Y_{31}$ in Formulae 5-4, 5-5, 5-14 and 5-15 may be O or S. $Z_{31}$, $Z_{32}$, e3, and e4 in Formulae 5-4, 5-5, 5-14, and 5-15 may be understood by referring to the description provided herein.

According to an embodiment of the present invention, at least one of $Ar_1$ to $Ar_4$ in Formulae 1A to 1D is represented by one of Formulae 5-4 or 5-14, and $Y_{31}$ in Formulae 5-4 and 5-14 may be O or S. $Z_{31}$, $Z_{32}$, e3, and e4 in Formulae 5-4, and 5-14 may be understood by referring to the description provided herein.

According to another embodiment of the present invention, the condensed cyclic compound represented by Formula 1 may be represented by Formula 1A, and at least one of $Ar_1$ to $Ar_4$ in Formulae 1A to 1D is represented by one of Formulae 5-4, 5-5, 5-14, or 5-15, and $Y_{31}$ in Formulae 5-4, 5-5, 5-14 and 5-15 may be O or S.

According to another embodiment of the present invention, the condensed cyclic compound represented by Formula 1 may be represented by Formula 1A(1) or 1A(2) below.

Formula 1A(1)

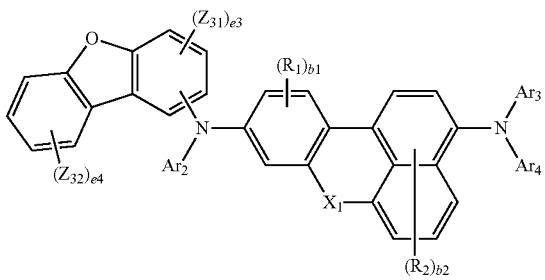

Formula 1A(2)

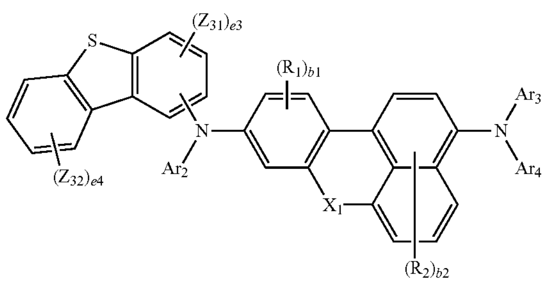

$X_1$, $R_1$, $R_2$, b1, b2, $Ar_2$, $Ar_3$, $Ar_4$, $Z_{31}$, $Z_{32}$, e3, and e4 in Formulae 1A(1) and 1A(2) may be understood by referring to the description provided herein.

For example, in Formulae 1A(1) and 1A(2), $Ar_2$ to $Ar_4$ may be each independently represented by one of Formulae 5-1 to 5-15; $R_1$ and $R_2$ are each independently selected from hydrogen, deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a phenyl group, a naphthyl group, or an anthracenyl group; b1 may be 0 or 1; and b2 may be 0 or 1.

According to another embodiment of the present invention, in Formulae 1A(1) and 1A(2), $Ar_2$ to $Ar_4$ may be each independently represented by one of Formulae 6-1 to 6-28; $R_1$ and $R_2$ are each independently selected from hydrogen, deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a phenyl group, a naphthyl group, or an anthracenyl group; b1 may be 0 or 1; and b2 may be 0 or 1.

In the present specification, for the substituted $C_3$-$C_{10}$ cycloalkylene group, the substituted $C_2$-$C_{10}$ heterocycloalkylene group, the substituted $C_3$-$C_{10}$ cycloalkenylene group, the substituted $C_2$-$C_{10}$ heterocycloalkenylene group, the substituted $C_6$-$C_{60}$ arylene group, the substituted $C_2$-$C_{60}$ heteroarylene group, the substituted $C_3$-$C_{10}$ cycloalkyl group, the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_2$-$C_{60}$ heteroaryl group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_5$-$C_{60}$ aryloxy group, and the substituted $C_6$-$C_{60}$ arylthio group, each of such substituted groups includes at least one substituent selected from deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group; a substituted $C_1$-$C_{60}$ alkyl group, a substituted $C_2$-$C_{60}$ alkenyl group, a substituted $C_2$-$C_{60}$ alkynyl group, a substituted $C_1$-$C_{60}$ alkoxy group, where for such substituted groups, each includes at least one substituent selected from deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, or a phosphoric acid or a salt thereof; a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group; a substituted $C_3$-$C_{10}$ cycloalkyl group, a substituted $C_3$-$C_{10}$ heterocycloalkyl group, a substituted $C_3$-$C_{10}$ cycloalkenyl group, a substituted $C_3$-$C_{10}$ heterocycloalkenyl group, a substituted $C_6$-$C_{60}$ aryl group, a $C_6$-$C_{60}$ aryloxy group, a substituted $C_6$-$C_{60}$ arylthio group, a substituted $C_2$-$C_{60}$ heteroaryl group, where for such substituted groups, each includes at least one substituent selected from deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group; —$Si(Q_{11})(Q_{12})(Q_{13})$, or —$N(Q_{14})(Q_{15})$ (wherein $Q_{11}$ to $Q_{15}$ are each independently selected from hydrogen, a $C_1$-$C_{60}$ alkyl group, a $C_1$-$C_{60}$ alkoxy group, a $C_6$-$C_{60}$ aryl group, or a $C_2$-$C_{60}$ heteroaryl group).

The condensed cyclic compound may be one of Compounds 1 to 152 below, but is not limited thereto.

1

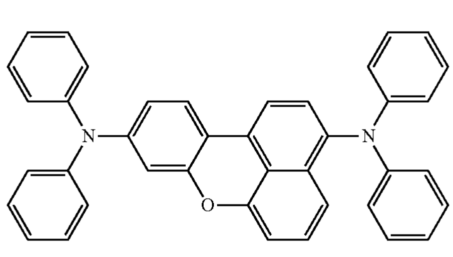

2

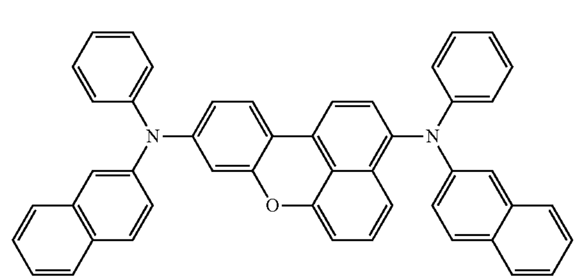

-continued
3
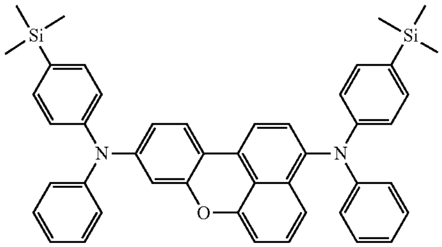
4
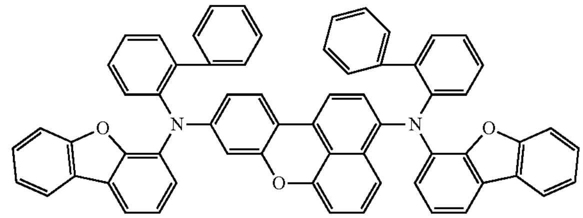
5
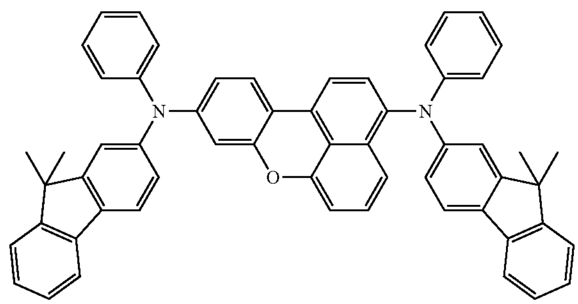
6
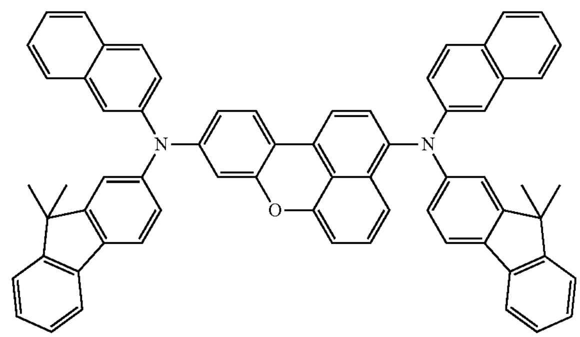
7
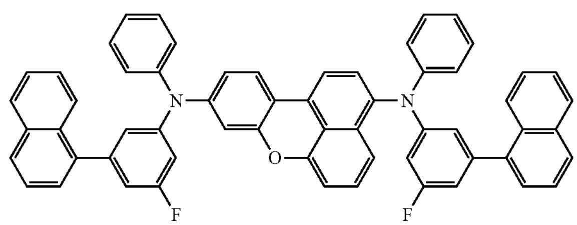
8
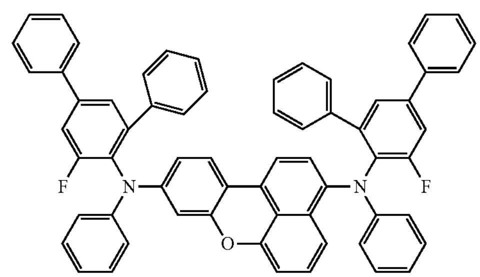
9
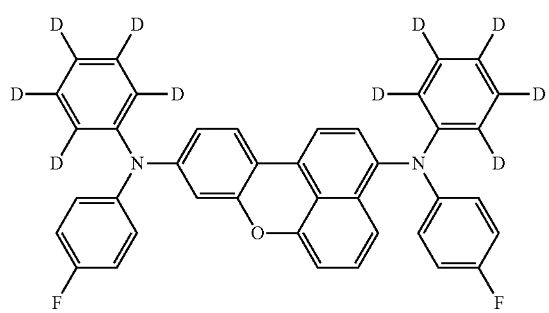
10
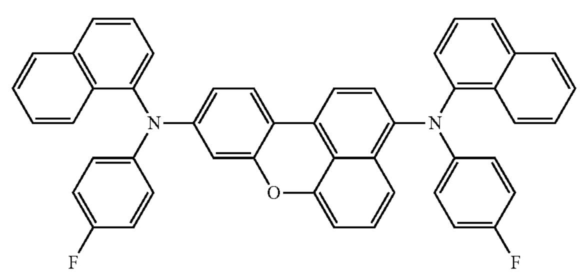
11
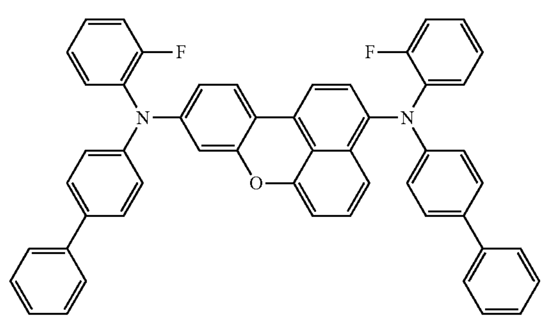
12
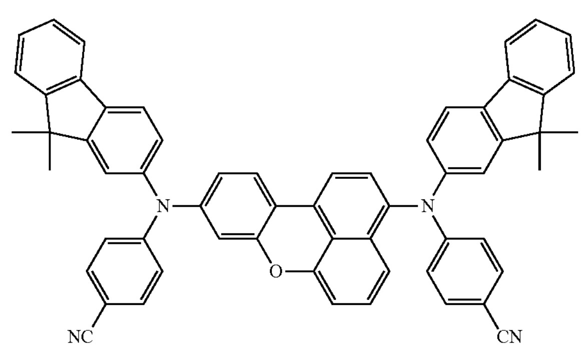

-continued
13
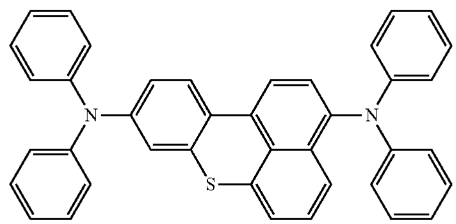
14
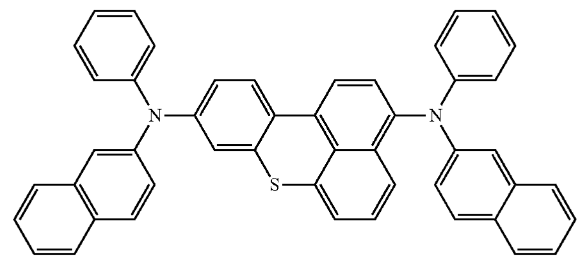
15
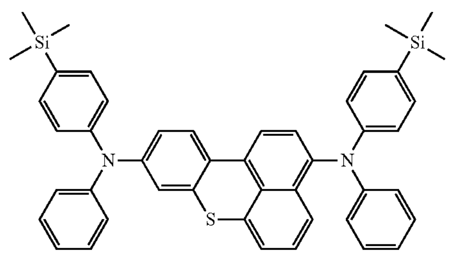
16
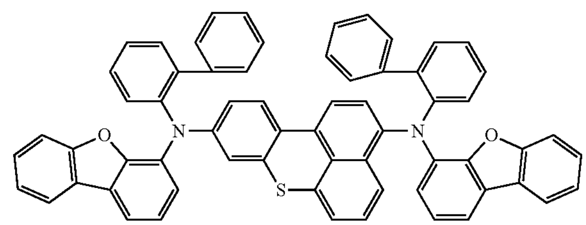
17
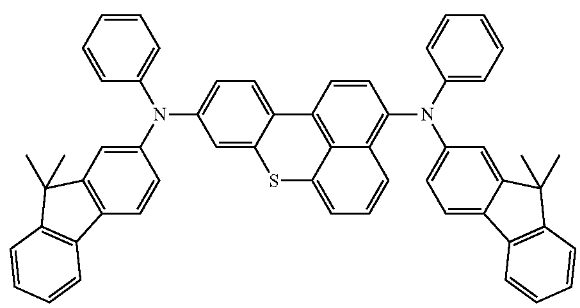
18
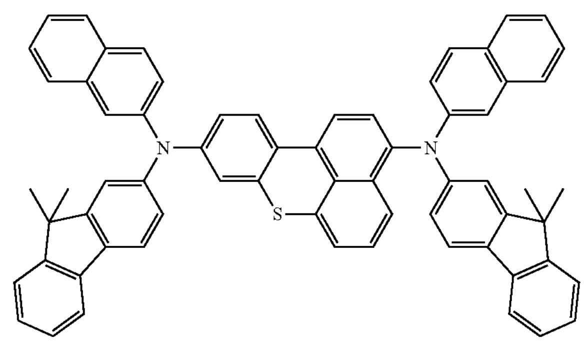
19
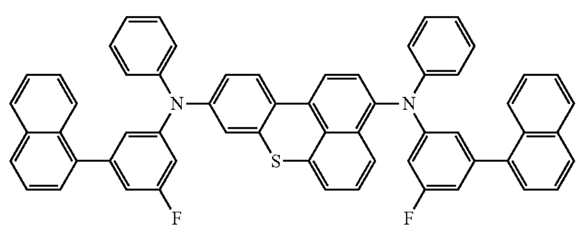
20
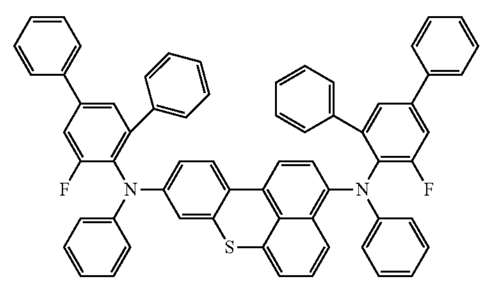
21
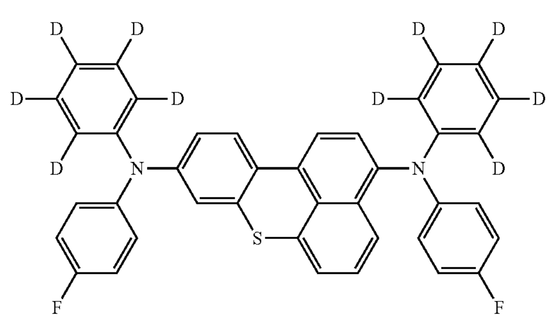
22
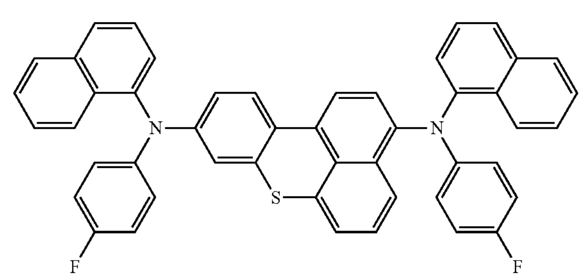

-continued
23
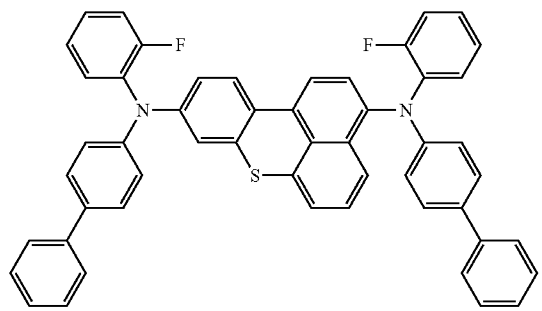
24
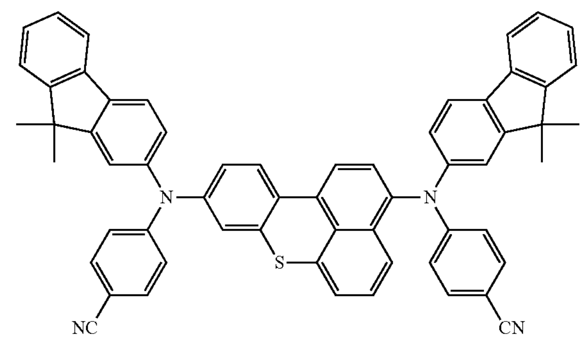
25
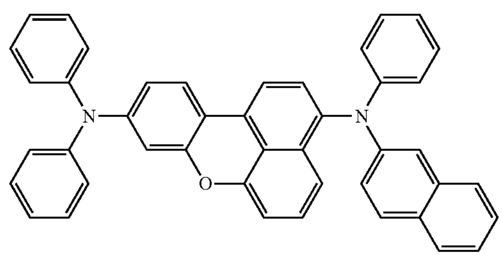
26
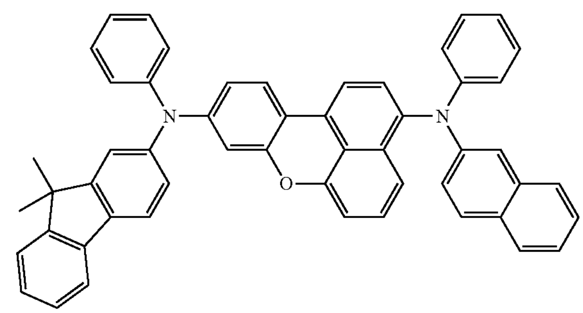
27
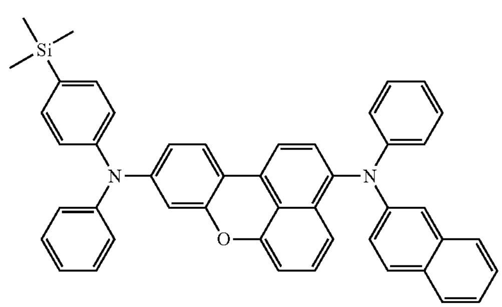
28
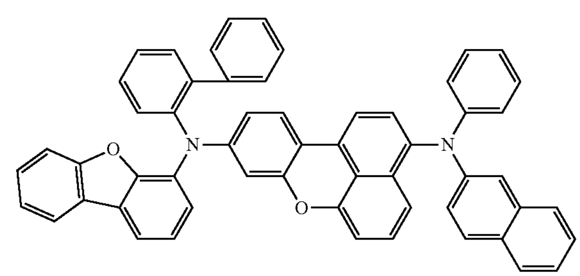
29
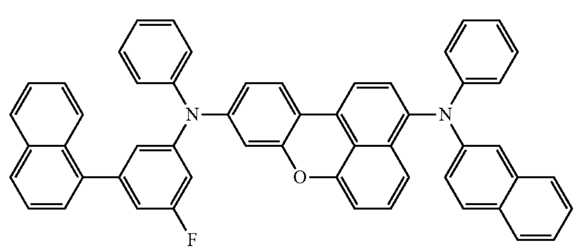
30
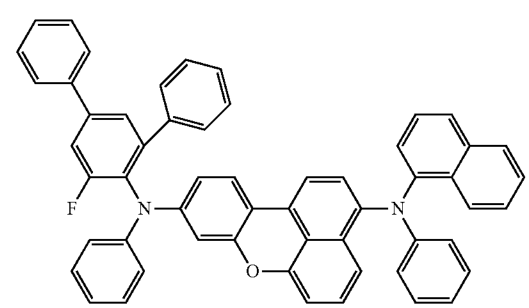

-continued
31
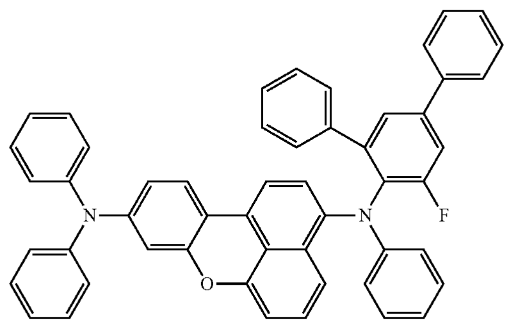
32
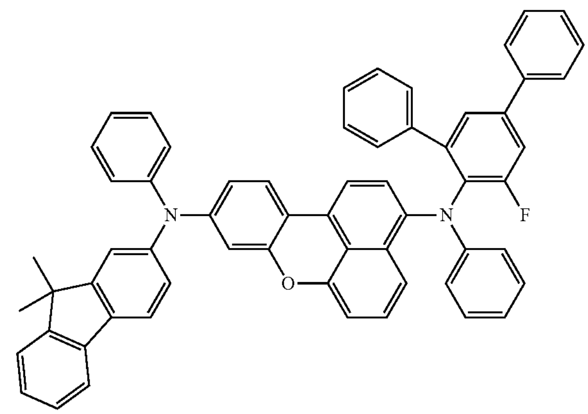
33
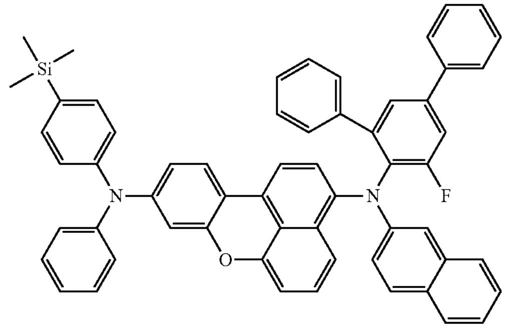
34
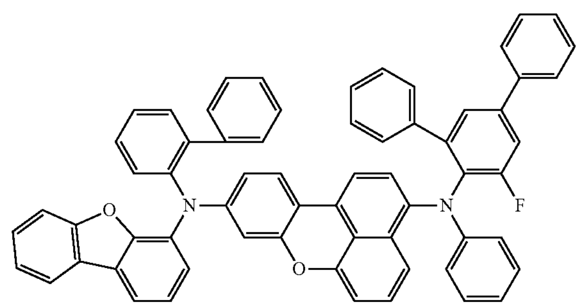
35
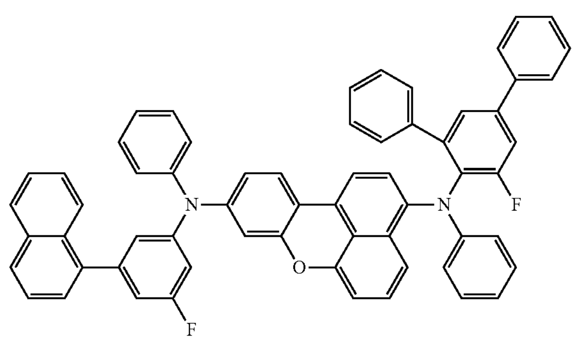
36
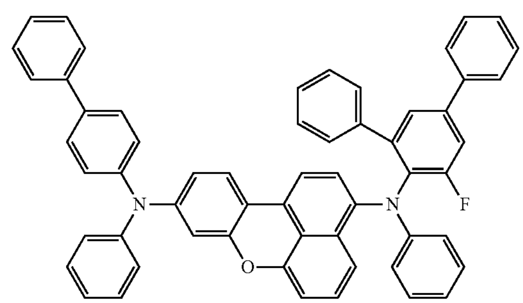
37
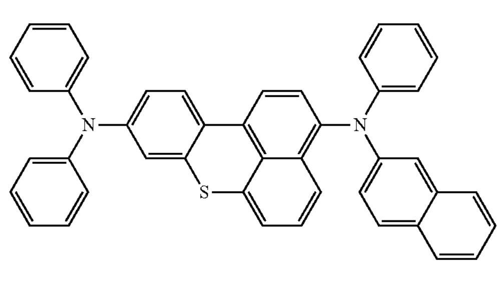
38
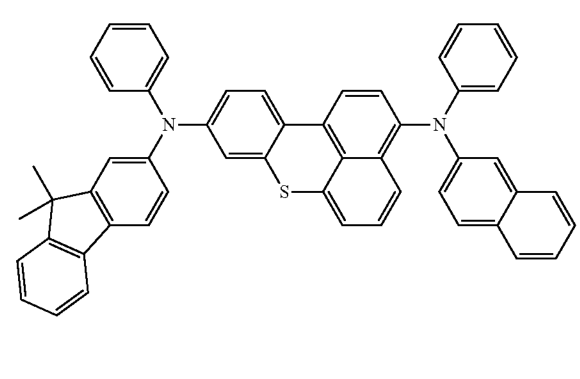

-continued
39
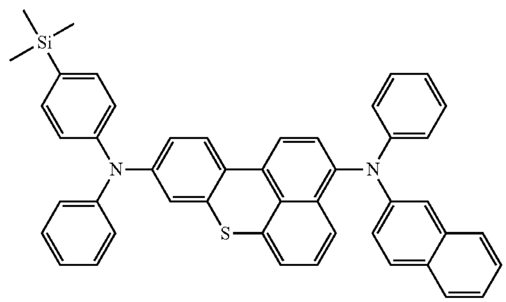
40
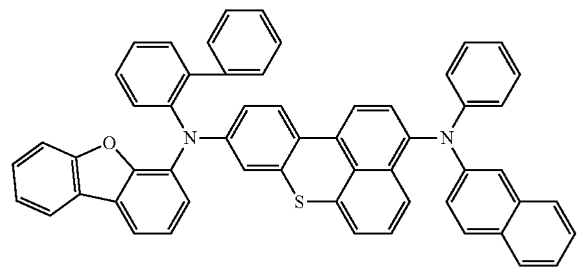
41
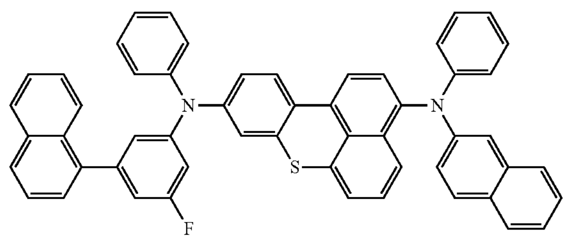
42
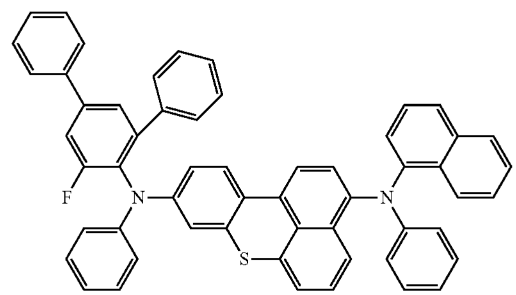
43
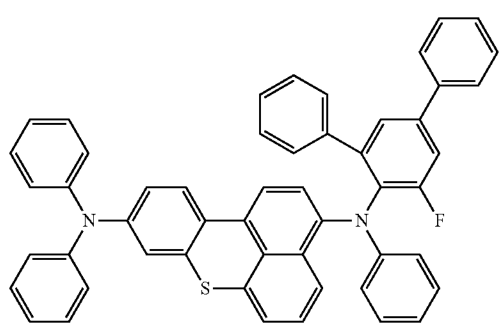
44
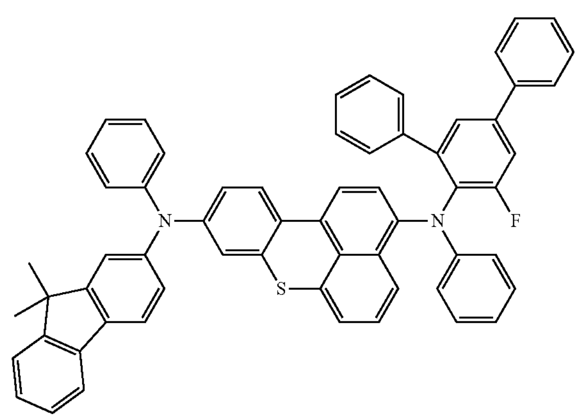
45
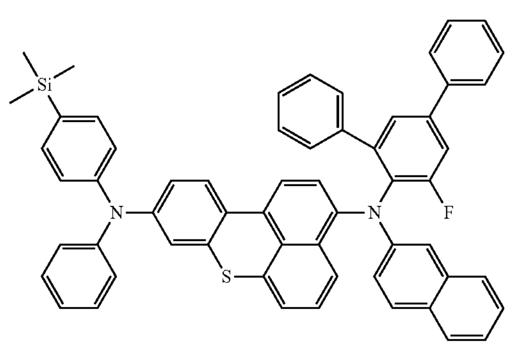
46
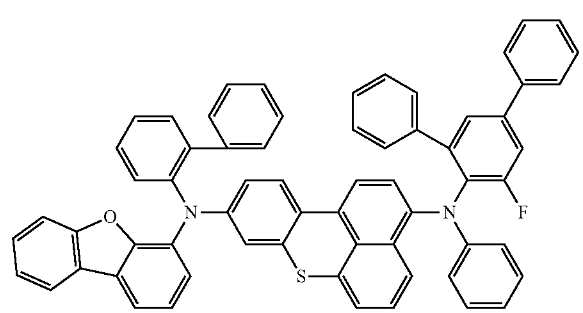

-continued
47
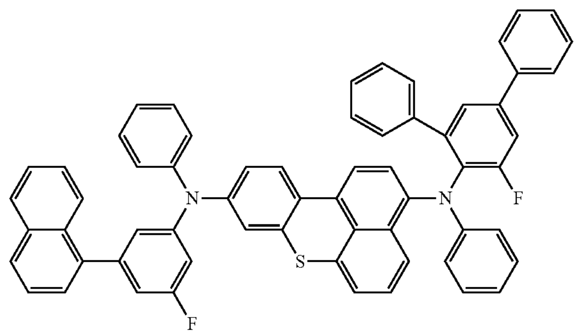
48
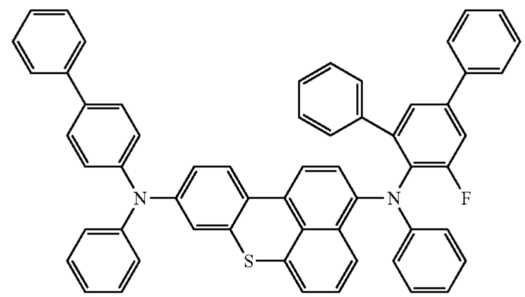
49
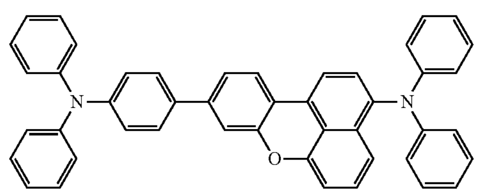
50
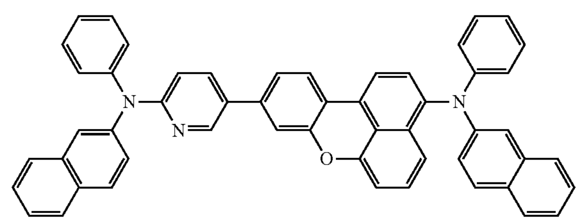
51
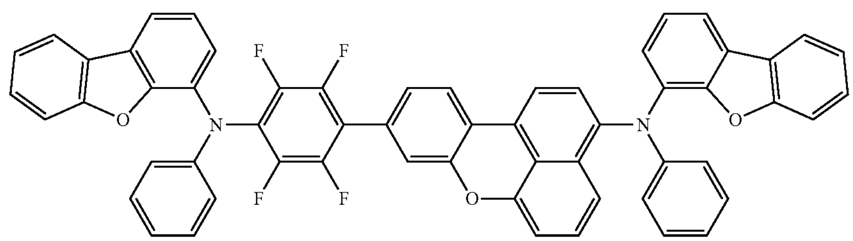
52
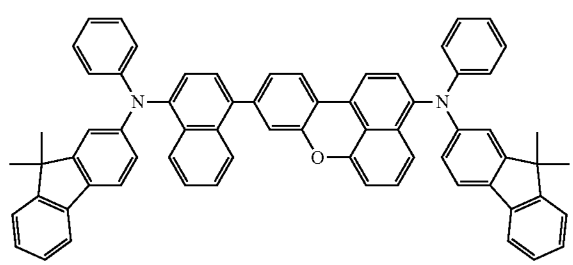
53
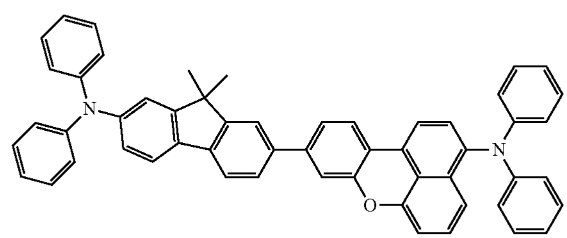
54
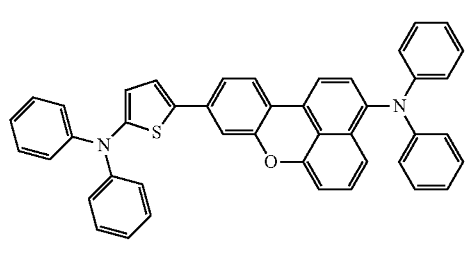
55
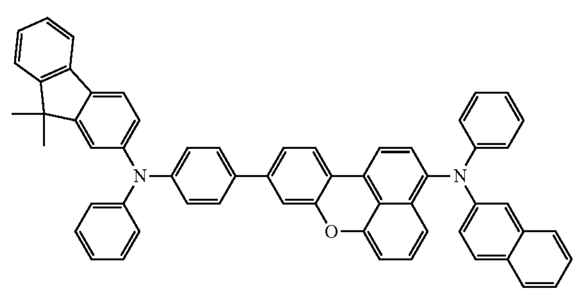

-continued
56
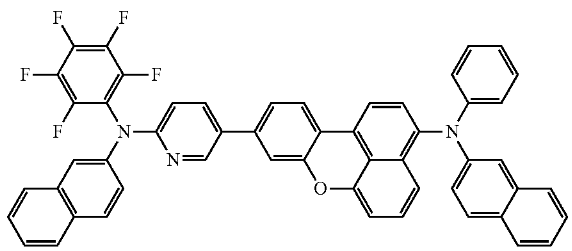
57
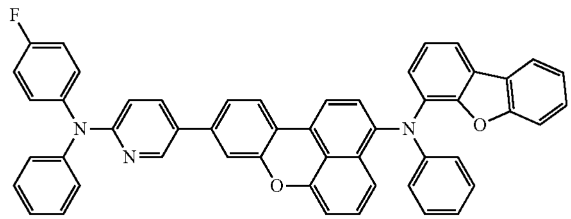
58
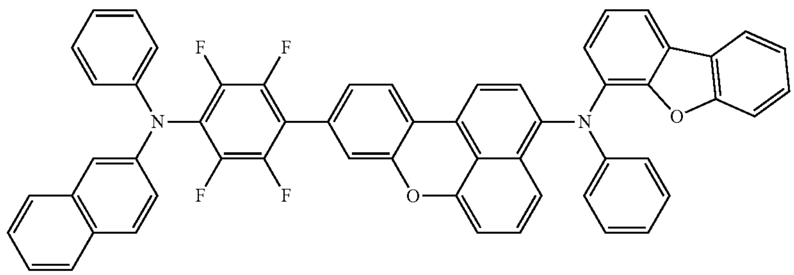
59
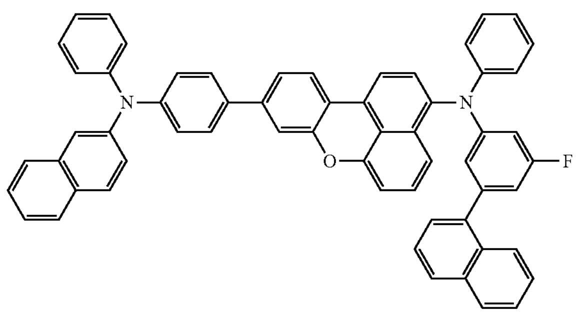
60
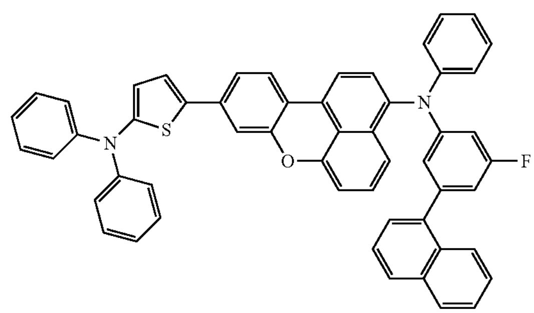
61
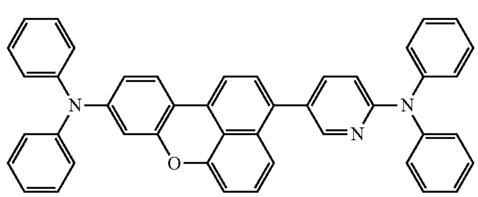
62
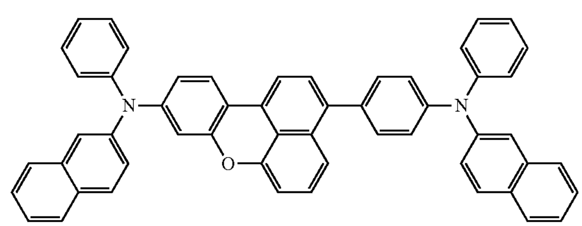
63
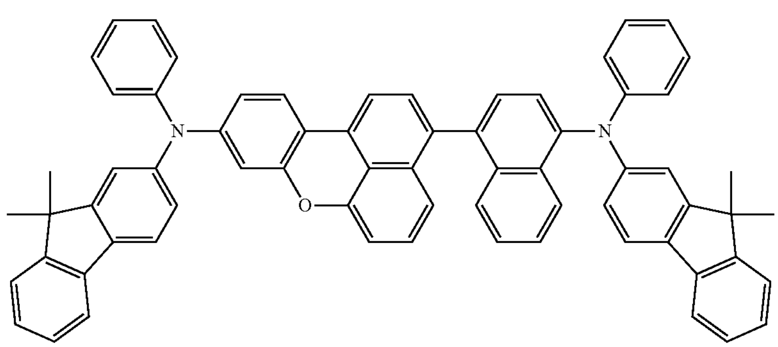

-continued
64
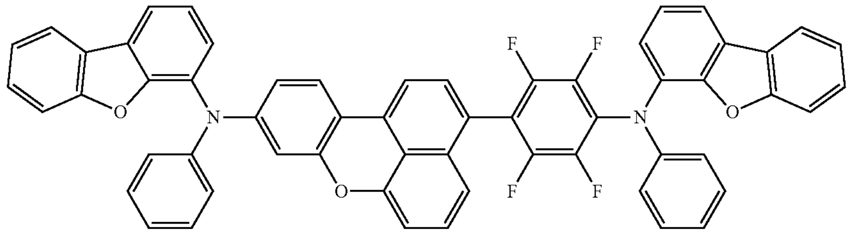
65
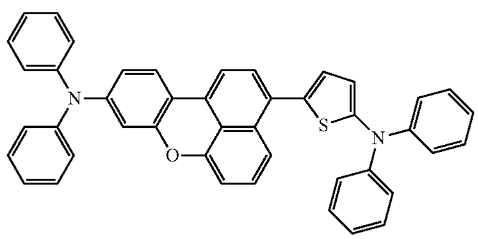
66
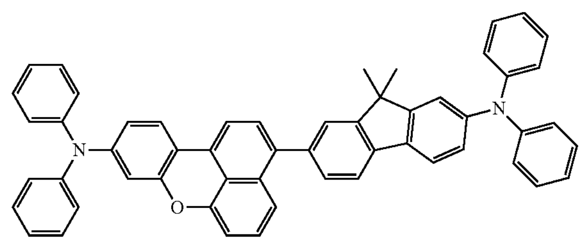
67
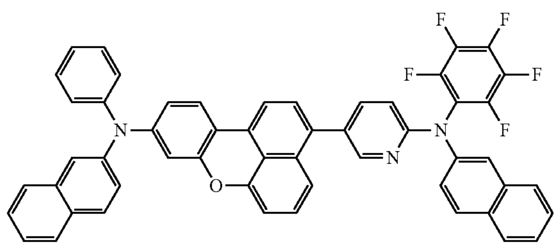
68
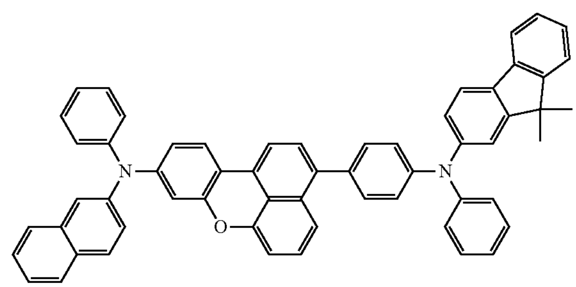
69
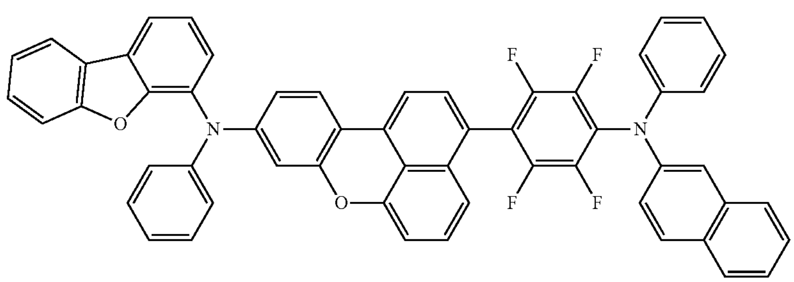
70
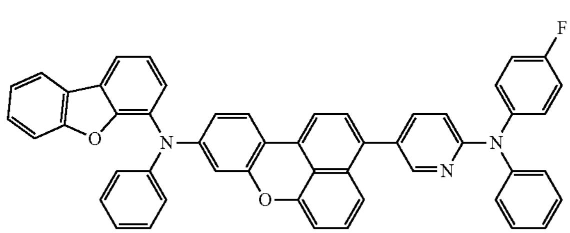
71
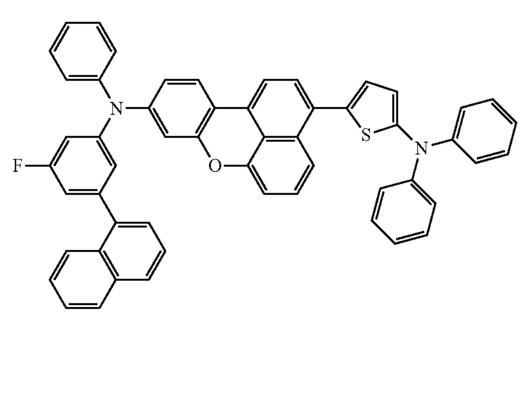

-continued
72
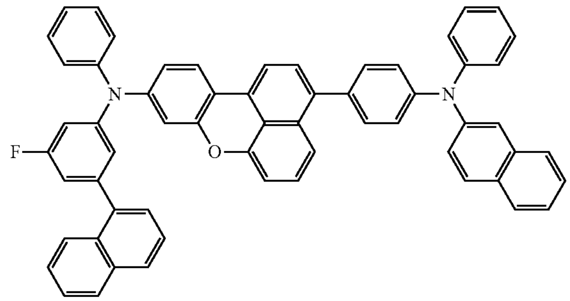
73
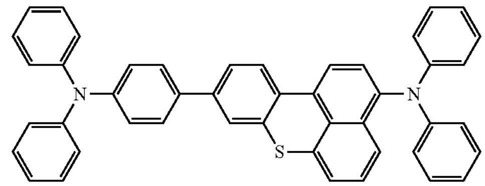
74
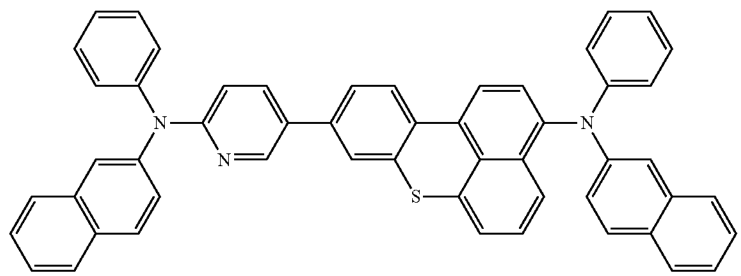
75
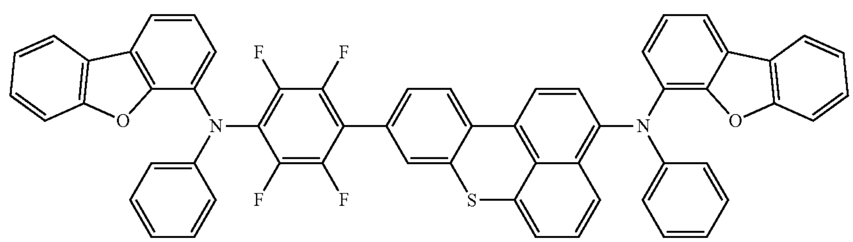
76
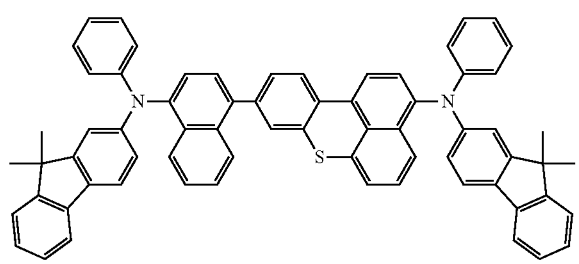
77
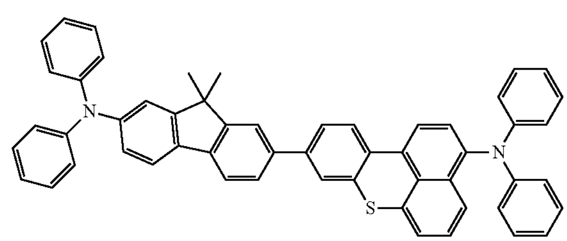
78
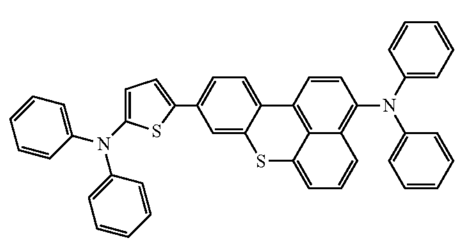
79
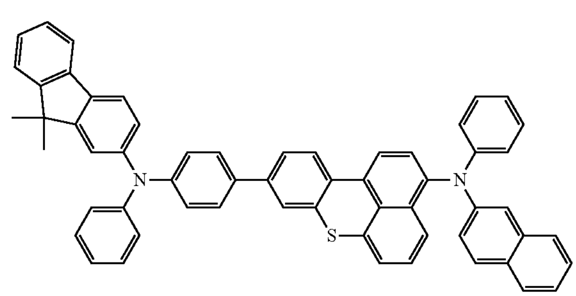

-continued
80
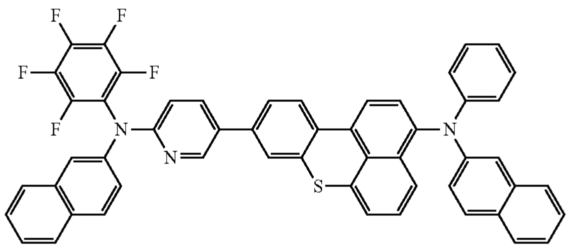
81
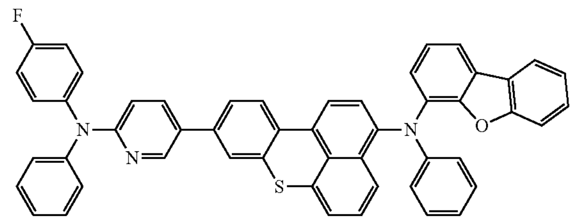
82
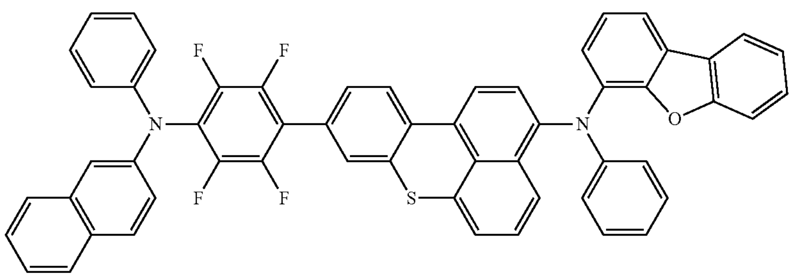
83
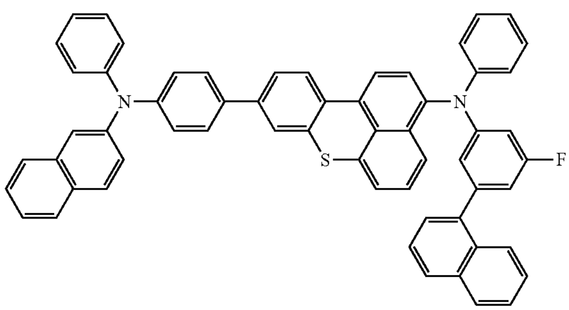
84
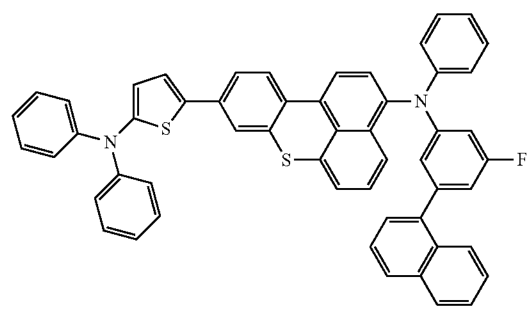
85
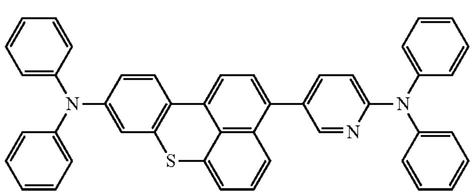
86
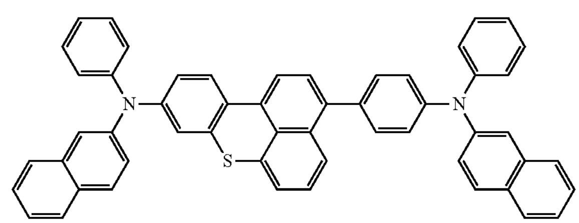
87
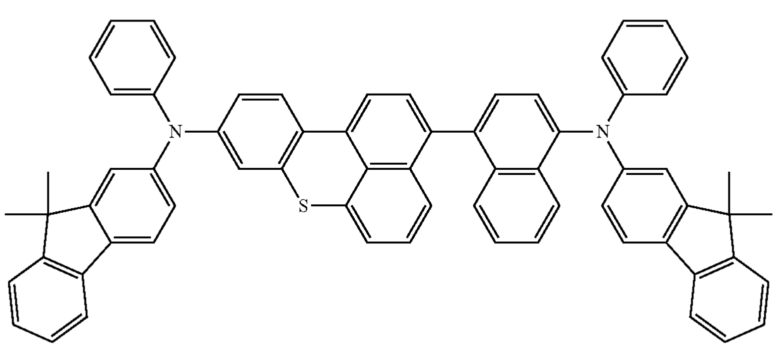

-continued
88
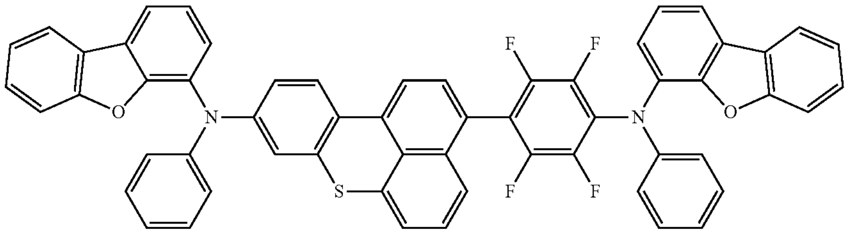
89
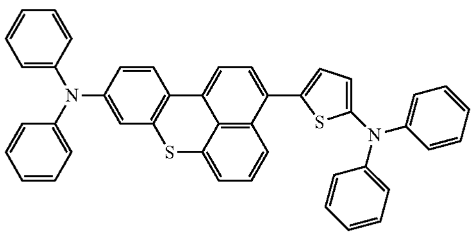
90
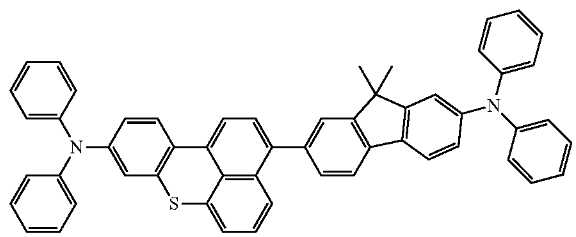
91
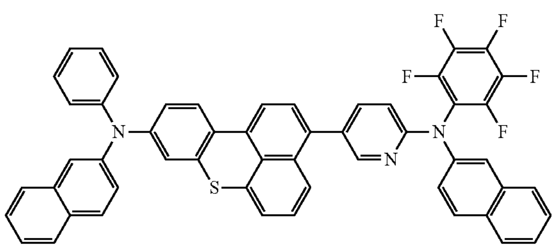
92
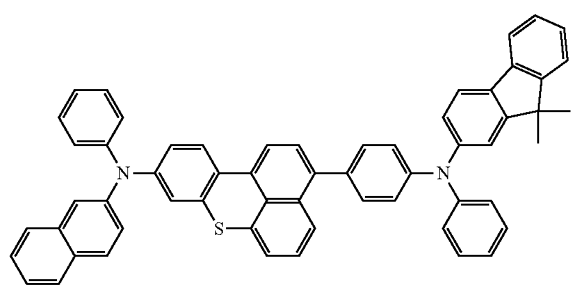
93
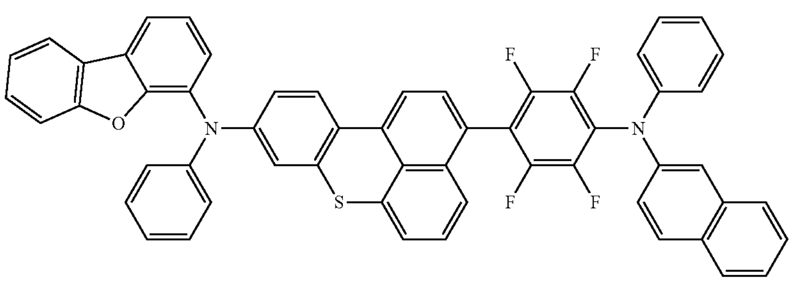
94
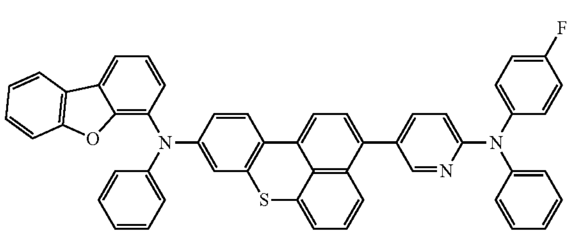
95
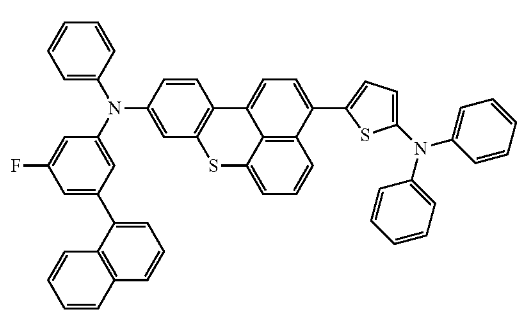

-continued
96
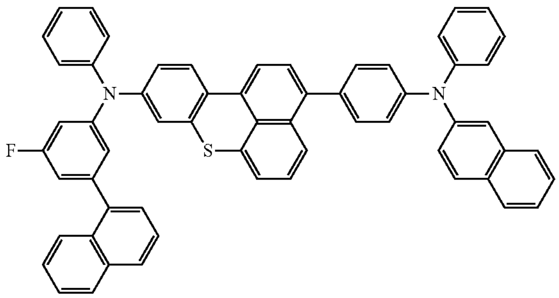
97
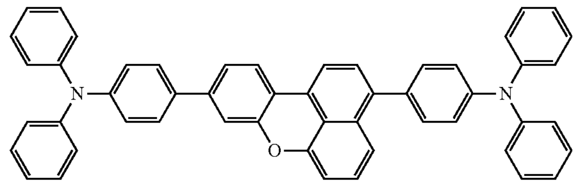
98
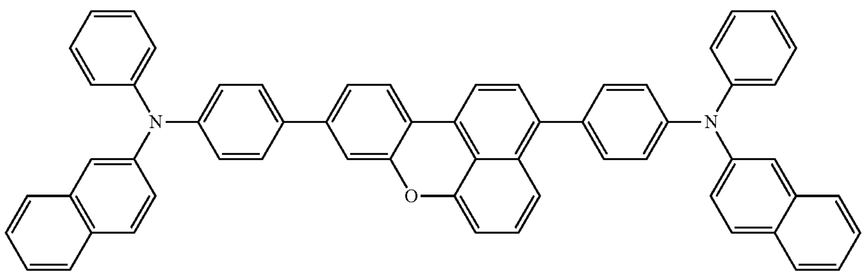
99
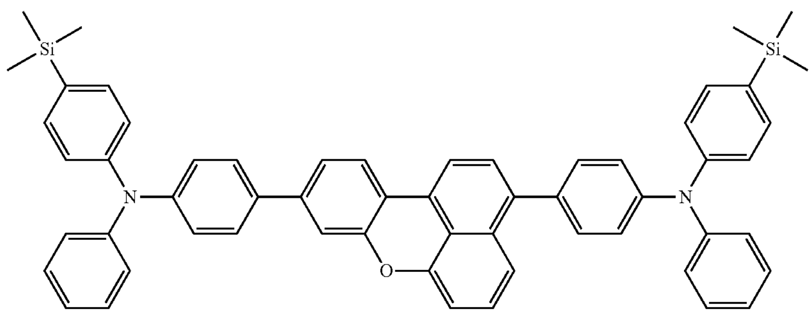
100
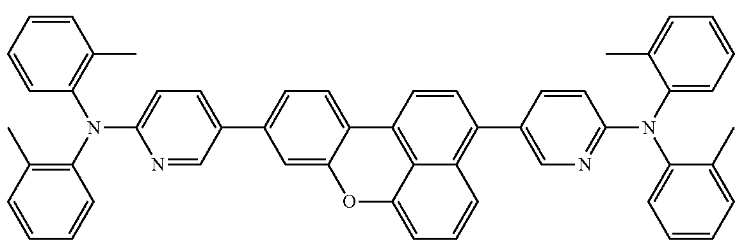
101
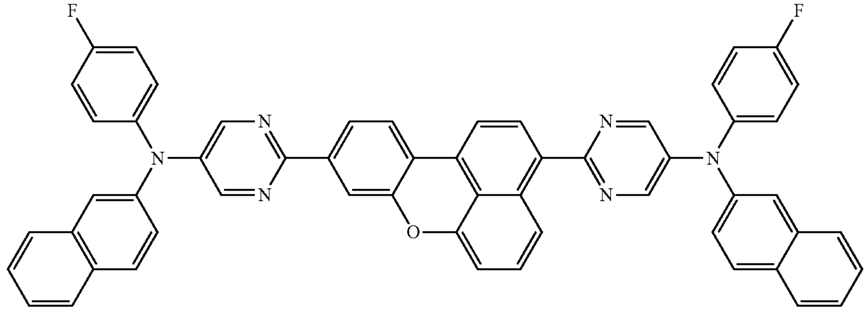

-continued
102
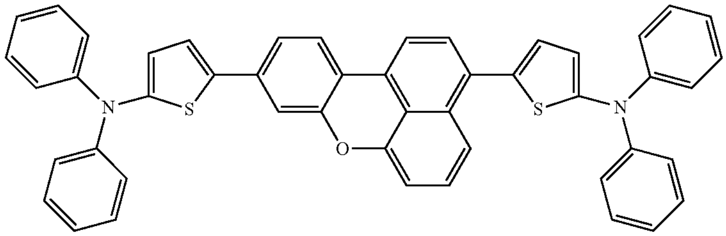
103
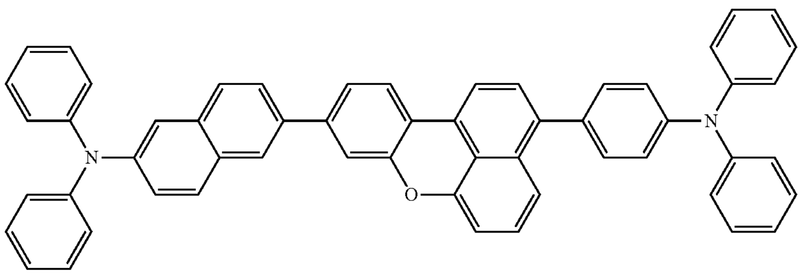
104
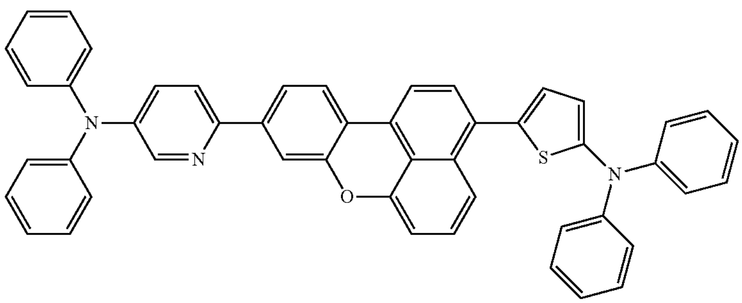
105
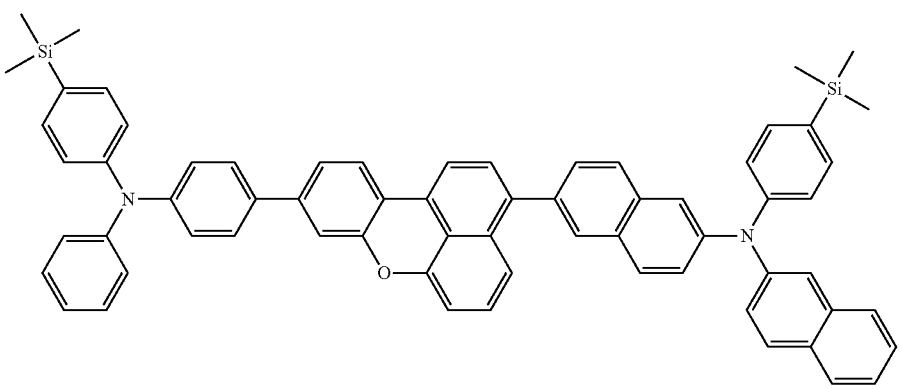
106
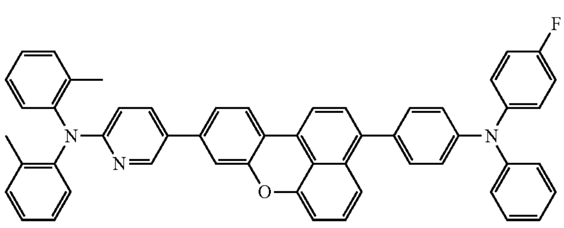
107
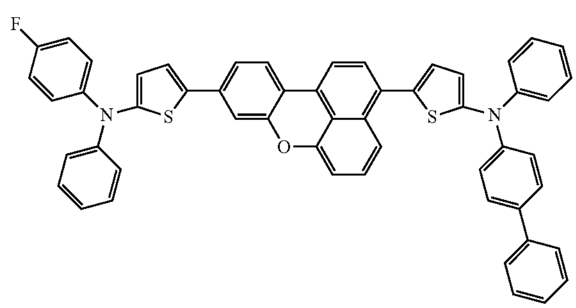

-continued
108
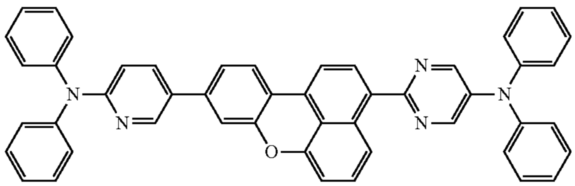
109
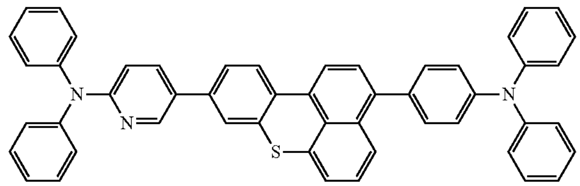
110
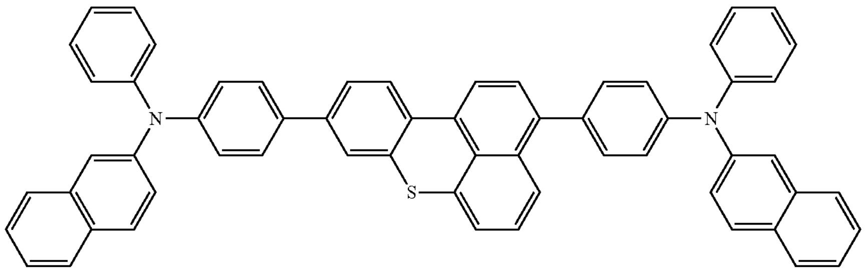
111
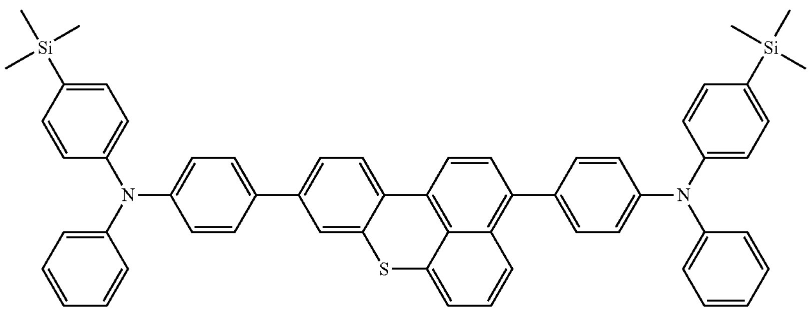
112
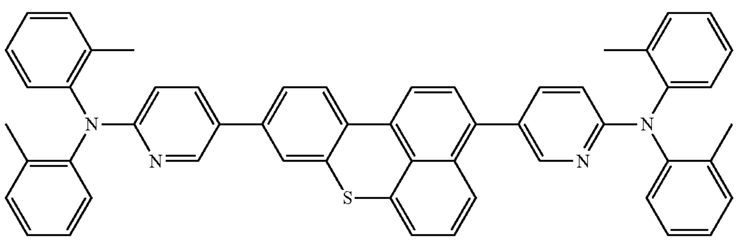
113
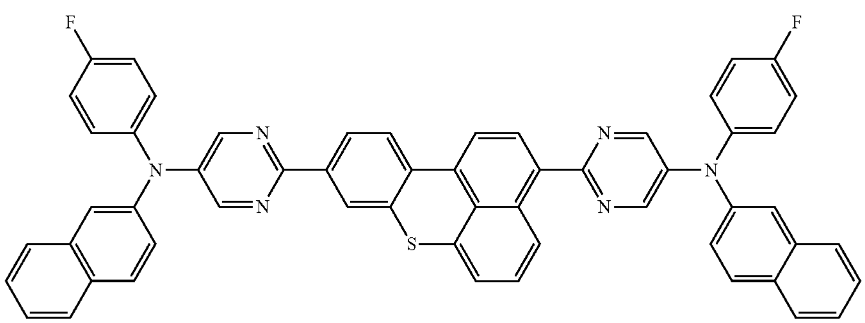
114
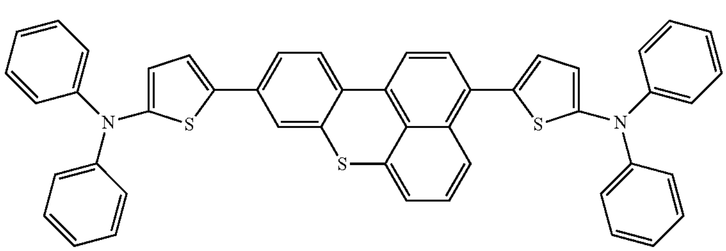

-continued
115
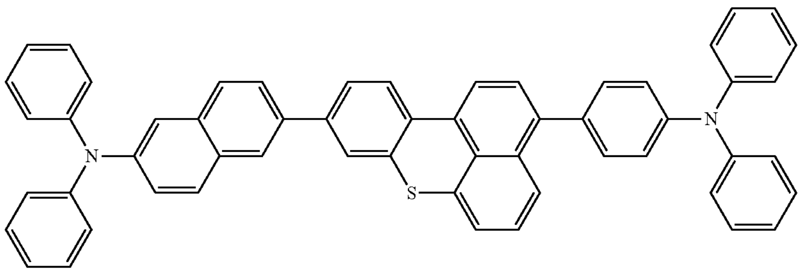
116
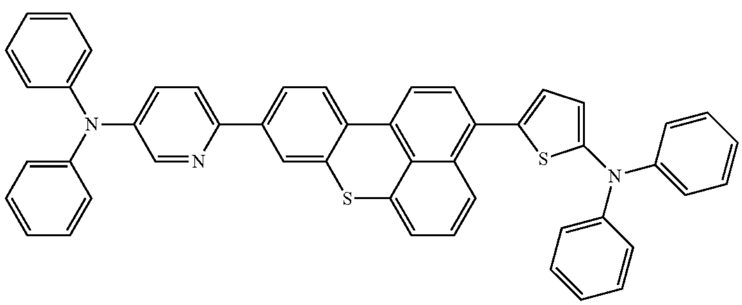
117
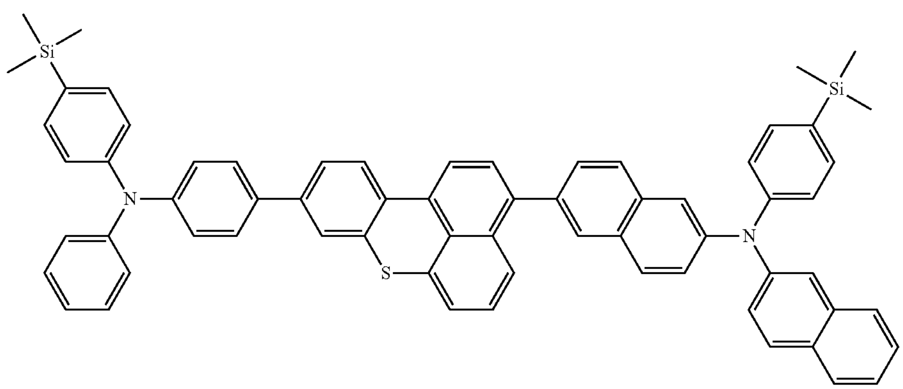
118
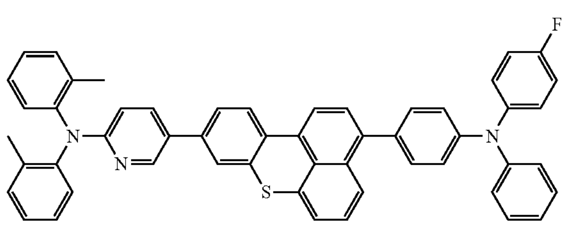
119
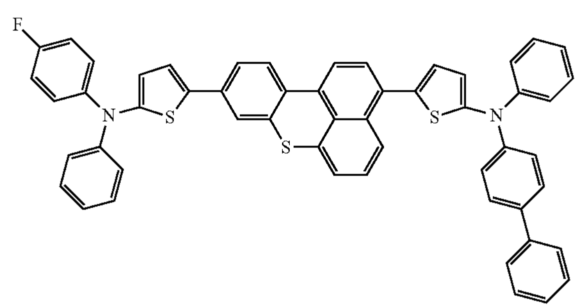
120
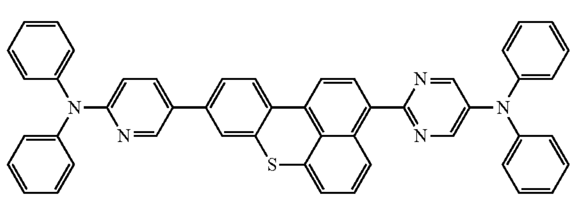
121
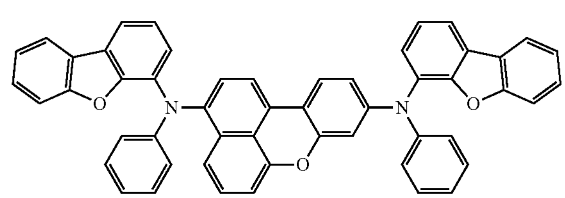

-continued
122
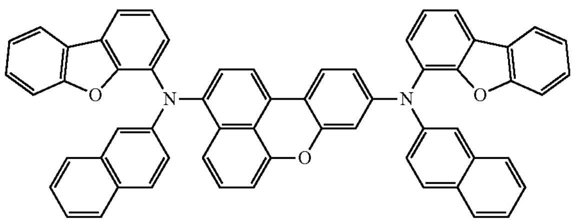
123
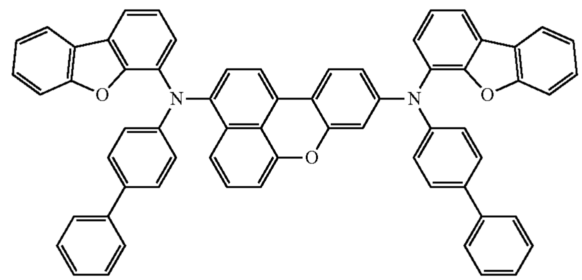
124
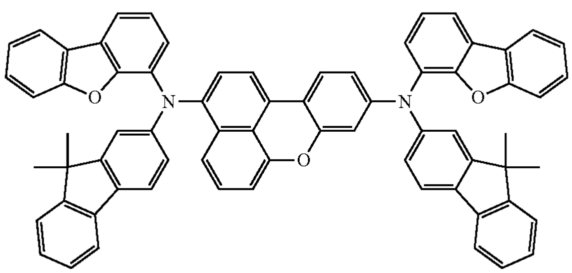
125
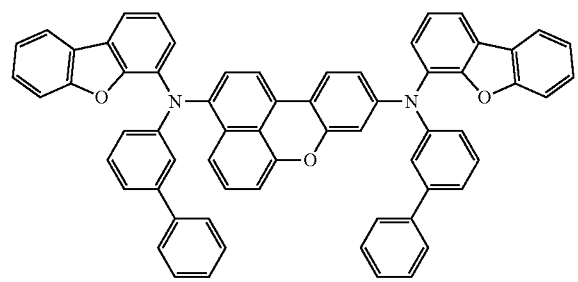
126
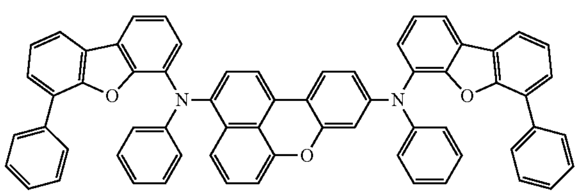
127
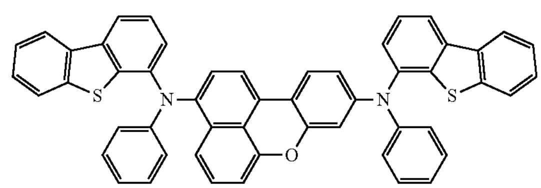
128
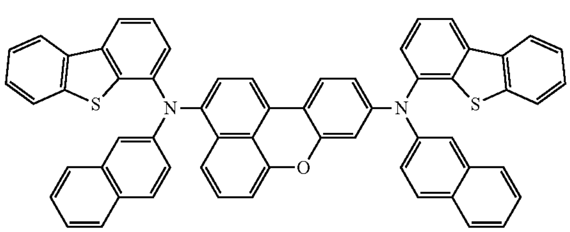
129
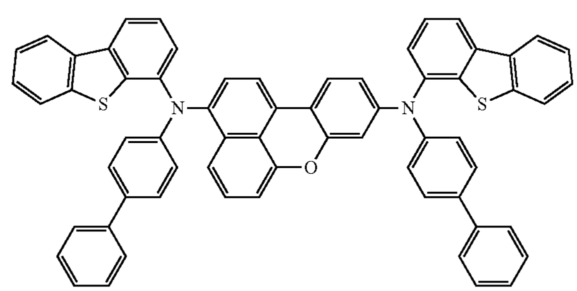
130
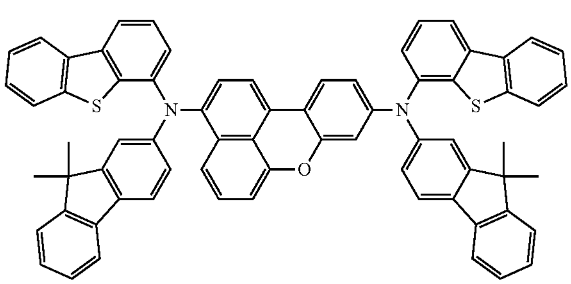
131
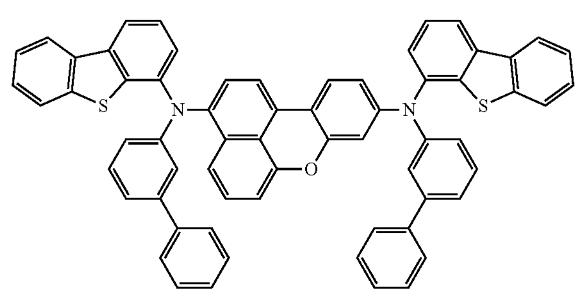

-continued
132
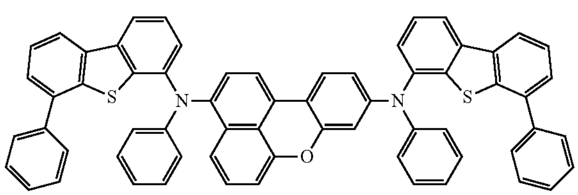
133
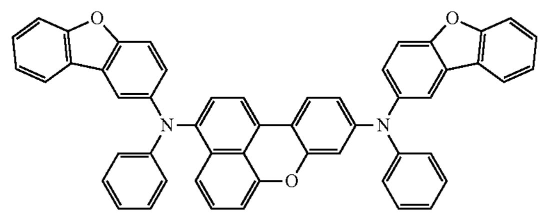
134
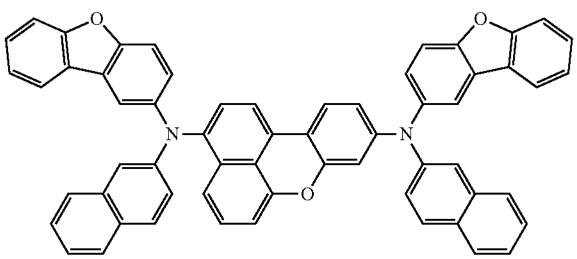
135
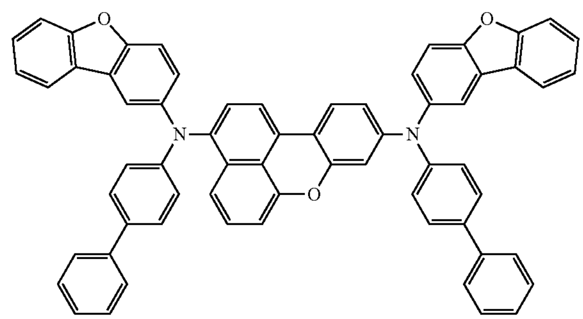
136
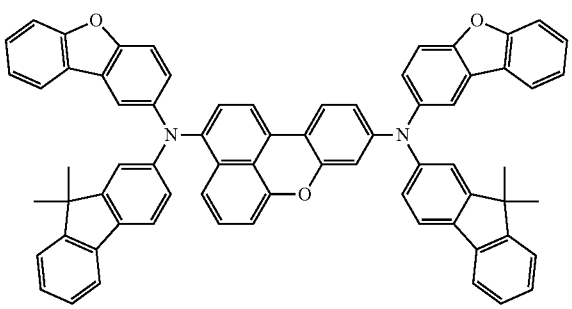
137
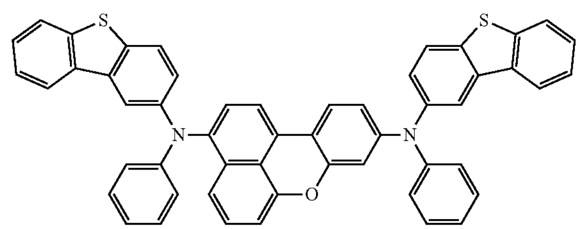
138
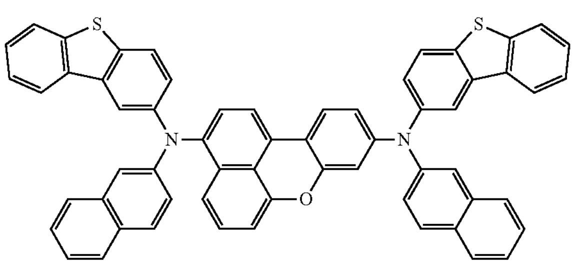
139
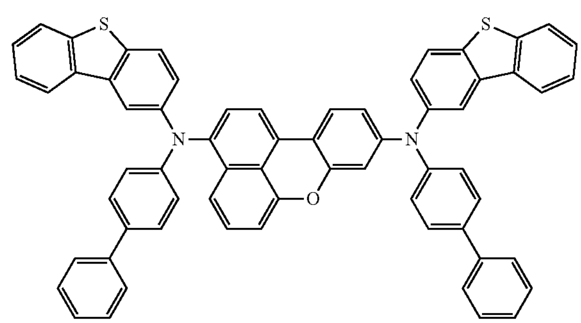
140
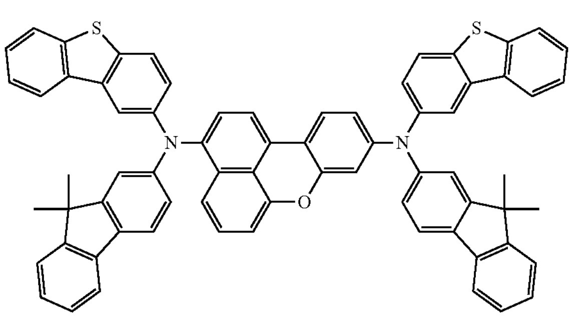
141
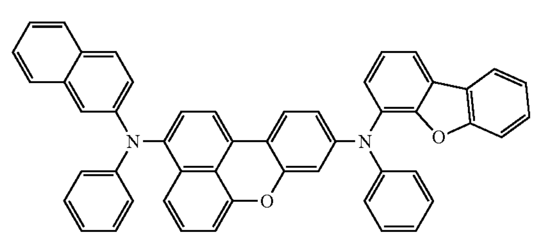

-continued
142
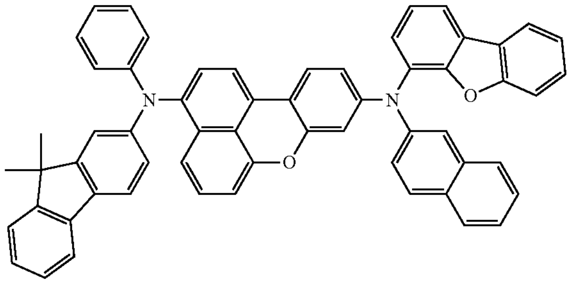
143
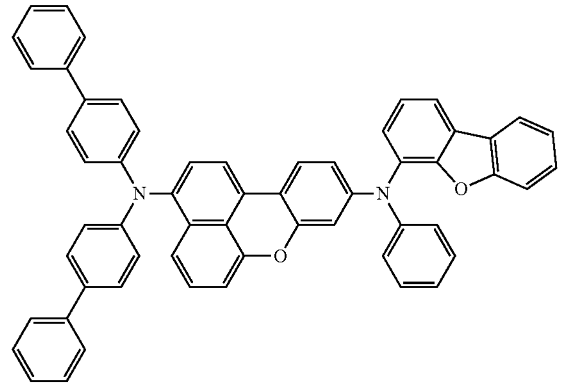
144
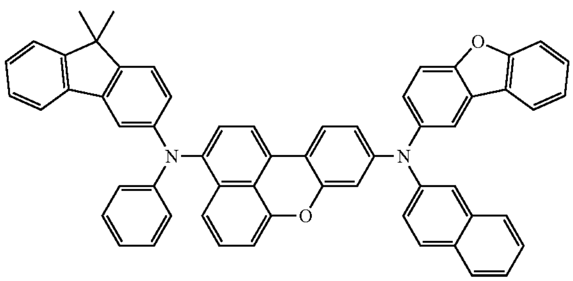
145
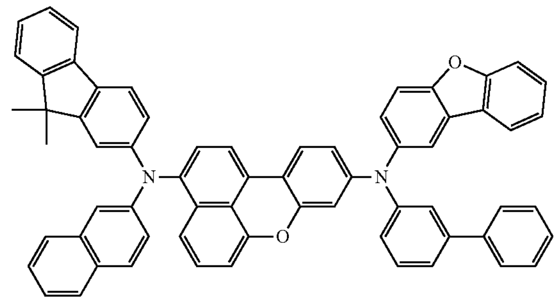
146
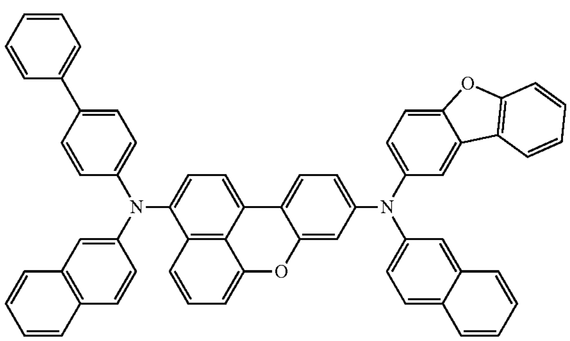
147
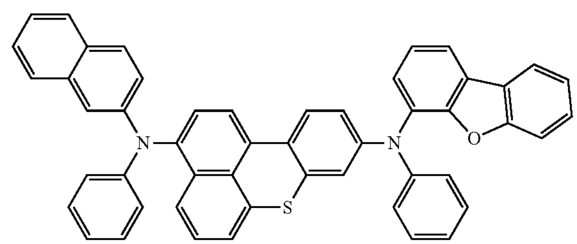
148
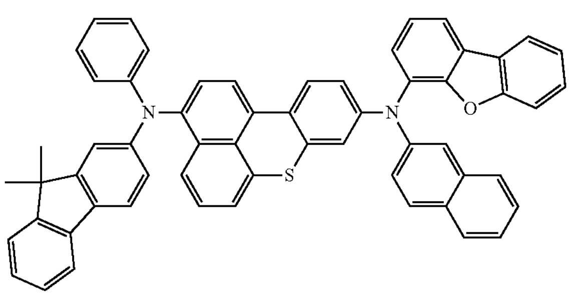
149
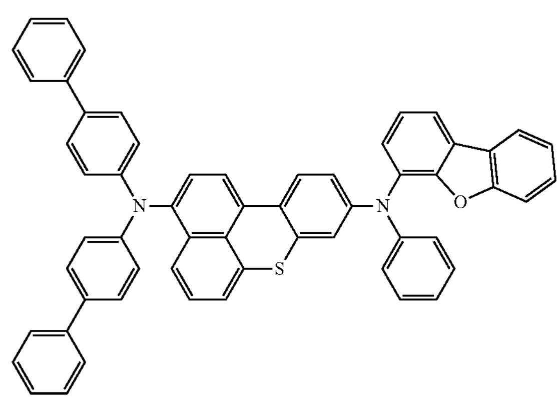

-continued

150

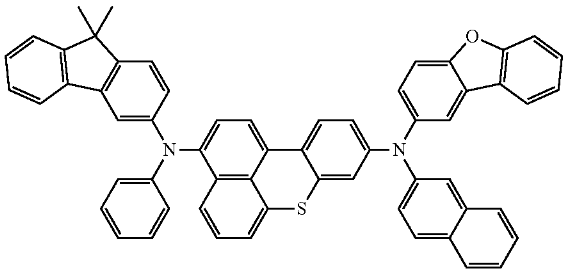

151

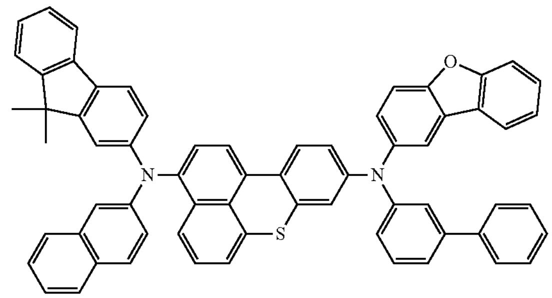

152

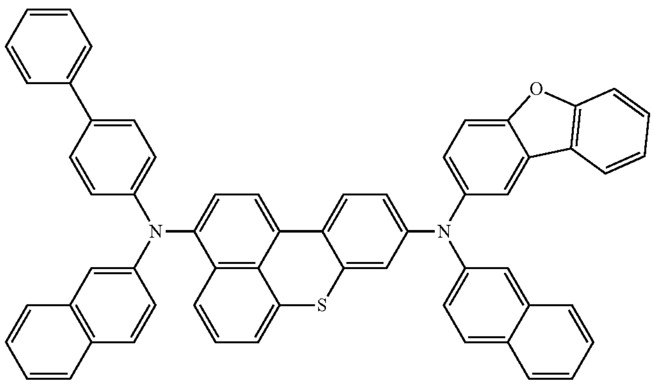

In the core

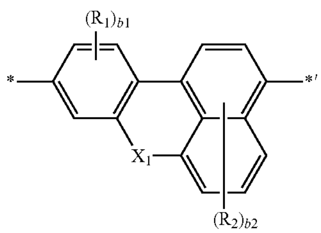

of Formula 1, benzene and naphthalene are condensed with $X_1$ located therebetween and linked to each other, and thus, the core has a delocalized structure of 16 π-electrons. Herein, $X_1$ in the core of Formula 1 is O or S, each having two unshared electron pairs, and thus, the core of Formula 1 may receive additional electrons from the unshared electron pairs of $X_1$. As such, due to the π-electron rich structure in the core of the condensed cyclic compound represented by Formula 1, $\pi\rightarrow\pi^*$ transition and $n\rightarrow\pi^*$ transition are likely to occur and thus, the luminance efficiency of such condensed cyclic compounds represented by Formula 1 may be improved.

However, in the case of an imaginary compound that has the same structure as Formula 1 except that $X_1$ is carbon (for example, see Compound Z below), benzene is connected to naphthalene with a carton atom that does not have a unshared electron pair therebetween. Therefore, the improved luminance efficiency caused by the above-mentioned mechanism according to embodiments of the invention may not be obtained. Also, due to two substituents linked to the carbon atom, the imaginary compound may have an increase in intramolecular vibration or the degree of freedom of rotation energy. As such, the transition energy of the imaginary compound molecule may decrease, and thus, non-radiative transition may occur instead of a radiative transition into a ground state, leading to a decrease in luminance efficiency of the imaginary compound.

Also, increased luminance efficiency is not realized where $R_1$ and/or $R_2$ of the core represented by

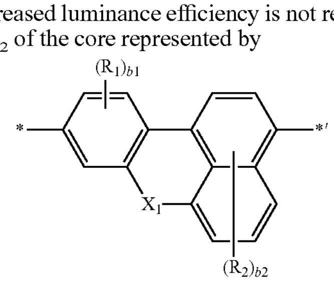

in Formula 1 and $L_1$ and/or $L_2$ in Formula 1 are linked to a benzene ring and/or a naphthalene ring of the core to form an additional ring. In the case of an imaginary compound in which an additional ring is condensed to the core of Formula 1 (for example, Compound A below), the core of the imaginary compound has too many π-electrons. Accordingly, an energy band gap of a molecular orbital may be narrowed. As such, the luminance wavelength of the imaginary compound may be shifted toward a relatively long wavelength.

Compound A

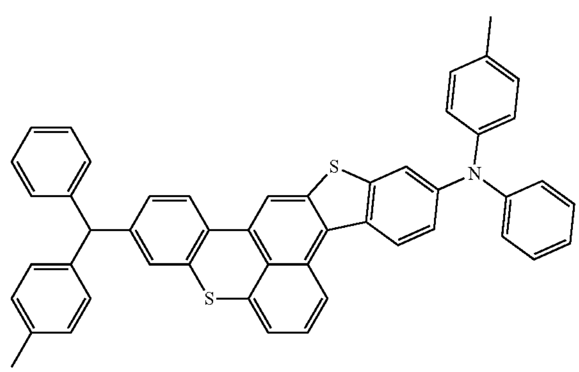

For example, a HOMO energy level, a LUMO energy level, Eg, absorption energy of a triplet state, and absorption energy of a singlet state (S1) of Compounds 2, 15, 26, 35, 70 and 85 and Compound A were measured by using Gaussain09 (B3LYP/6-31*) DFT. Evaluation results are shown in Table 1 below:

TABLE 1

| | HOMO (eV) | LUMO (eV) | Eg (eV) | Absorption energy of a singlet state (S1) (nm) |
|---|---|---|---|---|
| Compound 2 | −4.63005 | −1.41255 | 3.2175 | 446.94 |
| Compound 15 | −4.64801 | −1.43868 | 3.20933 | 446.34 |
| Compound 26 | −4.60856 | −1.37881 | 3.22975 | 445.85 |
| Compound 35 | −4.64502 | −1.36657 | 3.27845 | 436.97 |
| Compound 70 | −4.77672 | −1.42072 | 3.356 | 423.07 |
| Compound 85 | −4.73291 | −1.48439 | 3.24852 | 436.47 |
| Compound A | −4.57917 | −1.53528 | 3.04389 | 461.95 |

As confirmed from Table 1, a wavelength of absorption energy of a singlet state of Compound A is longer than a wavelength of absorption energy of a singlet state of Compounds 2, 15, 26, 35, 70 and 85. Accordingly, Compound A may emit light having a longer wavelength than Compounds 2, 15, 26, 35, 70 and 85. That is, the condensed cyclic compound represented by Formula 1 may emit blue light having better color purity than the imaginary compound (for example, Compound A), that is, the condensed cyclic compound represented by Formula 1 may emit darker blue light than the imaginary compound.

Accordingly, an organic light-emitting device including the Formula 1 represented by Formula 1 may have a low driving voltage, high efficiency, high brightness, and long lifespan.

Synthesis methods of the condensed cyclic compound represented by Formula 1 may be obvious to one of ordinary skill in the art by referring to Synthesis Examples provided below.

The condensed cyclic compound of Formula 1 may be used between a pair of electrodes of an organic light-emitting device. For example, the condensed cyclic compound may be used in an emission layer, a hole transport region (for example, a hole injection layer, a hole transport layer, or a functional layer that has a hole injection capability and a hole transport capability) between a first electrode and an emission layer, or an electron transport region (for example, an electron transport layer or an electron injection layer). According to an embodiment of the present invention, the condensed cyclic compound may be used as a material for forming an emission layer of an organic light-emitting device.

Accordingly, an organic light-emitting device according to an embodiment of the present invention includes: a first electrode; a second electrode facing the first electrode; and an organic layer that is disposed between the first electrode and the second electrode and includes an emission layer, wherein the organic layer includes at least one of the condensed cyclic compound described above. Herein, the organic layer may include, in addition to the emission layer, a hole transport region between the first electrode and the emission layer and an electron transport region between the emission layer and the second electrode. The condensed cyclic compound may exist in the emission layer.

The expression an organic layer "includes at least one condensed cyclic compounds" used herein may include a case in which an organic layer includes one condensed cyclic compound of Formula 1 and may also include a case in which two or more different condensed cyclic compounds of Formula 1 are included.

For example, the organic layer may include, as the condensed cyclic compound, only Compound 3. In this regard, Compound 3 may exist in an emission layer of the organic light-emitting device. In another embodiment of the present invention, the organic layer may include, as the condensed cyclic compound, Compound 3 and Compound 19. In this regard, Compound 3 and Compound 19 may exist in either an identical layer (for example, Compound 3 and Compound 19 may all exist in an emission layer), or different layers.

The hole transport region of the organic layer may include at least one layer selected from a hole injection layer, a hole transport layer, a functional layer having a hole injection capability and a hole transport capability (hereinafter referred to as "H-functional layer"), a buffer layer, and an electron blocking layer, and the electron transport region of the organic layer may include at least one layer selected from a hole blocking layer, an electron transport layer, an electron injection layer, and a functional layer having an electron transport capability and an electron capability function (hereinafter referred to as "E-functional layer").

The term "organic layer" used herein refers to a single layer and/or a plurality of layers interposed between the first electrode and the second electrode of an organic light-emitting device.

The FIGURE is a schematic view of an organic light-emitting device 10 according to an embodiment of the present invention. Hereinafter, the structure of an organic light-emitting device according to an embodiment of the present invention and a method of manufacturing an organic light-emitting device according to an embodiment of the present invention will be described in connection with the FIGURE.

For use as the substrate 11, any substrate that is used in general organic light-emitting devices may be used, and the substrate 11 may be a glass substrate or transparent plastic substrate, each with excellent mechanical strength, thermal stability, transparency, surface smoothness, ease of handling, and water repellency.

Although in the FIGURE, the substrate 11 is disposed under a first electrode 13, the substrate 11 may instead be disposed above a second electrode 17.

The first electrode 13 may be formed by depositing or sputtering a material for forming the first electrode 13 on the substrate 11. When the first electrode 13 is an anode, the material for the first electrode 13 may be selected from materials with a high work function to make holes be easily injected. The first electrode 13 may be a reflective electrode or a transmissive electrode. The material for the first electrode 13 may be a transparent and highly conductive material, and examples of such a material are indium tin oxide (ITO), indium zinc oxide (IZO), tin oxide ($SnO_2$), and zinc oxide (ZnO). According to another embodiment of the present invention, magnesium (Mg), aluminum (Al), aluminum-lithium (Al—Li), calcium (Ca), magnesium-indium (Mg—In), or magnesium-silver (Mg—Ag) may be used to form the first electrode 13 as a reflective electrode.

The first electrode 13 may have a single-layer structure, or a multi-layer structure including two or more layers. For example, the first electrode 13 may have a three-layered structure of ITO/Ag/ITO, but the structure of the first electrode 13 is not limited thereto.

An organic layer 15 is disposed on the first electrode 13. The organic layer 15 may include a hole transport region including a hole injection layer and a hole transport layer; an emission layer; and an electron transport region including an electron transport layer and an electron injection layer, which are disposed in this stated order.

A hole injection layer HIL may be formed on the first electrode 13 by using various methods, such as vacuum deposition, spin coating, casting, or langmuir-blodgett (LB).

When a hole injection layer is formed by vacuum deposition, the deposition conditions may vary according to a material that is used to form the hole injection layer, and the structure and thermal characteristics of the hole injection layer. For example, the deposition conditions may include a deposition temperature of about 100 to about 500° C., a vacuum pressure of about $10^{-8}$ to about $10^{-3}$ torr, and a deposition rate of about 0.01 to about 100 Å/sec. However, the deposition conditions are not limited thereto.

When the hole injection layer is formed by spin coating, coating conditions may vary according to the material used to form the hole injection layer, and the structure and thermal properties of the hole injection layer. For example, a coating speed may be from about 2000 rpm to about 5000 rpm, and a temperature at which a heat treatment is performed to remove a solvent after coating may be from about 80° C. to about 200° C. However, the coating conditions are not limited thereto.

Examples of the material for the hole injection layer are N,N'-diphenyl-N,N'-bis-[4-(phenyl-m-tolyl-amino)-phenyl]-biphenyl-4,4'-diamine (DNTPD), a phthalocyanine compound such as copper phthalocyanine, 4,4',4"-tris(3-methylphenylphenylamino)triphenylamine (m-MTDATA), N,N'-di(1-naphthyl)-N,N'-diphenylbenzidine (NPB), TDATA, 2-TNATA, a polyaniline/dodecylbenzenesulfonic acid (pani/DBSA), poly(3,4-ethylenedioxythiophene)/poly(4-styrenesulfonate) (PEDOT/PSS), polyaniline/camphor sulfonic acid (pani/CSA), or (polyaniline)/poly(4-styrenesulfonate) (PANI/PSS), but is not limited thereto.

m-MTDATA

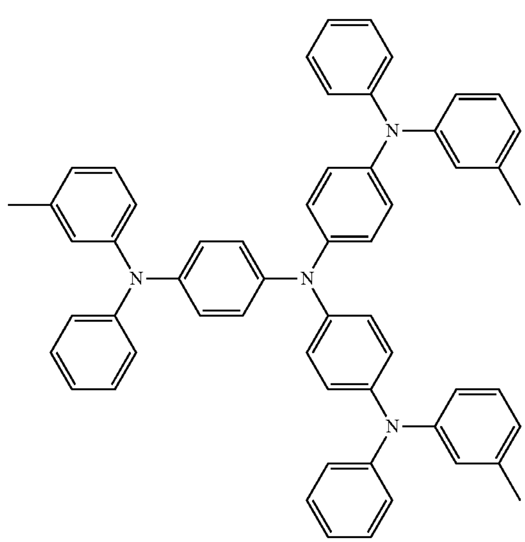

-continued

TDATA

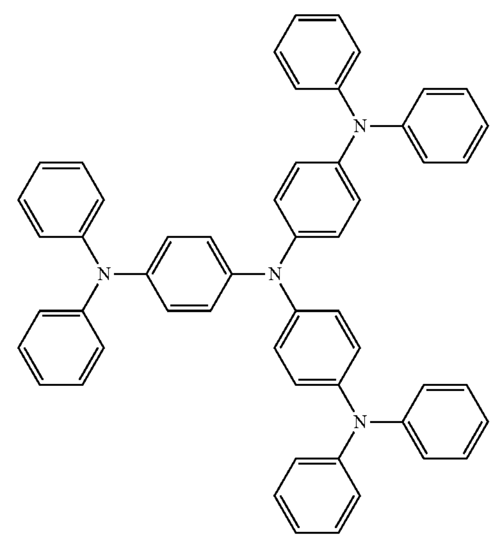

2-TNATA

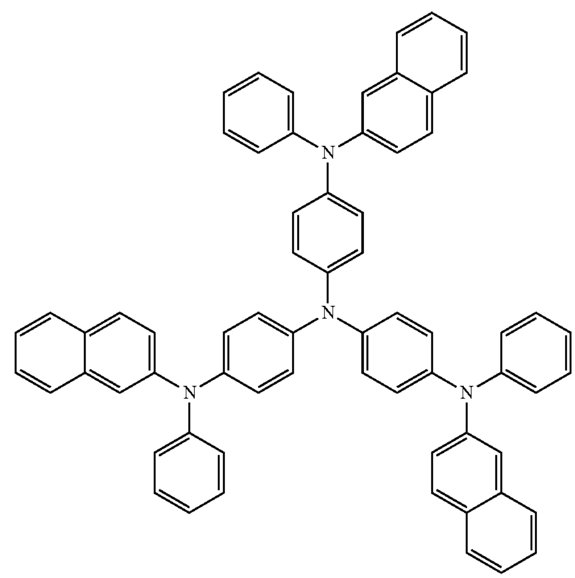

A thickness of the hole injection layer may be in a range of about 100 Å to about 10000 Å, for example, about 100 Å to about 1000 Å. When the thickness of the hole injection layer is within the range described above, the hole injection layer may have satisfactory hole injection characteristics without a substantial increase in a driving voltage.

Then, a hole transport layer (HTL) may be formed on the hole injection layer by using vacuum deposition, spin coating, casting, or LB. When the hole transport layer is formed by vacuum deposition or spin coating, the deposition or coating conditions may be similar to those applied to form the hole injection layer although the deposition or coating conditions may vary according to the material that is used to form the hole transport layer.

Examples of a hole transport material are a carbazole derivative, such as N-phenylcarbazole or polyvinylcarbazol, N,N'-bis(3-methylphenyl)-N,N'-diphenyl-[1,1-biphenyl]-4,4'-diamine (TPD), 4,4',4"-tris(N-carbazolyl)triphenylamine (TCTA), and N,N'-di(1-naphthyl)-N,N'-diphenylbenzidine (NPB), but are not limited thereto.

TPD

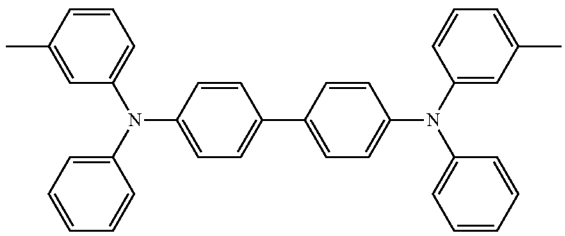

A thickness of the hole transport layer may be in a range of about 50 Å to about 2000 Å, for example, about 100 Å to about 1500 Å. When the thickness of the hole transport layer is within these ranges, the hole transport layer may have satisfactory hole transporting ability without a substantial increase in driving voltage.

The organic light-emitting device 10 may include, instead of the hole injection layer and the hole transport layer, an H-functional layer (a functional layer having a hole injection capability and a hole transport capability). The H-functional layer may include at least one material selected from the materials used to form a hole injection layer and the materials used to form a hole transport layer, and a thickness of the H-functional layer may be in a range of about 100 Å to about 10000 Å, for example, about 100 Å to about 1000 Å. When the thickness of the H-functional layer is within the range described above, the hole injection layer may have satisfactory hole injection and transport characteristics without a substantial increase in a driving voltage.

In addition, at least one layer of the hole injection layer, the hole transport layer, and the H-functional layer may include at least one of a compound represented by Formula 300 below and a compound represented by Formula 301 below:

Formula 300

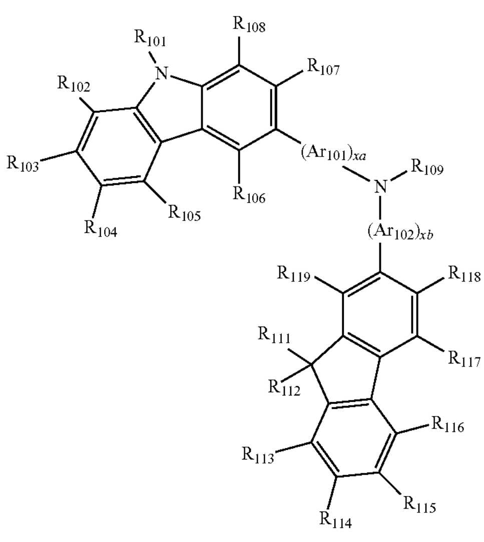

-continued

Formula 301

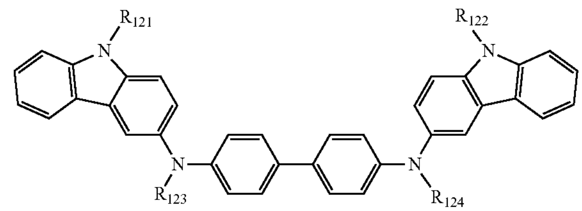

$Ar_{101}$ and $Ar_{102}$ in Formula 300 may be each independently a substituted or unsubstituted $C_6$-$C_{60}$ arylene group.

For example, $Ar_{101}$ and $Ar_{102}$ may be each independently selected from a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, a pentacenylene group; a substituted phenylene group, a substituted pentalenylene group, a substituted indenylene group, a substituted naphthylene group, an azulenylene group, a heptalenylene group, an acenaphthylene group, a substituted fluorenylene group, a substituted phenalenylene group, a substituted phenanthrenylene group, a substituted anthracenylene group, a substituted fluoranthenylene group, a substituted triphenylenylene group, a substituted pyrenylene group, a substituted chrysenylenylene group, a substituted naphthacenylene group, a substituted picenylene group, a substituted perylenylene group, or a substituted pentacenylene group, where such substituted groups include at least one substituent selected from deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, or a $C_2$-$C_{60}$ heteroaryl group.

In Formula 300, xa and xb in may be each independently selected from an integer from 0 to 5, or may be 0, 1, or 2. For example, xa is 1 and xb is 0, but xa and xb are not limited thereto.

$R_{101}$ to $R_{103}$, $R_{111}$ to $R_{119}$ and $R_{121}$ to $R_{124}$ in Formulae 300 and 301 may be each independently selected from hydrogen, deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_6$-$C_{60}$ aryl group, a substituted or unsubstituted $C_6$-$C_{60}$ aryloxy group, or a substituted or unsubstituted $C_6$-$C_{60}$ arylthio group.

For example, $R_{101}$ to $R_{108}$, $R_{111}$ to $R_{119}$ and $R_{121}$ to $R_{124}$ may be each independently selected from hydrogen, deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group (for example, a methyl group, an ethyl group, a propyl group, a butyl group, a pentyl group, or a hexyl group), a $C_1$-$C_{10}$ alkoxy group (for example, a methoxy group, an ethoxy group, a propoxy group, a butoxy group, or a pentoxy group); a substituted $C_1$-$C_{10}$ alkyl group, a substituted $C_1$-$C_{10}$ alkoxy group, where such substituted groups include at least one substituent selected from deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, or a phosphoric acid or a salt thereof; a phenyl group, a naphthyl group, an anthracenyl group, a fluorenyl group, a pyrenyl group; a substituted phenyl group, a substituted naphthyl group, a substituted anthracenyl group, a substituted fluorenyl group, or a substituted pyrenyl group, where such substituted groups include at least one substituent selected from deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, or a $C_1$-$C_{10}$ alkoxy group, but are not limited thereto.

$R_{109}$ in Formula 300 may be one of a phenyl group, a naphthyl group, an anthracenyl group, a biphenyl group, a pyridyl group; a substituted phenyl group, a substituted naphthyl group, a substituted anthracenyl group, a substituted biphenyl group, or a substituted pyridyl group, where such substituted groups include at least one substituent selected from deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{20}$ alkyl group, or a substituted or unsubstituted $C_1$-$C_{20}$ alkoxy group.

According to an embodiment of the present invention, the compound represented by Formula 300 below may be represented by Formula 300A below, but is not limited thereto:

Formula 300A

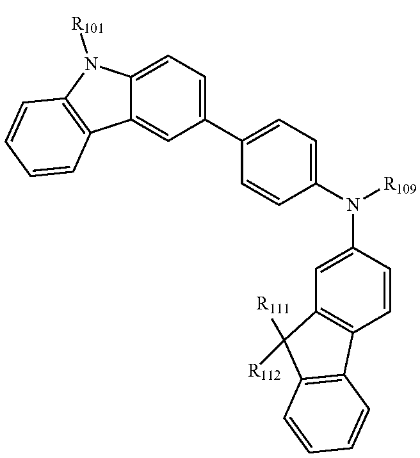

$R_{101}$, $R_{111}$, $R_{112}$, and $R_{109}$ in Formula 300A may be understood by referring to the description provided herein.

For example, at least one layer of the hole injection layer, hole transport layer and the H-functional layer may include at least one of compounds 301 to 320 below, but are not limited thereto:

301

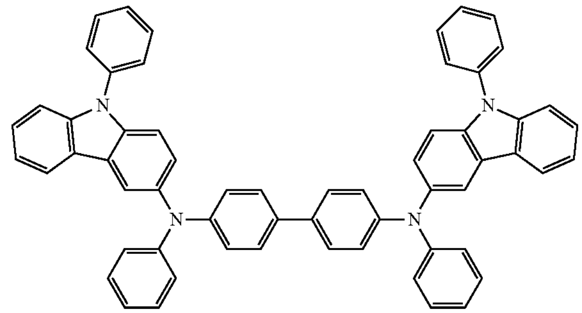

302

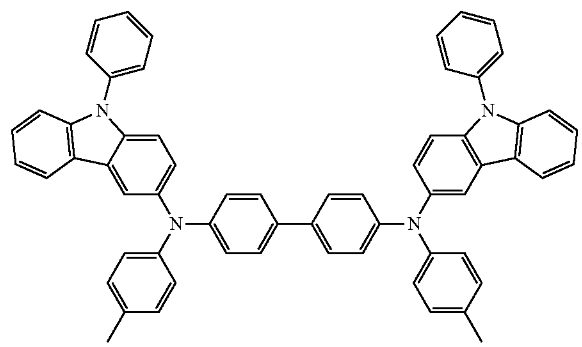

303

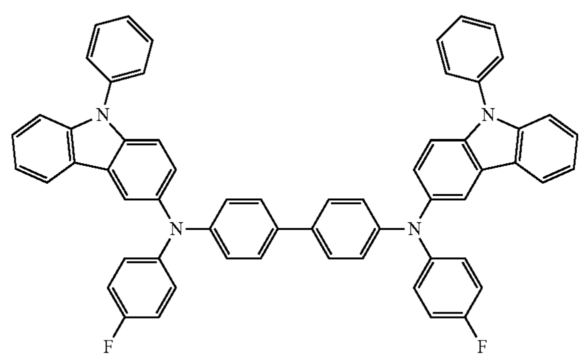

304

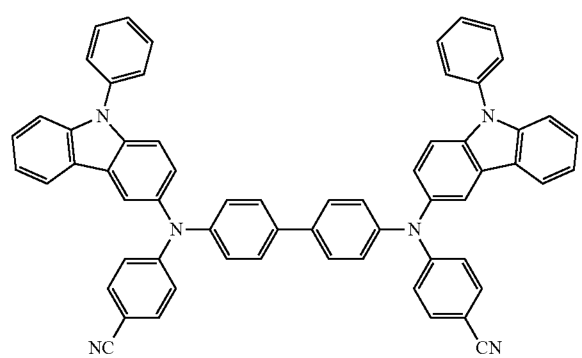

-continued
305
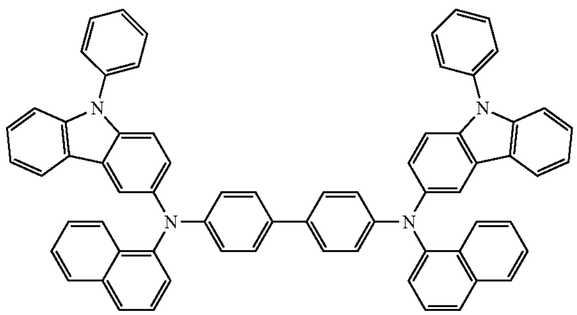
306
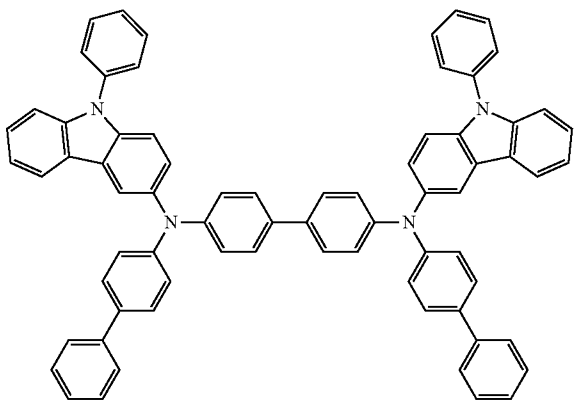
307
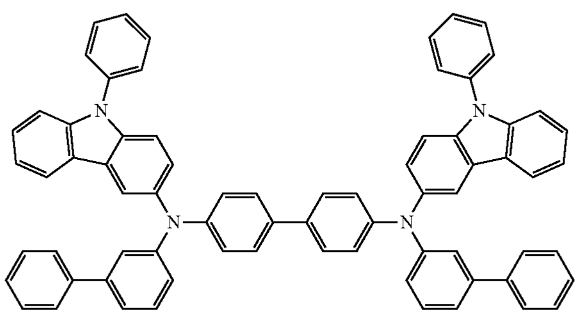
308
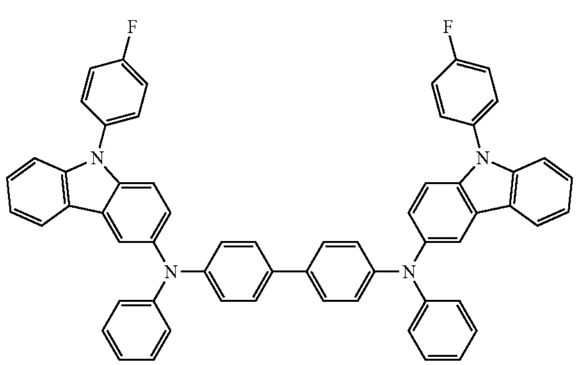
-continued
309
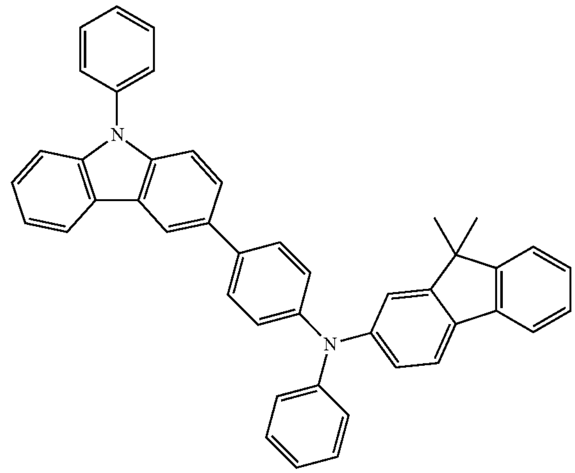
310
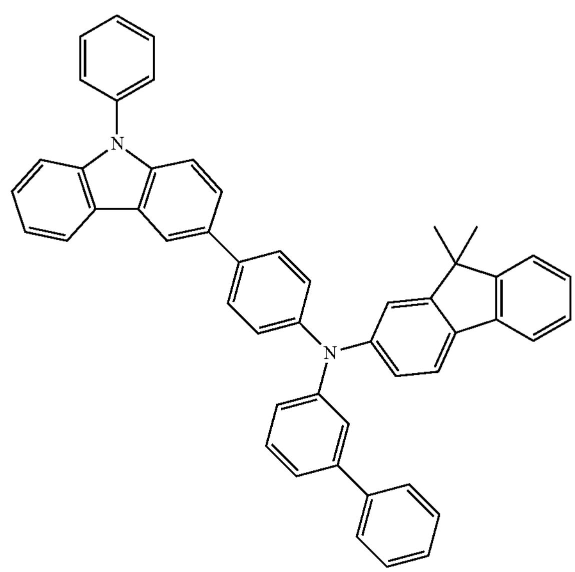

-continued
311
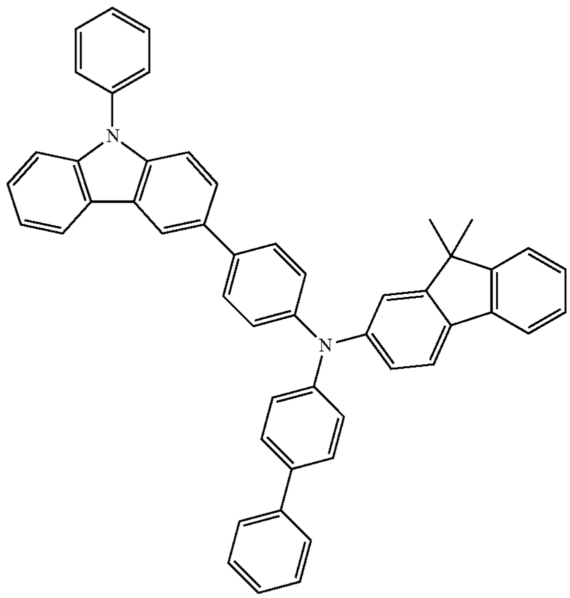
312
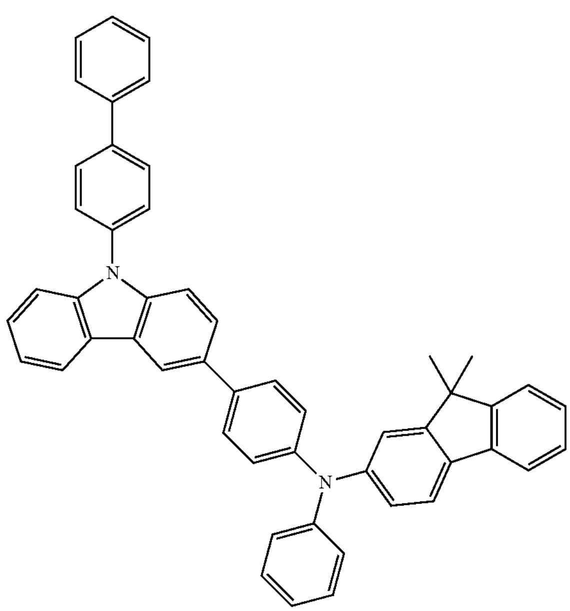
-continued
313
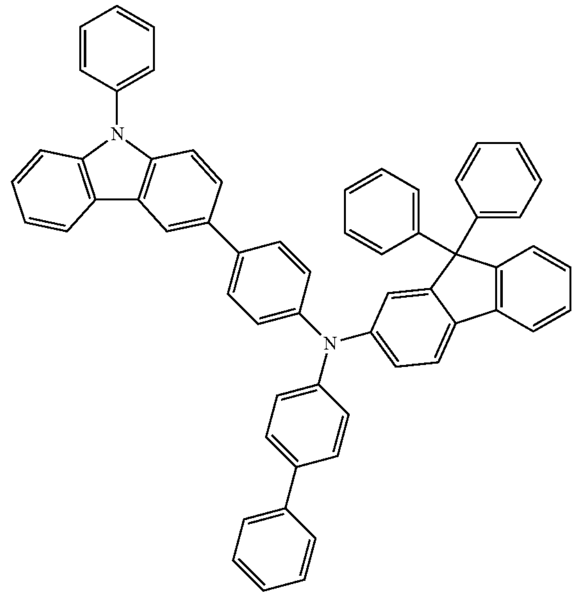
314
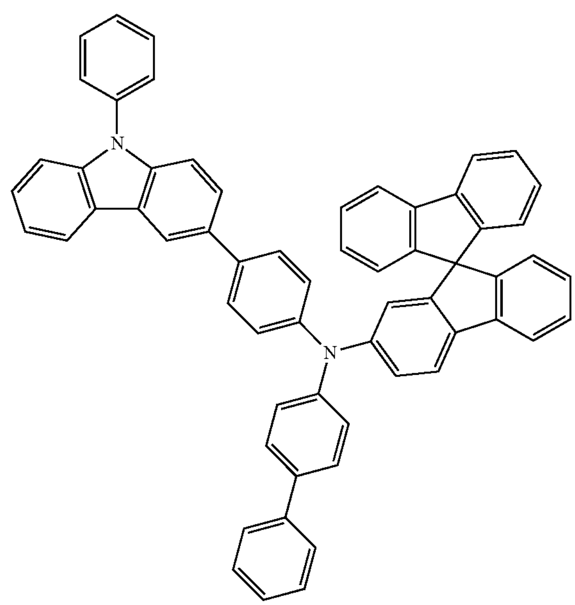

-continued
315
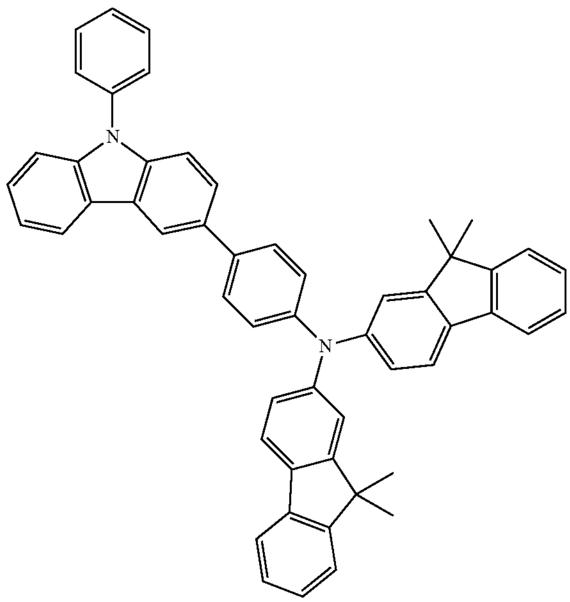
316
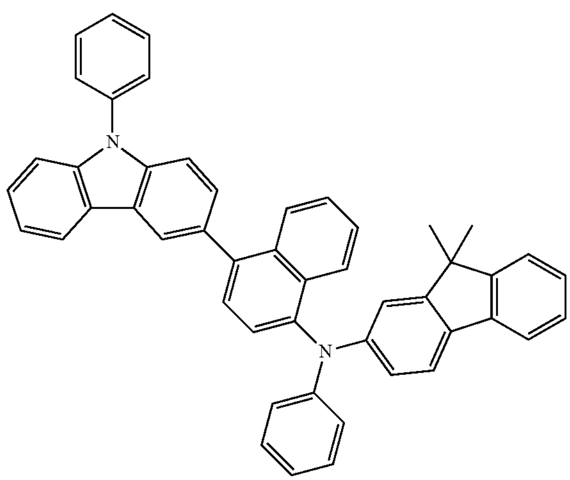
317
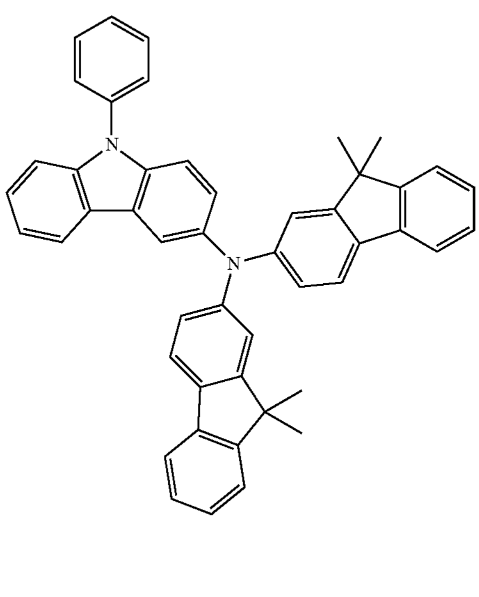
-continued
318
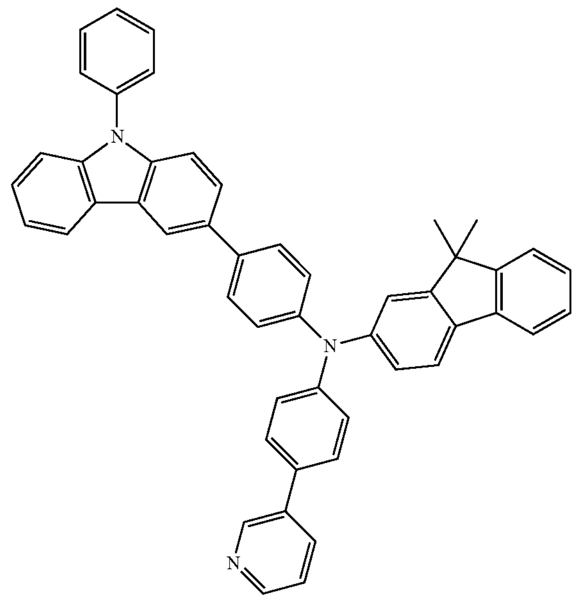
319
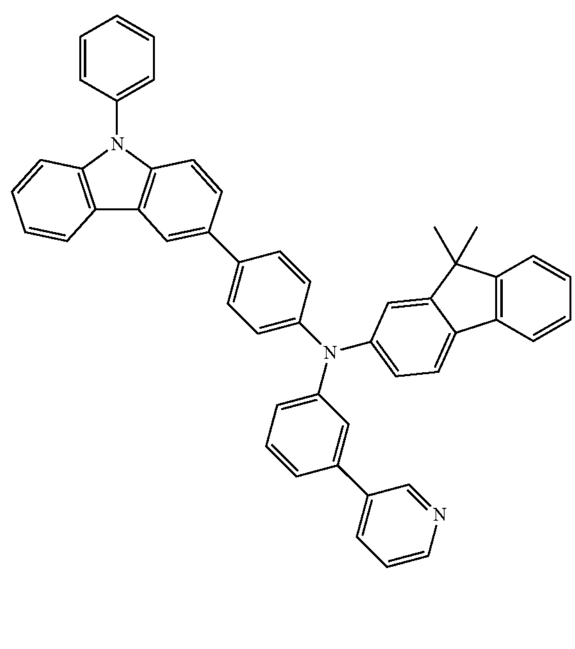

-continued

320

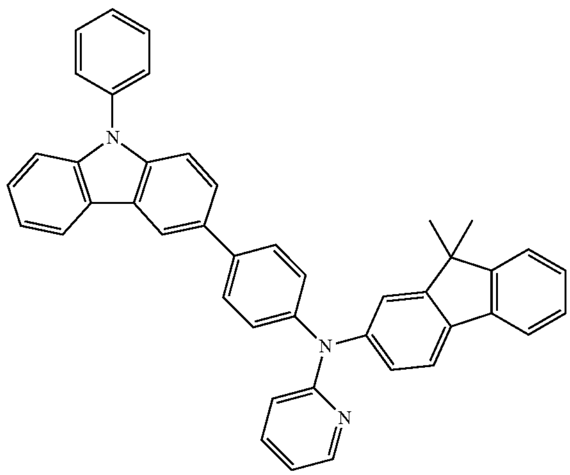

The hole transport region may further include, in addition to these materials, a charge-generation material for the improvement of conductive properties of a film.

The charge-generation material may be, for example, a p-dopant. The p-dopant may be one of a quinone derivative, a metal oxide, or a cyano group-containing compound, but is not limited thereto. Non-limiting examples of the p-dopant are a quinone derivative, such as tetracyanoquinonedimethane (TCNQ) or 2,3,5,6-tetrafluoro-tetracyano-1,4-benzoquinonedimethane (F4-CTNQ); a metal oxide, such as tungsten oxide or molybdenum oxide; or a cyano group-containing compound, such as Compound 200 below, but are not limited thereto.

Compound 200

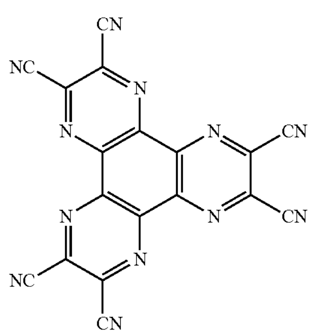

F4-TCNQ

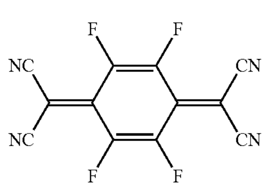

When the hole transport region further includes a charge-generation material, the charge-generating material may be homogeneously dispersed or non-homogeneously distributed in the hole transport region.

The hole transport region may further include a buffer layer between the hole transport layer and an emission layer (or between a H-functional layer and an emission layer).

Also, the buffer layer may compensate for an optical resonance distance according to a wavelength of light emitted from the emission layer, efficiency of a formed organic light-emitting device may be improved. The buffer layer may include a known hole injection material and a hole transportation material. Also, the buffer layer may include a material that is identical to one of materials included in the hole transport layer (or the H-functional layer) formed under the buffer layer.

Then, an emission layer (EML) may be formed on the hole transport region by vacuum deposition, spin coating, casting, LB deposition, or the like. When the emission layer is formed by vacuum deposition or spin coating, the deposition and coating conditions may be similar to those for the formation of the hole injection layer, though the conditions for deposition and coating may vary according to the material that is used to form the emission layer.

The emission layer may include a host and a dopant. As the host, Alq3, 4,4'-N,N'-dicarbazole-biphenyl(CBP), poly(n-vinylcarbazole)(PVK), 9,10-di(naphthalene-2-yl)anthracene (DNA), TCTA, 1,3,5-tris(N-phenylbenzimidazole-2-yl)benzene (TPBI), 3-tert-butyl-9,10-di(naphth-2-yl) anthracene (TBADN), E3, distyrylarylene (DSA), dmCBP (see the following chemical structure), Compounds 501 to 509 illustrated below, or the like may be used, but other materials may instead be used as the host.

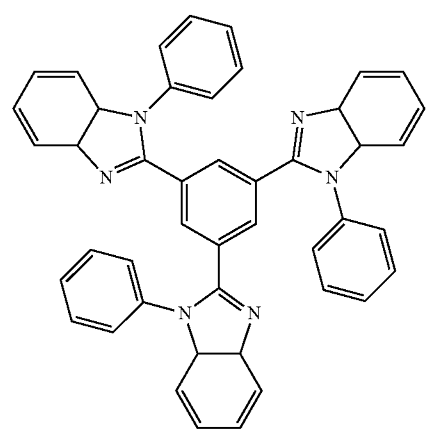

TPBI

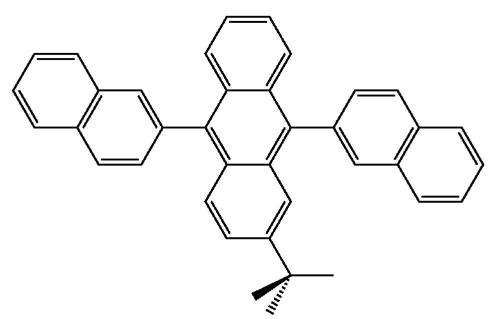

TBADN

E3

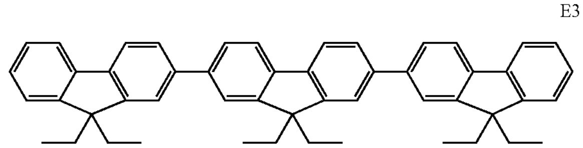

-continued
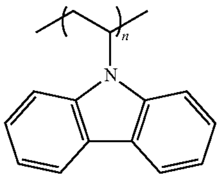
PVK
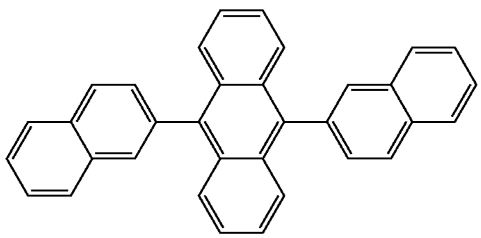
DNA
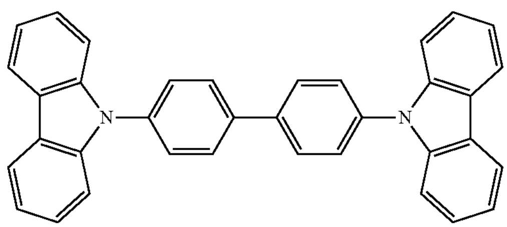
CBP
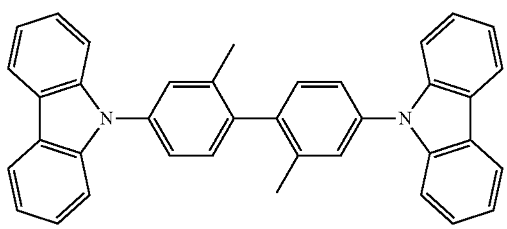
dmCBP
501
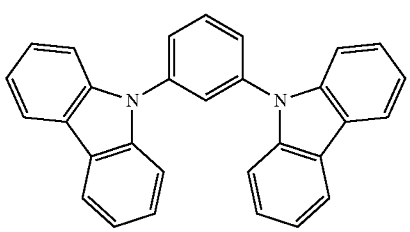
502
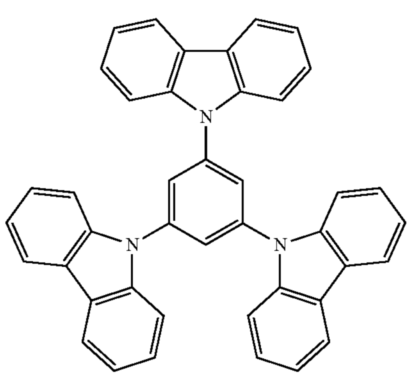
-continued
503
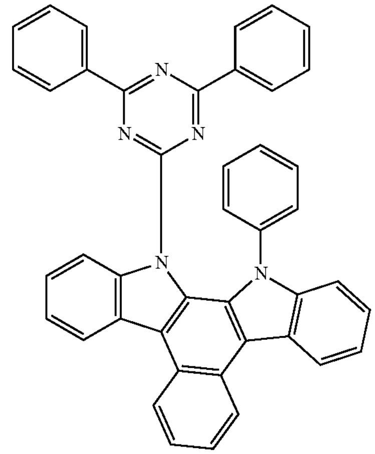
504
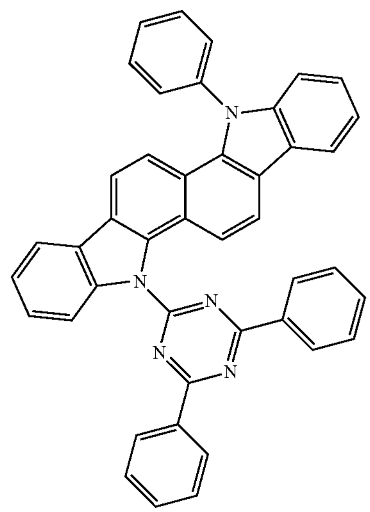
505
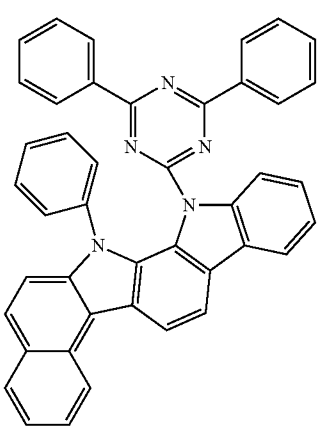

-continued

506

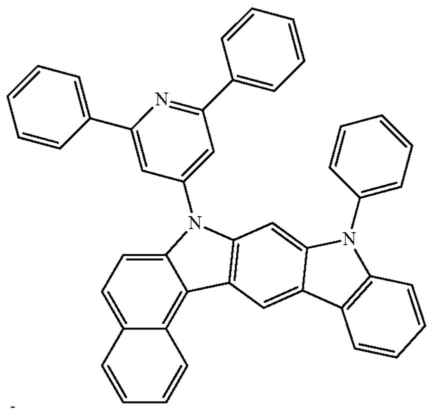

507

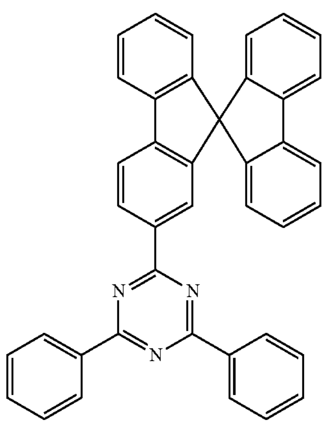

508

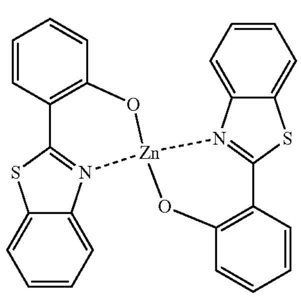

-continued

509

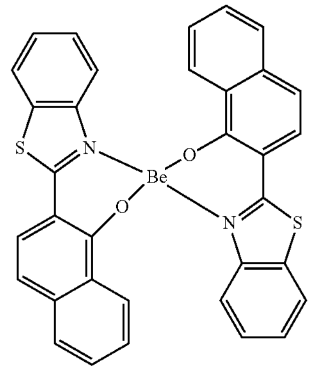

Also, the host may be an anthracene-based compound represented by Formula 400 below:

Formula 400>

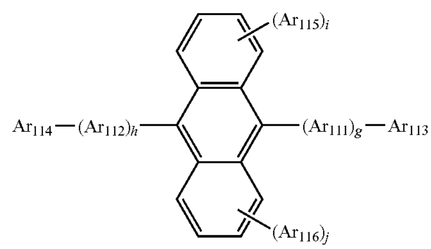

wherein in Formula 400, $Ar_{111}$ and $Ar_{112}$ may be each independently selected from a substituted or unsubstituted $C_6$-$C_{60}$ arylene group; $Ar_{113}$ to $Ar_{116}$ may be each independently a substituted or unsubstituted $C_1$-$C_{10}$ alkyl group, or a substituted or unsubstituted $C_6$-$C_{60}$ aryl group; and g, h, l, and j are each independently an integer from 0 to 4.

For example, $Ar_{111}$ and $Ar_{112}$ in Formula 400 may each be independently selected from a phenylene group, a naphthylene group, a phenanthrenylene group, a pyrenylene group; a substituted phenylene group, a substituted naphthylene group, a substituted phenanthrenylene group, a substituted fluorenyl group, or a substituted pyrenylene group, where such substituted groups include at least one substituent selected from a phenyl group, a naphthyl group, or an anthracenyl group, but are not limited thereto.

In Formula 400, g, h, i, and j may each be independently 0, 1, or 2.

$Ar_{113}$ to $Ar_{116}$ in Formula 400 may be each independently selected from a $C_1$-$C_{10}$ alkyl group substituted with at least one selected from a phenyl group, a naphthyl group, or an anthracenyl group; a phenyl group, a naphthyl group, an anthracenyl group, a pyrenyl group, phenanthrenyl group, a fluorenyl group; a substituted phenyl group, a substituted naphthyl group, a substituted anthracenyl group, a substituted pyrenyl group, a substituted phenanthrenyl group, or a substituted fluorenyl group, where such substituted groups include at least one substituent selected from deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a pyrenyl group, a phenanthrenyl group, a fluorenyl group; or
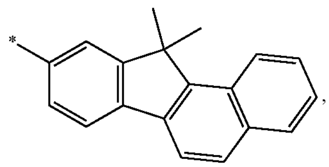 [SMILES: *c1ccc2c(c1)C(C)(C)c1c-2ccc2ccccc12]
but are not limited thereto.
For example, the anthracene-based compound represented by Formula 400 may be one of the following compounds, but is not limited thereto:
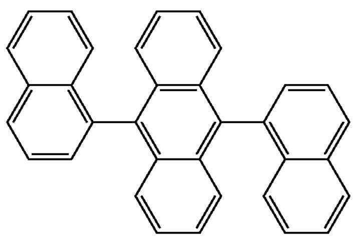
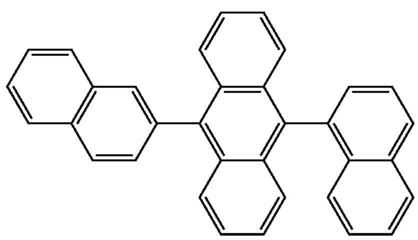
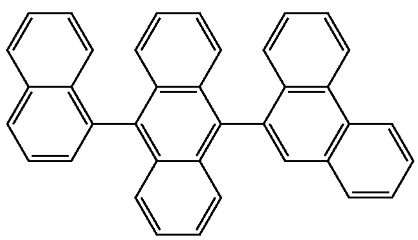
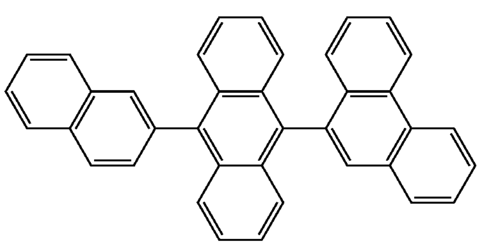
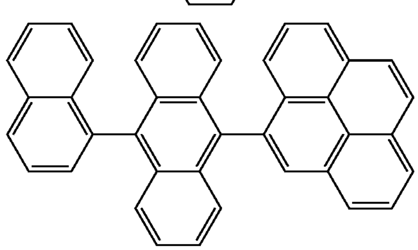
-continued
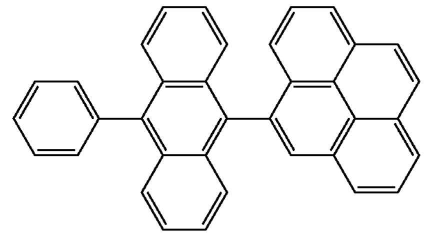
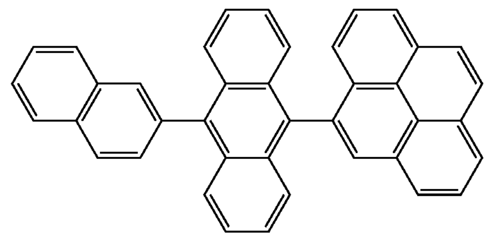
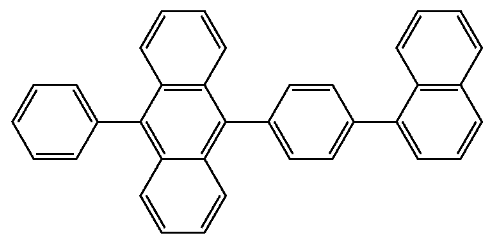
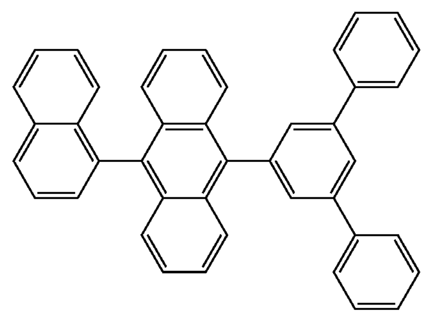
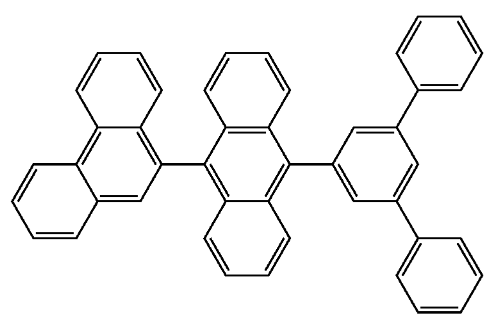
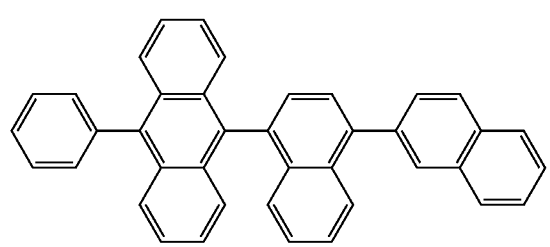

-continued
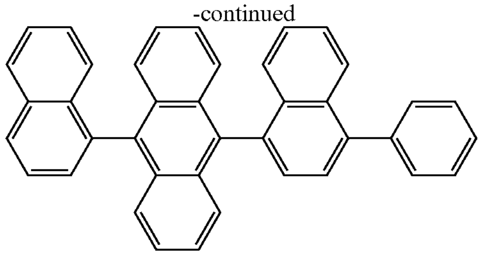
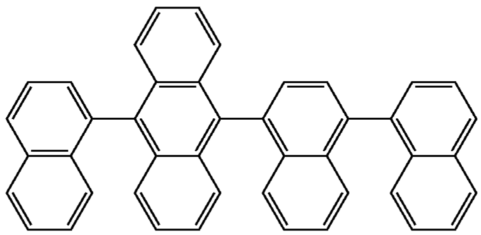
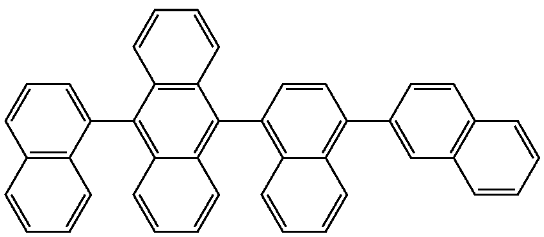
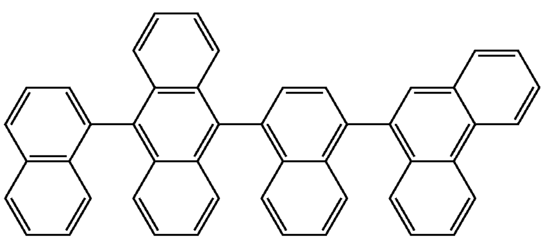
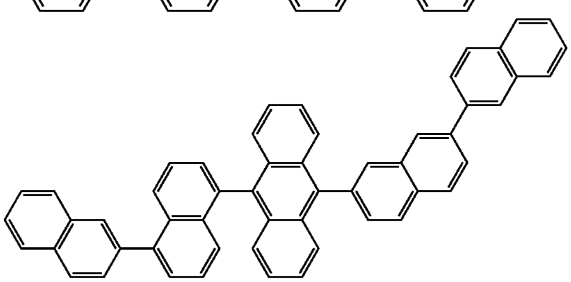
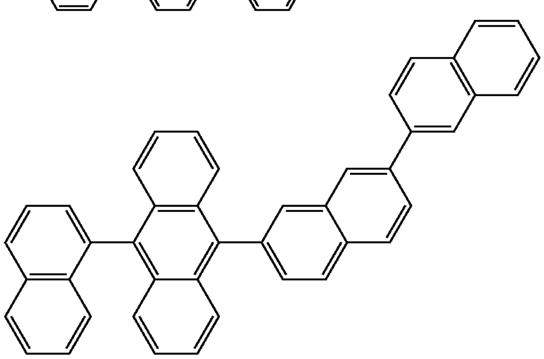
-continued
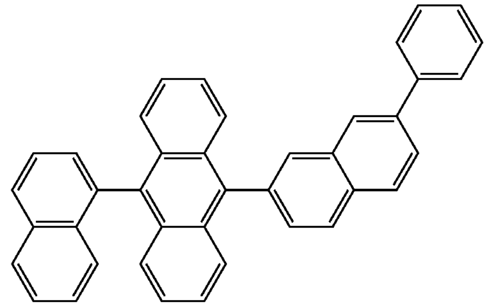
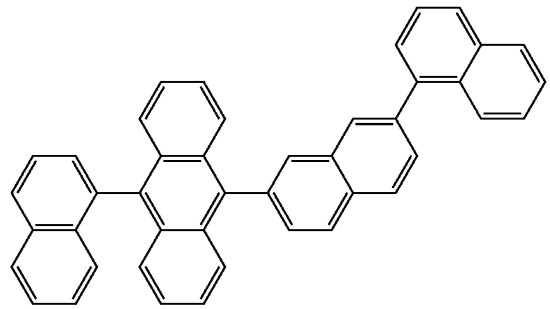
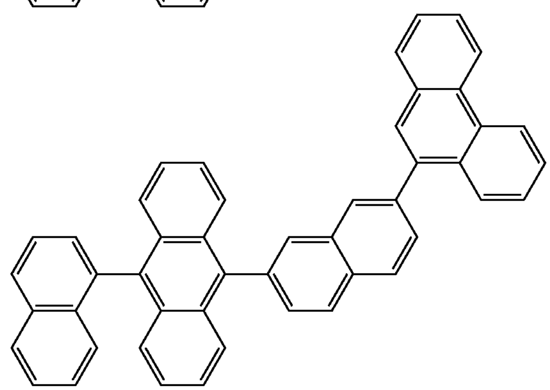
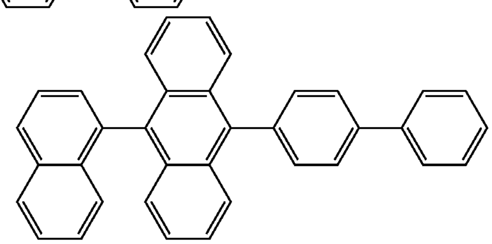
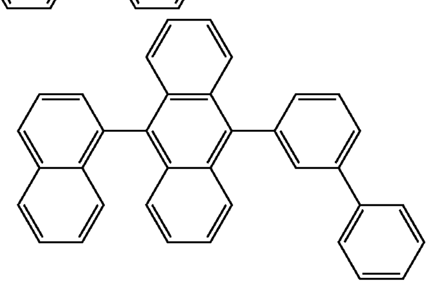
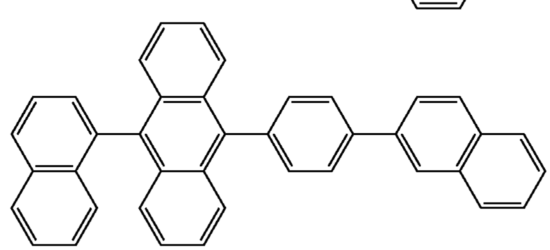

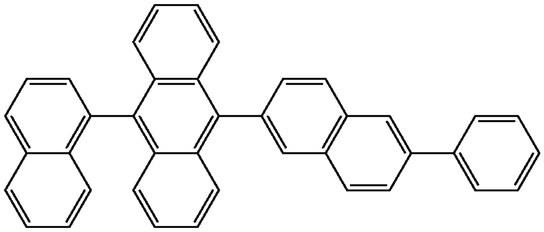
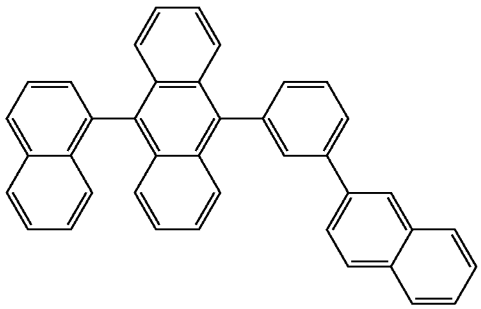
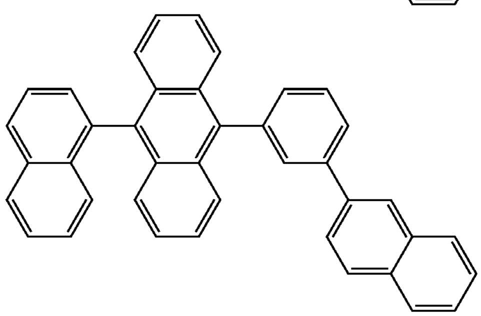
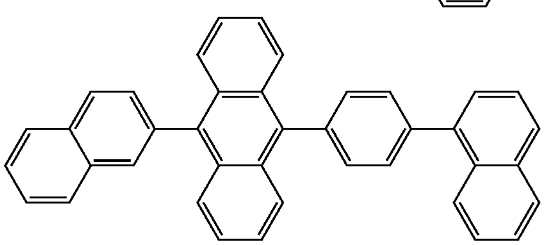
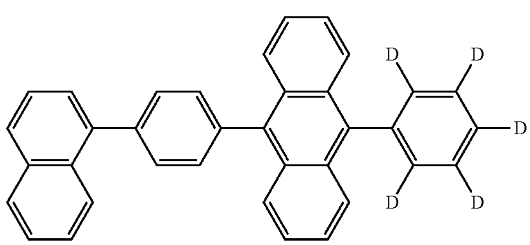
D
D
D
D
D
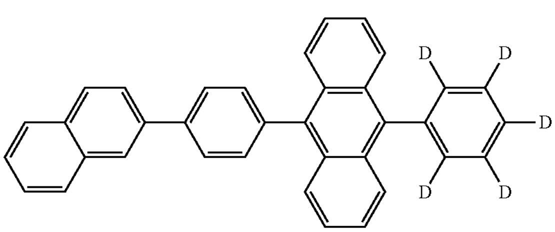
D
D
D
D
D
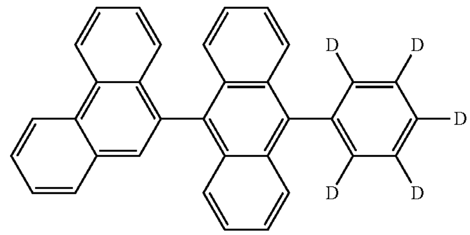
D
D
D
D
D
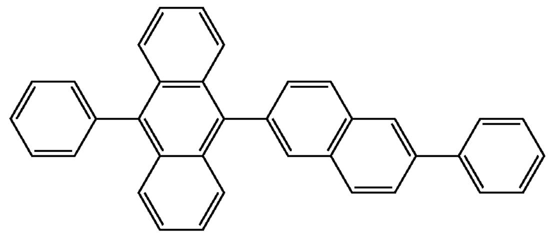
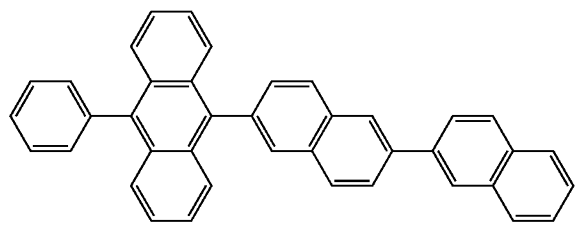
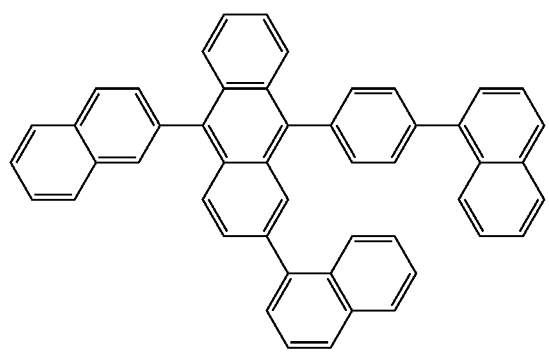
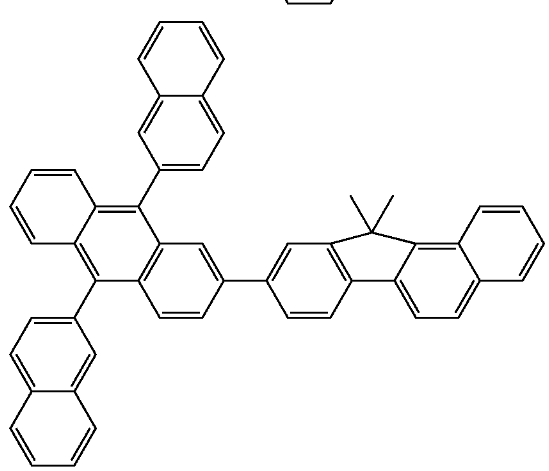

-continued

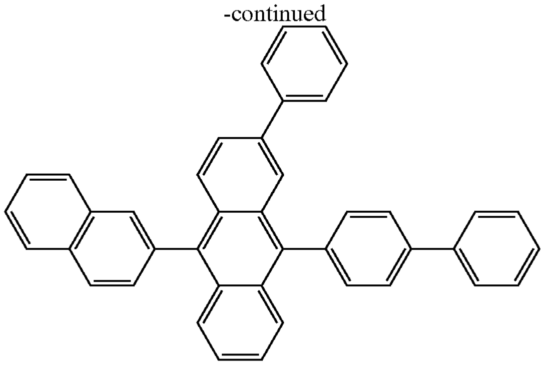

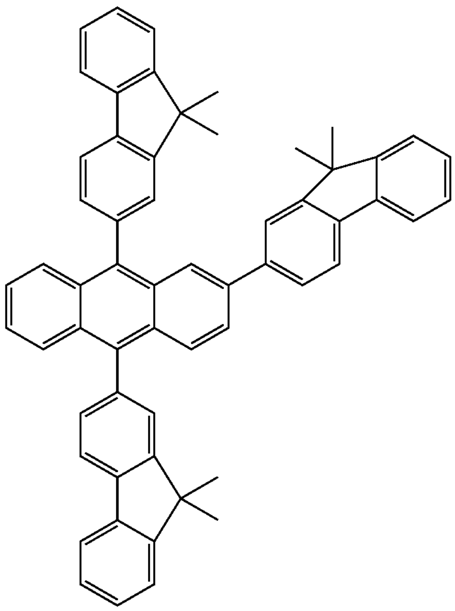

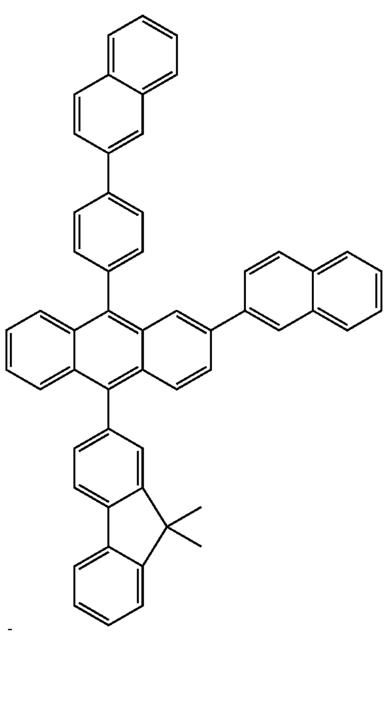

-continued

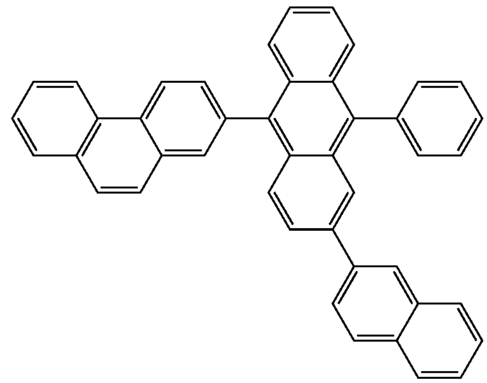

Also, the host may be an anthracene-based compound represented by Formula 401 below:

Formula 401

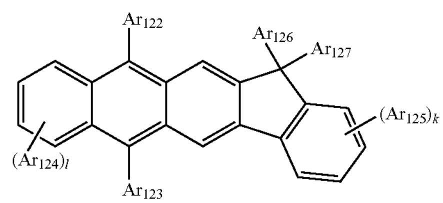

$Ar_{122}$ to $Ar_{125}$ in Formula 401 are the same as described in detail in connection with $Ar_{113}$ in Formula 400.

$Ar_{126}$ and $Ar_{127}$ in Formula 401 may be each independently a $C_1$-$C_{10}$ alkyl group (for example, a methyl group, an ethyl group, or a propyl group).

In Formula 401, k and l may each be independently an integer from 0 to 4. For example, k and l may be 0, 1, or 2.

For example, the anthracene-based compound represented by Formula 401 may be one of the following compounds, but is not limited thereto:

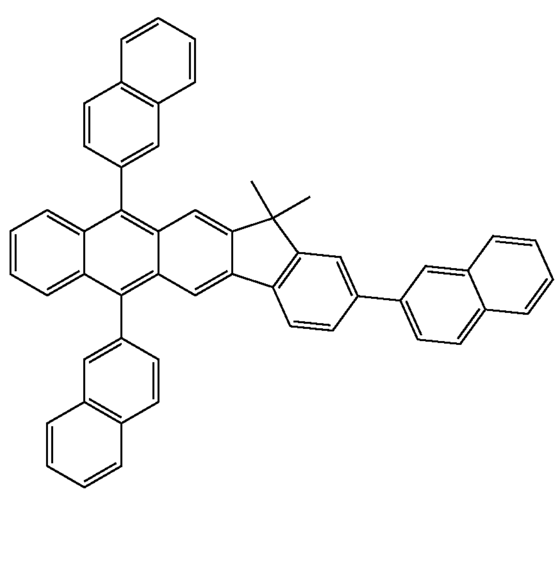

-continued

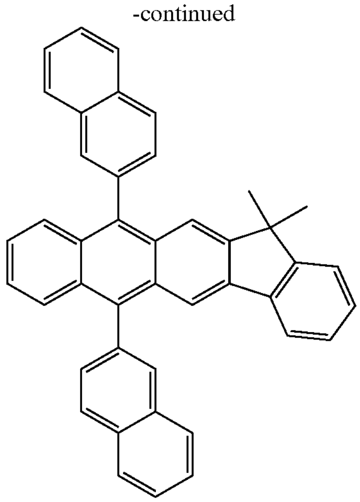

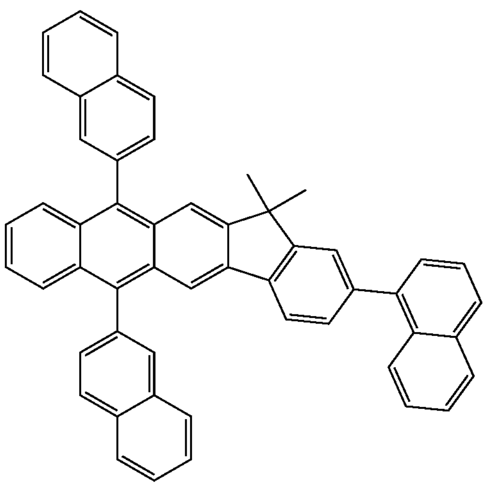

-continued

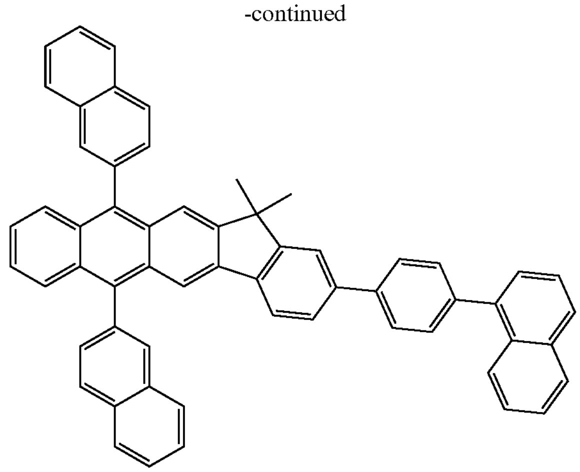

When the organic light-emitting device is a full color organic light-emitting device, the emission layer may be patterned into a red emission layer, a green emission layer, and a blue emission layer. According to another embodiment of the present invention, due to a stack structure including a red emission layer, a green emission layer, and/or a blue emission layer, the emission layer may emit white light.

A dopant included in the emission layer may be the condensed cyclic compound represented by Formula 1. In this regard, the condensed cyclic compound may act as a fluorescent dopant that emits light according to a fluorescence emission mechanism. For example, the condensed cyclic compound may act as a fluorescent dopant that emits blue light, but is not limited thereto:

According to another embodiment of the present invention, the emission layer may further include, in addition to the condensed cyclic compound represented by Formula 1, any known dopant described below.

For example, compounds illustrated below may be used as a blue dopant, but the blue dopant is not limited thereto.

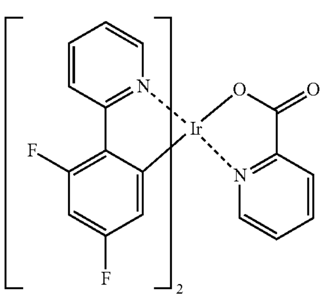

$F_2Irpic$

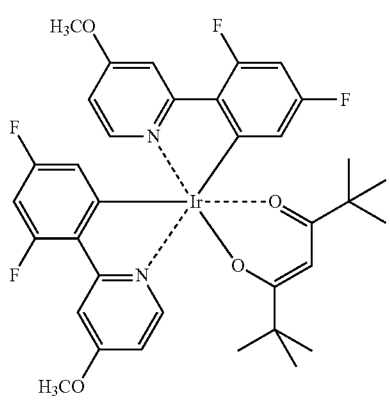

(F2ppy)2Ir(tmd)

-continued
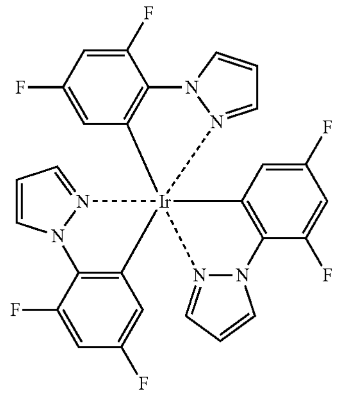
Ir(dfppz)3
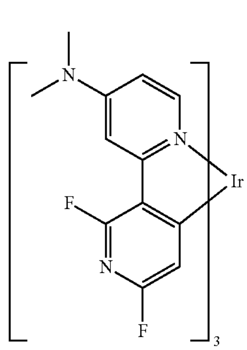
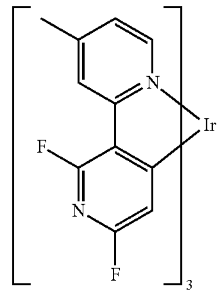
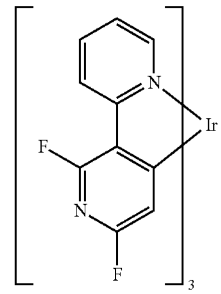
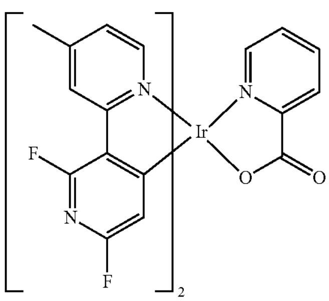
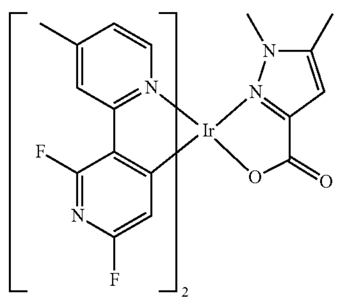
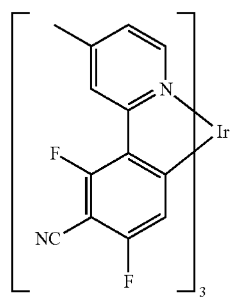
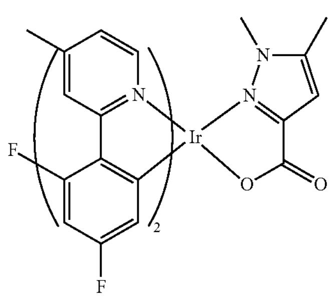
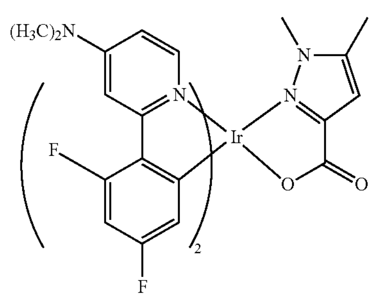
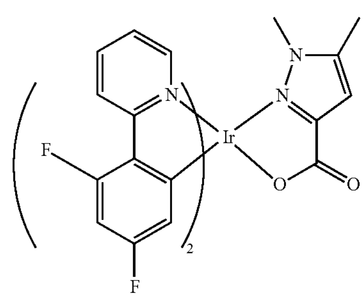
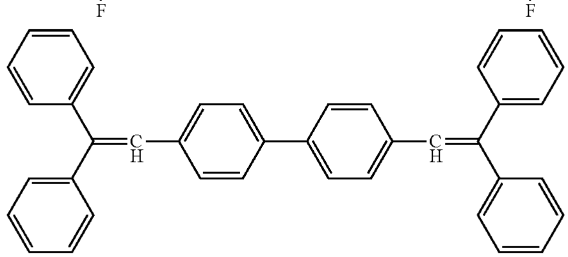
DPVBI
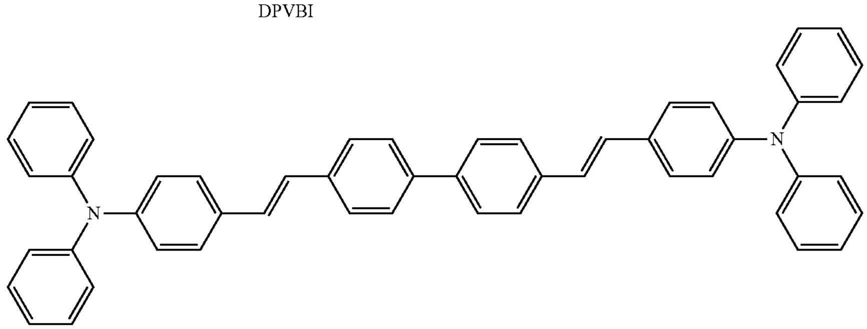
DPAVBi -continued
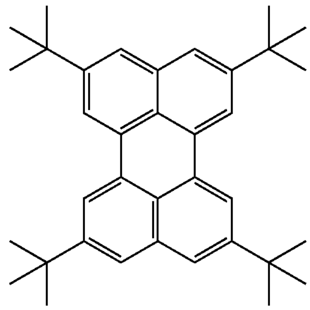
TBPe
For example, compounds illustrated below may be used as a red dopant, but the red dopant is not limited thereto. According to another embodiment of the present invention, the red dopant may be DCM or DCJTB.
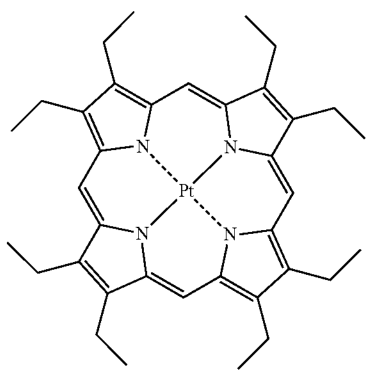
PtOEP
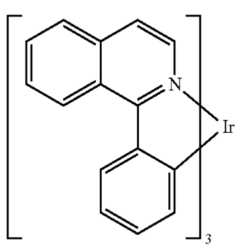
Ir(piq)$_3$
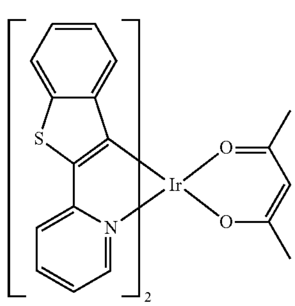
$Btp_2Ir(acac)$
-continued
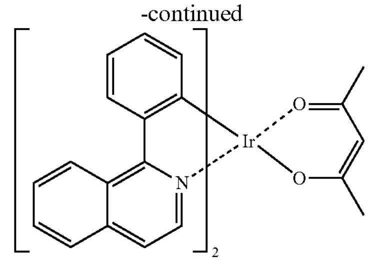
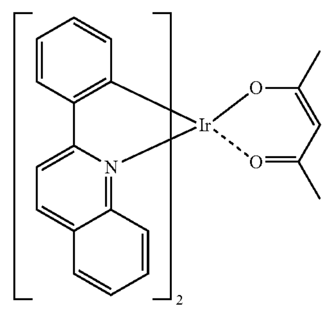
Ir(pq)$_2$(acac)
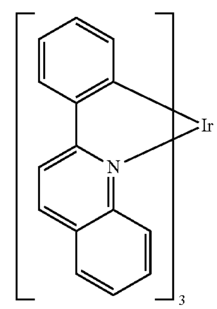
Ir(2-phq)$_3$
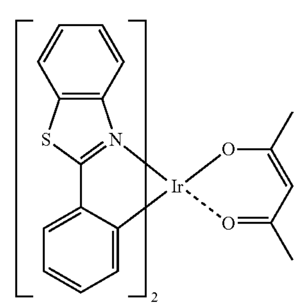
Ir(BT)$_2$(acac)

-continued

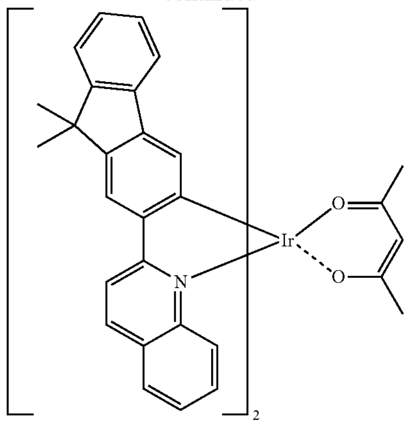

Ir(flq)2(acac)

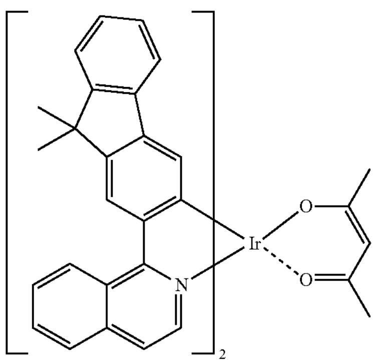

Ir(fliq)2(acac)

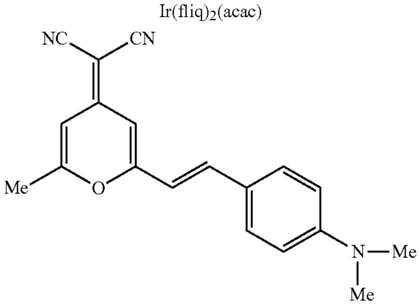

DCM

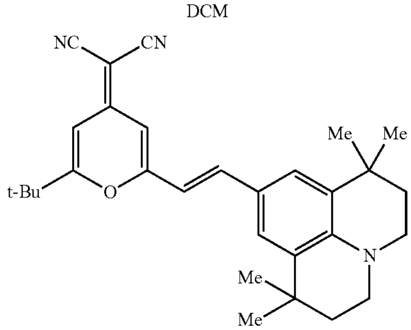

DCJTB

For example, compounds illustrated below may be used as a green dopant, but the green dopant is not limited thereto. According to another embodiment of the present invention, the green dopant may be C545T.

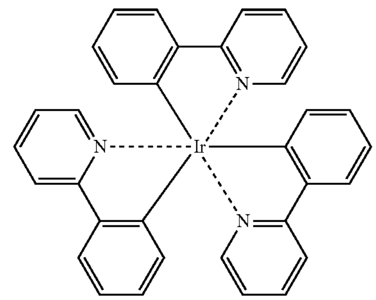

Ir(ppy)3

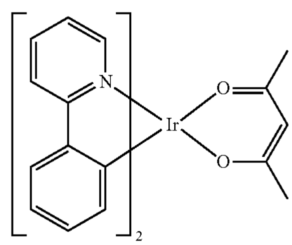

Ir(ppy)2(acac)

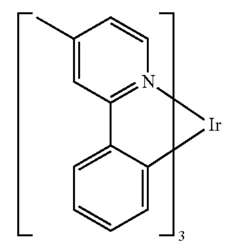

Ir(mpyp)3

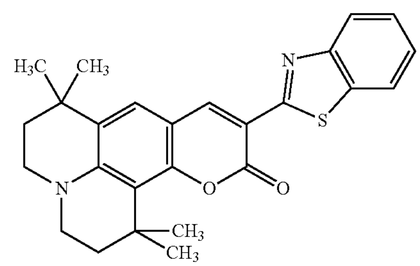

C545T

Also, the dopant available for use in the emission layer may be a complex described below, but is not limited thereto:

D1

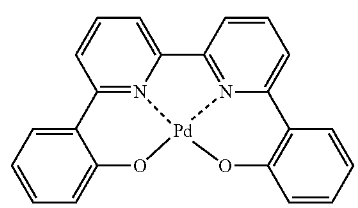

D2

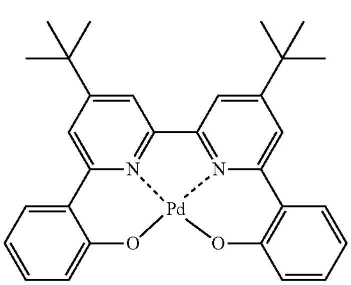

-continued
D3
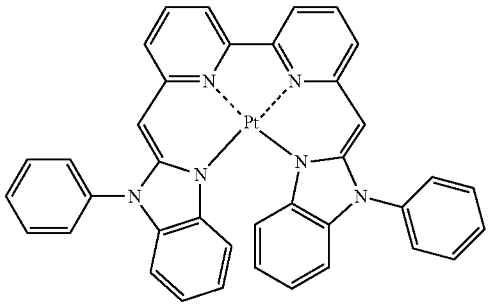
D4
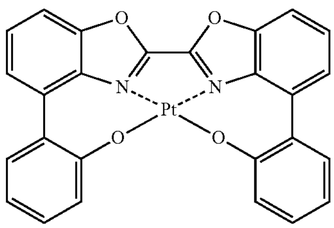
D5
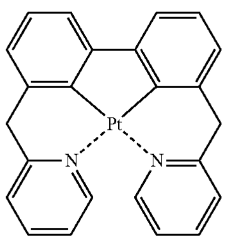
D6
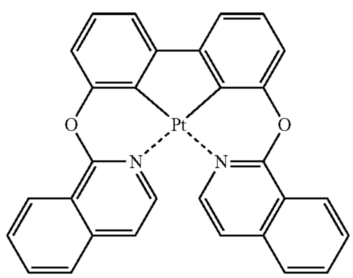
D7
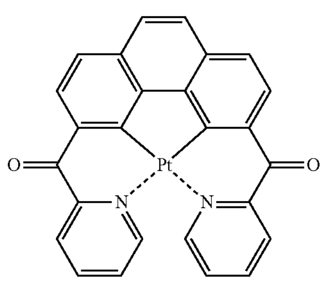
D8
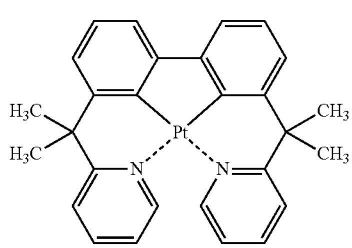
-continued
D9
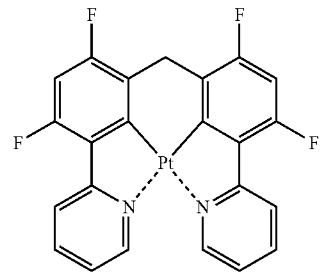
D10
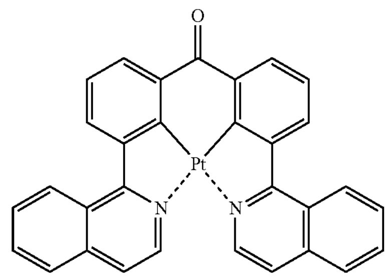
D11
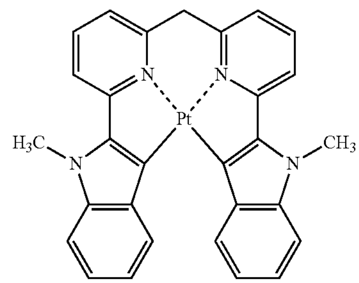
D12
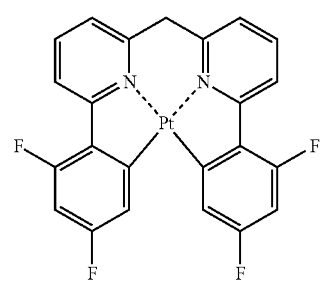
D13
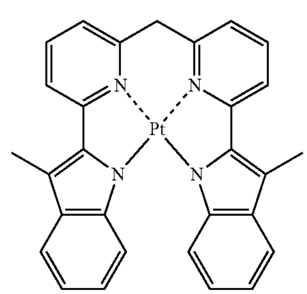

-continued
D14
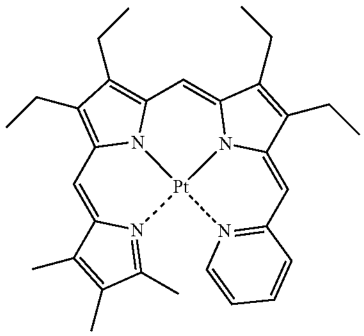
D15
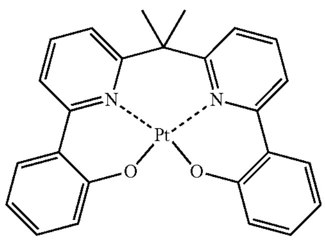
D16
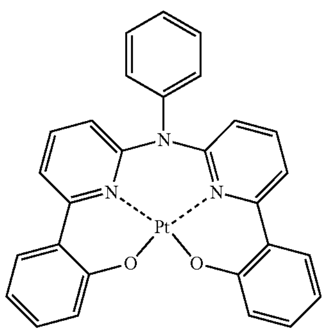
D17
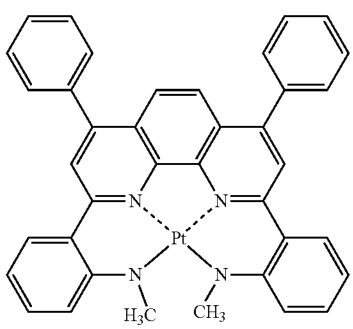
D18
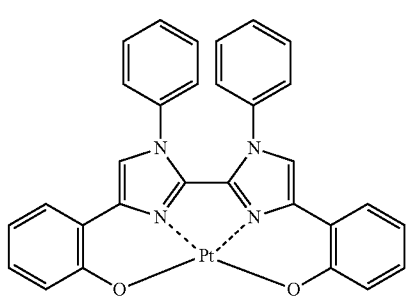
-continued
D19
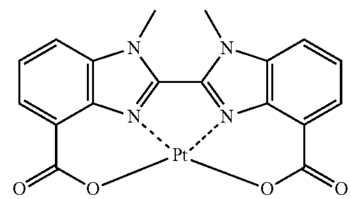
D20
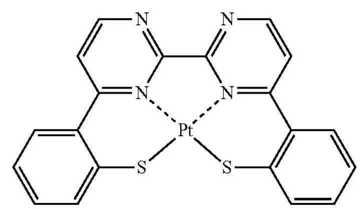
D21
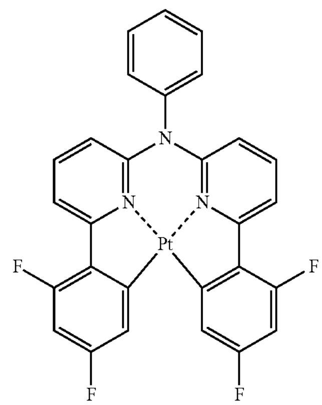
D22
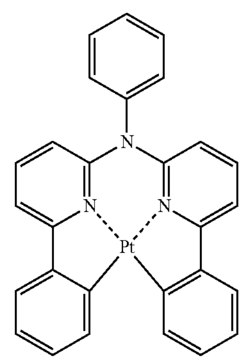
D23
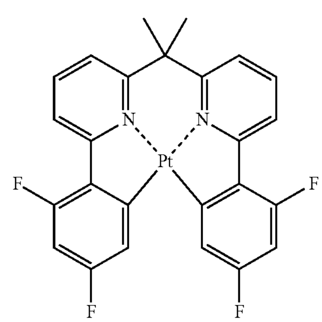

-continued
D24
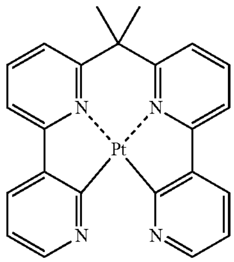
D25
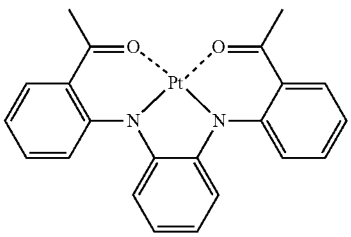
D26
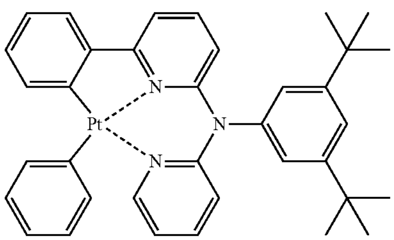
D27
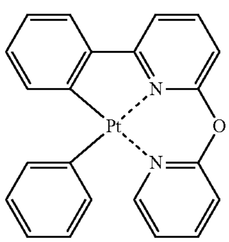
D28
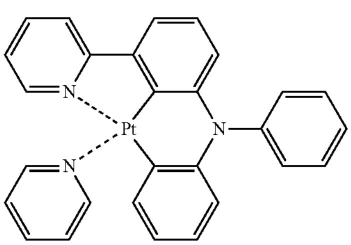
D29
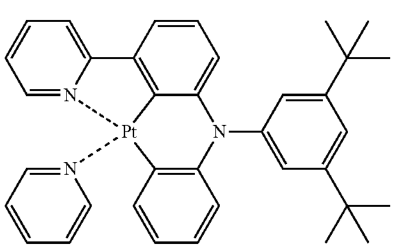
-continued
D30
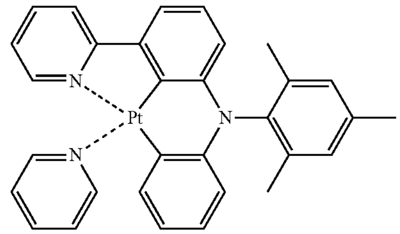
D31
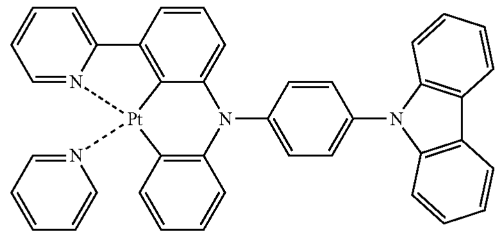
D32
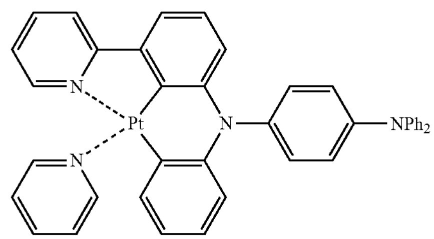
D33
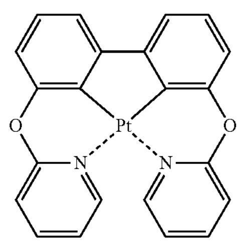
D34
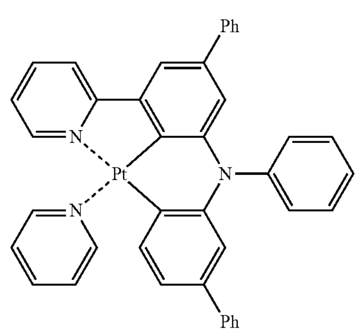
D35
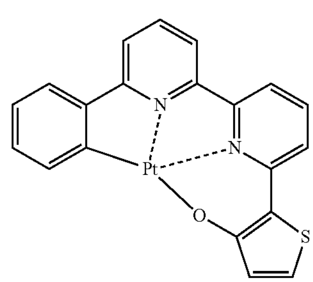

-continued
D36
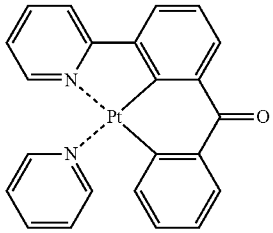
D37
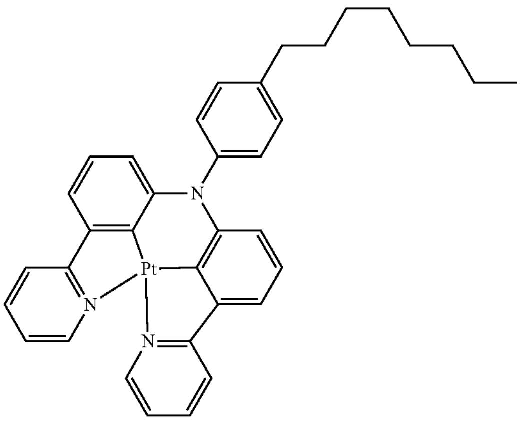
D38
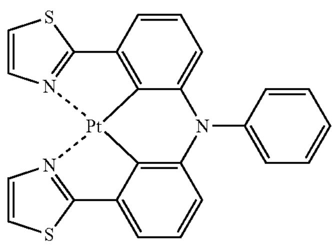
D39
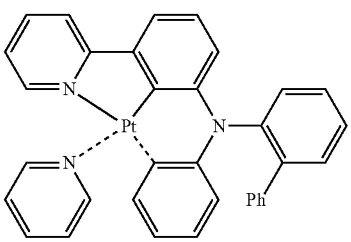
D40
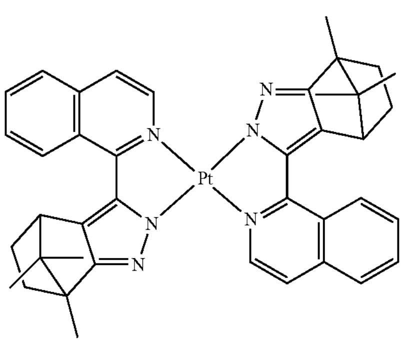
-continued
D41
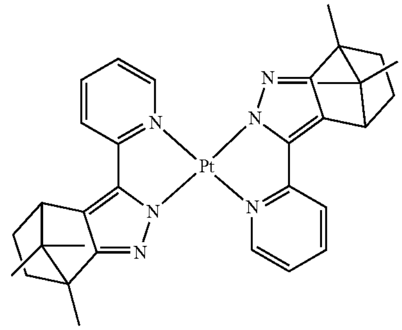
D42
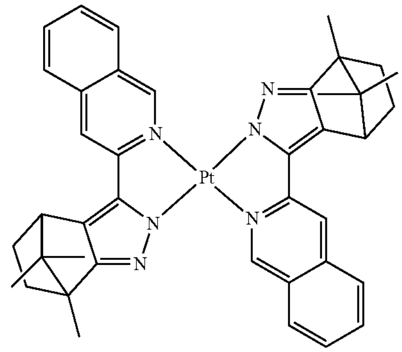
D43
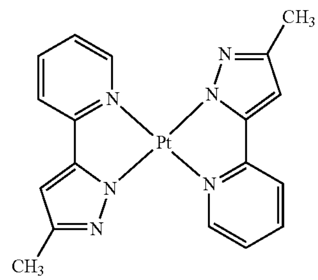
D44
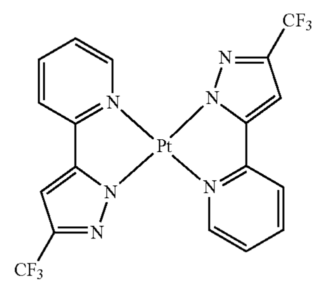
D45
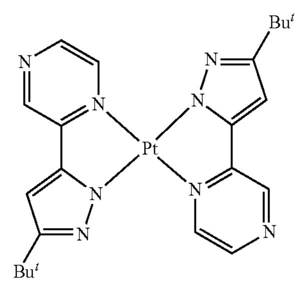

-continued

D46

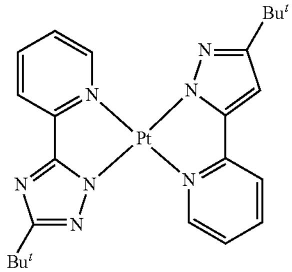

D47

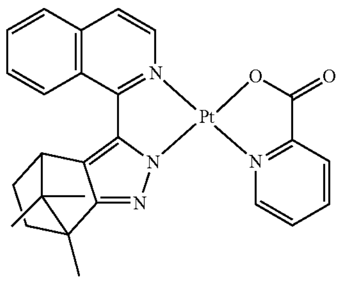

D48

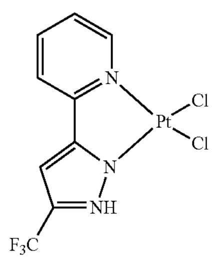

D49

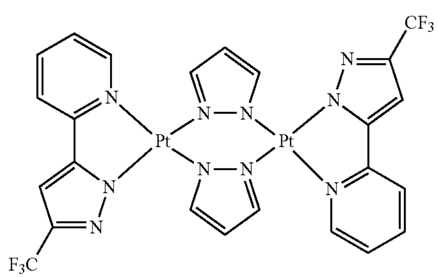

D50

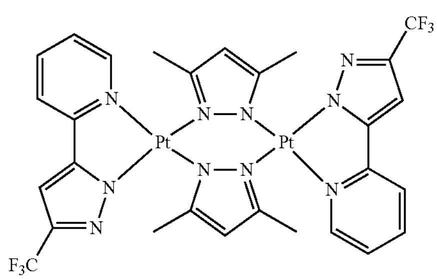

Also, the dopant available for use in the emission layer may be an Os-complex described below, but is not limited thereto:

$Os(fppz)_2(CO)_2$

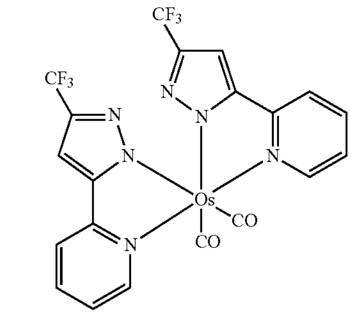

$Os(fppz)_2(PPh_2Me)_2$

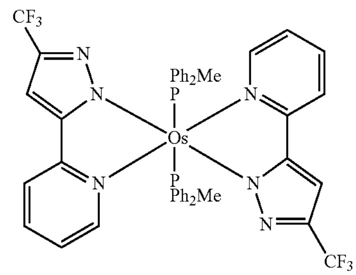

$Os(bppz)_2(PPh_3)_2$

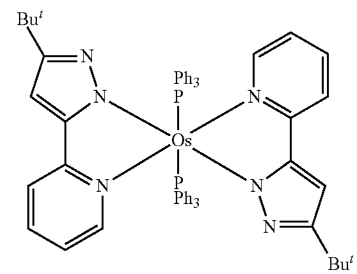

$Os(fptz)_2(PPh_2Me)_2$

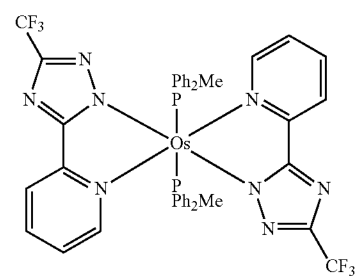

$Os(hptz)_2(PPhMe_2)_2$

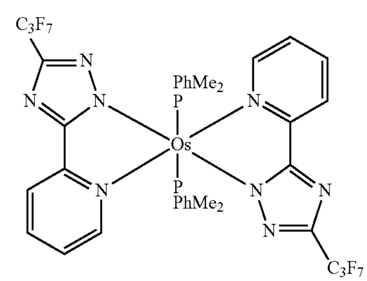

When the emission layer includes a host and a dopant, an amount of the dopant may be, conventionally, in a range of about 0.01 to about 15 wt % based on 100 wt % of the host, but the amount of the dopant is not limited thereto.

A thickness of the emission layer may be in a range of about 100 Å to about 1000 Å, for example, about 200 Å to about 600 Å. When the thickness of the emission layer is within this range, excellent light-emission characteristics may be obtained without a substantial increase in driving voltage.

Next, an electron transport layer (ETL) is formed on the emission layer by using various methods, for example, by vacuum deposition, spin coating, casting, or the like. When the electron transport layer is formed using vacuum deposition or spin coating, the deposition and coating conditions may be similar to those for the formation of the hole injection layer, though the conditions for deposition and coating may vary according to the material that is used to form the electron transport layer.

A material for forming the electron transport layer may stably transport electrons injected from the second electrode 17, and may be a known electron transportation material. Examples of a known electron transport material are a quinoline derivative, such as tris(8-quinolinorate)aluminum (Alq3), TAZ, Balq, beryllium bis(benzoquinolin-10-olate) ($Bebq_2$), ADN, Compound 201, or Compound 202 but are not limited thereto.

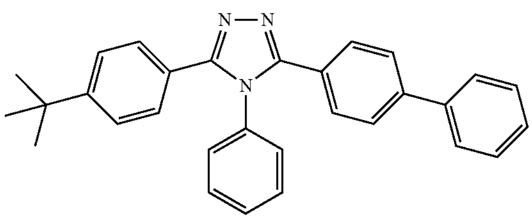

TAZ

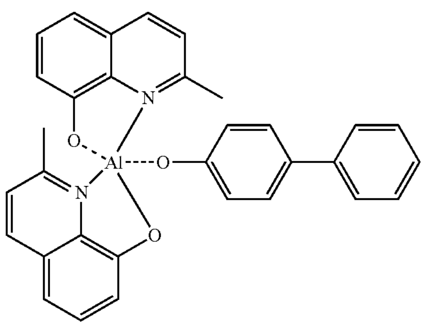

BAlq

Compound 201

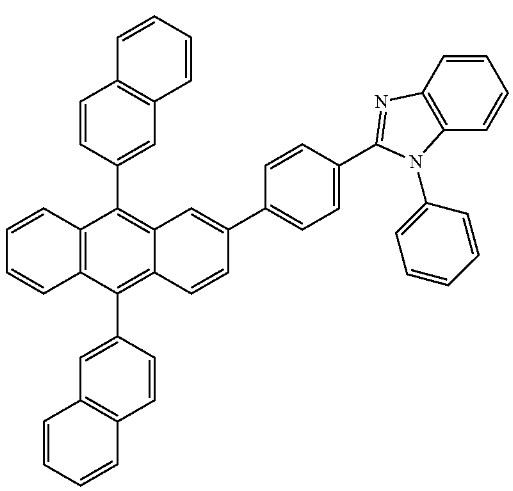

-continued

Compound 202

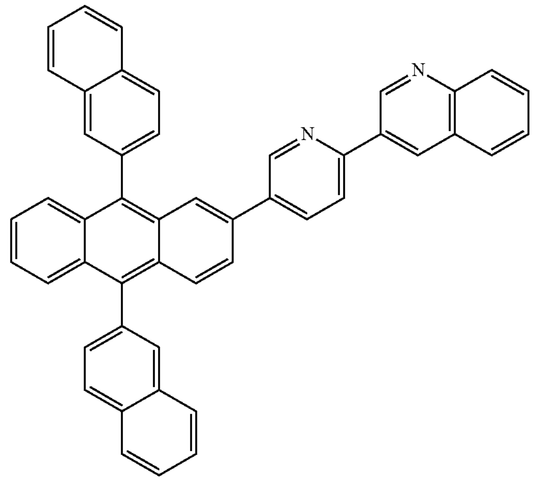

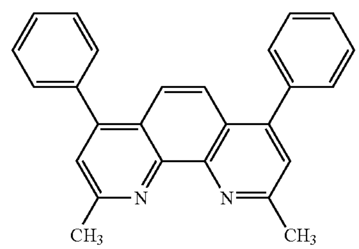

BCP

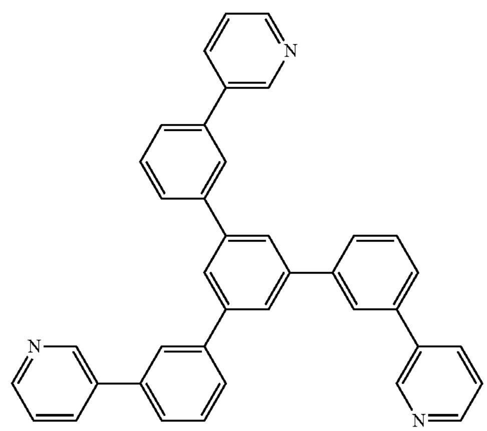

TmPyPB

A thickness of the electron transport layer may be in a range of about 100 Å to about 1000 Å, for example, about 150 Å to about 500 Å. When the thickness of the electron transport layer is within the range described above, the electron transport layer may have satisfactory electron transportation characteristics without a substantial increase in driving voltage.

Also, the electron transport layer may further include, in addition to the materials described above, a metal-containing material.

The metal-containing material may include a Li complex. Non-limiting examples of the Li complex are lithium quinolate (LiQ) and Compound 203 illustrated below:

Compound 203

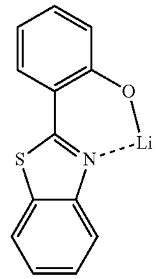

Then, an electron injection layer (EIL), which facilitates injection of electrons from the second electrode 17, may be formed on the electron transport layer. Any suitable electron-injecting material may be used to form the electron injection layer.

Non-limiting examples of materials for forming the electron injection layer are LiF, NaCl, CsF, $Li_2O$, and BaO, which are known in the art. The deposition conditions of the electron injection layer may be similar to those used to form the hole injection layer, although the deposition conditions may vary according to the material that is used to form the electron injection layer.

A thickness of the electron injection layer may be in a range of about 1 Å to about 100 Å, about 3 Å to about 90 Å. When the thickness of the electron injection layer is within the range described above, the electron injection layer may have satisfactory electron transportation characteristics without a substantial increase in driving voltage.

The second electrode 17 is disposed on the organic layer 15. The second electrode 17 may be a cathode that is an electron injection electrode, and in this regard, a material for forming the second electrode 17 may be a material having a low work function, and such a material may be metal, alloy, an electrically conductive compound, or a mixture thereof. For example, lithium (Li), magnesium (Mg), aluminum (Al), aluminum-lithium (Al—Li), calcium (Ca), magnesium-indium (Mg—In), or magnesium-silver (Mg—Ag) may be formed as a thin film for use as a transmissive electrode. Also, to manufacture a top emission type light-emitting device, a transmissive electrode formed using ITO or IZO may be formed.

Hereinbefore, the organic light-emitting device has been described with reference to the FIGURE, but is not limited thereto.

In addition, when a phosphorescent dopant is used in the emission layer, a triplet exciton or a hole may diffuse to the electron transport layer. To prevent the diffusion, a hole blocking layer (HBL) may be formed between the hole transport layer and the emission layer or between the H-functional layer and the emission layer by vacuum deposition, spin coating, casting, LB deposition, or the like. When the hole blocking layer is formed using vacuum deposition or spin coating, the deposition and coating conditions may be similar to those for the formation of the hole injection layer, though the conditions for deposition and coating may vary according to the material that is used to form the hole blocking layer. Any known hole-blocking material may be used. Non-limiting examples of hole-blocking materials are oxadiazole derivatives, triazole derivatives, and phenanthroline derivatives. For example, BCP illustrated below may be used as the hole-blocking material.

BCP

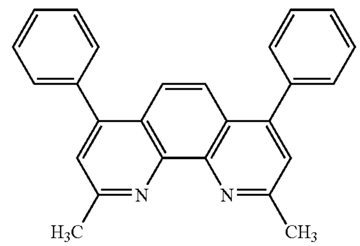

A thickness of the hole blocking layer may be in a range of about 20 Å to about 1,000 Å, for example, about 30 Å to about 300 Å. When the thickness of the hole blocking layer is within these ranges, the hole blocking layer may have improved hole blocking ability without a substantial increase in driving voltage.

The organic light-emitting device may be included in an organic light-emitting device. Accordingly, according to another aspect, an organic light-emitting device including the organic light-emitting device and a transistor may be provided. The thin film transistor may include an active layer, source and drain electrodes, a gate electrode, a gate insulating film, and at least one of the first and second electrodes 13 and 17 of the organic light-emitting device may electrically contact one of source and drain electrodes of the transistor. The active layer of the transistor may be selected from various known active layers formed of amorphous silicon, crystalline silicon, an oxide semiconductor, or an organic compound semiconductor.

The substituted or unsubstituted $C_1$-$C_{60}$ alkyl group used herein may be a $C_1$-$C_{60}$ linear or branched alkyl group, such as a methyl group, an ethyl group, a propyl group, an isobutyl group, a sec-butyl group, a pentyl group, an iso-amyl group, or a hexyl group, and the substituted $C_1$-$C_{60}$ alkyl group may include a substituent selected from hydrogen, deuterium, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group; a substituted $C_1$-$C_{60}$ alkyl group, a substituted $C_2$-$C_{60}$ alkenyl group, a substituted $C_2$-$C_{60}$ alkynyl group, a substituted $C_1$-$C_{60}$ alkoxy group, where such substituted groups include at least one substituent selected from deuterium, a halogen atom, a hydroxyl group, a cyano group, a nitro group, an amino group, an amidino group, a hydrazine group, a hydrazone group, a carboxylic acid group or a salt thereof, a sulfonic acid or a salt thereof, or a phosphoric acid or a salt thereof; a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group; a substituted $C_3$-$C_{10}$ cycloalkyl group, a substituted $C_3$-$C_{10}$ heterocycloalkyl group, a substituted $C_3$-$C_{10}$ cycloalkenyl group, a substituted $C_3$-$C_{10}$ heterocycloalkenyl group, a substituted $C_6$-$C_{60}$ aryl group, a substituted $C_6$-$C_{60}$ aryloxy group, a substituted $C_6$-$C_{60}$ arylthio group, a substituted $C_2$-$C_{60}$ heteroaryl group, where such substituted groups include at least one substituent selected from deuterium, a halogen atom, a hydroxyl group, a cyano group, a nitro group, an amino group, an amidino group, a hydrazine group, a hydrazone group, a carboxylic acid group or a salt thereof, a sulfonic acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group; —$N(Q_{11})(Q_{12})$; or —$Si(Q_{11})(Q_{12})(Q_{13})$ (wherein $Q_{11}$ and $Q_{12}$ are each independently a $C_6$-$C_{60}$ aryl group, or a $C_2$-$C_{60}$ heteroaryl group, and $Q_{13}$ to $Q_{15}$ are each independently a $C_1$-$C_{60}$ alkyl group, a $C_1$-$C_{60}$ alkoxy group, a $C_6$-$C_{60}$ aryl group, or a $C_2$-$C_{60}$ heteroaryl group), but is not limited thereto.

The substituted or unsubstituted $C_1$-$C_{60}$ alkoxy group used herein refers to a group represented by —OA (wherein A is the substituted or unsubstituted $C_1$-$C_{60}$ alkyl group described above), and detailed examples thereof are methoxy, ethoxy, and isopropyloxy.

The substituted or unsubstituted $C_2$-$C_{60}$ alkenyl group group) used herein refers to a substituted or unsubstituted $C_2$-$C_{60}$ alkyl group having one or more carbon double bonds at a center or end thereof. Examples of the unsubstituted $C_2$-$C_{60}$ alkenyl group are an ethenyl group, a prophenyl group, and a butenyl group. One or more hydrogen atoms of these unsubstituted $C_2$-$C_{60}$ alkenyl groups may be substituted with the same substituents as described in connection with the substituted $C_1$-$C_{60}$ alkyl group.

The substituted or unsubstituted $C_2$-$C_{60}$ alkynyl group used herein refers to a substituted or unsubstituted $C_2$-$C_{60}$ alkyl group having one or more carbon triple bonds at a center or end thereof. Examples of the unsubstituted $C_2$-$C_{60}$ alkynyl group are ethynyl group, propynyl group, and the like. One or more hydrogen atoms of these alkynyl groups may be substituted with the same substituents as described in connection with the substituted $C_1$-$C_{60}$ alkyl group.

The unsubstituted $C_6$-$C_{60}$ aryl group is a monovalent group having a carbocyclic aromatic system having 6 to 60 carbon atoms including at least one aromatic ring. The unsubstituted $C_6$-$C_{60}$ arylene group is a divalent group having a carbocyclic aromatic system having 6 to 60 carbon atoms including at least one aromatic ring. When the aryl group and/or the arylene group have at least two rings, they may be fused to each other via a single bond. One or more hydrogen atoms of the aryl group and the arylene group may be substituted with the same substituents as described in connection with the substituted $C_1$-$C_{60}$ alkyl group.

Examples of the substituted or unsubstituted $C_6$-$C_{60}$ aryl group are a phenyl group, a $C_1$-$C_{10}$ alkylphenyl group (for example, ethylphenyl group), a $C_1$-$C_{10}$ alkylbiphenyl group (for example, ethylbiphenyl group), a halophenyl group (for example, an o-, m- or p-fluorophenyl group, or a dichlorophenyl group), a dicyanophenyl group, a trifluoromethoxyphenyl group, o-, m-, and p-tolyl groups, o-, m- and p-cumenyl groups, a mesityl group, a phenoxyphenyl group, a (α,α-dimethylbenzene)phenyl group, a (N,N'-dimethyl)aminophenyl group, a (N,N'-diphenyl)aminophenyl group, a pentalenyl group, an indenyl group, a naphthyl group, halonaphthyl group (for example, a fluoronaphthyl group), a $C_1$-$C_{10}$ alkylnaphthyl group (for example, a methylnaphthyl group), a $C_1$-$C_{10}$ alkoxynaphthyl group (for example, a methoxynaphthyl group), an anthracenyl group, an azrenyl group, a heptalenyl group, an acenaphthylenyl group, a phenalenyl group, a fluorenyl group, an anthraquinolinyl group, a methylanthracenyl group, a phenanthracenyl group, a triphenylenyl group, a pyrenyl group, a chrysenyl group, an ethyl-chrysenyl group, a picenyl group, a perylenyl group, a chloroperylenyl group, a pentaphenyl group, a pentasenyl group, a tetraphenylenyl group, a hexaphenyl group, a hexacenyl group, a rubicenyl group, a coroneryl group, a trinaphthylenyl group, a heptaphenyl group, a heptacenyl group, a piranthrenyl group, or an obarenyl group, and examples of the substituted $C_6$-$C_{60}$ aryl group may be easily understood by referring to the examples of the unsubstituted $C_6$-$C_{60}$ aryl group and the substituents of the substituted $C_1$-$C_{60}$ alkyl group. Examples of the substituted or unsubstituted $C_6$-$C_{60}$ arylene group may be easily understood by referring to examples of the substituted or unsubstituted $C_6$-$C_{60}$ aryl group. Examples of the substituted or unsubstituted $C_6$-$C_{60}$ arylene group may be easily understood by referring to examples of the substituted or unsubstituted $C_6$-$C_{60}$ aryl group.

The unsubstituted $C_2$-$C_{60}$ heteroaryl group used herein refers to a monovalent group having a system composed of one or more aromatic rings having at least one hetero atom selected from nitrogen (N), oxygen (O), phosphorous (P), silicon (Si), and sulfur (S) and carbon atoms as the remaining ring atoms. The unsubstituted $C_2$-$C_{60}$ heteroarylene group used herein refers to a divalent group having a system composed of one or more aromatic rings having at least one hetero atom selected from nitrogen (N), oxygen (O), phosphorous (P), silicon (Si), and sulfur (S) and carbon atoms as the remaining ring atoms. In this regard, when the heteroaryl group and the heteroarylene group each include two or more rings, the rings may be fused to each other. One or more hydrogen atoms of the heteroaryl group or the heteroarylene group may be substituted with the same substituents as described in connection with the substituted $C_1$-$C_{60}$ alkyl group.

Examples of the unsubstituted $C_2$-$C_{60}$ heteroaryl group are a pyrazolyl group, an imidazolyl group, a oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, benzoan imidazolyl group, an imidazo pyridinyl group, and an imidazo pyrimidinyl group. Examples of the unsubstituted $C_2$-$C_{60}$ hetroarylene group may be easily understood by referring to examples of the substituted or unsubstituted $C_2$-$C_{60}$ arylene group.

The substituted or unsubstituted $C_6$-$C_{60}$ aryloxy group may be represented by —$OA_2$ (wherein $A_2$ indicates the substituted or unsubstituted $C_6$-$C_{60}$ aryl group), and the substituted or unsubstituted $C_5$-$C_{60}$ arylthio group may be represented by —$SA_3$ (wherein $A_3$ indicates a substituted or unsubstituted $C_6$-$C_{60}$ aryl group).

Hereinafter, an organic light-emitting device according to an embodiment of the present invention is described in detail with reference to Synthesis Example and Examples. However, the organic light-emitting device is not limited thereto. The wording "B was used instead of A" used in describing Synthesis Examples means that a molar equivalent of A was identical to a molar equivalent of B.

EXAMPLE

Synthesis Example 1

Synthesis of Compound 2

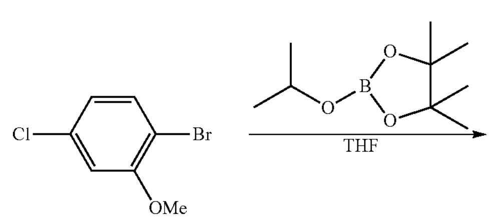

-continued

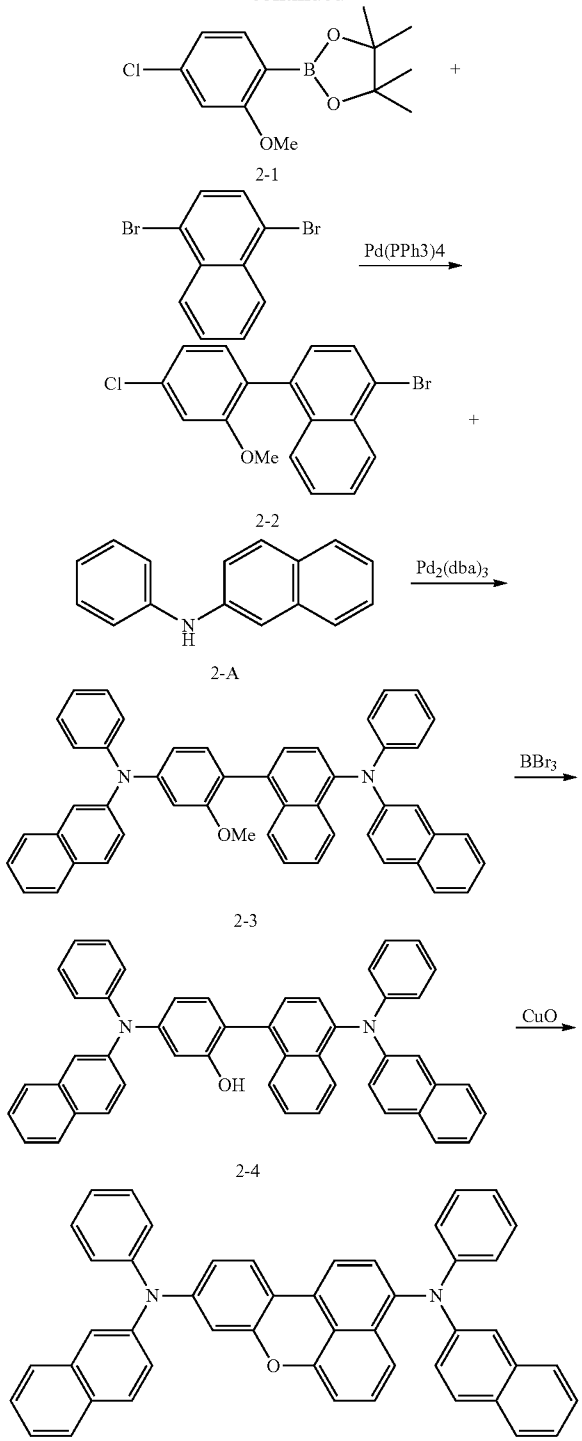

Synthesis of Intermediate 2-1

5.2 g (23.6 mmol) of 2-bromo-5-chloroanisol was dissolved in 100 ml of THF, and then, at a temperature of −78° C., n-BuLi 10 mL (25.0 mmol, 2.5M in Hexane) was slowly dropped thereto. At the same temperature, the resultant solution was stirred for 1 hour, and then, 9.3 mL (50.0 mmol) of 2-isopropoxy-4,4,5,5-tetramethyl-1,3,2-dioxaborolane was slowly added thereto, and the reaction solution was stirred at a temperature of −78° C. for 1 hours, and then, additionally stirred for 24 hours at room temperature. After the reaction was stopped, 50 mL of 10% HCl aqueous solution and 50 mL of $H_2O$ were added thereto, and then the resultant solution was extracted three times by using 80 mL of diethylether. An organic layer obtained therefrom was dried by using magnesium sulfate, and then the residual obtained by evaporating a solvent therein was separation-purified by silica gel column chromatography to obtain 5.83 g (yield: 92%) of Intermediate 2-1. The obtained compound was confirmed by LC-MS.

$C_{13}H_{18}BClO_3$: $M^+$ 268.1

Synthesis of Intermediate 2-2

5.90 g (22.0 mmol) of Intermediate 2-1, 12.4 g (44.0 mmol) of 1,4-dibromonaphthalene, 1.27 g (1.1 mmol) of tetrakis (triphenylphosphine)palladium ($Pd(PPh_3)_4$), and 4.50 g (33 mmol) of $K_2CO_3$ were dissolved in 200 ml of a mixed solution of $THF/H_2O$ (2/1 volumetric ratio), and then, stirred at a temperature of 70° C. for 5 hours. The reaction solution was cooled to room temperature, and then, 60 ml of water was added thereto, and the result was extracted three times by using 60 ml of ethyl ether. An organic layer obtained therefrom was dried by using magnesium sulfate and the residual obtained by evaporating a solvent therefrom was separation-purified by silica gel column chromatography to obtain 5.81 g (yield: 76%) of Intermediate 2-2. The obtained compound was confirmed by LC-MS.

$C_{17}H_{12}BrClO$: $M^+$ 345.9

Synthesis of Intermediate 2-3

6.92 g (20.0 mmol) of Intermediate 2-2, 8.73 g (40.0 mmol) of Intermediate 2-A, 0.37 g (0.4 mmol) of $Pd_2(dba)_3$, 0.08 g (0.4 mmol) of $PtBu_3$, and 5.76 g (60.0 mmol) of KOtBu were dissolved in 90 ml of toluene, and then, stirred at a temperature of 85° C. for 4 hours. The reaction solution was cooled to room temperature, and then extracted three times by using 50 mL of water and 50 mL of diethylether. An organic layer obtained therefrom was dried by using magnesium sulfate and the residual obtained by evaporating a solvent therefrom was separation-purified by silica gel column chromatography to obtain 11.1 g (yield: 83%) of Intermediate 2-3. The obtained compound was confirmed by LC-MS.

$C_{49}H_{36}N_2O$ $M^+$ 668.2

Synthesis of Intermediate 2-4

1.34 g (2.00 mmol) of Intermediate 2-3 was dissolved in 10 mL of MC, and then, at a temperature of −78° C., 0.33 mL (3.5 mmol) of $BBr_3$ was slowly dropped thereto. The reaction solution was heated to room temperature and then stirred for 24 hours at room temperature. After the reaction was stopped, 5 mL of MeOH aqueous solution and 10 mL of $H_2O$ were added thereto, and then the resultant solution was extracted three times by using 10 mL of MC. An organic layer obtained therefrom was dried by using magnesium sulfate, and then the residual obtained by evaporating a solvent therein was separation-purified by silica gel column chromatography to obtain 1.20 g (yield: 92%) of Intermediate 2-4. The obtained compound was confirmed by LC-MS.

$C_{48}H_{34}N_2O$: $M^+$ 654.2

Synthesis of Compound 2

1.30 g (2.00 mmol) of Intermediate 2-4 was dissolved in 10 mL of DMF, and then, at room temperature, 0.48 mL (6.0 mmol) of CuO was slowly dropped thereto. The reaction solution was stirred at a temperature of 140° C. for 48 hours. When the reaction was stopped, the reaction solution was filtered by using cellite, and then, 10 mL of $H_2O$ was added to an organic layer obtained therefrom and then, the resulting solution was extracted three times by using 10 mL of ethylacetate. An organic layer obtained therefrom was dried by using magnesium sulfate, and then the residual obtained by evaporating a solvent therein was separation-purified by silica gel column chromatography to obtain 0.82 g (yield: 63%) of Compound 2. The obtained compound was identified by LC-MS and NMR.

$C_{48}H_{32}N_2O$: $M^+$ found 652.29, calc. 652.25

$^1H$ NMR ($CDCl_3$, 400 MHz) δ(ppm) 7.84 (d, 1H), 7.78-7.75 (m, 3H), 7.66 (dd, 2H), 7.60-7.54 (m, 5H), 7.48-7.46 (m, 1H), 7.42-7.35 (m, 4H), 7.20-7.18 (m, 1H), 7.14-7.02 (m, 5H), 6.89-6.86 (m, 1H), 6.73 (d, 1H), 6.69-6.61 (m, 3H), 6.53 (dd, 1H), 6.36-6.33 (m, 2H), 6.19-6.15 (m, 2H)

Synthesis Example 2

Synthesis of Compound 15

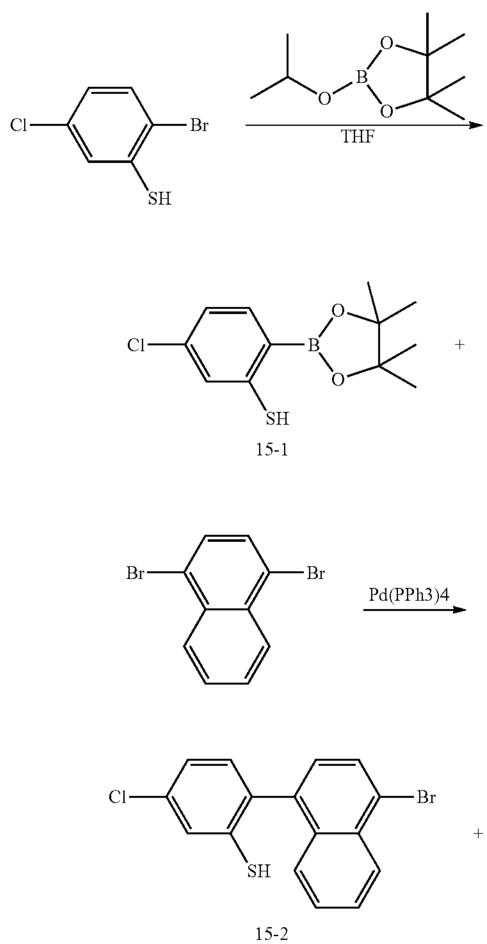

-continued

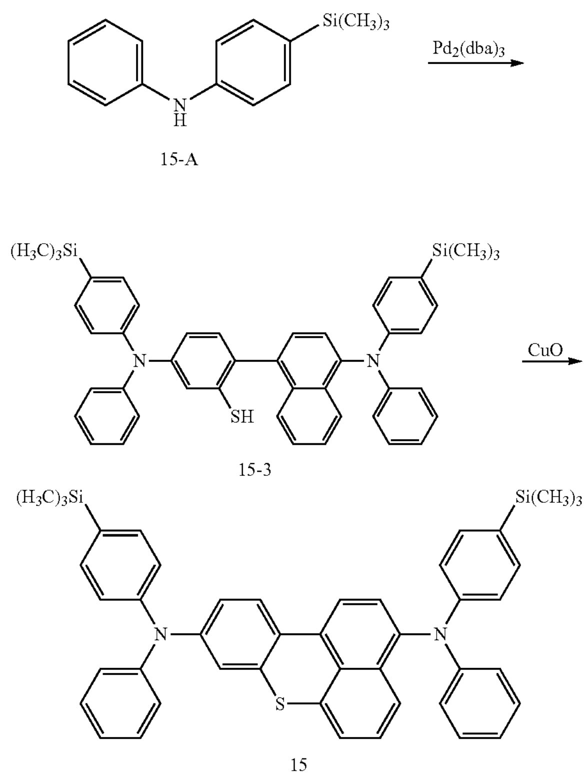

Synthesis of Intermediate 15-1

Intermediate 15-1 was synthesized in the same manner as in synthesizing Intermediate 2-1 of Synthesis Example 1, except that 2-bromo-5-chloro-benzenethiol was used instead of 2-bromo-5-chloroanisol.

Synthesis of Intermediate 15-2

Intermediate 15-2 was synthesized in the same manner as in synthesizing Intermediate 2-2 of Synthesis Example 1, except that Intermediate 15-1 was used instead of Intermediate 2-1.

Synthesis of Intermediate 15.3

Intermediate 15-3 was prepared in the same manner as used in synthesizing Intermediate 2-3 of Synthesis Example 1, except that Intermediate 15-2 and Intermediate 15-A were respectively used instead of Intermediate 2-2 and Intermediate 2-A.

Synthesis of Compound 15

Compound 15 (0.63 g, 53% of yield) was synthesized in the same manner as used to synthesize Compound 2 of Synthesis Example 1, except that Intermediate 15-3 was used instead of Intermediate 2-4. The obtained compound was identified by LC-MS and NMR.

$C_{46}H_{44}N_2SSi_2$: $M^+$ found 712.31, Calc. 712.27

$^1H$ NMR ($CDCl_3$, 400 MHz) δ(ppm) 7.83 (d, 1H), 7.63 (d, 1H), 7.56-7.53 (m, 2H), 7.41-7.35 (m, 5H), 7.09-7.03 (m, 5H), 6.87 (d, 1H), 6.72-6.61 (m, 4H), 6.56-6.50 (m, 3H), 6.40-6.37 (m, 2H), 6.20-6.16 (m, 2H), 0.24 (s, 18H)

Synthesis Example 3

Synthesis of Compound 54

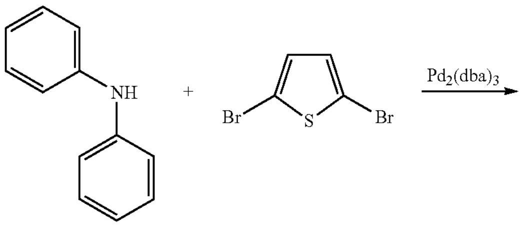

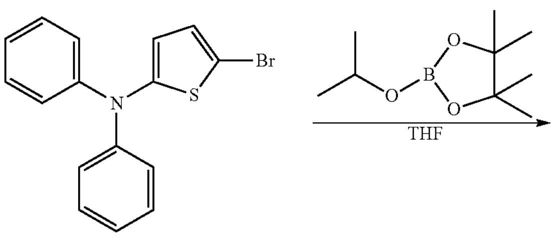

54-1

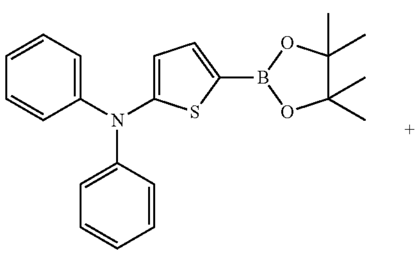

54-A

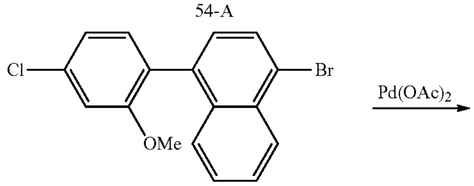

2-2

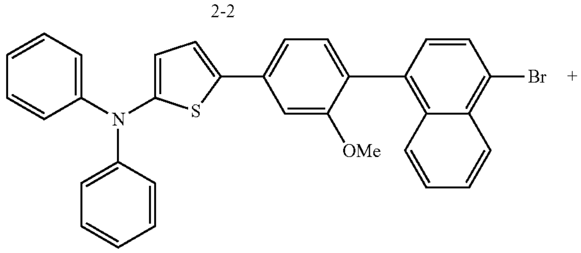

54-2

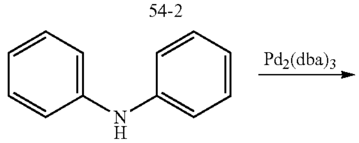

-continued

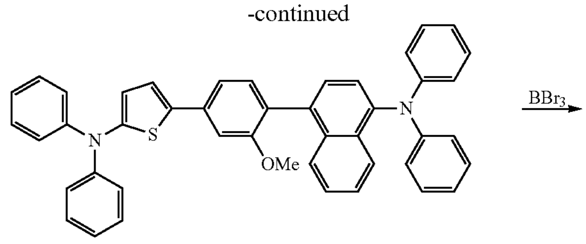

54-3

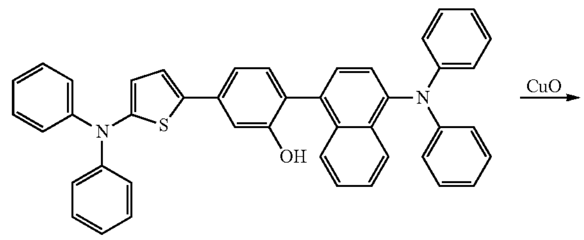

54-4

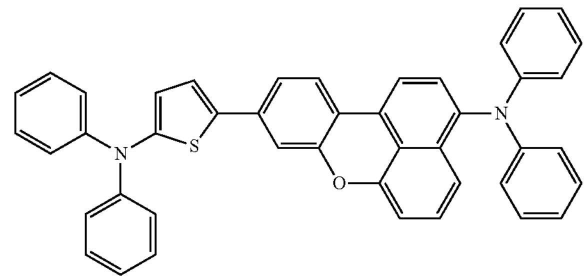

54

Synthesis of Intermediate 54-1

Intermediate 54-1 was prepared in the same manner as used in synthesizing Intermediate 2-3 of Synthesis Example 1, except that diphenylamine and 2,5-dibromothiophene were respectively used instead of Intermediate 2-A and Intermediate 2-2. The obtained compound was identified by LC-MS.

$C_{16}H_{12}BrNS$: $M^+$ 328.9

Synthesis of Intermediate 54-A

Intermediate 54-A was synthesized in the same manner as in synthesizing Intermediate 2-1 of Synthesis Example 1, except that Intermediate 54-1 was used instead of 2-bromo-5-chloroanisol. The obtained compound was identified by LC-MS.

$C_{22}H_{24}BNO_2S$: $M^+$ 377.1

Synthesis of Intermediate 54-2

7.54 g (20.0 mmol) of Intermediate 54-A, 6.95 g (20.0 mmol) of Intermediate 2-2, 0.22 g (1.0 mmol) of $Pd(OAc)_2$ (palladiumacetate), and 11.4 g (35 mmol) of $CsCO_3$ were dissolved in 200 ml of a mixed solution of $THF/H_2O$ (2/1 volumetric ratio), and then, stirred at a temperature of 70° C. for 5 hours. The reaction solution was cooled to room temperature, and then, 60 ml of water was added thereto, and the resultant solution was extracted three times by using 60 ml of ethyl ether. An organic layer obtained therefrom was dried by using magnesium sulfate and the residual obtained by evaporating a solvent therefrom was separation-purified by silica gel column chromatography to obtain 6.96 g (yield: 72%) of Intermediate 54-2. The obtained compound was identified by LC-MS.

$C_{33}H_{25}NOS$: $M^+$ 483.1

Synthesis of Intermediate 54-3

Intermediate 54-3 was prepared in the same manner as used in synthesizing Intermediate 2-3 of Synthesis Example 1, except that diphenylamine and Intermediate 54-2 were respectively used instead of Compound 2-A and Intermediate 2-2. The obtained compound was identified by LC-MS.

$C_{45}H_{34}N_2OS$: $M^+$ 650.2

Synthesis of Intermediate 54-4

Intermediate 54-4 was synthesized in the same manner as in synthesizing Intermediate 2-4 of Synthesis Example 1, except that Intermediate 54-3 was used instead of Intermediate 2-3. The obtained compound was identified by LC-MS.

$C_{44}H_{32}N_2OS$: $M^+$ 636.2

Synthesis of Compound 54

Compound 54 (0.65 g, yield: 71%) was synthesized in the same manner as used to synthesize Compound 2 of Synthesis Example 1, except that Intermediate 54-4 was used instead of Intermediate 2-4. The obtained compound was identified by LC-MS and NMR.

$C_{44}H_{30}N_2OS$: $M^+$ found 634.24, Calc. 634.20

$^1H$ NMR ($CDCl_3$, 400 MHz) δ(ppm) 7.81 (d, 1H), 7.72-7.70 (m, 2H), 7.48-7.35 (m, 3H), 7.31-7.26 (m, 4H), 7.15-6.97 (m, 12H), 6.74 (d, 1H), 6.65-6.61 (m, 3H), 6.14-6.10 (m, 4H)

Synthesis Example 4

Synthesis of Compound 70

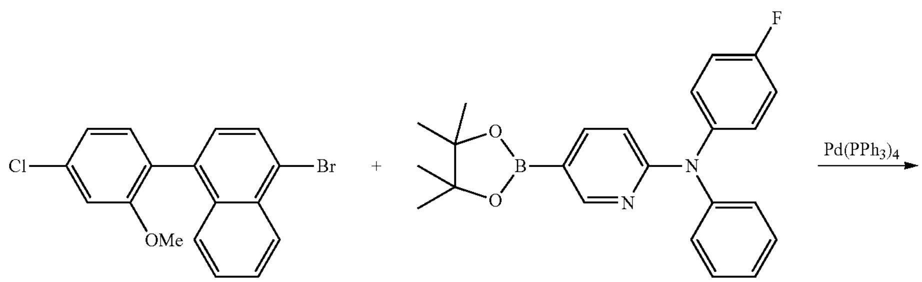

2-2 70-A

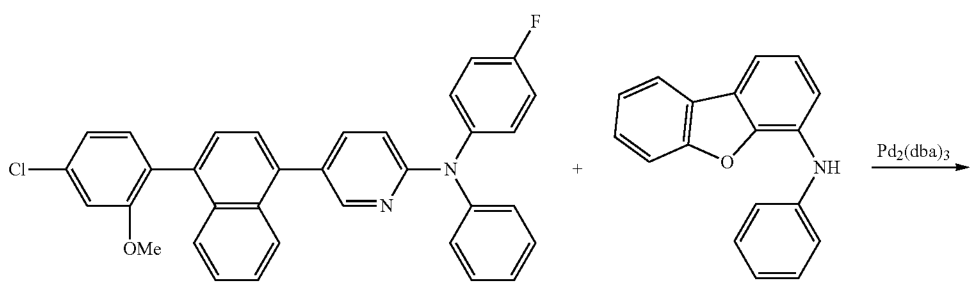

70-2 70-B

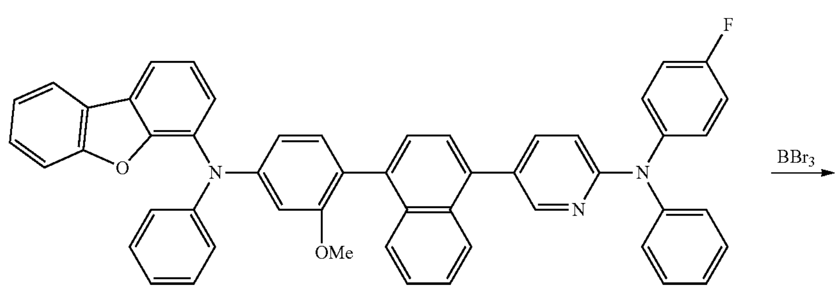

70-3

-continued

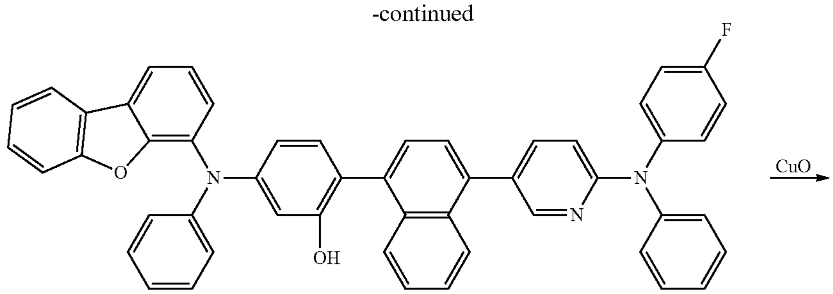

70-4

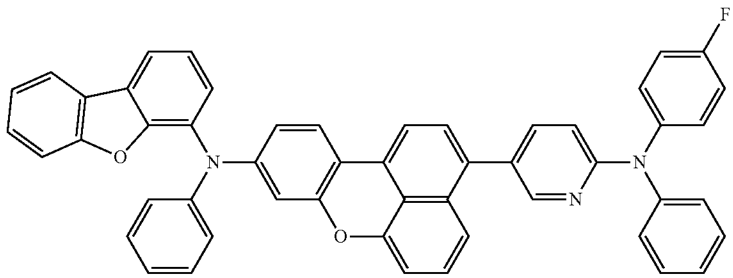

70

Synthesis of Intermediate 70-2

Intermediate 70-2 was prepared in the same manner as used in synthesizing Intermediate 2-2 of Synthesis Example 1, except that Intermediate 70-A and Intermediate 2-2 were respectively used instead of Intermediate 2-1 and 1,4-dibromonaphthalene. The obtained compound was identified by LC-MS.

$C_{30}H_{20}ClFN_2OS$: $M^+$ 514.1

Synthesis of Intermediate 70-3

Intermediate 70-3 was prepared in the same manner as used in synthesizing Intermediate 2-3 of Synthesis Example 1, except that Intermediate 70-B and Intermediate 70-2 were respectively used instead of Compound 2-A and Intermediate 2-2. The obtained compound was identified by LC-MS.

$C_{52}H_{36}FN_3O_2$: $M^+$ 753.2

Synthesis of Intermediate 70-4

Intermediate 70-4 was synthesized in the same manner as in synthesizing Intermediate 2-4 of Synthesis Example 1, except that Intermediate 70-3 was used instead of Intermediate 2-3. The obtained compound was identified by LC-MS.

$C_{51}H_{34}FN_3O_2$: $M^+$ 739.2

Synthesis of Compound 70

Compound 70 (0.73 g, 52% of yield) was synthesized in the same manner as used to synthesize Compound 2 of Synthesis Example 1, except that Intermediate 70-4 was used instead of Intermediate 2-4. The obtained compound was identified by LC-MS and NMR.

$C_{51}H_{32}FN_3O_2$: $M^+$ found 737.26, Calc. 737.24

$^1H$ NMR ($CDCl_3$, 400 MHz) δ(ppm) 8.50 (d, 1H), 8.38 (d, 1H), 8.01 (d, 1H), 7.94 (dd, 1H), 7.84-7.82 (m, 1H), 7.72-7.62 (m, 4H), 7.53-7.40 (m, 3H), 7.25-7.20 (m, 2H), 7.08-6.85 (m, 9H), 6.72-6.61 (m, 6H), 6.48 (dd, 1H), 6.36-6.32 (m, 2H)

Synthesis Example 5

Synthesis of Compound 99

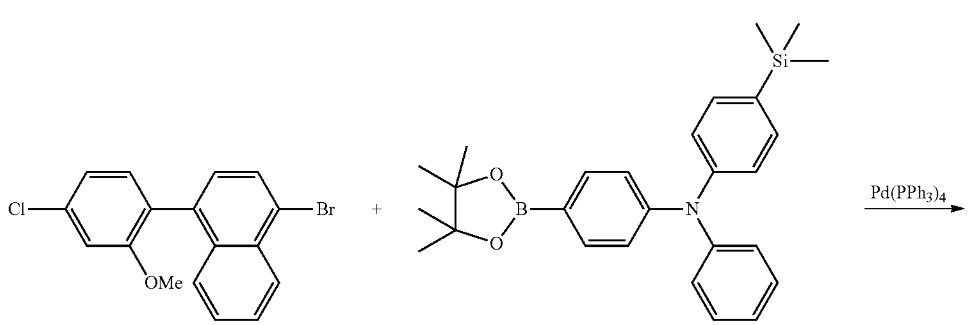

2-2 99-A

-continued

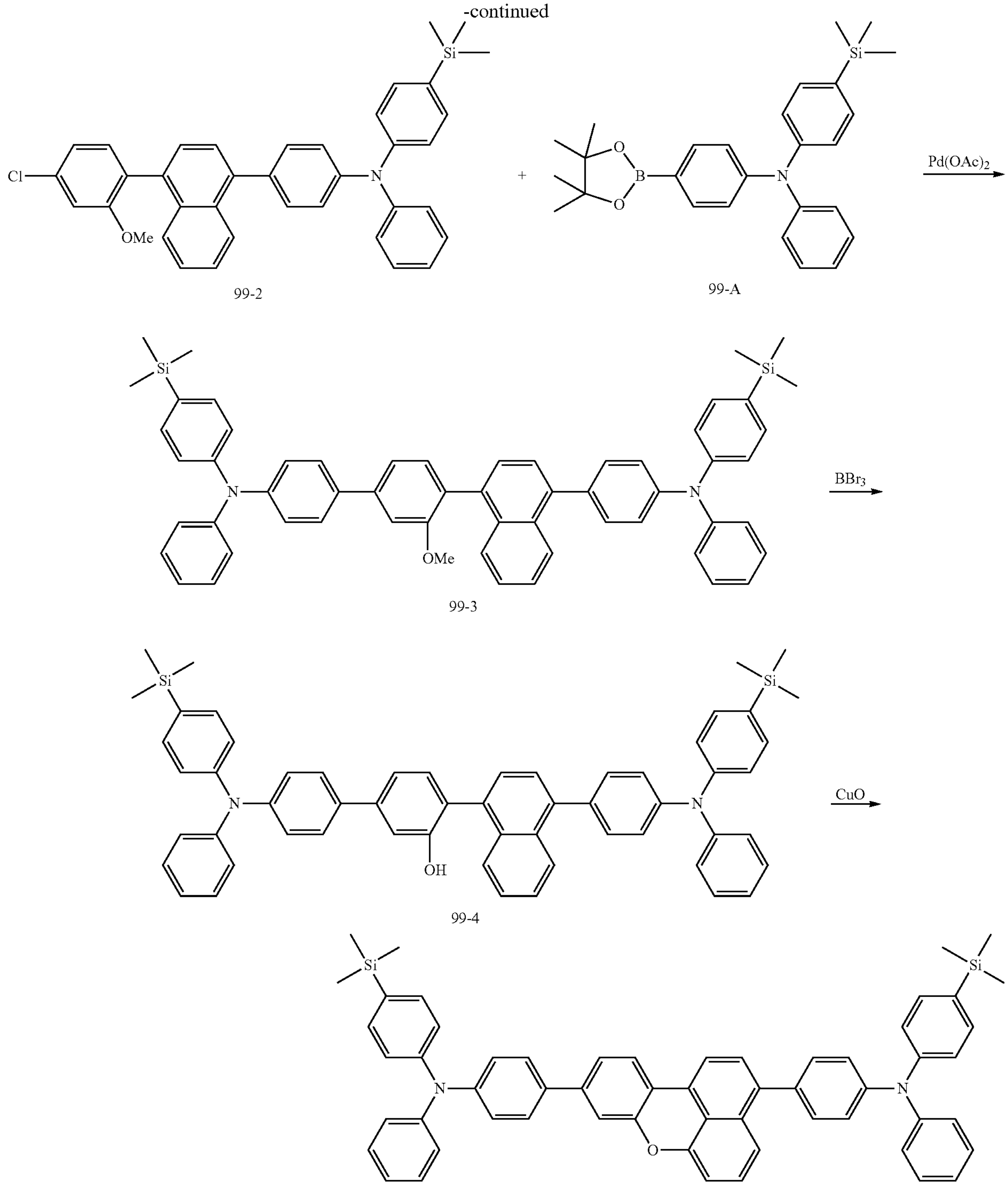

99

Synthesis of Intermediate 99-2

Intermediate 99-2 was prepared in the same manner as used in synthesizing Intermediate 2-2 of Synthesis Example 1, except that Intermediate 99-A and Intermediate 2-2 were respectively used instead of Intermediate 2-1 and 1,4-dibromonaphthalene. The obtained compound was identified by LC-MS.

$C_{38}H_{34}ClNOSi$: $M^+$ 583.2

Synthesis of Intermediate 99-3

Intermediate 99-3 was prepared in the same manner as used in synthesizing Intermediate 54-2 of Synthesis Example 3, except that Intermediate 99-A and Intermediate 99-2 were respectively used instead of Compound 54-A and Intermediate 2-2. The obtained compound was identified by LC-MS.

$C_{59}H_{56}N_2OSi_2$: $M^+$ 864.4

Synthesis of Intermediate 99-4

Intermediate 99-4 was synthesized in the same manner as in synthesizing Intermediate 2-4 of Synthesis Example 1, except that Intermediate 99-3 was used instead of Intermediate 2-3. The obtained compound was identified by LC-MS.

$C_{59}H_{54}N_2OSi_2$: $M^+$ 850.4

Synthesis of Compound 99

Compound 99 (0.87 g, 73% of yield) was synthesized in the same manner as used to synthesize Compound 2 of Synthesis Example 1, except that Intermediate 99-4 was used instead of Intermediate 2-4. The obtained compound was identified by LC-MS and NMR.

$C_{58}H_{52}N_2OSi_2$: $M^+$ found 848.39, Calc. 848.36

$^1H$ NMR ($CDCl_3$, 400 MHz) δ(ppm) 8.37 (d, 1H), 7.97-7.95 (m, 2H), 7.58-7.36 (m, 12H), 7.08-7.03 (m, 4H), 6.95-6.85 (m, 5H), 6.66-6.63 (m, 2H), 6.56-6.53 (m, 4H), 6.23-6.20 (m, 4H), 0.23 (s, 18H)

Synthesis Example 6

Synthesis of Compound 3

Compound 3 (0.63 g, yield: 73%) was obtained in the same manner as in Synthesis Example 1, except that in synthesizing Intermediate 2-3, Intermediate 3-A was used instead of Intermediate 2-A. The obtained compound was identified by LC-MS and NMR.

$C_{48}H_{44}N_2OSi_2$: $M^+$ found 696.32, Calc. 696.29

$^1H$ NMR ($CDCl_3$, 400 MHz) δ(ppm) 7.84 (d, 1H), 7.74 (d, 1H), 7.48-7.46 (m, 1H), 7.41-7.35 (m, 5H), 7.20-7.18 (m, 1H), 7.09-7.01 (m, 4H), 6.90 (d, 1H), 6.75-6.61 (m, 5H), 6.52-6.50 (m, 3H), 6.36-6.33 (m, 2H), 6.20-6.17 (m, 2H), 0.25 (s, 18H)

Intermediate 3-A

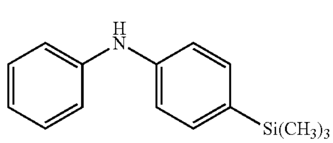

Synthesis Example 7

Synthesis of Compound 4

Compound 4 (0.42 g, yield: 67%) was obtained in the same manner as in Synthesis Example 1, except that in synthesizing Intermediate 2-3, Intermediate 4-A was used instead of Intermediate 2-A. The obtained compound was identified by LC-MS and NMR.

$C_{64}H_{40}N_2O_3$: $M^+$ found 884.32, Calc. 884.30

$^1H$ NMR ($CDCl_3$, 400 MHz) δ(ppm) 7.84-7.79 (m, 3H), 7.74-7.68 (m, 3H), 7.81-7.37 (m, 18H), 7.20-7.12 (m, 5H), 7.03-6.86 (m, 8H), 6.50-6.48 (m, 1H), 6.37 (dd, 1H), 6.28 (d, 1H)

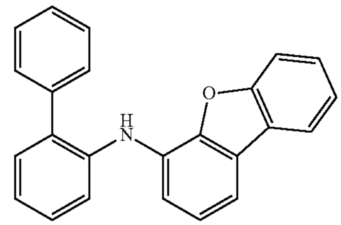 [SMILES: c1ccc(-c2ccccc2Nc2cccc3c2oc2ccccc23)cc1]

Intermediate 4-A

Synthesis Example 8

Synthesis of Compound 8

Compound 8 (0.55 g, yield: 75%) was obtained in the same manner as in Synthesis Example 1, except that in synthesizing Intermediate 2-3, Intermediate 8-A was used instead of Intermediate 2-A. The obtained compound was identified by LC-MS and NMR.

$C_{64}H_{42}N_2OF_2$: $M^+$ found 892.36, Calc. 892.32

$^1H$ NMR ($CDCl_3$, 400 MHz) δ(ppm) 7.84 (d, 1H), 7.72-7.68 (m, 4H), 7.65-7.49 (m, 18H), 7.42-7.37 (m, 3H), 7.20-7.01 (m, 8H), 6.63-6.58 (m, 3H), 6.39 (dd, 1H), 6.26-6.22 (m, 2H), 6.11-6.07 (m, 2H)

Intermediate 8-A

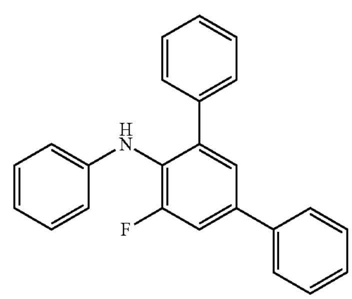 [SMILES: Fc1cc(-c2ccccc2)cc(-c2ccccc2)c1Nc1ccccc1]

Synthesis Example 9

Synthesis of Compound 12

Compound 12 (0.87 g, yield: 56%) was obtained in the same manner as in Synthesis Example 1, except that in synthesizing Intermediate 2-3, Intermediate 12-A was used instead of Intermediate 2-A. The obtained compound was identified by LC-MS and NMR.

$C_{60}H_{42}N_4O$: $M^+$ found 834.36, Calc. 834.33

$^1H$ NMR ($CDCl_3$, 400 MHz) δ(ppm) 7.84 (d, 1H), 7.78-7.75 (m, 3H), 7.57 (d, 1H), 7.50 (d, 1H), 7.43-7.30 (m, 8H), 7.20-7.18 (m, 1H), 7.14-7.08 (m, 4H), 7.02 (d, 1H), 6.90-6.87 (m, 3H), 6.73-6.69 (m, 4H), 6.53-6.50 (m, 3H), 1.61 (s, 12H)

Intermediate 12-A

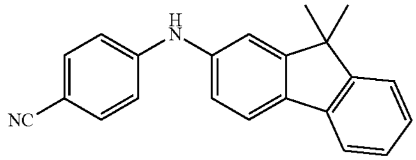 [SMILES: CC1(C)c2ccccc2-c2ccc(Nc3ccc(C#N)cc3)cc21]

Synthesis Example 10

Synthesis of Compound 18

Compound 18 (0.66 g, yield: 74%) was obtained in the same manner as in Synthesis Example 2, except that in synthesizing Intermediate 15-3, Intermediate 18-A was used instead of Intermediate 15-A. The obtained compound was identified by LC-MS and NMR.

$C_{66}H_{48}N_2S$: $M^+$ found 900.39, Calc. 900.35

$^1H$ NMR ($CDCl_3$, 400 MHz) δ(ppm) 7.84 (d, 1H), 7.78-7.48 (m, 17H), 7.43-7.22 (m, 7H), 7.13-7.08 (m, 5H), 6.79-6.74 (m, 2H), 6.66-6.62 (m, 2H), 6.57 (dd, 1H), 6.45 (d, 1H), 1.61 (s, 12H)

Intermediate 18-A

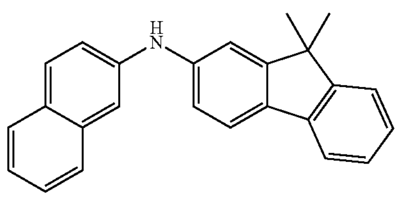 [SMILES: CC1(C)c2ccccc2-c2ccc(Nc3ccc4ccccc4c3)cc21]

Synthesis Example 11

Synthesis of Compound 20

Compound 20 (0.52 g, yield: 70%) was obtained in the same manner as in Synthesis Example 2, except that in synthesizing Intermediate 15-3, Intermediate 8-A was used instead of Intermediate 15-A. The obtained compound was identified by LC-MS and NMR.

$C_{64}H_{42}N_2SF_2$: $M^+$ found 908.33, Calc. 908.30

$^1H$ NMR ($CDCl_3$, 400 MHz) δ(ppm) 7.83 (d, 1H), 7.72-7.68 (m, 4H), 7.65-7.40 (m, 22H), 7.14-6.99 (m, 7H), 6.90-6.88 (m, 1H), 6.57-6.58 (m, 3H), 6.27-6.24 (m, 2H), 6.11-6.07 (m, 2H)

Synthesis Example 12

Synthesis of Compound 21

Compound 21 (0.45 g, yield: 69%) was obtained in the same manner as in Synthesis Example 2, except that in synthesizing Intermediate 15-3, Intermediate 21-A was used instead of Intermediate 15-A. The obtained compound was identified by LC-MS and NMR.

$C_{40}H_{16}N_2D_{10}SF_2$: $M^+$ found 614.27, Calc. 614.24

$^1H$ NMR ($CDCl_3$, 400 MHz) δ(ppm) 7.83 (d, 1H), 7.63 (d, 1H), 7.56-7.53 (m, 2H), 7.43-7.39 (m, 1H), 6.95-6.84 (m, 5H), 6.64-6.60 (m, 2H), 6.55 (dd, 1H), 6.44-6.39 (m, 2H)

Intermediate 21-A

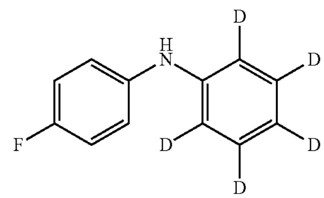 [SMILES: [2H]c1c([2H])c([2H])c(Nc2ccc(F)cc2)c([2H])c1[2H]]

Synthesis Example 13

Synthesis of Compound 26

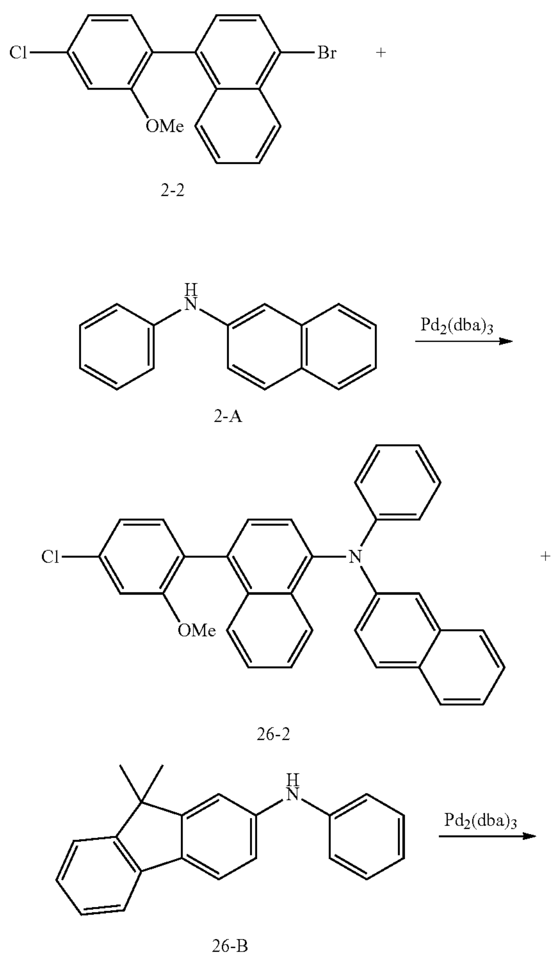

-continued

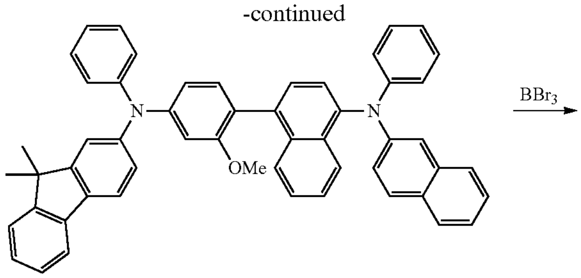

26-3

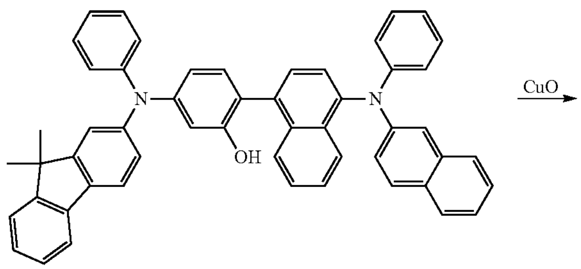

26-4

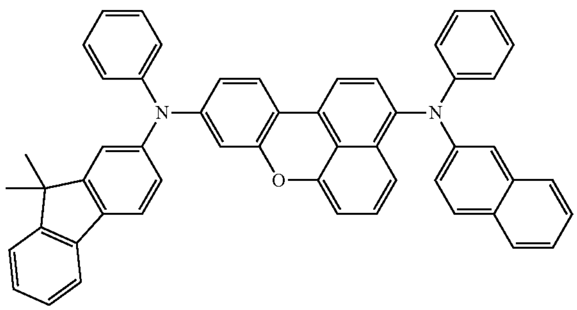

26

Synthesis of Intermediate 26-2

Intermediate 26-2 was synthesized in the same manner as in synthesizing Intermediate 2-3 of Synthesis Example 1, except that an amount of Intermediate 2-A was 20.0 mmol instead of 40.0 mmol.

Synthesis of Intermediate 26-3

Intermediate 26-3 was prepared in the same manner as used in synthesizing Intermediate 2-3 of Synthesis Example 1, except that Intermediate 26-2 (20.0 mmol) and Intermediate 26-B (20.0 mmol) were respectively used instead of Intermediate 2-2 (20.0 mmol) and Intermediate 2-A (40.0 mmol).

Synthesis of Intermediate 26-4

Intermediate 26-4 was synthesized in the same manner as in synthesizing Intermediate 2-4 of Synthesis Example 1, except that Intermediate 26-3 was used instead of Intermediate 2-3.

Synthesis of Intermediate 26

Compound 26 was synthesized in the same manner as used to synthesize Compound 2 of Synthesis Example 1, except that Intermediate 26-4 was used instead of Intermediate 2-4. The obtained compound was identified by LC-MS and NMR.

$C_{53}H_{38}N_2O$: $M^+$ found 718.32, Calc. 718.29

$^1H$ NMR ($CDCl_3$, 400 MHz) δ(ppm) 7.84 (d, 1H), 7.78-7.75 (m, 3H), 7.64 (d, 1H), 7.58-7.55 (m, 3H), 7.43-7.30 (m, 5H), 7.20-7.18 (m, 1H), 7.14-7.02 (m, 6H), 6.86 (dd, 1H), 6.68-6.60 (m, 5H), 6.51-6.48 (m, 2H), 6.34-6.31 (m, 2H), 6.19-6.15 (m, 2H), 1.61 (s, 6H)

Synthesis Example 14

Synthesis of Compound 28

Compound 28 (0.85 g, yield: 69%) was obtained in the same manner as in Synthesis Example 13, except that in synthesizing Intermediate 26-3, Intermediate 4-A was used instead of Intermediate 26-B. The obtained compound was identified by LC-MS and NMR.

$C_{56}H_{36}N_2O_2$: $M^+$ found 768.95, Calc. 768.89

$^1H$ NMR ($CDCl_3$, 400 MHz) δ(ppm) 7.85-7.82 (m, 2H), 7.78-7.70 (m, 3H), 7.64 (d, 1H), 7.60-7.35 (m, 14H), 7.21-6.92 (m, 10H), 6.69-6.61 (m, 2H), 6.49-6.47 (m, 1H), 6.36 (dd, 1H), 6.19-6.16 (m, 2H)

Synthesis Example 15

Synthesis of Compound 31

Compound 31 (0.91 g, yield: 72%) was obtained in the same manner as in Synthesis Example 13, except that in synthesizing Intermediate 26-2, Intermediate 8-A was used instead of Intermediate 2-A, and in synthesizing Intermediate 26-3, diphenylamine was used instead of Intermediate 26-B. The obtained compound was identified by LC-MS and NMR.

$C_{52}H_{35}N_2OF$: $M^+$ found 722.30, Calc. 722.27

$^1H$ NMR ($CDCl_3$, 400 MHz) δ(ppm) 7.84 (d, 1H), 7.75-7.70 (m, 3H), 7.65-7.49 (m, 9H), 7.44-7.37 (m, 2H), 7.20-7.18 (m, 1H), 7.09-7.01 (m, 8H), 6.73-6.72 (m, 1H), 6.66-6.58 (m, 3H), 6.47 (dd, 1H), 6.30-6.26 (m, 4H), 6.11-6.07 (m, 2H)

Synthesis Example 16

Synthesis of Compound 35

Compound 35 (0.45 g, yield: 52%) of was obtained in the same manner as in Synthesis Example 13, except that in synthesizing Intermediate 26-2, Intermediate 8-A was used instead of Intermediate 2-A, and in synthesizing Intermediate 26-3, Intermediate 35-B was used instead of Intermediate 26-B. The obtained compound was identified by LC-MS and NMR.

$C_{62}H_{40}N_2OF_2$: $M^+$ found 866.35, Calc. 866.31

$^1H$ NMR ($CDCl_3$, 400 MHz) δ(ppm) 7.92 (d, 1H), 7.85-7.70 (m, 6H), 7.65-7.49 (m, 11H), 7.44-7.37 (m, 2H), 7.25-

7.00 (m, 10H), 6.88-6.87 (m, 1H), 6.72-6.54 (m, 4H), 6.48-6.45 (m, 2H), 6.40-6.37 (m, 1H), 6.11-6.08 (m, 2H)

Intermediate 35-B

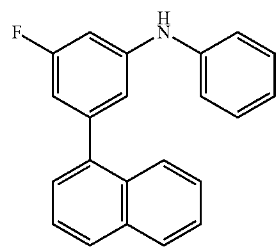 [SMILES: Fc1cc(Nc2ccccc2)cc(-c2cccc3ccccc23)c1]

Synthesis Example 17

Synthesis of Compound 38

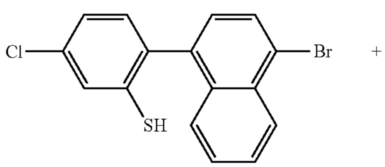

15-2

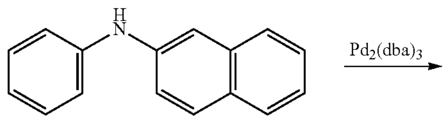

2-A

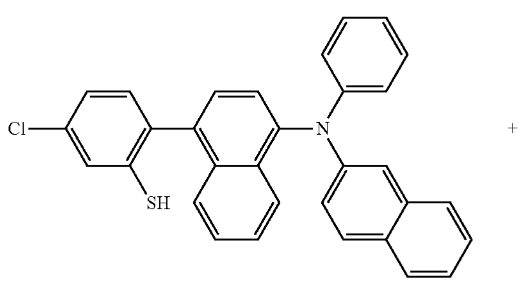

38-2

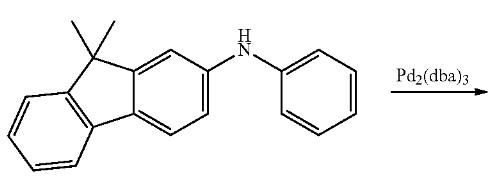

26-B

-continued

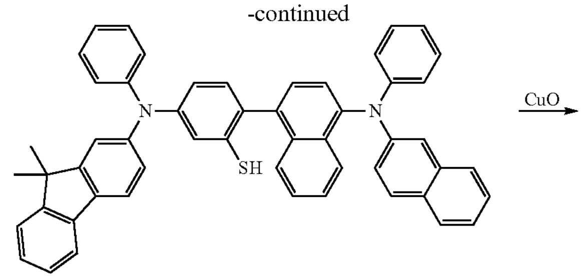

38-3

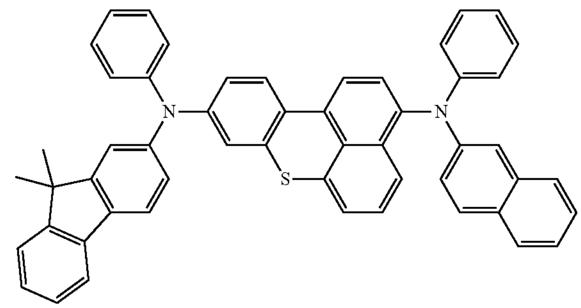

38

Synthesis of Intermediate 38-2

Intermediate 38-2 was prepared in the same manner as used in synthesizing Intermediate 2-3 of Synthesis Example 1, except that Intermediate 15-2 (20.0 mmol) and Intermediate 2-A (20.0 mmol) were respectively used instead of Intermediate 2-2 (20.0 mmol) and Intermediate 2-A (40.0 mmol).

Synthesis of Intermediate 38-3

Intermediate 38-3 was prepared in the same manner as used in synthesizing Intermediate 2-3 of Synthesis Example 1, except that Intermediate 38-2 (20.0 mmol) and Intermediate 26-B (20.0 mmol) were respectively used instead of Intermediate 2-2 (20.0 mmol) and Intermediate 2-A (40.0 mmol).

Synthesis of Intermediate 38

Compound 38 (0.65 g, yield: 69%) was synthesized in the same manner as used to synthesize Compound 2 of Synthesis Example 1, except that Intermediate 38-3 was used instead of Intermediate 2-4. The obtained compound was identified by LC-MS and NMR.

$C_{53}H_{38}N_2S$: $M^+$ found 734.31, Calc. 734.27

$^1H$ NMR ($CDCl_3$, 400 MHz) δ(ppm) 7.83 (d, 1H), 7.78-7.75 (m, 2H), 7.66-7.63 (m, 2H), 7.58-7.48 (m, 6H), 7.44-7.30 (m, 3H), 7.26-7.24 (m, 1H), 7.14-7.07 (m, 7H), 6.85 (d, 1H), 6.75 (dd, 1H), 6.67-6.60 (m, 3H), 6.53 (dd, 1H), 6.38-6.34 (m, 2H), 6.19-6.15 (m, 2H), 1.61 (s, 6H)

Synthesis Example 18

Synthesis of Compound 40

Compound 40 (0.87 g, yield: 72%) was obtained in the same manner as in Synthesis Example 17, except that in synthesizing intermediate 38-3, Intermediate 4-A was used instead of Intermediate 26-B. The obtained compound was identified by LC-MS and NMR.

$C_{56}H_{36}N_2OS$: $M^+$ found 784.30, Calc. 784.25

$^1H$ NMR ($CDCl_3$, 400 MHz) δ(ppm) 7.84-7.70 (m, 4H), 7.66-7.38 (m, 17H), 7.21-6.93 (m, 10H), 6.87 (d, 1H), 6.64-6.62 (m, 1H), 6.31 (dd, 1H), 6.19-6.16 (m, 2H)

Synthesis Example 19

Synthesis of Compound 43

Compound 43 (0.75 g, yield: 63%) was obtained in the same manner as in Synthesis Example 17, except that in synthesizing Intermediate 38-2, Intermediate 8-A was used instead of Intermediate 2-A, and in synthesizing Intermediate 38-3, diphenylamine was used instead of Intermediate 26-B. The obtained compound was identified by LC-MS and NMR.

$C_{52}H_{35}N_2SF$: $M^+$ found 738.31, Calc. 738.25

$^1H$ NMR ($CDCl_3$, 400 MHz) δ(ppm) 7.83 (d, 1H), 7.72-7.70 (m, 2H), 7.65-7.40 (m, 13H), 7.09-7.01 (m, 8H), 6.87 (d, 1H), 6.67-6.58 (m, 3H), 6.53 (dd, 1H), 6.33-6.29 (m, 4H), 6.11-6.08 (m, 2H)

Synthesis Example 20

Synthesis of Compound 45

Compound 45 (0.77 g, yield: 53%) of was obtained in the same manner as in Synthesis Example 17, except that in synthesizing Intermediate 38-2, Intermediate 45-A was used instead of Intermediate 2-A, and in synthesizing Intermediate 38-3, Intermediate 3-A was used instead of Intermediate 26-B. The obtained compound was identified by LC-MS and NMR.

$C_{59}H_{45}N_2SFSi$: $M^+$ found 860.33, Calc. 860.30

$^1H$ NMR ($CDCl_3$, 400 MHz) δ(ppm) 7.84 (d, 1H), 7.78-7.76 (m, 1H), 7.71-7.69 (m, 2H), 7.65-7.49 (m, 14H), 7.44-7.36 (m, 6H), 7.11-7.00 (m, 5H), 6.86 (d, 1H), 6.72-6.63 (m, 3H), 6.53 (dd, 1H), 6.40-6.38 (m, 2H), 0.24 (s, 9H)

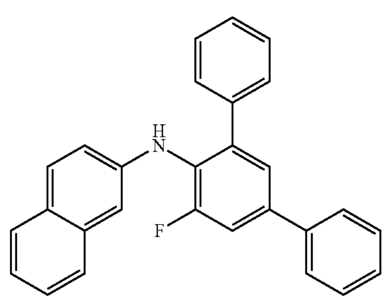 [SMILES: Fc1cc(-c2ccccc2)cc(-c2ccccc2)c1Nc1ccc2ccccc2c1]

Intermediate 45-A

Synthesis Example 21

Synthesis of Compound 48

Compound 48 (0.92 g, yield: 78%) of was obtained in the same manner as in Synthesis Example 17, except that in synthesizing Intermediate 38-2, Intermediate 8-A was used instead of Intermediate 2-A, and in synthesizing Intermediate 38-3, Intermediate 48-B was used instead of Intermediate 26-B. The obtained compound was identified by LC-MS and NMR.

$C_{58}H_{39}N_2SF$: $M^+$ found 814.32, Calc. 814.28

$^1H$ NMR ($CDCl_3$, 400 MHz) δ(ppm) 7.84 (d, 1H), 7.72-7.70 (m, 2H), 7.65-7.38 (m, 19H), 7.07-7.01 (m, 7H), 6.86 (d, 1H), 6.68-6.54 (m, 5H), 6.40-6.36 (m, 2H), 6.11-6.07 (m, 2H)

Intermediate 48-B

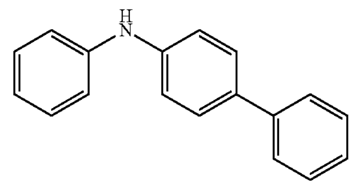 [SMILES: c1ccc(Nc2ccc(-c3ccccc3)cc2)cc1]

Synthesis Example 22

Synthesis of Compound 50

Compound 50 (0.88 g, yield: 69%) was obtained in the same manner as in Synthesis Example 3, except that i) in synthesizing Intermediate 54-1, N-phenylnaphthalene-2-amine and 2,5-dibromopyridin were respectively used instead of diphenylamine and 2,5-dibromothiophene, and ii) in synthesizing Intermediate 54-3, Intermediate 2-A was used instead of diphenylamine. The obtained compound was identified by LC-MS and NMR.

$C_{53}H_{35}N_3O$: $M^+$ found 729.30, Calc. 729.27

$^1H$ NMR ($CDCl_3$, 400 MHz) δ(ppm) 8.39 (d, 1H), 7.92-7.80 (m, 2H), 7.82-7.48 (m, 17H), 7.26-7.21 (m, 2H), 7.13-6.91 (m, 6H), 6.79 (d, 1H), 6.69-6.61 (m, 4H), 6.18-6.15 (m, 2H)

Synthesis Example 23

Synthesis of Compound 55

Compound 55 (0.76 g, yield: 85%) was obtained in the same manner as in Synthesis Example 3, except that i) in synthesizing Intermediate 54-1, Intermediate 26-B and 1,4-dibromobenzene were respectively used instead of diphenylamine and 2,5-dibromothiophene, and ii) in synthesizing Intermediate 54-3, Intermediate 2-A was used instead of diphenylamine. The obtained compound was identified by LC-MS and NMR.

$C_{59}H_{42}N_2O$: $M^+$ found 794.35, Calc. 794.32

$^1H$ NMR ($CDCl_3$, 400 MHz) δ(ppm) 7.85 (d, 1H), 7.82-7.76 (m, 3H), 7.64 (d, 1H), 7.57-7.52 (m, 4H), 7.48-7.46 (m, 2H), 7.43-7.30 (m, 6H), 7.14-7.03 (m, 7H), 6.98 (dd, 1H), 6.69-6.61 (m, 4H), 6.50-6.46 (m, 2H), 6.39-6.38 (m, 1H), 6.24-6.17 (m, 4H), 1.61 (s, 6H)

Synthesis Example 24

Synthesis of Compound 58

Compound 58 (0.73 g, yield: 75%) was obtained in the same manner as in Synthesis Example 3, except that i) in synthesizing Intermediate 54-1, N-phenylnaphthalene-2-amine and 1,4-dibromo-2,3,5,6-tetrafluorobenzene were respectively used instead of diphenylamine and 2,5-dibromothiophene and ii) in synthesizing Intermediate 54-3, Intermediate 70-B was used instead of diphenylamine. The obtained compound was identified by LC-MS and NMR.

$C_{56}H_{32}N_2O_2F_4$: $M^+$ found 840.30, Calc. 840.24

$^1$H NMR ($CDCl_3$, 400 MHz) δ(ppm) 8.18 (d, 1H), 7.84-7.68 (m, 6H), 7.59-7.54 (m, 4H), 7.48-7.35 (m, 6H), 7.13-6.91 (m, 7H), 6.81 (d, 1H), 6.63-6.60 (m, 3H), 6.41-6.38 (m, 2H), 6.25-6.20 (m, 2H)

Synthesis Example 25

Synthesis of Compound 61

Compound 61 (0.46 g, yield: 55%) was obtained in the same manner as in Synthesis Example 4, except that i) in synthesizing Intermediate 70-2, Intermediate 61-A was used instead of Intermediate 70-A, and ii) in synthesizing intermediate 70-3, diphenylamine was used instead of Intermediate 70-B. The obtained compound was identified by LC-MS and NMR.

$C_{45}H_{31}N_3O$: $M^+$ found 629.27, Calc. 629.24

$^1$H NMR ($CDCl_3$, 400 MHz) δ(ppm) 8.49 (d, 1H), 8.38 (d, 1H), 8.01 (d, 1H), 7.94 (dd, 1H), 7.70-7.59 (m, 3H), 7.25-7.20 (m, 4H), 7.09-7.04 (m, 5H), 6.95-6.85 (m, 3H), 6.73 (d, 1H), 6.66-6.57 (m, 6H), 6.48 (dd, 1H), 6.34-6.26 (m, 4H)

Intermediate 61-A

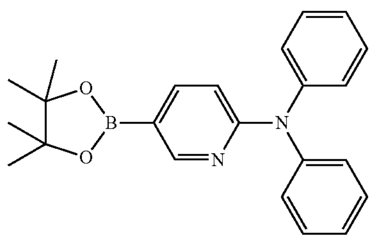 [SMILES: CC1(C)OB(c2ccc(N(c3ccccc3)c3ccccc3)nc2)OC1(C)C]

Synthesis Example 26

Synthesis of Compound 63

Compound 63 (0.42 g, yield: 53%) was obtained in the same manner as in Synthesis Example 4, except that i) in synthesizing Intermediate 70-2, Intermediate 63-A was used instead of Intermediate 70-A, and ii) in synthesizing Intermediate 70-3, intermediate 26-B was used instead of Intermediate 70-B. The obtained compound was identified by LC-MS and NMR.

$C_{68}H_{50}N_2O$: $M^+$ found 910.45, Calc. 910.39

$^1$H NMR ($CDCl_3$, 400 MHz) δ(ppm) 8.43 (d, 1H), 7.84 (d, 1H), 7.78-7.76 (m, 2H), 7.67-7.47 (m, 8H), 7.36-7.30 (m, 2H), 7.19-7.02 (m, 11H), 6.85 (dd, 1H), 6.69-6.62 (m, 4H), 6.53-6.48 (m, 3H), 6.37-6.31 (m, 3H), 6.12-6.09 (m, 2H), 1.61 (s, 12H)

Intermediate 63-A

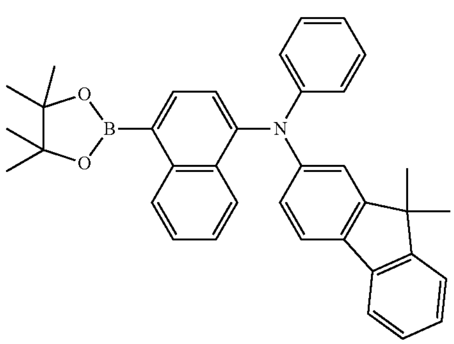

Synthesis Example 27

Synthesis of Compound 66

Compound 66 (0.96 g, yield: 76%) was obtained in the same manner as in Synthesis Example 4, except that i) in synthesizing Intermediate 70-2, Intermediate 66-A was used instead of Intermediate 70-A, and ii) in synthesizing Intermediate 70-3, diphenylamine was used instead of Intermediate 70-B. The obtained compound was identified by LC-MS and NMR.

$C_{52}H_{40}N_2O$: $M^+$ found 743.36, Calc. 743.31

$^1$H NMR ($CDCl_3$, 400 MHz) δ(ppm) 8.17 (d, 1H), 7.86-7.75 (m, 4H), 7.61-7.52 (m, 3H), 7.44 (d, 1H), 7.09-7.00 (m, 9H), 6.73-6.71 (m, 1H), 6.66-6.60 (m, 5H), 6.48 (dd, 1H), 6.38-6.36 (m, 1H), 6.30-6.25 (m, 4H), 6.16-6.13 (m, 4H), 1.63 (s, 6H)

Intermediate 66-A

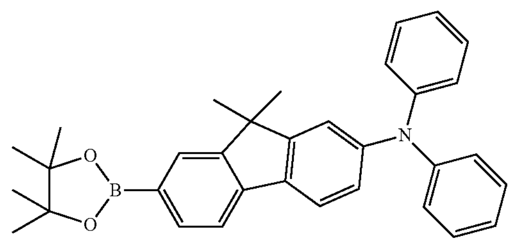 [SMILES: CC1(C)c2cc(B3OC(C)(C)C(C)(C)O3)ccc2-c2ccc(N(c3ccccc3)c3ccccc3)cc21]

Synthesis Example 28

Synthesis of Compound 72

Compound 72 (0.87 g, yield: 75%) was obtained in the same manner as in Synthesis Example 4, except that i) in synthesizing Intermediate 70-2, Intermediate 72-A was used instead of Intermediate 70-A, and ii) in synthesizing Intermediate 70-3, Intermediate 35-B was used instead of Intermediate 70-B. The obtained compound was identified by LC-MS and NMR.

$C_{60}H_{39}N_2OF$: $M^+$ found 822.35, Calc. 822.30

$^1$H NMR ($CDCl_3$, 400 MHz) δ(ppm) 8.32 (d, 1H), 7.96 (d, 1H), 7.92 (d, 1H), 7.84 (d, 1H), 7.76-7.73 (m, 2H), 7.70 (dd, 1H), 7.66-7.38 (m, 11H), 7.25-6.94 (m, 11H), 6.88-6.86 (m, 1H), 6.72-6.63 (m, 3H), 6.55-6.53 (m, 1H), 6.48-6.45 (m, 2H), 6.40-6.37 (m, 1H), 6.25-6.22 (m, 2H)

Intermediate 72-A

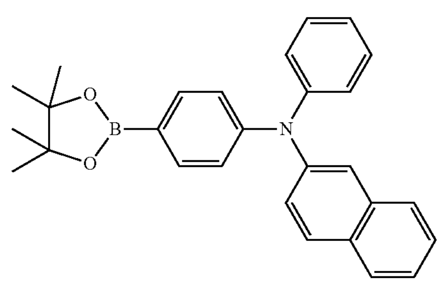 [SMILES: CC1(C)OB(c2ccc(N(c3ccccc3)c3ccc4ccccc4c3)cc2)OC1(C)C]

Synthesis Example 29
Synthesis of Compound 75
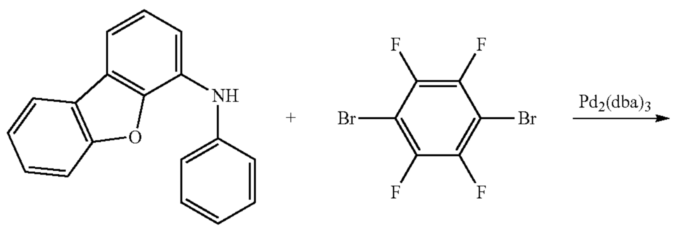
70-B
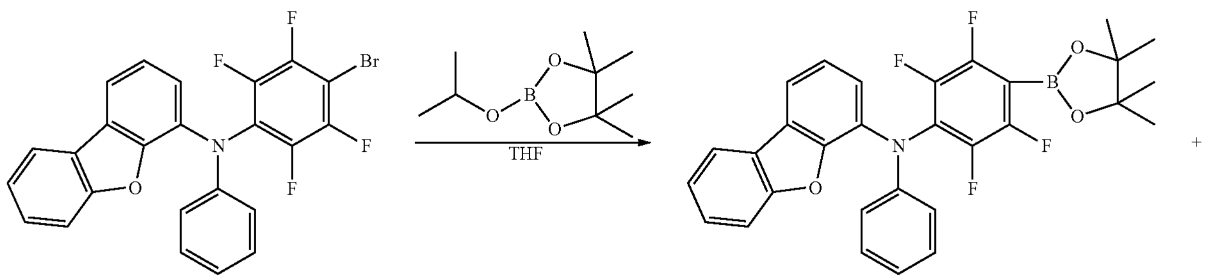
75-1
75-A
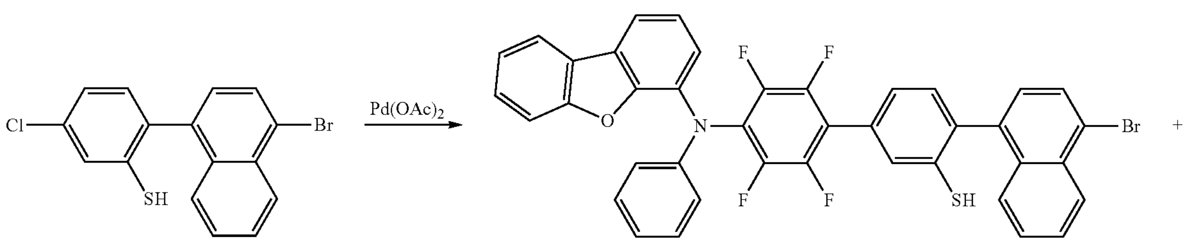
15-2
75-2
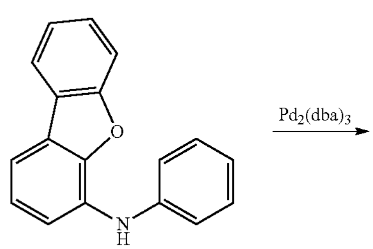
70-B
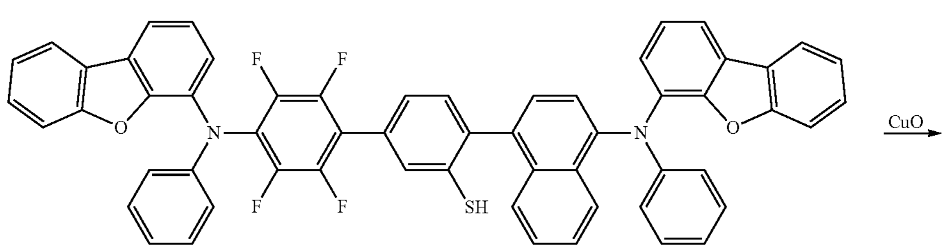
75-3

-continued

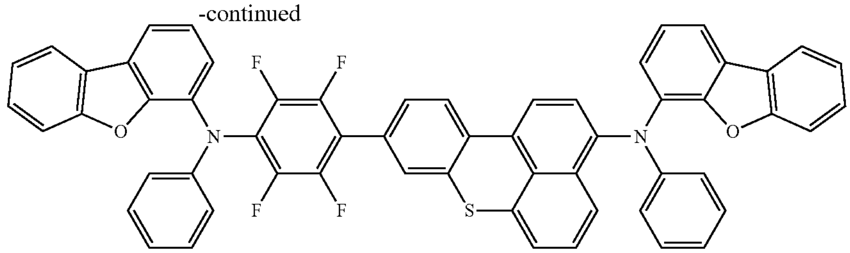

75

Synthesis of Intermediate 75-1

Intermediate 75-1 was prepared in the same manner as used in synthesizing Intermediate 54-1 of Synthesis Example 3, except that Intermediate 70-B and 1,4-dibromo-2,3,5,6-tetrafluorobenzene were respectively used instead of diphenylamine and 2,5-dibromothiophene.

Synthesis of Intermediate 75-A

Intermediate 75-A was synthesized in the same manner as in synthesizing Intermediate 54-A of Synthesis Example 3, except that Intermediate 75-1 was used instead of Intermediate 54-1.

Synthesis of Intermediate 75-2

Intermediate 75-2 was prepared in the same manner as used in synthesizing Intermediate 54-2 of Synthesis Example 3, except that Intermediate 75-A and Intermediate 15-2 were respectively used instead of Compound 54-A and Intermediate 2-2.

Synthesis of Intermediate 75-3

Intermediate 75-3 was prepared in the same manner as used in synthesizing Intermediate 54-3 of Synthesis Example 3, except that Intermediate 75-2 and Intermediate 70-B were respectively used instead of Intermediate 54-2 and Intermediate 54-B.

Synthesis of Compound 75

Compound 75 (0.69 g, yield: 73%) was synthesized in the same manner as used to synthesize Compound 54 of Synthesis Example 3, except that Intermediate 75-3 was used instead of Intermediate 54-4. The obtained compound was identified by LC-MS and NMR.

$C_{58}H_{32}N_2O_2SF_4$: $M^+$ found 896.31, Calc. 896.25

$^1H$ NMR ($CDCl_3$, 400 MHz) δ(ppm) 8.32 (d, 1H), 8.14-8.12 (m, 1H), 7.84-7.74 (m, 7H), 7.63-7.55 (m, 4H), 7.48-7.39 (m, 5H), 7.12-6.91 (m, 8H), 6.63-6.58 (m, 2H), 6.45-6.42 (m, 2H), 6.25-6.22 (m, 2H)

Synthesis Example 30

Synthesis of Compound 80

Compound 80 (0.637 g, yield: 55%) was synthesized in the same manner as in Synthesis Example 29, except that I) in synthesizing Intermediate 75-1, N-(perfluorophenyl)naphthalene-2-amine and 2,5-dibromopyridin were respectively used instead of Intermediate 70-B and 1,4-dibromo-2,3,5,6-tetrafluorobenzene, and ii) in synthesizing Intermediate 75-3, Intermediate 2-A was used instead of Intermediate 70-B. The obtained compound was identified by LC-MS and NMR.

$C_{53}H_{30}N_3SF_5$: $M^+$ found 835.24, Calc. 835.20

$^1H$ NMR ($CDCl_3$, 400 MHz) δ(ppm) 8.45 (d, 1H), 8.14-8.13 (m, 1H), 7.94 (d, 1H), 7.87 (dd, 1H), 7.81-7.73 (m, 5H), 7.68-7.48 (m, 9H), 7.43-7.38 (m, 3H), 7.13-7.02 (m, 4H), 6.85 (d, 1H), 6.72 (d, 1H), 6.65-6.61 (m, 1H), 6.18-6.16 (m, 1H)

Synthesis Example 31

Synthesis of Compound 83

Compound 83 (0.71 g, yield: 79%) was synthesized in the same manner as in Synthesis Example 29, except that i) in synthesizing Intermediate 75-1, N-phenylnaphthalene-2-amine and 1,4-dibromobenzene were respectively used instead of Intermediate 70-B and 1,4-dibromo-2,3,5,6-tetrafluorobenzene, and ii) in synthesizing Intermediate 75-3, Intermediate 35-B was used instead of Intermediate 70-B. The obtained compound was identified by LC-MS and NMR.

$C_{60}H_{39}N_2SF$: $M^+$ found 838.31, Calc. 838.28

$^1H$ NMR ($CDCl_3$, 400 MHz) δ(ppm) 8.09 (d, 1H), 7.95 (d, 1H), 7.91 (d, 1H), 7.86 (d, 1H), 7.81-7.74 (m, 3H), 7.66-7.51 (m, 9H), 7.47-7.40 (m, 4H), 7.25-7.03 (m, 8H), 6.91 (d, 1H), 6.82-6.80 (m, 1H), 6.66-6.62 (m, 4H), 6.40 (dt, 1H), 6.30-6.22 (m, 4H)

Synthesis Example 32

Synthesis of Compound 85

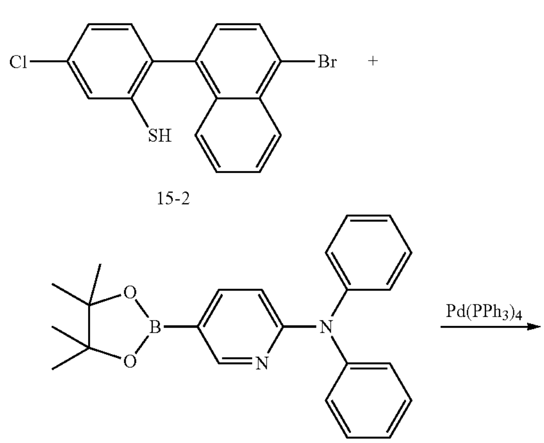

15-2

61-A

-continued

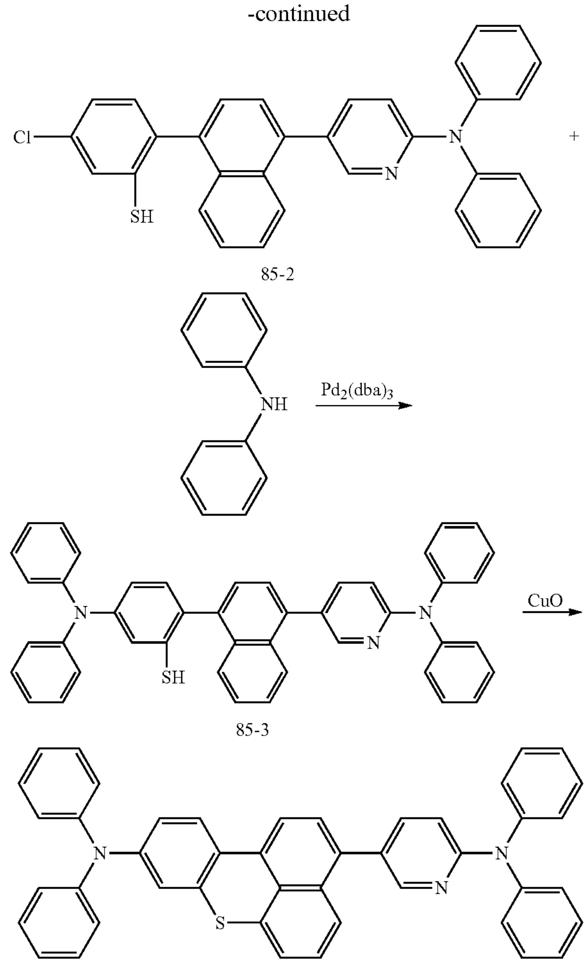

85-2

85-3

85

Synthesis of Intermediate 85-2

Intermediate 85-2 was prepared in the same manner as used in synthesizing Intermediate 70-2 of Synthesis Example 4, except that Intermediate 15-2 and Intermediate 61-A were respectively used instead of Intermediate 2-2 and Intermediate 70-A.

Synthesis of Intermediate 85-3

Intermediate 85-3 was prepared in the same manner as used in synthesizing Intermediate 70-3 of Synthesis Example 4, except that Intermediate 85-2 and diphenylamine were respectively used instead of Intermediate 70-2 and Intermediate 70-B.

Synthesis of Compound 85

Compound 85 (0.74 g, 68% of yield) was synthesized in the same manner as used to synthesize Compound 70 of Synthesis Example 4, except that Intermediate 85-3 was used instead of Intermediate 70-4. The obtained compound was identified by LC-MS and NMR.

$C_{45}H_{31}N_3S$: $M^+$ found 645.25, Calc. 645.22

$^1$H NMR ($CDCl_3$, 400 MHz) δ(ppm) 8.49 (d, 1H), 8.27 (d, 1H), 8.05 (d, 1H), 7.94-7.92 (m, 2H), 7.81-7.77 (m, 2H), 7.69-7.65 (m, 1H), 7.26-7.20 (m, 4H), 7.09-7.04 (m, 4H), 6.95-6.85 (m, 4H), 6.66-6.50 (m, 7H), 6.33-6.29 (m, 4H)

Synthesis Example 33

Synthesis of Compound 90

Compound 90 (0.63 g, yield: 70%) was obtained in the same manner as in Synthesis Example 31, except that in synthesizing Intermediate 85-2, Intermediate 66-A was used instead of Intermediate 61-A. The obtained compound was identified by LC-MS and NMR.

$C_{55}H_{40}N_2S$: $M^+$ found 760.33, Calc. 760.29

$^1$H NMR ($CDCl_3$, 400 MHz) δ(ppm) 8.13 (d, 1H), 7.93 (d, 1H), 7.83-7.75 (m, 4H), 7.64-7.60 (m, 3H), 7.53 (d, 1H), 7.09-7.04 (m, 8H), 6.87-6.86 (m, 1H), 6.67-6.63 (m, 5H), 6.54 (dd, 1H), 6.39-6.37 (m, 1H), 6.33-6.29 (m, 4H), 6.16-6.13 (m, 4H), 1.63 (s, 6H)

Synthesis Example 34

Synthesis of Compound 91

Compound 91 (0.49 g, yield: 56%) was obtained in the same manner as in Synthesis Example 32, except that i) in synthesizing Intermediate 85-2, Intermediate 91-A was used instead of Intermediate 61-A, and ii) in synthesizing Intermediate 85-3, Intermediate 2-A was used instead of diphenylamine. The obtained compound was identified by LC-MS and NMR.

$C_{53}H_{30}N_3SF_5$: $M^+$ found 835.25, Calc. 835.20

$^1$H NMR ($CDCl_3$, 400 MHz) δ(ppm) 8.54 (d, 1H), 8.27 (d, 1H), 8.07 (d, 1H), 8.00-7.95 (m, 2H), 7.81-7.54 (m, 13H), 7.41-7.38 (m, 2H), 7.12-7.05 (m, 3H), 6.99 (d, 1H), 6.99-6.96 (m, 2H), 6.66-6.62 (m, 1H), 6.53 (dd, 1H), 6.36-6.34 (m, 2H)

Intermediate 91-A

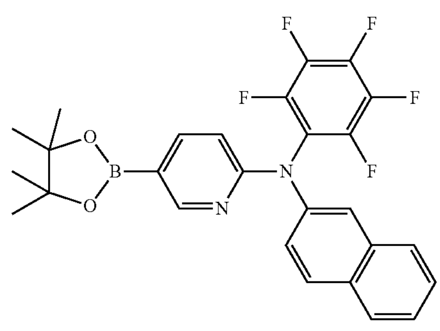 [SMILES: CC1(C)OB(c2ccc(N(c3ccc4ccccc4c3)c3c(F)c(F)c(F)c(F)c3F)nc2)OC1(C)C]

Synthesis Example 35

Synthesis of Compound 98

Compound 98 (0.50 g, yield: 48%) was obtained in the same manner as in Synthesis Example 5, except that i) in synthesizing Intermediate 99-2, Intermediate 98-A was used instead of Intermediate 99-A, and ii) in synthesizing Intermediate 99-3, Intermediate 98-A was used instead of Intermediate 99-A. The obtained compound was identified by LC-MS and NMR.

$C_{60}H_{40}N_2O$: $M^+$ found 804.33, Calc. 804.31

$^{1}$H NMR ($CDCl_3$, 400 MHz) δ(ppm) 8.37 (d, 1H), 7.97-7.95 (m, 2H), 7.78-7.76 (m, 2H), 7.65 (d, 1H), 7.57-7.38 (m, 17H), 7.13-7.04 (m, 6H), 6.98-6.89 (m, 3H), 6.66-6.63 (m, 2H), 6.56-6.52 (m, 2H), 6.24-6.20 (m, 4H)

Intermediate 98-A

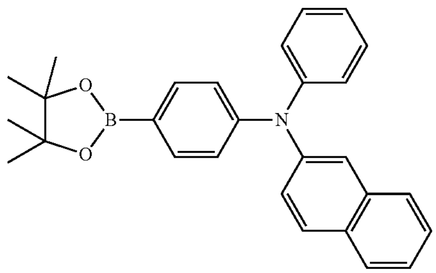 [SMILES: CC1(C)OB(c2ccc(N(c3ccccc3)c3ccc4ccccc4c3)cc2)OC1(C)C]

Synthesis Example 36

Synthesis of Compound 106

Compound 106 (0.87 g, yield: 79%) was obtained in the same manner as in Synthesis Example 5, except that i) in synthesizing Intermediate 99-2, Intermediate 106-A was used instead of Intermediate 99-A, and ii) in synthesizing Intermediate 99-3, Intermediate 106-B was used instead of Intermediate 99-A. The obtained compound was identified by LC-MS and NMR.

$C_{53}H_{38}N_3OF$: $M^+$ found 751.33, Calc. 751.29

$^{1}$H NMR ($CDCl_3$, 400 MHz) δ(ppm) 8.38-8.34 (m, 2H), 8.00-7.95 (m, 2H), 7.85 (dd, 1H), 7.58-7.44 (m, 6H), 7.10-6.85 (m, 12H), 6.75-6.72 (m, 4H), 6.65 (dt, 1H), 6.48-6.44 (m, 2H), 6.23-6.20 (m, 2H), 1.93 (s, 6H)

Intermediate 106-A

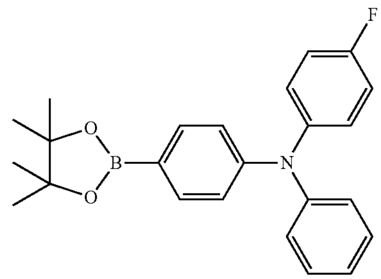

Intermediate 106-B

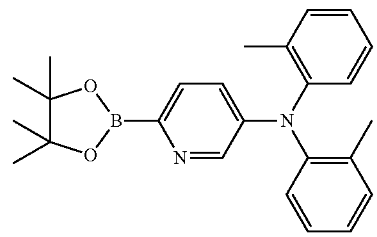

Synthesis Example 37

Synthesis of Compound 114

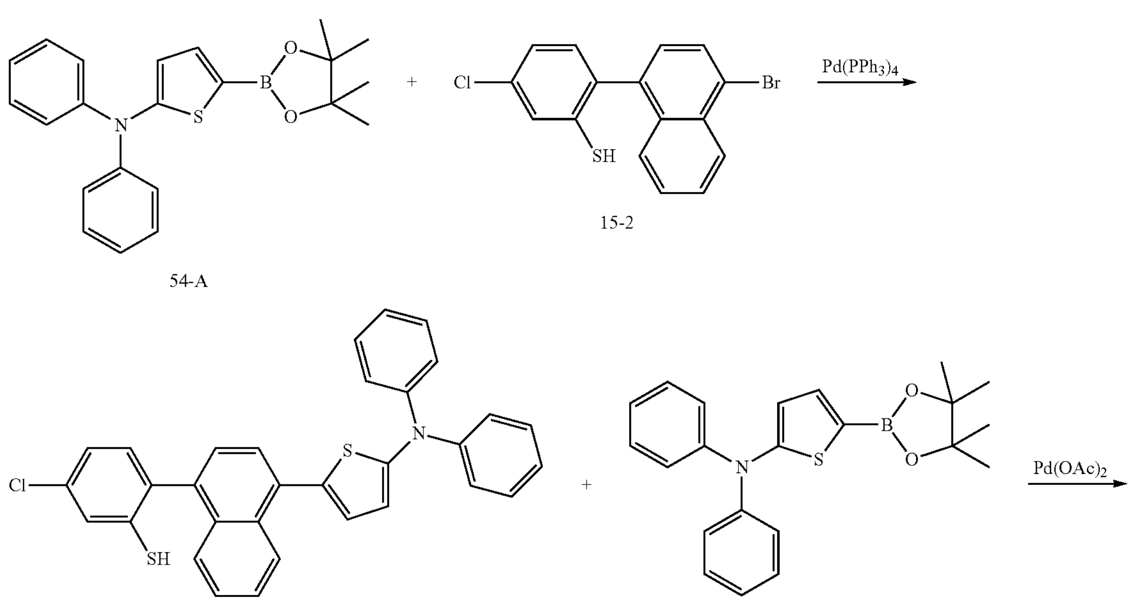

-continued

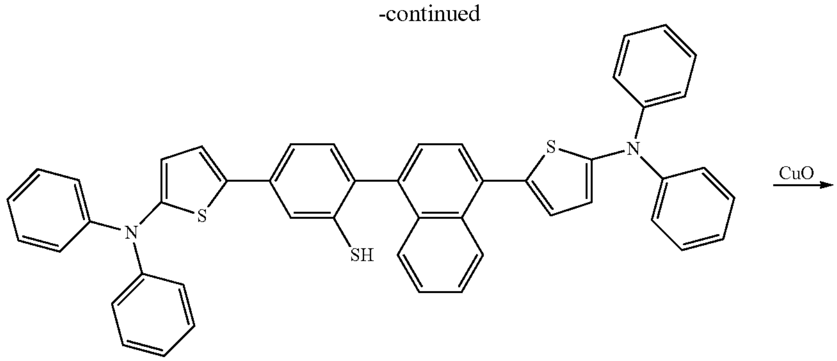

114-3

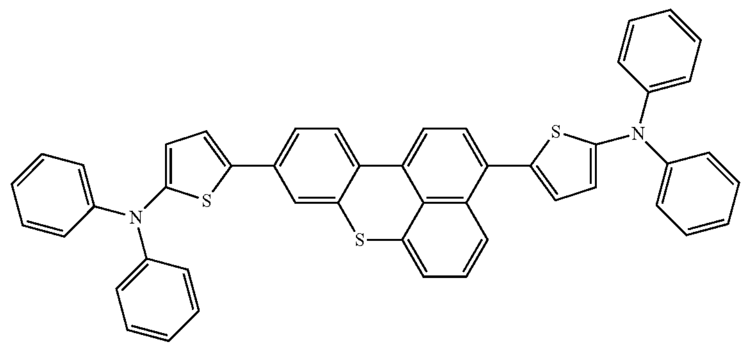

114

Synthesis of Intermediate 114-2

Intermediate 114-2 was prepared in the same manner as used in synthesizing Intermediate 99-2 of Synthesis Example 5, except that Intermediate 15-2 and Intermediate 54-A were respectively used instead of Intermediate 2-2 and Intermediate 99-A.

Synthesis of Intermediate 114-3

Intermediate 114-3 was prepared in the same manner as used in synthesizing Intermediate 99-3 of Synthesis Example 5, except that Intermediate 114-2 and Intermediate 54-A were respectively used instead of Intermediate 99-2 and Intermediate 99-A.

Synthesis of Compound 114

Compound 114 (0.63 g, 76% of yield) was synthesized in the same manner as used to synthesize Compound 99 of Synthesis Example 5, except that Intermediate 114-3 was used instead of Intermediate 99-4. The obtained compound was identified by LC-MS and NMR.

$C_{48}H_{32}N_2S_3$: $M^+$ found 732.20, Calc. 732.17

$^1H$ NMR ($CDCl_3$, 400 MHz) δ(ppm) 8.38 (d, 1H), 7.95-7.92 (m, 2H), 7.67-7.52 (m, 5H), 7.31-7.26 (m, 8H), 7.20 (d, 1H), 7.15-7.05 (m, 13H), 6.71 (d, 1H), 6.64 (d, 1H)

Synthesis Example 38

Synthesis of Compound 117

Compound 117 (0.68 g, yield: 60%) was obtained in the same manner as in Synthesis Example 37, except that i) in synthesizing Intermediate 114-2, Intermediate 117-A was used instead of Intermediate 54-A, and ii) in synthesizing Intermediate 114-3, Intermediate 99-A was used instead of Intermediate 54-A. The obtained compound was identified by LC-MS and NMR.

$C_{66}H_{56}N_2SSi_2$: $M^+$ found 964.40, Calc. 964.37

$^1H$ NMR ($CDCl_3$, 400 MHz) δ(ppm) 8.26 (d, 1H), 8.09-8.07 (m, 2H), 8.02-7.98 (m, 2H), 7.84-7.36 (m, 20H), 7.20-7.15 (m, 2H), 7.08-7.03 (m, 2H), 6.68-6.61 (m, 5H), 6.56-6.53 (m, 2H), 6.22-6.19 (m, 2H), 0.23 (s, 18H)

Intermediate 117-A

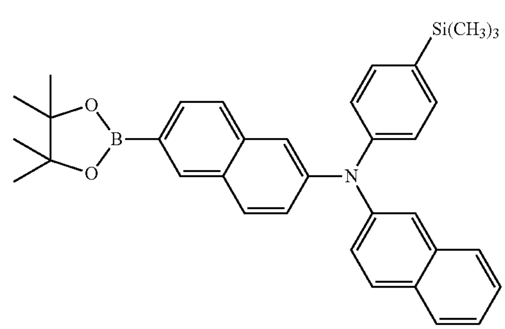

Synthesis Example 39

Synthesis of Compound 118

Compound 118 (0.66 g, yield: 72%) was obtained in the same manner as in Synthesis Example 37, except that i) in synthesizing Intermediate 114-2, Intermediate 106-A was used instead of Intermediate 54-A, and ii) in synthesizing Intermediate 114-3, Intermediate 106-B was used instead of Intermediate 54-A. The obtained compound was identified by LC-MS and NMR.

$C_{53}H_{38}N_3SF$: $M^+$ found 767.32, Calc. 767.27

$^1H$ NMR ($CDCl_3$, 400 MHz) δ(ppm) 8.37 (d, 1H), 8.26 (d, 1H), 8.14 (d, 1H), 7.98-7.96 (m, 2H), 7.79 (dd, 1H), 7.68-7.57 (m, 3H), 7.50-7.43 (m, 3H), 7.10-6.85 (m, 12H), 6.78-6.74 (m, 2H), 6.65 (dt, 1H), 6.55 (d, 1H), 6.48-6.43 (m, 2H), 6.23-6.19 (m, 2H), 1.93 (s, 6H)

Synthesis Example 40

Synthesis of Compound 121

Compound 121 (0.87 g, yield: 75%) was obtained in the same manner as in Synthesis Example 1, except that in synthesizing Intermediate 2-3, Intermediate 70-B was used instead of Intermediate 2-A. The obtained compound was identified by LC-MS and NMR.

Intermediate 70-B

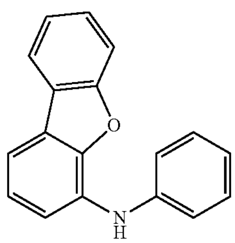 [SMILES: c1ccc(Nc2cccc3c2oc2ccccc23)cc1]

$C_{52}H_{32}N_2O_3$: $M^+$ found 732.35, Calc. 732.24

$^1H$ NMR ($CDCl_3$, 400 MHz) δ(ppm) 7.84-7.81 (m, 3H), 7.77-7.70 (m, 3H), 7.58-7.53 (m, 3H), 7.48-7.36 (m, 5H), 7.20-7.18 (m, 1H), 7.08-6.91 (m, 8H), 6.81 (d, 1H), 6.72-6.71 (m, 1H), 6.65-6.59 (m, 2H), 6.47 (dd, 1H), 6.38-6.33 (m, 2H), 6.25-6.22 (m, 2H)

Synthesis Example 41

Synthesis of Compound 122

Compound 122 (0.69 g, yield: 72%) was obtained in the same manner as in Synthesis Example 1, except that in synthesizing Intermediate 2-3, Intermediate 122-A was used instead of Intermediate 2-A. The obtained compound was identified by LC-MS and NMR.

Intermediate 122-A

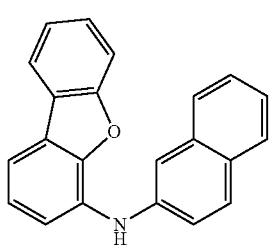 [SMILES: c1ccc2cc(Nc3cccc4c3oc3ccccc34)ccc2c1]

$C_{60}H_{36}N_2O_3$: $M^+$ found 832.33, Calc. 832.27

$^1H$ NMR ($CDCl_3$, 400 MHz) δ(ppm) 7.83-7.68 (m, 10H), 7.59-7.52 (m, 9H), 7.46-7.36 (m, 7H), 7.26 (dd, 1H), 7.20-7.15 (m, 2H), 7.06-6.94 (m, 4H), 6.78 (d, 1H), 6.73-6.71 (m, 1H), 6.51 (dd, 1H)

Synthesis Example 42

Synthesis of Compound 126

Compound 126 (0.82 g, yield: 73%) was obtained in the same manner as in Synthesis Example 1, except that in synthesizing Intermediate 2-3, Intermediate 126-A was used instead of Intermediate 2-A. The obtained compound was identified by LC-MS and NMR.

Intermediate 126-A

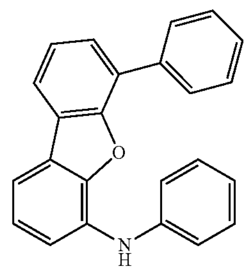 [SMILES: c1ccc(Nc2cccc3c2oc2c(-c4ccccc4)cccc23)cc1]

$C_{64}H_{40}N_2O_3$: $M^+$ found 884.41, Calc. 884.30

$^1H$ NMR ($CDCl_3$, 400 MHz) δ(ppm) 7.90-88 (m, 2H), 7.83-7.75 (m, 4H), 7.69-7.56 (m, 7H), 7.43-7.34 (m, 7H), 7.24-7.18 (m, 3H), 7.08-6.80 (m, 9H), 6.71 (d, 1H), 6.65-6.59 (m, 2H), 6.49 (dd, 1H), 6.36-6.33 (m, 2H), 6.25-6.22 (m, 2H)

Synthesis Example 43

Synthesis of Compound 129

Compound 129 (0.63 g, yield: 68%) was obtained in the same manner as in Synthesis Example 1, except that in synthesizing Intermediate 2-3, Intermediate 129-A was used instead of Intermediate 2-A. The obtained compound was identified by LC-MS and NMR.

Intermediate 129-A

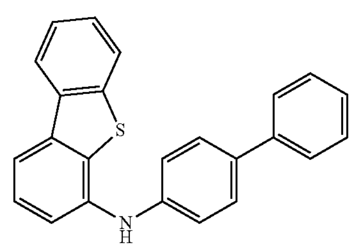 [SMILES: c1ccc(-c2ccc(Nc3cccc4c3sc3ccccc34)cc2)cc1]

$C_{64}H_{40}N_2OS_2$: $M^+$ found 916.35, Calc. 916.26

$^1H$ NMR ($CDCl_3$, 400 MHz) δ(ppm) 8.06-8.04 (m, 2H), 7.97-7.92 (m, 3H), 7.81-7.79 (m, 2H), 7.69-7.58 (m, 7H), 7.53-7.34 (m, 14H), 7.26-7.24 (m, 1H), 7.20-7.18 (m, 1H), 6.99-6.91 (m, 3H), 6.75-6.67 (m, 4H), 6.56-6.51 (m, 3H)

Synthesis Example 44

Synthesis of Compound 132

Compound 132 (0.89 g, yield: 79%) was obtained in the same manner as in Synthesis Example 1, except that in synthesizing Intermediate 2-3, Intermediate 132-A was used instead of Intermediate 2-A. The obtained compound was identified by LC-MS and NMR.

Intermediate 132-A

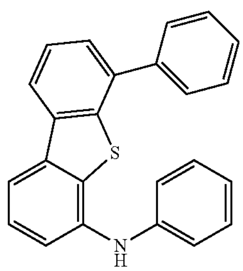 [SMILES: c1ccc(Nc2cccc3c2sc2c(-c4ccccc4)cccc23)cc1]

$C_{64}H_{40}N_2OS_2$: $M^+$ found 916.39, Calc. 916.26

$^1$H NMR ($CDCl_3$, 400 MHz) δ(ppm) 8.16-8.13 (m, 2H), 7.99-7.92 (m, 3H), 7.76-7.74 (m, 2H), 6.68 (d, 1H), 7.63-7.60 (m, 4H), 7.47-7.34 (m, 10H), 7.20 (t, 1H), 7.20-7.16 (m, 1H), 7.10-6.96 (m, 6H), 6.81-6.75 (m, 2H), 6.65-6.61 (m, 2H), 6.55-6.52 (m, 2H), 6.37-6.34 (m, 2H), 6.21-6.19 (m, 2H)

Synthesis Example 45

Synthesis of Compound 136

Compound 136 (0.71 g, yield: 63%) was obtained in the same manner as in Synthesis Example 1, except that in synthesizing Intermediate 2-3, Intermediate 136-A was used instead of Intermediate 2-A. The obtained compound was identified by LC-MS and NMR.

Intermediate 136-A

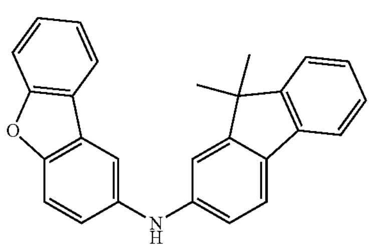 [SMILES: CC1(C)c2ccccc2-c2ccc(Nc3ccc4oc5ccccc5c4c3)cc21]

$C_{70}H_{48}N_2O_3$: $M^+$ found 964.44, Calc. 964.37

$^1$H NMR ($CDCl_3$, 400 MHz) δ(ppm) 7.85-7.72 (m, 10H), 7.61-7.50 (m, 6H), 7.44-7.30 (m, 6H), 7.20-7.18 (m, 1H), 7.13-7.00 (m, 6H), 6.94-6.89 (m, 2H), 6.72-6.67 (m, 2H), 6.59-6.50 (m, 3H), 1.61 (s, 12H)

Synthesis Example 46

Synthesis of Compound 140

Compound 140 (0.74 g, yield: 68%) was obtained in the same manner as in Synthesis Example 1, except that in synthesizing Intermediate 2-3, Intermediate 140-A was used instead of Intermediate 2-A. The obtained compound was identified by LC-MS and NMR.

Intermediate 140-A

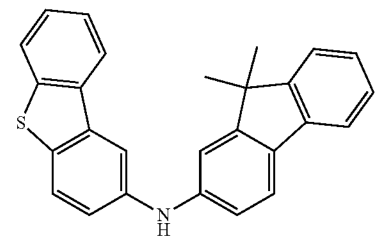 [SMILES: CC1(C)c2ccccc2-c2ccc(Nc3ccc4sc5ccccc5c4c3)cc21]

$C_{70}H_{48}N_2OS_2$: $M^+$ found 996.39, Calc. 996.32

$^1$H NMR ($CDCl_3$, 400 MHz) δ(ppm) 8.06-8.00 (m, 4H), 7.85-7.69 (m, 8H), 7.62-7.52 (m, 4H), 7.46-7.30 (m, 6H), 7.19-7.17 (m, 1H), 7.14-7.10 (m, 4H), 7.08-7.00 (m, 2H), 6.91-6.85 (m, 2H), 6.72-6.67 (m, 2H), 6.59-6.50 (m, 3H), 1.61 (s, 12H)

Synthesis Example 47

Synthesis of Compound 141

Compound 141 (0.84 g, yield: 79%) was obtained in the same manner as in Synthesis Example 13, except that in synthesizing Intermediate 26-3, Intermediate 70-B was used instead of Intermediate 26-B. The obtained compound was identified by LC-MS and NMR.

$C_{50}H_{32}N_2O_2$: $M^+$ found 692.30, Calc. 692.25

$^1$H NMR ($CDCl_3$, 400 MHz) δ(ppm) 7.85-7.63 (m, 6H), 7.57-7.54 (m, 3H), 7.48-7.35 (m, 6H), 7.20-7.18 (m, 1H), 7.13-6.94 (m, 7H), 6.71-6.61 (m, 4H), 6.49 (dd, 1H), 6.36-6.33 (m, 2H), 6.19-6.15 (m, 2H)

Synthesis Example 48

Synthesis of Compound 148

Compound 148 (0.58 g, yield: 74%) was obtained in the same manner as in Synthesis Example 17, except that in synthesizing Intermediate 38-2, Intermediate 26-B used instead of Intermediate 2-A, and in synthesizing Intermediate 26-B, Intermediate 122-A was used instead of Intermediate 26-B. The obtained compound was identified by LC-MS and NMR.

$C_{59}H_{40}N_2OS$: $M^+$ found 824.36, Calc. 824.29

$^1$H NMR ($CDCl_3$, 400 MHz) δ(ppm) 7.85-7.70 (m, 6H), 7.61 (d, 1H), 7.58-7.30 (m, 12H), 7.26-7.23 (m, 1H), 7.14-6.96 (m, 7H), 6.79 (d, 1H), 6.65-6.61 (m, 2H), 6.50 (dd, 1H), 6.41-6.39 (m, 1H), 6.18-6.15 (m, 2H), 1.60 (s, 6H)

Synthesis Example 49

Synthesis of Compound 151

Compound 151 (0.86 g, yield: 67%) was obtained in the same manner as in Synthesis Example 17, except that in synthesizing Intermediate 38-2, Intermediate 18-B used instead of Intermediate 2-A, and in synthesizing Intermediate 38-3, Intermediate 151-A was used instead of Intermediate 26-B. The obtained compound was identified by LC-MS and NMR.

Intermediate 151-A

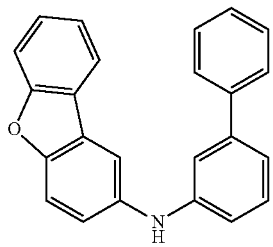 [SMILES: c1ccc(-c2cccc(Nc3ccc4oc5ccccc5c4c3)c2)cc1]

$C_{65}H_{44}N_2OS$: $M^+$ found 900.38, Calc. 900.32

$^1H$ NMR ($CDCl_3$, 400 MHz) δ(ppm) 7.84-7.64 (m, 7H), 7.59-7.49 (m, 11H), 7.44-7.30 (m, 7H), 7.26-7.23 (m, 1H), 7.13-7.08 (m, 4H), 6.97-6.92 (m, 3H), 6.76 (d, 1H), 6.65 (dd, 1H), 6.58 (dd, 1H), 6.47-6.45 (m, 1H), 6.19-6.15 (m, 1H), 1.63 (s, 6H)

Example 1

An anode was prepared by cutting a Corning 15 $\Omega cm^2$ (1200 Å) ITO glass substrate to a size of 50 mm×50 mm×0.7 mm, ultrasonically cleaning the glass substrate by using isopropyl alcohol and pure water for 5 minutes each, and then irradiating UV light for 30 minutes thereto and exposing to ozone to clean. Then, the anode was loaded into a vacuum deposition apparatus.

2-TNATA was deposited on the ITO layer to form an hole injection layer having a thickness of 600 Å, and then, NPB was deposited on the hole injection layer to form a hole transport layer having a thickness of 300 Å.

Subsequently, 9,10-di-naphthalene-2-yl-anthracene (DNA, host) and Compound 2 (dopant) were co-deposited on the hole transport layer at a weight ratio of 98:2 to form an emission layer having a thickness of 300 Å.

Thereafter, $Alq_3$ was deposited on the emission layer to form an electron transport layer having a thickness of 300 Å, and LIF was deposited on the electron transport layer to form an electron injection layer having a thickness of 10 Å, and then, Al was deposited on the electron injection layer to form a second electrode (cathode) having a thickness of 3000 Å, thereby completing manufacturing of an organic light-emitting device.

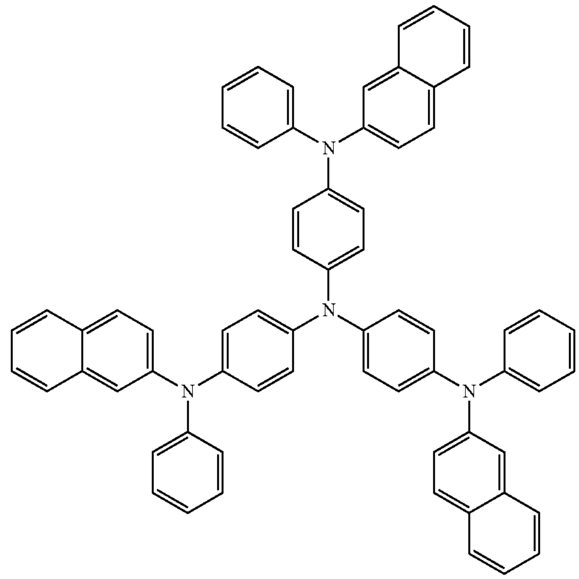

2-TNATA

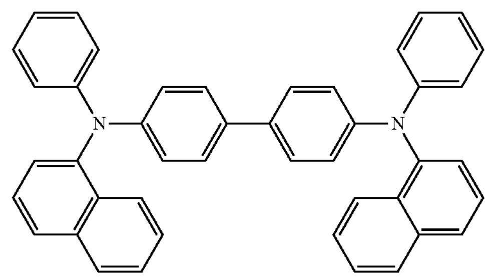

NPB

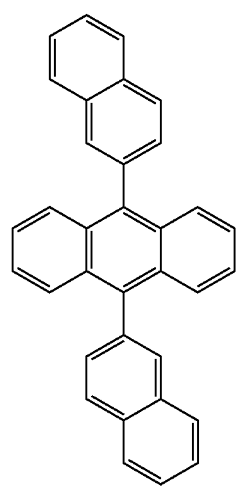

DNA

Example 2

An organic light-emitting device was manufactured in the same manner as in Example 1, except that in forming the emission layer, Compound 8 was used instead of Compound 2.

Example 3

An organic light-emitting device was manufactured in the same manner as in Example 1, except that in forming the emission layer, Compound 15 was used instead of Compound 2.

Example 4

An organic light-emitting device was manufactured in the same manner as in Example 1, except that in forming the emission layer, Compound 26 was used instead of Compound 2.

Example 5

An organic light-emitting device was manufactured in the same manner as in Example 1, except that in forming the emission layer, Compound 35 was used instead of Compound 2.

Example 6

An organic light-emitting device was manufactured in the same manner as in Example 1, except that in forming the emission layer, Compound 54 was used instead of Compound 2.

Example 7

An organic light-emitting device was manufactured in the same manner as in Example 1, except that in forming the emission layer, Compound 70 was used instead of Compound 2.

Example 8

An organic light-emitting device was manufactured in the same manner as in Example 1, except that in forming the emission layer, Compound 85 was used instead of Compound 2.

Example 9

An organic light-emitting device was manufactured in the same manner as in Example 1, except that in forming the emission layer, Compound 99 was used instead of Compound 2.

Example 10

An organic light-emitting device was manufactured in the same manner as in Example 1, except that in forming the emission layer, Compound 122 was used instead of Compound 2.

Example 11

An organic light-emitting device was manufactured in the same manner as in Example 1, except that in forming the emission layer, Compound 132 was used instead of Compound 2.

Example 12

An organic light-emitting device was manufactured in the same manner as in Example 1, except that in forming the emission layer, Compound 136 was used instead of Compound 2.

Example 13

An organic light-emitting device was manufactured in the same manner as in Example 1, except that in forming the emission layer, Compound 151 was used instead of Compound 2.

Comparative Example 1

An organic light-emitting device was manufactured in the same manner as in Example 1, except that in forming the emission layer, Compound Y below was used instead of Compound 2.

Compound Y

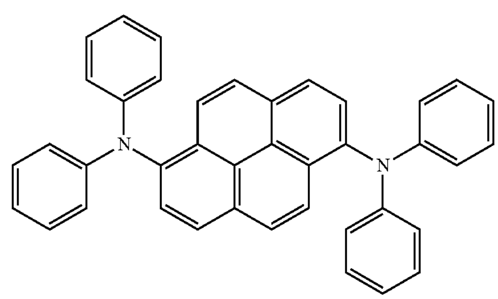 [SMILES: c1ccc(N(c2ccccc2)c2ccc3ccc4c(N(c5ccccc5)c5ccccc5)ccc5ccc2c3c54)cc1]

Comparative Example 2

An organic light-emitting device was manufactured in the same manner as in Example 1, except that in forming the emission layer, Compound Z below was used instead of Compound 2.

Compound Z

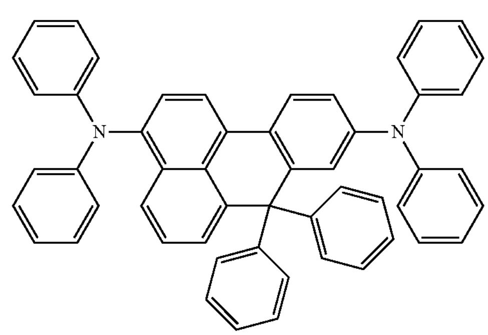 [SMILES: c1ccc(N(c2ccccc2)c2ccc3c(c2)C(c2ccccc2)(c2ccccc2)c2cccc4c(N(c5ccccc5)c5ccccc5)ccc-3c24)cc1]

Evaluation Example 1

Driving voltage, current density, brightness, luminescence color, efficiency, and half-life lifespan (@100 $mA/cm^2$) of the organic light-emitting devices of Examples 1 to 13 and Comparative Examples 1 and 2 were evaluated by using PR650 Spectroscan Source Measurement Unit. (a product of Photo-Research Company). Results thereof are shown in Table 2.

TABLE 2

| | Dopant | Driving Voltage (V) | Current density (mA/cm$^2$) | Brightness (cd/m$^2$) | Efficiency (cd/A) | Emission color | Half-life lifespan (hr) |
|---|---|---|---|---|---|---|---|
| Example 1 | Compound 2 | 6.11 | 50 | 3210 | 6.42 | Blue | 380 |
| Example 2 | Compound 8 | 6.18 | 50 | 3388 | 6.78 | Blue | 358 |
| Example 3 | Compound 15 | 6.17 | 50 | 3515 | 7.03 | Blue | 362 |
| Example 4 | Compound 26 | 6.22 | 50 | 3328 | 6.66 | Blue | 351 |
| Example 5 | Compound 35 | 6.23 | 50 | 3540 | 7.08 | Blue | 345 |
| Example 6 | Compound 54 | 6.09 | 50 | 3452 | 6.90 | Blue | 354 |
| Example 7 | Compound 70 | 6.32 | 50 | 3580 | 7.16 | Blue | 325 |
| Example 8 | Compound 85 | 6.15 | 50 | 3205 | 6.41 | Blue | 310 |
| Example 9 | Compound 99 | 6.25 | 50 | 3575 | 7.15 | Blue | 335 |
| Example 10 | Compound 122 | 6.22 | 50 | 3225 | 6.45 | Blue | 342 |
| Example 11 | Compound 132 | 6.20 | 50 | 3480 | 6.96 | Blue | 354 |
| Example 12 | Compound 136 | 6.15 | 50 | 3525 | 7.05 | Blue | 328 |
| Example 13 | Compound 151 | 6.30 | 50 | 3420 | 6.84 | Blue | 362 |
| Comp. Example 1 | Compound Y | 7.01 | 50 | 2645 | 5.29 | Blue | 258 |
| Comp. Example 2 | Compound Z | 7.35 | 50 | 2065 | 4.13 | Blue | 245 |

From Table 2, it was confirmed that the organic light-emitting devices of Examples 1 to 13 had better driving voltage, brightness, efficiency, color purity, and lifetime characteristics than the organic light-emitting devices of Comparative Examples 1 and 2.

An organic light-emitting device including the condensed cyclic compound according to an embodiment of the present invention may have a low driving voltage, high brightness, high efficiency, and long lifespan.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the FIGURES, it will be understood by those of ordinary skill in the art that various changes in form and details may be made therein without departing from the spirit and scope of the present invention as defined by the following claims.

What is claimed is:

1. A condensed cyclic compound represented by Formula 1:

Formula 1

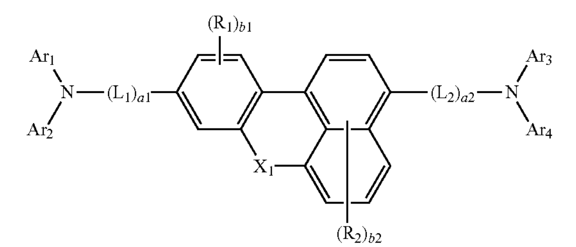

where:

$X_1$ is O or S;

each of $L_1$ and $L_2$ is independently selected from a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, or a substituted or unsubstituted $C_2$-$C_{60}$ heteroarylene group;

each of a1 and a2 is independently an integer from 0 to 3;

each of $Ar_1$ to $Ar_4$ is independently selected from a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, or a substituted or unsubstituted $C_2$-$C_{60}$ heteroaryl group;

each of $R_1$ and $R_2$ is independently selected from hydrogen, deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ heterocycloalkyl group, a substituted or unsubstituted $C_3$-$C_{10}$ cycloalkenyl group, a substituted or unsubstituted $C_3$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, —$Si(Q_1)(Q_2)(Q_3)$ or —$N(Q_4)(Q_5)$ where each of $Q_1$ to $Q_5$ is independently a $C_1$-$C_{60}$ alkyl group, a $C_1$-$C_{60}$ alkoxy group, a $C_6$-$C_{60}$ aryl group, or a $C_2$-$C_{60}$ heteroaryl group;

b1 is an integer from 1 to 3;

b1 is an integer from 1 to 5; and the substituted groups identified above include at least one substituent selected from: deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group; a substituted $C_1$-$C_{60}$ alkyl group, a substituted $C_2$-$C_{60}$ alkenyl group, a substituted $C_2$-$C_{60}$ alkynyl group, or a substituted $C_1$-$C_{60}$ alkoxy group, each substituted with at least one substituent selected from deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, or a phosphoric acid or a salt thereof; a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group; a substituted $C_3$-$C_{10}$ cycloalkyl group, a substituted $C_3$-$C_{10}$ heterocycloalkyl group, a substituted $C_3$-$C_{10}$ cycloalkenyl group, a substituted $C_3$-$C_{10}$ heterocycloalkenyl group, a substituted $C_6$-$C_{60}$ aryl group, a substituted $C_6$-$C_{60}$ aryloxy group, a substituted $C_6$-$C_{60}$ arylthio group, or a substituted $C_2$-$C_{60}$ heteroaryl group, where such substituted groups include at least one substituent selected from deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, or a $C_2$-$C_{60}$ heteroaryl group; —$Si(Q_{11})(Q_{12})(Q_{13})$, or —$N(Q_{14})(Q_{15})$, where each of $Q_{11}$ to $Q_{15}$ is independently selected from hydrogen, a $C_1$-$C_{60}$ alkyl group, a $C_1$-$C_{60}$ alkoxy group, a $C_6$-$C_{60}$ aryl group, or a $C_2$-$C_{60}$ heteroaryl group.

2. The condensed cyclic compound of claim 1, wherein:

each of $L_1$ and $L_2$ is independently selected from a substituted or unsubstituted phenylene group, a substituted or unsubstituted pentalenylene group, a substituted or unsubstituted indenylene group, a substituted or unsubstituted naphthylene group, a substituted or unsubstituted azulenylene group, a substituted or unsubstituted heptalenylene group, a substituted or unsubstituted indacenylene group, a substituted or unsubstituted acenaphthylene group, a substituted or unsubstituted fluorenylene group, a substituted or unsubstituted spiro-fluorenylene group, a substituted or unsubstituted phenalenylene group, a substituted or unsubstituted phenanthrenylene group, a substituted or unsubstituted anthracenylene group, a substituted or unsubstituted fluoranthenylene group, a substituted or unsubstituted triphenylenylene group, a substituted or unsubstituted pyrenylene group, a substituted or unsubstituted chrysenylene group, a substituted or unsubstituted naphthacenylene group, a substituted or unsubstituted picenylene group, a substituted or unsubstituted perylenylene group, a substituted or unsubstituted pentaphenylene group, a substituted or unsubstituted hexacenylene group, a substituted or unsubstituted pyrrolylene group, a substituted or unsubstituted imidazolylene group, a substituted or unsubstituted pyrazolylene group, a substituted or unsubstituted pyridinylene group, a substituted or unsubstituted pyrazinylene group, a substituted or unsubstituted pyrimidinylene group, a substituted or unsubstituted pyridazinylene group, a substituted or unsubstituted isoindolylene group, a substituted or unsubstituted indolylene group, a substituted or unsubstituted indazolylene group, a substituted or unsubstituted purinylene group, a substituted or unsubstituted quinolinylene group, a substituted or unsubstituted benzoquinolinylene group, a substituted or unsubstituted phthalazinylene phthalazinylene group, a substituted or unsubstituted naphthyridinylene naphthyridinylene group, a substituted or unsubstituted quinoxalinylene group, a substituted or unsubstituted quinazolinylene group, a substituted or unsubstituted cinnolinylene group, a substituted or unsubstituted carbazolylene group, a substituted or unsubstituted phenanthridinylene group, a substituted or unsubstituted acridinylene group, a substituted or unsubstituted phenanthrolinylene group, a substituted or unsubstituted phenazinylene group, a substituted or unsubstituted benzooxazolylene group, a substituted or unsubstituted benzoimidazolylene group, a substituted or unsubstituted furanylene group, a substituted or unsubstituted benzofuranylene group, a substituted or unsubstituted thiophenylene group, a substituted or unsubstituted benzothiophenylene group, a substituted or unsubstituted thiazolylene group, a substituted or unsubstituted isothiazolylene group, a substituted or unsubstituted benzothiazolylene group, a substituted or unsubstituted isoxazolylene group, a substituted or unsubstituted oxazolylene group, a substituted or unsubstituted triazolylene group, a substituted or unsubstituted tetrazolylene group, a substituted or unsubstituted oxadiazolylene group, a substituted or unsubstituted triazinylene group, a substituted or unsubstituted benzooxazolylene group, a substituted or unsubstituted dibenzofuranylene group, a substituted or unsubstituted dibenzothiophenylene group, a substituted or unsubstituted benzocarbazolylene group, or a substituted or unsubstituted dibenzosilolylene group; and the substituted phenylene group, the substituted pentalenylene group, the substituted indenylene group, the substituted naphthylene group, the substituted azulenylene group, the substituted heptalenylene group, the substituted indacenylene group, the substituted acenaphthylene group, the substituted fluorenylene group, the substituted spiro-fluorenylene group, the substituted phenalenylene group, the substituted phenanthrenylene group, the substituted anthracenylene group, the substituted fluoranthenylene group, the substituted triphenylenylene group, the substituted pyrenylene group, the substituted chrysenylene group, the substituted naphthacenylene group, the substituted picenylene group, the substituted perylenylene group, the substituted pentaphenylene group, the substituted hexacenylene group, the substituted pyrrolylene group, the substituted imidazolylene group, the substituted pyrazolylene group, the substituted pyridinylene group, the substituted pyrazinylene group, the substituted pyrimidinylene group, the substituted pyridazinylene group, the substituted isoindolylene group, the substituted indolylene group, the substituted indazolylene group, the substituted purinylene group, the substituted quinolinylene group, the substituted benzoquinolinylene group, the substituted phthalazinylene group, the substituted naphthyridinylene group, the substituted quinoxalinylene group, the substituted quinazolinylene group, the substituted cinnolinylene group, the substituted carbazolylene group, the substituted phenanthridinylene group, the substituted acridinylene group, the substituted phenanthrolinylene group, the substituted phenazinylene group, the substituted benzooxazolylene group, the substituted benzoimidazolylene substituted furanylene group, the substituted benzofuranylene group, the substituted thiophenylene group, the substituted benzothiophenylene group, the substituted thiazolylene group, the substituted isothiazolylene group, the substituted benzothiazolylene group, the substituted isooxazolylene group, the substituted oxazolylene group, the substituted triazolylene group, the substituted tetrazolylene group, the substituted oxadiazolylene group, the substituted triazinylene group, the substituted benzooxazolylene group, the substituted dibenzofuranylene group, the substituted dibenzothiophenylene group, the substituted benzocarbazolylene, and the substituted dibenzosilolylene each include at least one substituent selected from deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group; a substituted $C_1$-$C_{20}$ alkyl group or a substituted $C_1$-$C_{20}$ alkoxy group, each substituted with at least one substituent selected from deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, or a phosphoric acid or a salt thereof; a $C_6$-$C_{20}$ aryl group, a $C_2$-$C_{20}$ heteroaryl group; or a substituted $C_6$-$C_{20}$ aryl group or a substituted $C_2$-$C_{20}$ heteroaryl group, each substituted with at least one substituent selected from deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group.

3. The condensed cyclic compound of claim 1, wherein:

each of $L_1$ and $L_2$ is independently selected from Formulae 2-1 to 2-28:

Formula 2-1

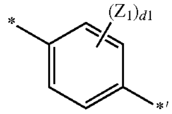

Formula 2-2

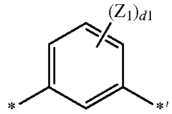

-continued

Formula 2-3

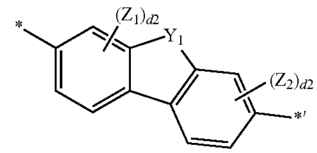

Formula 2-4

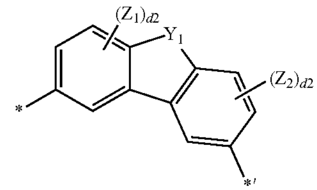

Formula 2-5

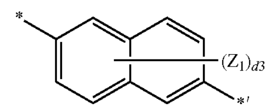

Formula 2-6

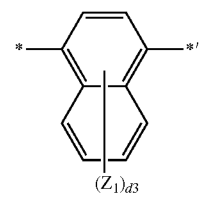

Formula 2-7

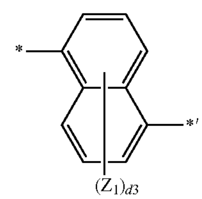

Formula 2-8

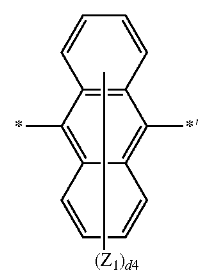

Formula 2-9

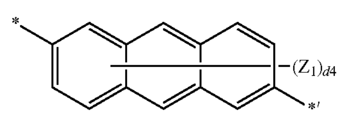

Formula 2-10

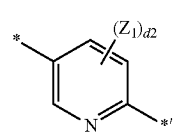

Formula 2-11

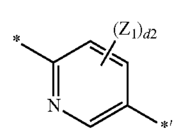

-continued

Formula 2-12

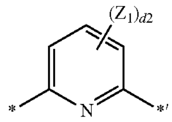

Formula 2-13

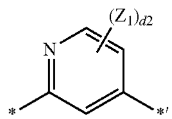

Formula 2-14

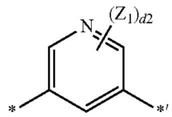

Formula 2-15

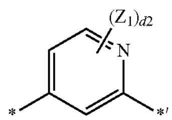

Formula 2-16

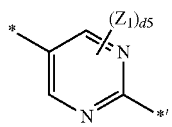

Formula 2-17

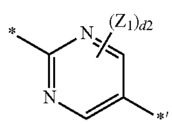

Formula 2-18

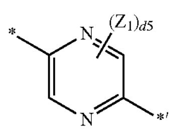

Formula 2-19

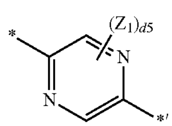

Formula 2-20

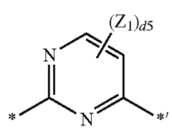

Formula 2-21

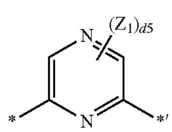

Formula 2-22

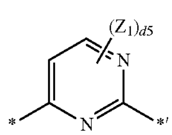

Formula 2-23

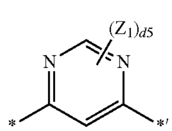

-continued

Formula 2-24

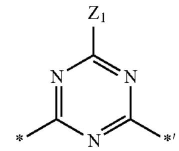

Formula 2-25

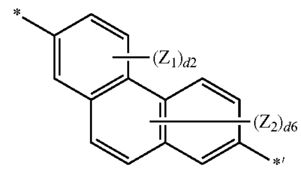

Formula 2-26

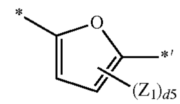

Formula 2-27

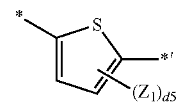

Formula 2-28

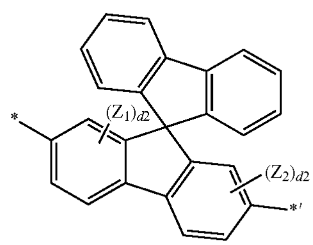

where:

$Y_1$ is O, S, $C(Z_3)(Z_4)$, $N(Z_5)$, or $Si(Z_6)(Z_7)$;

each of $Z_1$ to $Z_7$ is independently selected from hydrogen, deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group; a substituted $C_1$-$C_{20}$ alkyl group or a substituted $C_1$-$C_{20}$ alkoxy group, each substituted with at least one substituent selected from deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, or a phosphoric acid or a salt thereof; a $C_6$-$C_{20}$ aryl group, a $C_2$-$C_{20}$ heteroaryl group; or a substituted $C_6$-$C_{20}$ aryl group or a substituted a $C_2$-$C_{20}$ heteroaryl group, each substituted with at least one substituent selected from deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenylyl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group;

d1 is an integer from 1 to 4;

d2 is an integer from 1 to 3;

d3 is an integer from 1 to 6;

d4 is an integer from 1 to 8;

d5 is 1 or 2;

d6 is an integer from 1 to 5; and each of * and *" is a binding site to a neighboring atom.

4. The condensed cyclic compound of claim 3, wherein:

each of $Z_1$ to $Z_7$ is independently selected from hydrogen, deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a methyl group, an ethyl group, a propyl group, a butyl group, a pentyl group, a hexyl group, a heptyl group, or an octyl group.

5. The condensed cyclic compound of claim 1, wherein:

each of $L_1$ and $L_2$ is independently selected from Formulae 3-1 to 3-20:

Formula 3-1

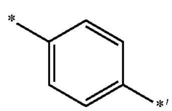

Formula 3-2

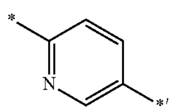

Formula 3-3

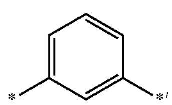

Formula 3-4

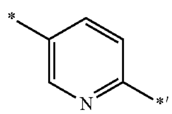

Formula 3-5

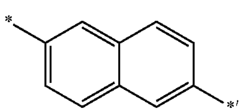

Formula 3-6

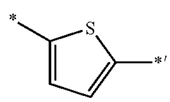

Formula 3-7

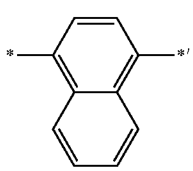

Formula 3-8

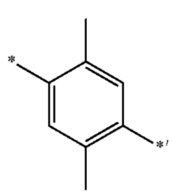

-continued

Formula 3-9

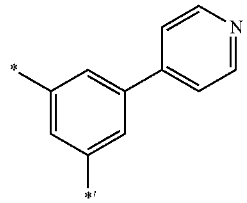

Formula 3-10

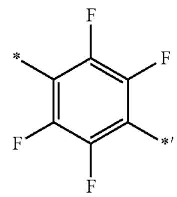

Formula 3-11

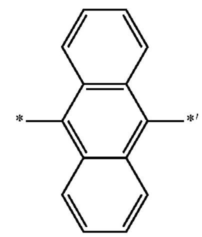

Formula 3-12

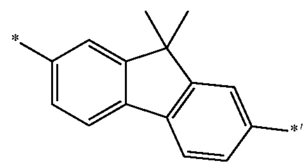

Formula 3-13

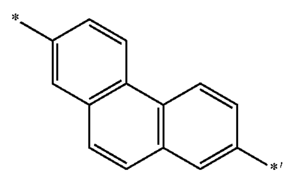

Formula 3-14

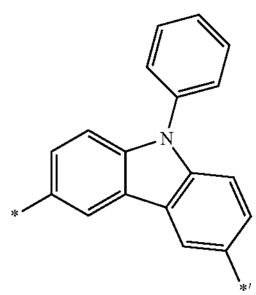

Formula 3-15

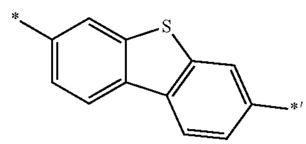

Formula 3-16

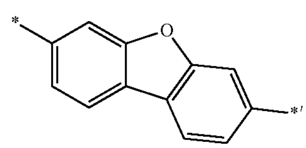

-continued

Formula 3-17

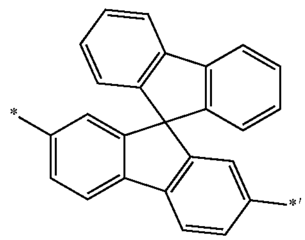

Formula 3-18

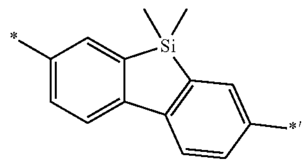

Formula 3-19

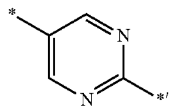

Formula 3-20

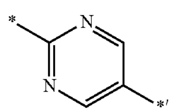

where each of * and *' is a binding site to a neighboring atom.

6. The condensed cyclic compound of claim 1, wherein:

a1 is 0 and a2 is 0;

a1 is 1 and a2 is 0;

a1 is 0 and a2 is 1; or a1 is 1 and a2 is 2.

7. The condensed cyclic compound of claim 1, wherein:

each of $Ar_1$ to $Ar_4$ is independently selected from a substituted or unsubstituted phenyl group, a substituted or unsubstituted pentalenyl group, a substituted or unsubstituted indenyl group, a substituted or unsubstituted naphthyl group, a substituted or unsubstituted azulenyl group, a substituted or unsubstituted heptalenyl group, a substituted or unsubstituted indacenyl, a substituted or unsubstituted acenaphthyl group, a substituted or unsubstituted fluorenyl group, a substituted or unsubstituted spiro-fluorenyl group, a substituted or unsubstituted phenalenyl group a substituted or unsubstituted phenanthrenyl group, a substituted or unsubstituted anthracenyl group, a substituted or unsubstituted fluoranthenyl group, a substituted or unsubstituted triphenylenyl group, a substituted or unsubstituted pyrenyl group, a substituted or unsubstituted chrysenyl group, a substituted or unsubstituted naphthacenyl group, a substituted or unsubstituted picenyl group, a substituted or unsubstituted perylenyl group, a substituted or unsubstituted pentaphenyl group, a substituted or unsubstituted hexacenyl group, a substituted or unsubstituted pyrrolyl group, a substituted or unsubstituted imidazolyl group, a substituted or unsubstituted pyrazolyl group, a substituted or unsubstituted pyridinyl group, a substituted or unsubstituted pyrazinyl group, a substituted or unsubstituted pyrimidinyl group, a substituted or unsubstituted pyridazinyl group, a substituted or unsubstituted isoindolyl group, a substituted or unsubstituted indolyl group, a substituted or unsubstituted indazolyl group, a substituted or unsubstituted purinyl group, a substituted or unsubstituted quinolinyl group, a substituted or unsubstituted benzoquinolinyl group, a substituted or unsubstituted phthalazinyl group, a substituted or unsubstituted naphthyridinyl group, a substituted or unsubstituted quinoxalinyl group, a substituted or unsubstituted quinazolinyl group, a substituted or unsubstituted cinnolinyl group, a substituted or unsubstituted carbazolyl group, a substituted or unsubstituted phenanthridinyl group, a substituted or unsubstituted acridinyl group, a substituted or unsubstituted phenanthrolinyl group, a substituted or unsubstituted phenazinyl group, a substituted or unsubstituted benzooxazolyl group, a substituted or unsubstituted benzoimidazolyl group, a substituted or unsubstituted furanyl group, a substituted or unsubstituted benzofuranyl group, a substituted or unsubstituted thiophenyl group, a substituted or unsubstituted benzothiophenyl group, a substituted or unsubstituted thiazolyl group, a substituted or unsubstituted isothiazolyl thiazolyl group, a substituted or unsubstituted benzothiazolyl group, a substituted or unsubstituted isoxazolyl group, a substituted or unsubstituted oxazolyl group, a substituted or unsubstituted triazolyl group, a substituted or unsubstituted tetrazolyl group, a substituted or unsubstituted oxadiazolyl group, a substituted or unsubstituted triazinyl group, a substituted or unsubstituted benzooxazolyl group, a substituted or unsubstituted dibenzofuranyl group, a substituted or unsubstituted dibenzothiophenyl group, a substituted or unsubstituted benzocarbazolyl group, or a substituted or unsubstituted dibenzosilolyl group; and the substituted phenyl group, the substituted pentalenyl group, the substituted indenyl group, the substituted naphthyl group, the substituted azulenyl group, the substituted heptalenyl group, the substituted indacenyl group, the substituted acenaphthyl group, the substituted fluorenyl group, the substituted spiro-fluorenyl group, the substituted phenalenyl group, the substituted phenanthrenyl group, the substituted anthracenyl group, the substituted fluoranthenyl group, the substituted triphenylenyl group, the substituted pyrenyl group, the substituted chrysenyl group, the substituted naphthacenyl group, the substituted picenyl group, the substituted perylenyl group, the substituted pentaphenyl group, the substituted hexacenyl group, the substituted pyrrolyl group, the substituted imidazolyl group, the substituted pyrazolyl group, the substituted pyridinyl group, the substituted pyrazinyl group, the substituted pyrimidinyl group, the substituted pyridazinyl group, the substituted isoindolyl group, the substituted indolyl group, the substituted indazolyl group, the substituted purinyl group, the substituted quinolinyl group, the substituted benzoquinolinyl group, the substituted phthalazinyl group, the substituted naphthyridinyl group, the substituted quinoxalinyl group, the substituted quinazolinyl group, the substituted cinnolinyl group, the substituted carbazolyl group, the substituted phenanthridinyl group, the substituted acridinyl group, the substituted phenanthrolinyl group, the substituted phenazinyl group, the substituted benzooxazolyl group, the substituted benzoimidazolyl substituted furanyl group, the substituted benzofuranyl group, the substituted thiophenyl group, the substituted benzothiophenyl group, the substituted thiazolyl group, the substituted isothiazolyl group, the substituted benzothiazolyl group, the substituted isooxazolyl group, the substituted oxazolyl group, the substituted triazolyl group, the substituted tetrazolyl group, the substituted oxadiazolyl group, the substituted triazinyl group, the substituted benzooxazolyl group, the substituted dibenzofuranyl group, the substituted dibenzothiophenyl group, the substituted benzocarbazolyl group, and the substituted dibenzosilolyl each include at least one substituent selected from deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group; a substituted $C_1$-$C_{20}$ alkyl group or a substituted $C_1$-$C_{20}$ alkoxy group, each substituted with at least one substituent selected from deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, or a phosphoric acid or a salt thereof; a $C_6$-$C_{20}$ aryl group, a $C_2$-$C_{20}$ heteroaryl group; or a substituted $C_6$-$C_{20}$ aryl group or a substituted $C_2$-$C_{20}$ heteroaryl group, each substituted with at least one substituent selected from deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group.

8. The condensed cyclic compound of claim 1, wherein:

each of $Ar_1$ to $Ar_4$ is independently selected from Formulae 5-1 to 5-15:

Formula 5-1

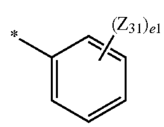

Formula 5-2

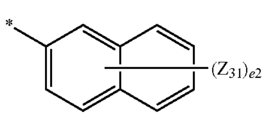

Formula 5-3

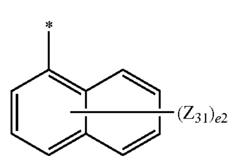

Formula 5-4

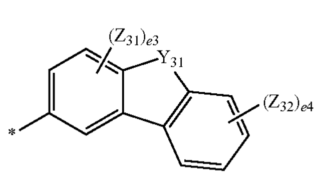

-continued

Formula 5-5

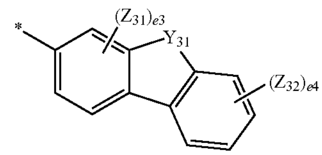

Formula 5-6

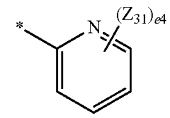

Formula 5-7

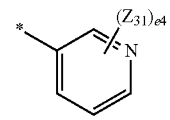

Formula 5-8

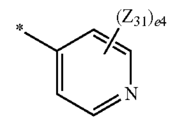

Formula 5-9

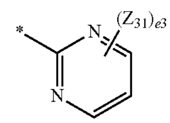

Formula 5-10

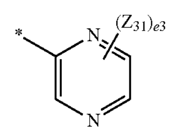

Formula 5-11

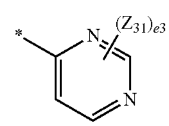

Formula 5-12

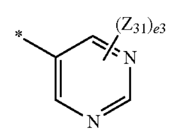

Formula 5-13

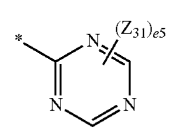

Formula 5-14

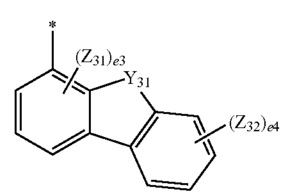

Formula 5-15

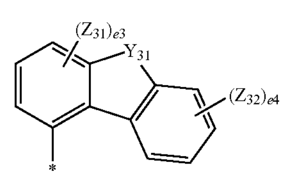

where:

$Y_{31}$ is O, S, $C(Z_{33})(Z_{34})$ or $N(Z_{35})$;

each of $Z_{31}$ to $Z_{35}$ is independently selected from hydrogen, deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group; a substituted $C_1$-$C_{20}$ alkyl group or a substituted $C_1$-$C_{20}$ alkoxy group, each substituted with at least one substituent selected from deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, or a phosphoric acid or a salt thereof; a $C_6$-$C_{20}$ aryl group, a $C_2$-$C_{20}$ heteroaryl group; a substituted $C_6$-$C_{20}$ aryl group or a substituted $C_2$-$C_{20}$ heteroaryl group, each substituted with at least one substituent selected from deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group; or $Si(Q_{11})(Q_{12})(Q_{13})$ where each of $Q_{11}$ to $Q_{13}$ is independently a $C_1$-$C_{20}$ alkyl group, a phenyl group, a naphthyl group, or an anthracenyl group;

e1 is an integer from 1 to 5;

e2 is an integer from 1 to 7;

e3 is an integer from 1 to 3;

e4 is an integer from 1 to 4;

e5 is 1 or 2; and

* is a binding site to a neighboring atom.

9. The condensed cyclic compound of claim 8, wherein:

each of $Z_{31}$ to $Z_{35}$ is independently selected from hydrogen, deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a methyl group, an ethyl group, a propyl group, a butyl group, a pentyl group, a hexyl group, a heptyl group, an octyl group, a methoxy group, an ethoxy group, a propoxy group, a butoxy group, a pentoxy group; a substituted methyl group, a substituted ethyl group, a substituted propyl group, a substituted butyl group, a substituted pentyl group, a substituted hexyl group, a substituted heptyl group, a substituted octyl group, a substituted methoxy group, a substituted ethoxy group, a substituted propoxy group, a substituted butoxy group, or a substituted pentoxy group, each substituted with at least one substituent selected from deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, or a phosphoric acid or a salt thereof; a phenyl group, a naphthyl group, an anthracenyl group, a phenanthrenyl group, a pyridinyl group, a pyrimidinyl group, a pyridazinyl group, a triazinyl group, a quinolinyl group, an isoquinolinyl group; or $Si(Q_{11})(Q_{12})(Q_{13})$ where each of $Q_{11}$ to $Q_{13}$ is independently a $C_1$-$C_{20}$ alkyl group, a phenyl group, a naphthyl group, or an anthracenyl group.

10. The condensed cyclic compound of claim 1, wherein:

each of $Ar_1$ to $Ar_4$ is independently selected from Formulae 6-1 to 6-28:

Formula 6-1

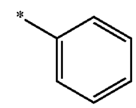

Formula 6-2

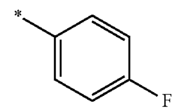

Formula 6-3

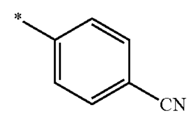

Formula 6-4

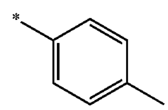

Formula 6-5

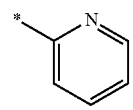

Formula 6-6

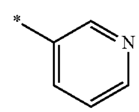

Formula 6-7

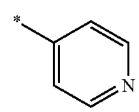

Formula 6-8

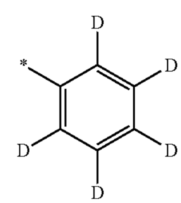

Formula 6-9

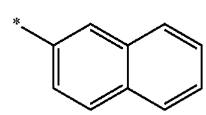

Formula 6-10

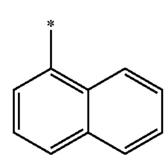

Formula 6-11

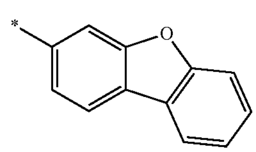

-continued
Formula 6-12
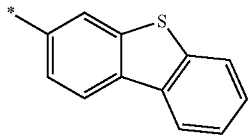
Formula 6-13
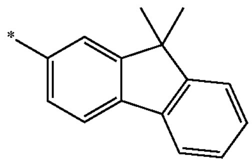
Formula 6-14
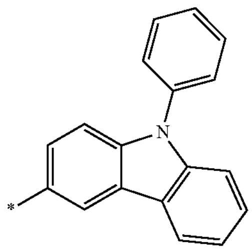
Formula 6-15
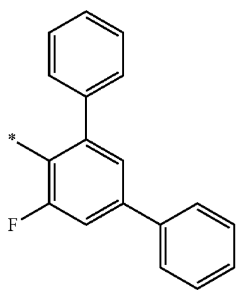
Formula 6-16
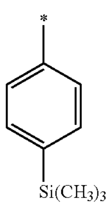
Formula 6-17
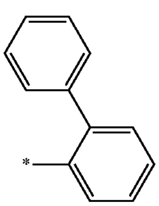
Formula 6-18
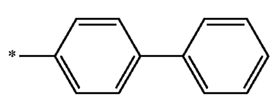
Formula 6-19
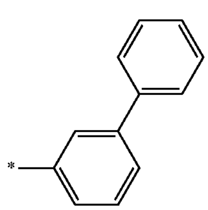
-continued
Formula 6-20
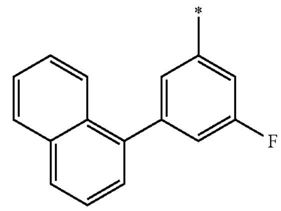
Formula 6-21
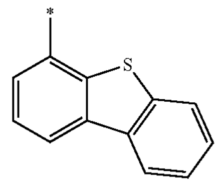
Formula 6-22
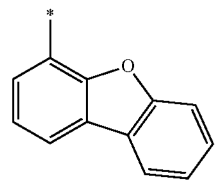
Formula 6-23
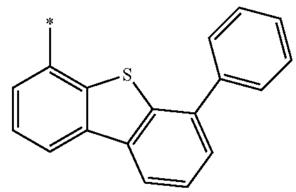
Formula 6-24
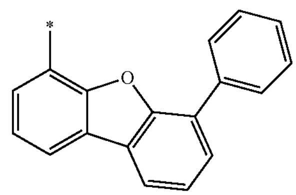
Formula 6-25
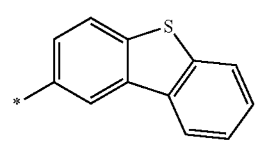
Formula 6-26
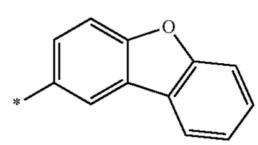
Formula 6-27
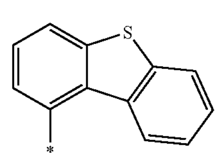

-continued

Formula 6-28

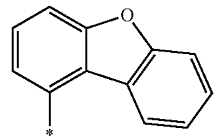

where * is a binding site to a neighboring atom.

11. The condensed cyclic compound of claim 1, wherein at least one of $Ar_1$ to $Ar_4$ is represented by any one of Formulae 5-4, 5-5, 5-14, and 5-15:

Formula 5-4

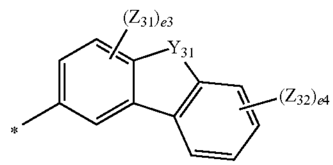

Formula 5-5

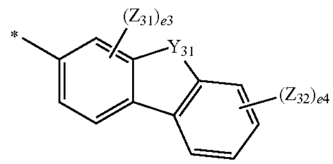

Formula 5-14

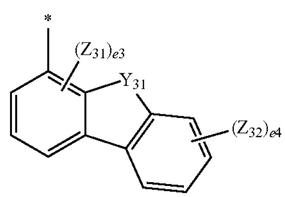

Formula 5-15

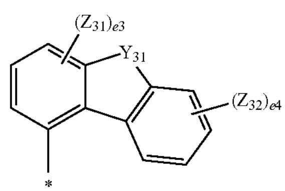

where:

$Y_{31}$ is O or S;

each of $Z_{31}$ to $Z_{32}$ is independently selected from hydrogen, deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group; a substituted $C_1$-$C_{20}$ alkyl group or a substituted $C_1$-$C_{20}$ alkoxy group, each substituted with at least one substituent selected from deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, or a phosphoric acid or a salt thereof; a $C_6$-$C_{20}$ aryl group, a $C_2$-$C_{20}$ heteroaryl group; a substituted $C_6$-$C_{20}$ aryl group or a substituted $C_2$-$C_{20}$ heteroaryl group, each substituted with at least one substituent selected from deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group; or $Si(Q_{11})(Q_{12})(Q_{13})$ where each of $Q_{11}$ to $Q_{13}$ is independently a $C_1$-$C_{20}$ alkyl group, a phenyl group, a naphthyl group, or an anthracenyl group; and e3 is an integer from 1 to 3;

e4 is an integer from 1 to 4; and

* is a binding site to a neighboring atom.

12. The condensed cyclic compound of claim 1, wherein each of $R_1$ and $R_2$ is independently selected from hydrogen, deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a phenyl group, a naphthyl group, or an anthracenyl group.

13. The condensed cyclic compound of claim 1, wherein the condensed cyclic compound is represented by one of Formulae 1A, 1B, 1C, or 1D:

Formula 1A

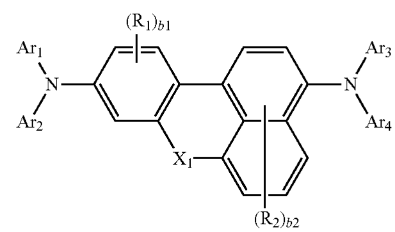

Formula 1B

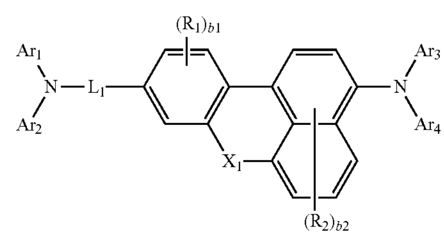

Formula 1C

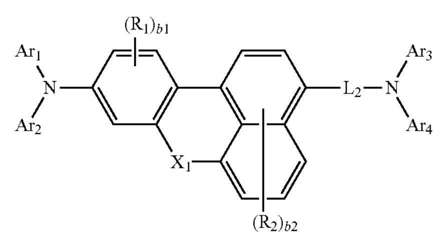

-continued

Formula 1D

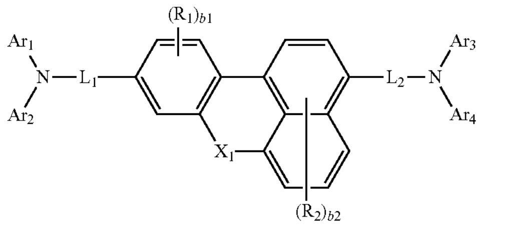

where:

each of $L_1$ and $L_2$ is independently represented by one of Formulae 2-1 to 2-28;

each of $Ar_1$ and $Ar_4$ is independently selected from Formulae 5-1 to 5-15;

each of $R_1$ and $R_2$ is independently selected from hydrogen, deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a phenyl group, a naphthyl group, or an anthracenyl group;

each of b1 and b2 is independently 1 or 2;

Formula 2-1

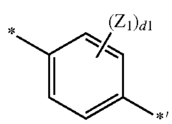

Formula 2-2

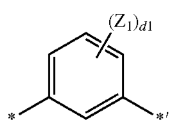

Formula 2-3

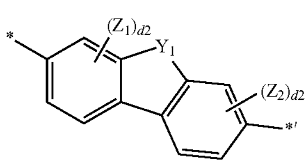

Formula 2-4

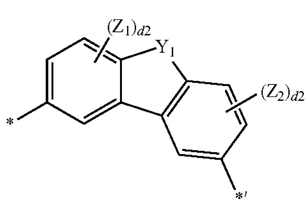

Formula 2-5

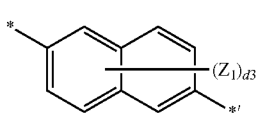

Formula 2-6

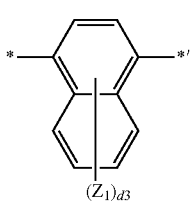

-continued

Formula 2-7

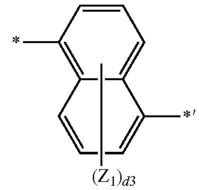

Formula 2-8

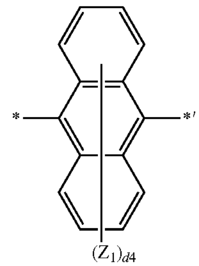

Formula 2-9

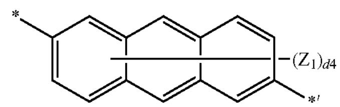

Formula 2-10

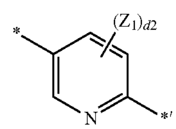

Formula 2-11

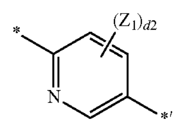

Formula 2-12

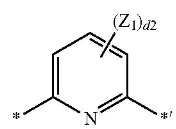

Formula 2-13

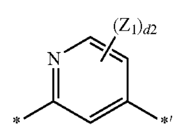

Formula 2-14

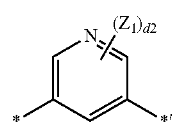

Formula 2-15

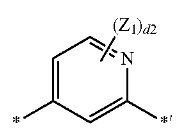

Formula 2-16

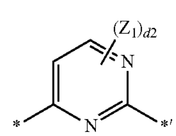

Formula 2-17

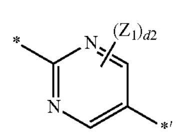

-continued
Formula 2-18
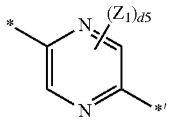
Formula 2-19
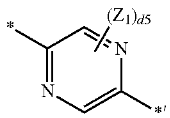
Formula 2-20
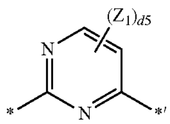
Formula 2-21
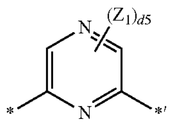
Formula 2-22
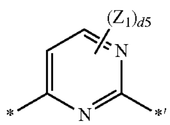
Formula 2-23
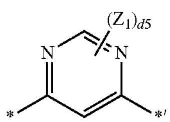
Formula 2-24
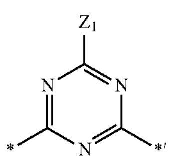
Formula 2-25
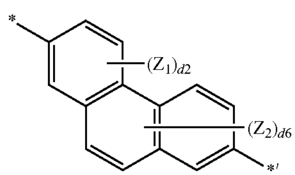
Formula 2-26
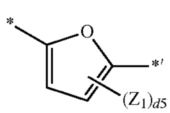
Formula 2-27
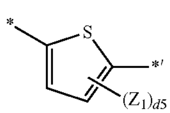
Formula 2-28
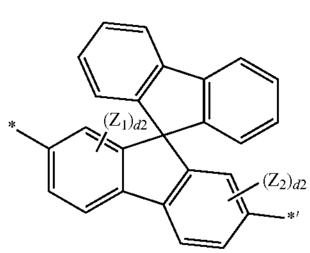
-continued
Formula 5-1
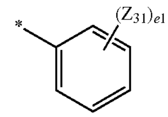
Formula 5-2
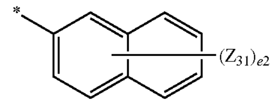
Formula 5-3
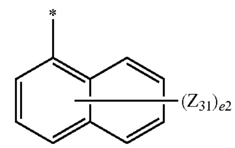
Formula 5-4
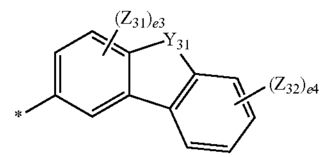
Formula 5-5
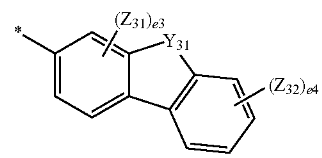
Formula 5-6
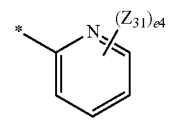
Formula 5-7
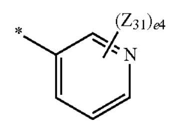
Formula 5-8
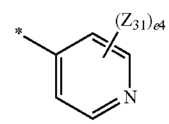
Formula 5-9
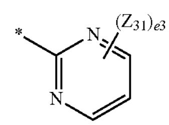
Formula 5-10
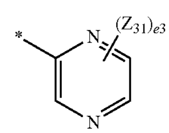
Formula 5-11
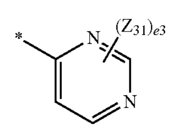
Formula 5-12
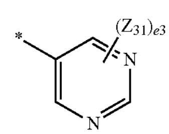

-continued

Formula 5-13

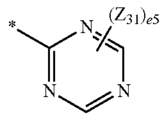

Formula 5-14

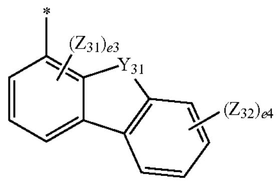

Formula 5-15

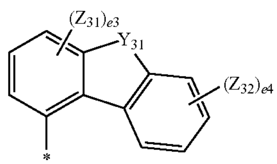

where in Formulae 2-1 to 2-28, $Y_1$ is O, S, $C(Z_3)(Z_4)$, $N(Z_5)$, or $Si(Z_6)(Z_7)$;

each of $Z_1$ to $Z_7$ is independently selected from: hydrogen, deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group; a substituted $C_1$-$C_{20}$ alkyl group or a substituted $C_1$-$C_{20}$ alkoxy group, each substituted with at least one substituent selected from deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, or a phosphoric acid or a salt thereof; a $C_6$-$C_{20}$ aryl group, a $C_2$-$C_{20}$ heteroaryl group; or a substituted $C_6$-$C_{20}$ aryl group or a substituted $C_2$-$C_{20}$ heteroaryl group, each substituted with at least one substituent selected from deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group;

d1 is an integer from 1 to 4;

d2 is an integer from 1 to 3;

d3 is an integer from 1 to 6;

d4 is an integer from 1 to 8;

d5 is 1 or 2;

d6 is an integer from 1 to 5; and each of * and *" is a binding site to a neighboring atom; and in Formulae 5-1 to 5-15:

$Y_{31}$ is O, S, $C(Z_{33})(Z_{34})$ or $N(Z_{35})$;

each of $Z_{31}$ to $Z_{35}$ is independently selected from: hydrogen, deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group; a substituted $C_1$-$C_{20}$ alkyl group or a substituted $C_1$-$C_{20}$ alkoxy group, each substituted with at least one substituent selected from deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, or a phosphoric acid or a salt thereof; a $C_6$-$C_{20}$ aryl group, a $C_2$-$C_{20}$ heteroaryl group; a substituted $C_6$-$C_{20}$ aryl group or a substituted $C_2$-$C_{20}$ heteroaryl group, each substituted with at least one substituent selected from deuterium, a halogen atom, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolyl group, or an isoquinolyl group; or $Si(Q_{11})(Q_{12})(Q_{13})$ where each of $Q_{11}$ to $Q_{13}$ is independently a $C_1$-$C_{20}$ alkyl group, a phenyl group, a naphthyl group, or an anthracenyl group;

e1 is an integer from 1 to 5;

e2 is an integer from 1 to 7;

e3 is an integer from 1 to 3;

e4 is an integer from 1 to 4;

e5 is 1 or 2; and

* is a binding site to a neighboring atom.

14. The condensed cyclic compound of claim 13, wherein the condensed cyclic compound is represented by Formula 1A, at least one of $Ar_1$ to $Ar_4$ is represented by one of Formulae 5-4, 5-5, 5-14, or 5-15, and $Y_{31}$ is O or S.

15. A condensed cyclic compound comprising one of Compounds 1 to 152:

1

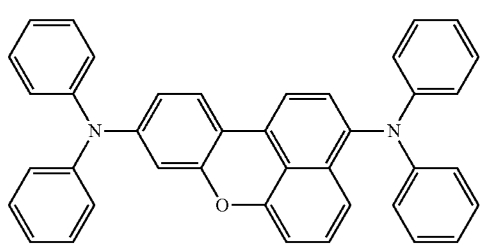

-continued
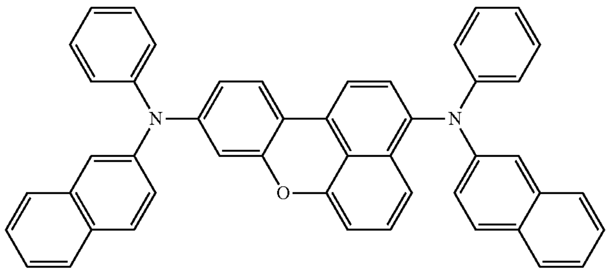
2
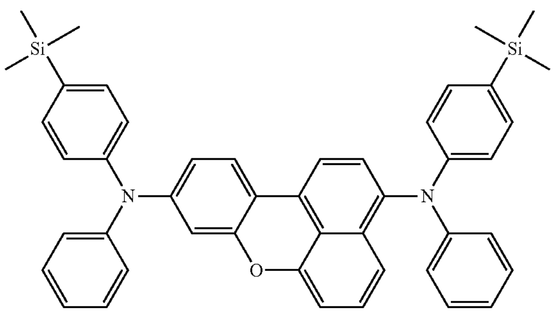
3
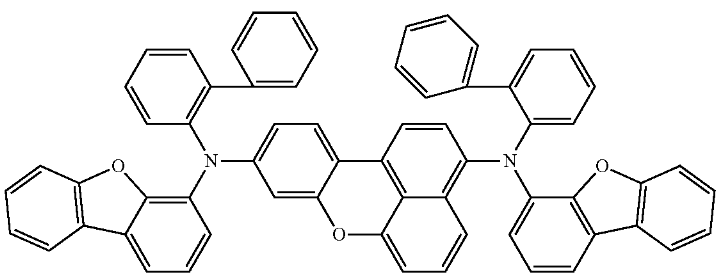
4
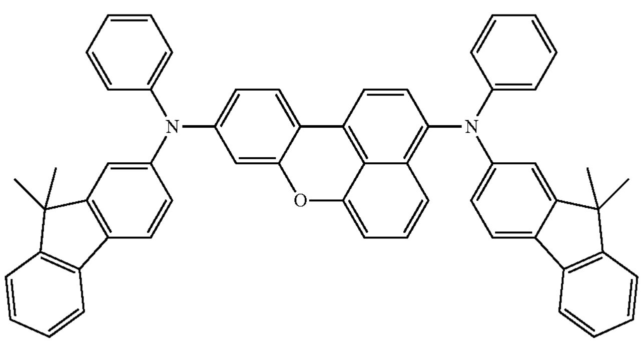
5
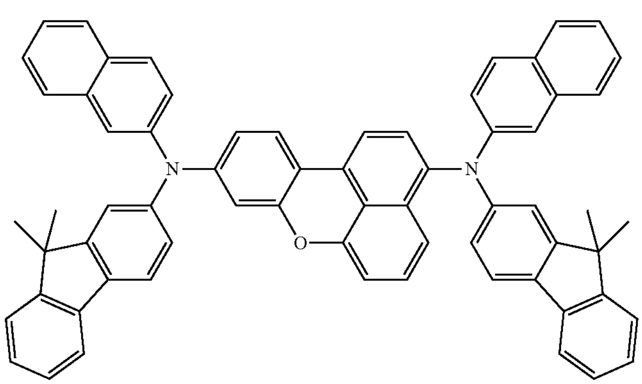
6

-continued
7
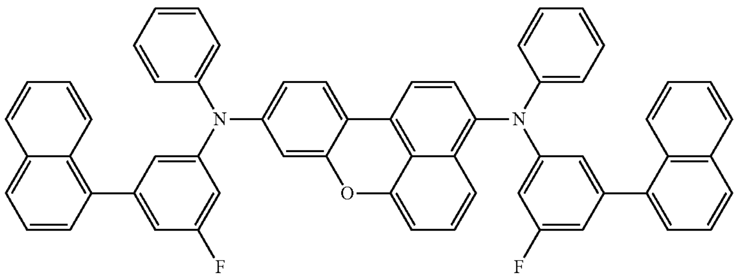
8
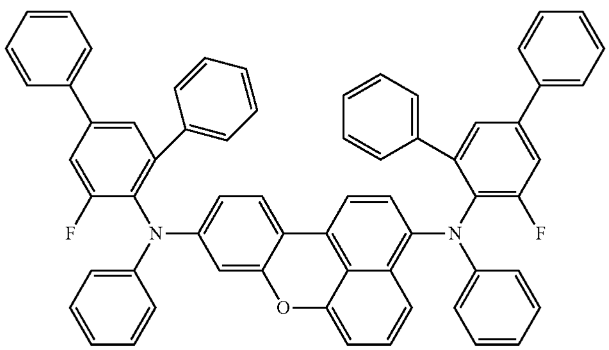
9
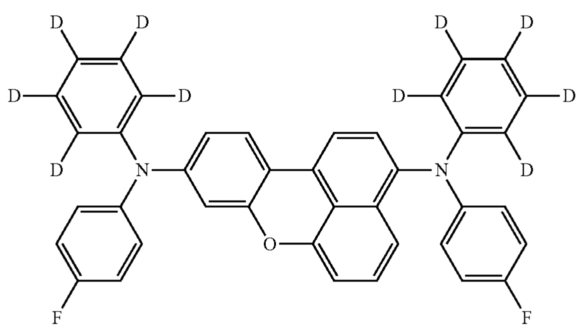
10
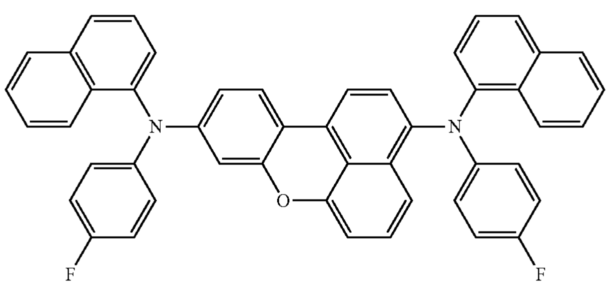
11
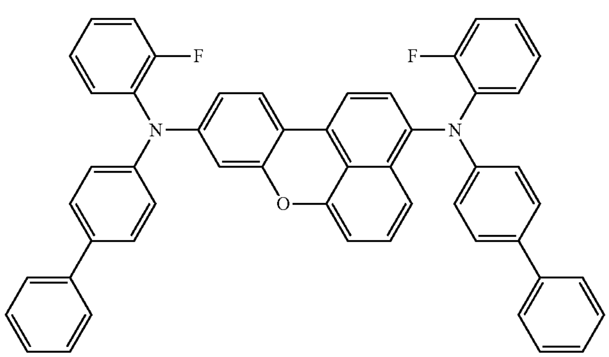

-continued
12
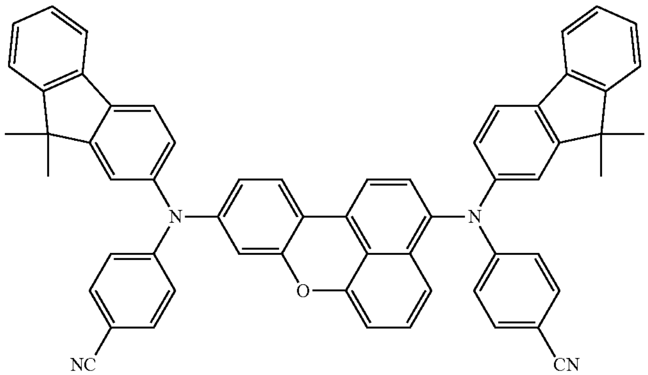
13
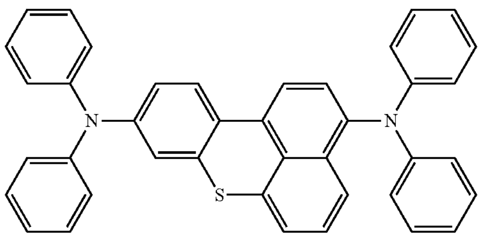
14
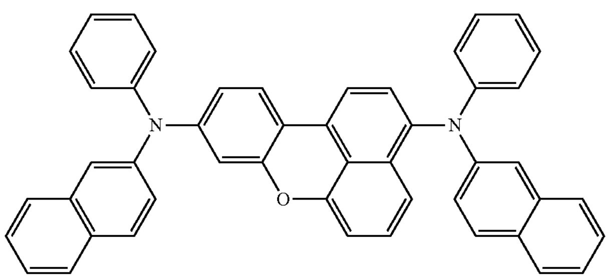
15
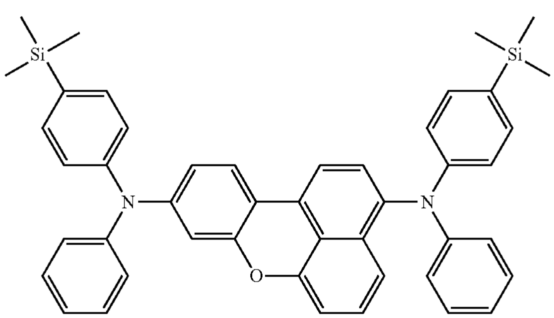
16
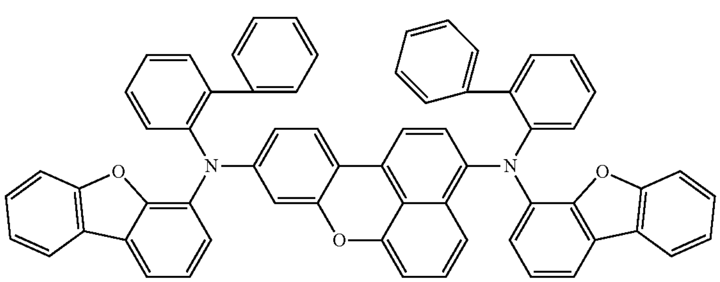

-continued
17
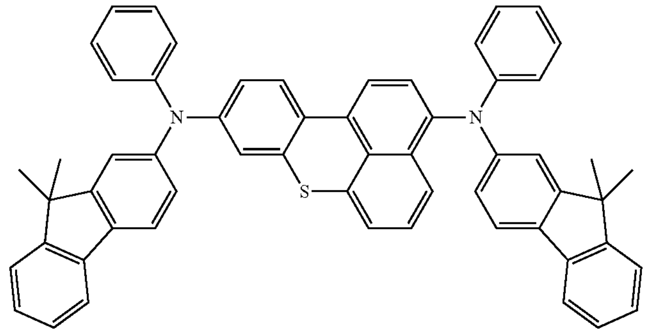
18
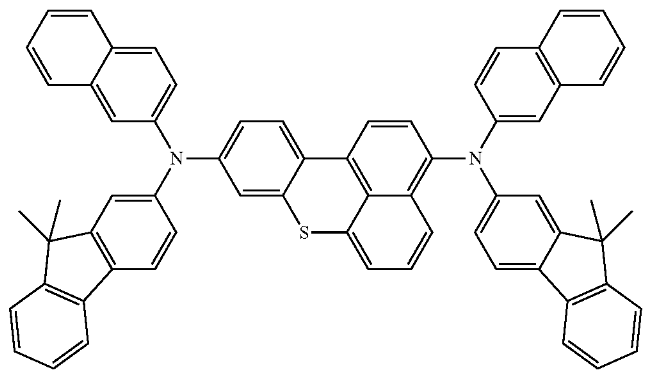
19
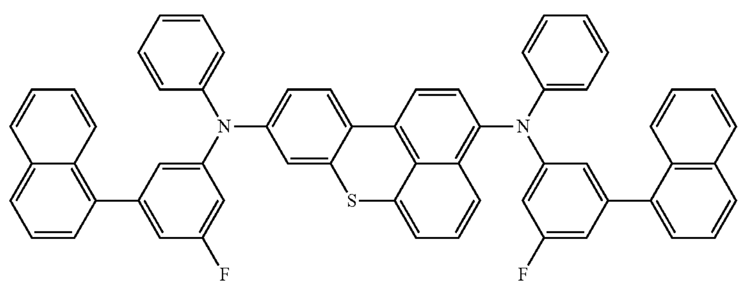
20
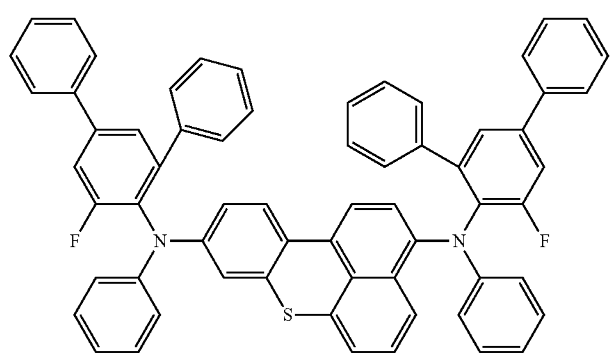

-continued
21
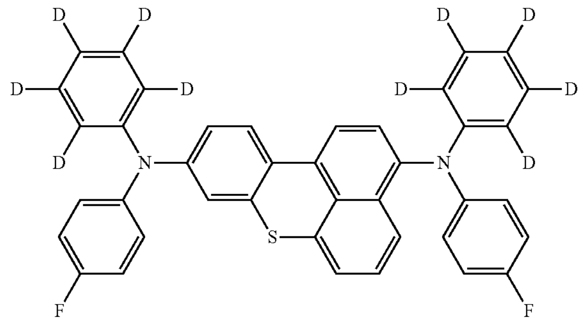
22
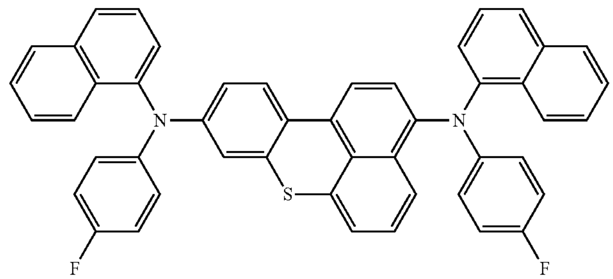
23
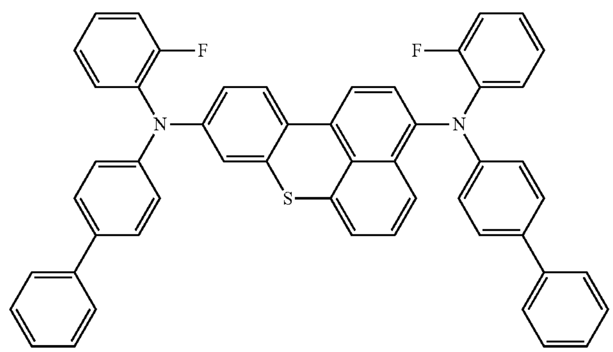
24
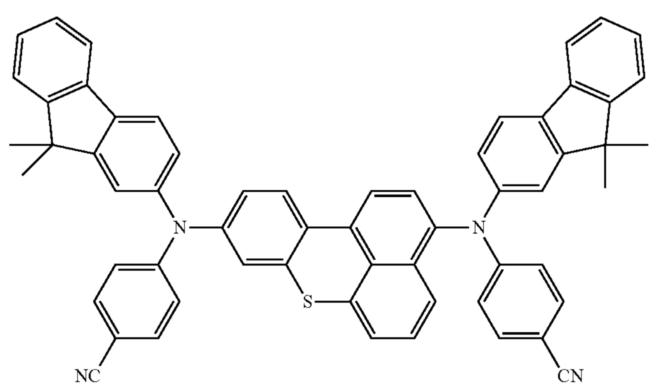
25
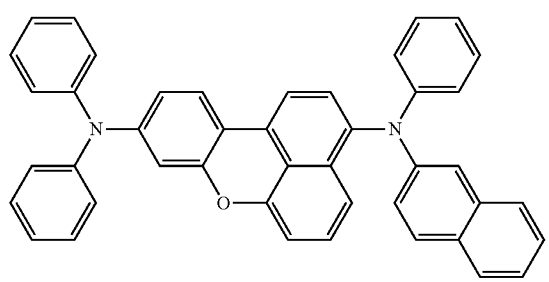

-continued
26
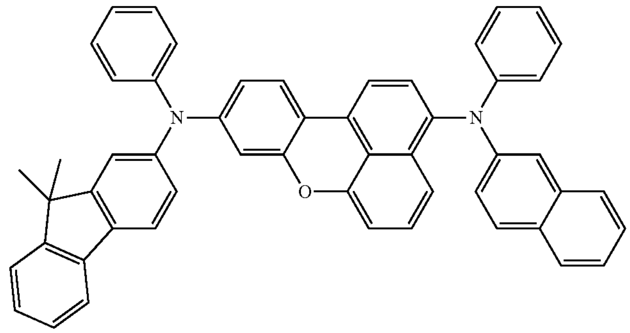
27
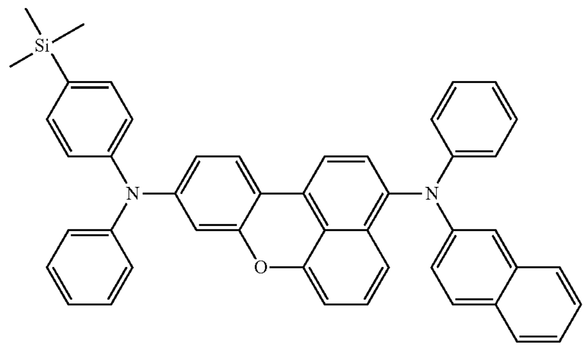
28
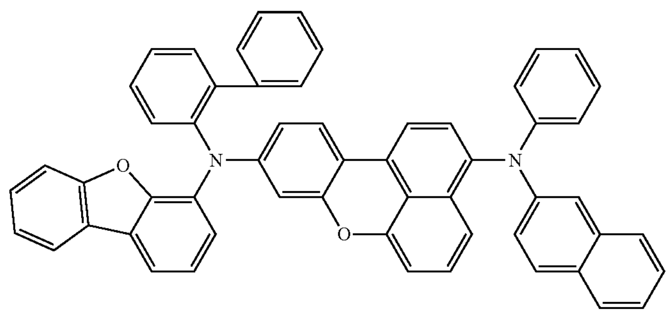
29
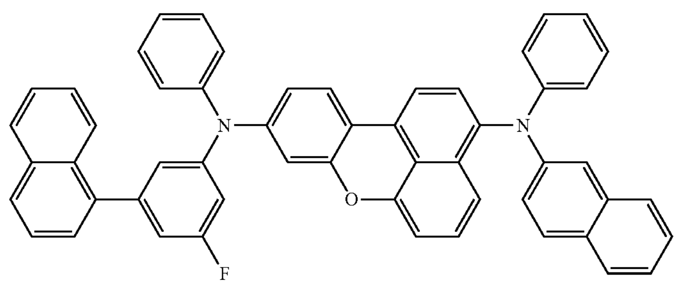
30
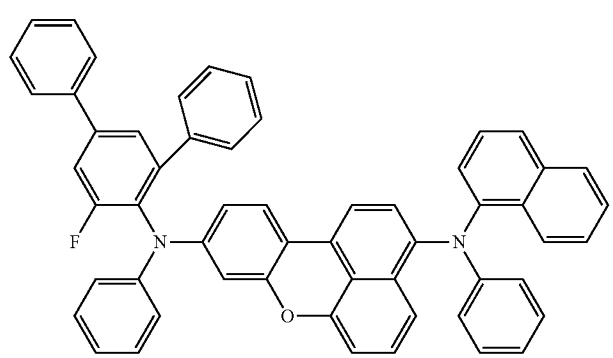

-continued
31
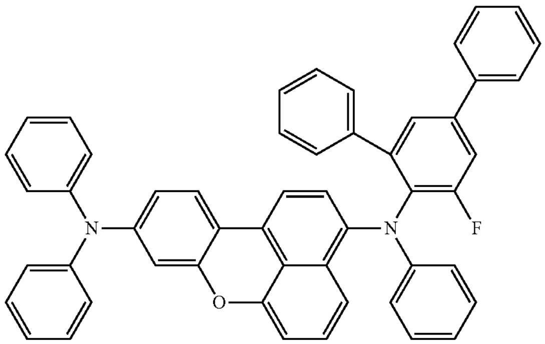
32
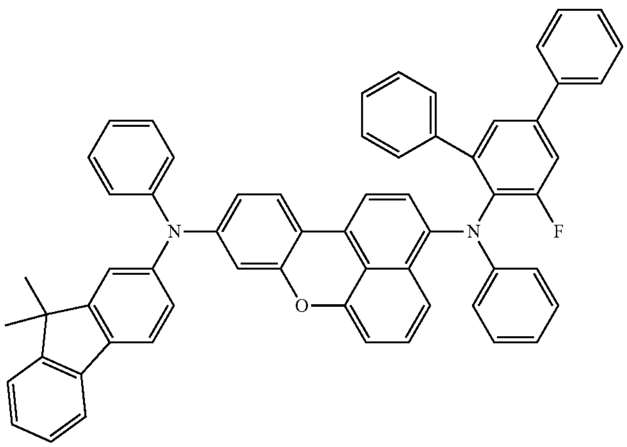
33
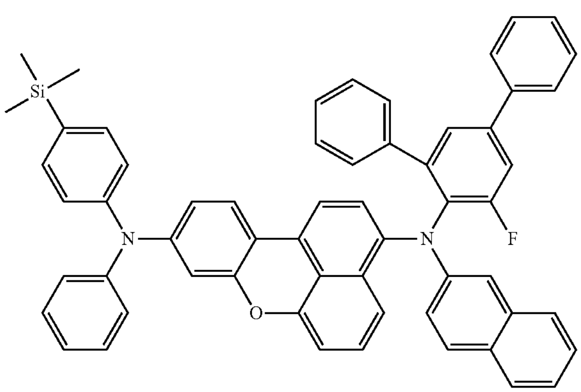
34
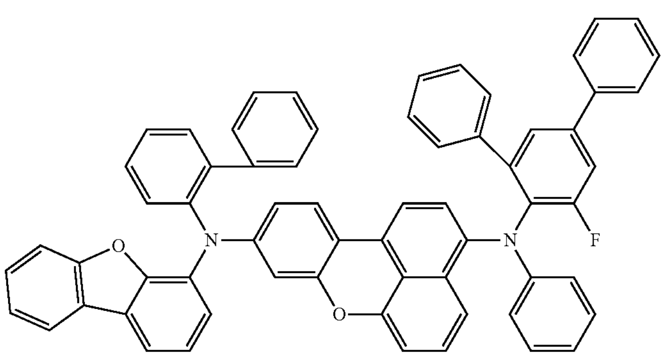

-continued
35
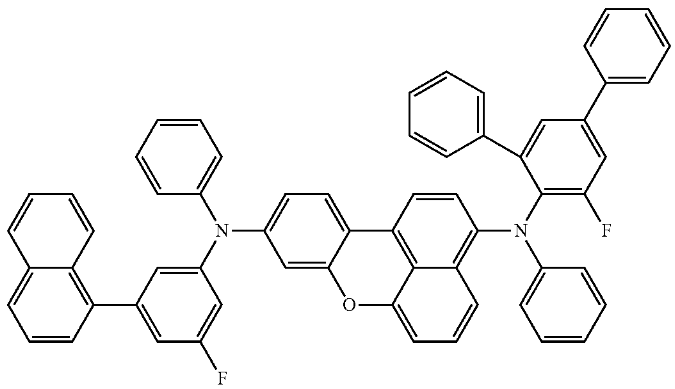
36
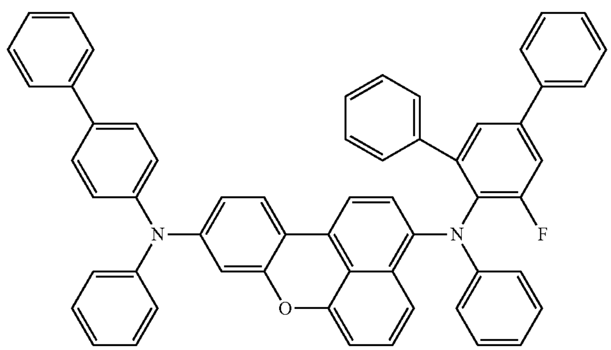
37
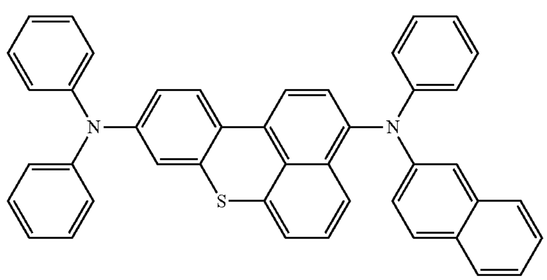
38
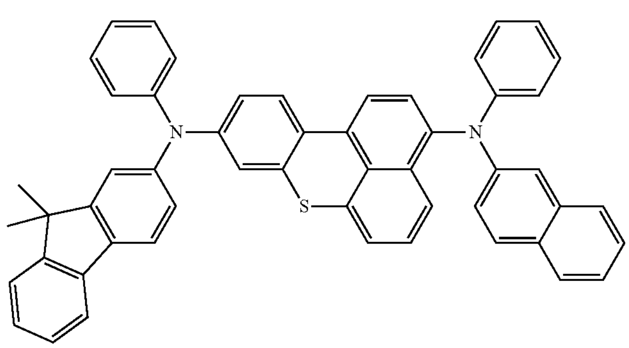

-continued
39
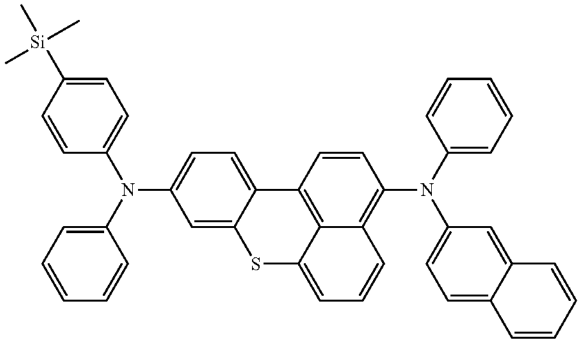
40
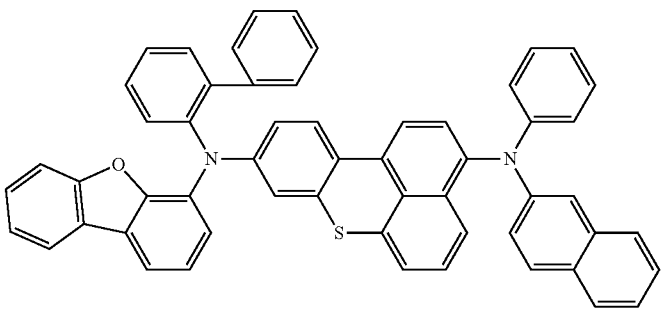
41
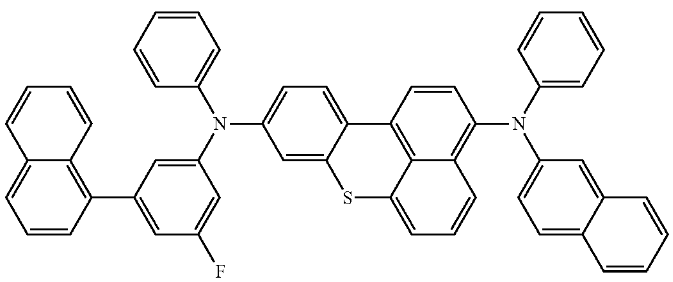
42
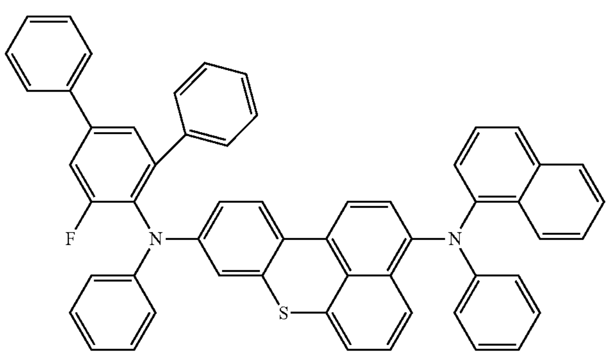
43
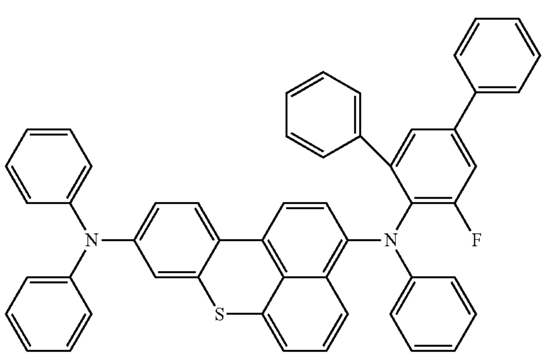

-continued
44
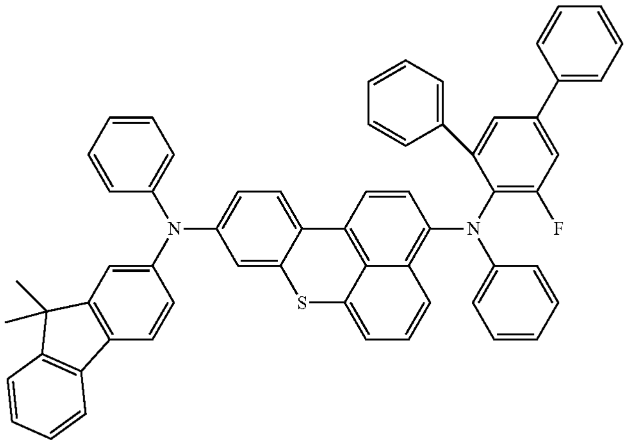
45
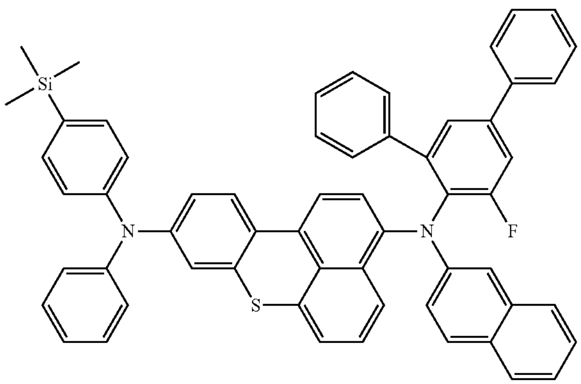
46
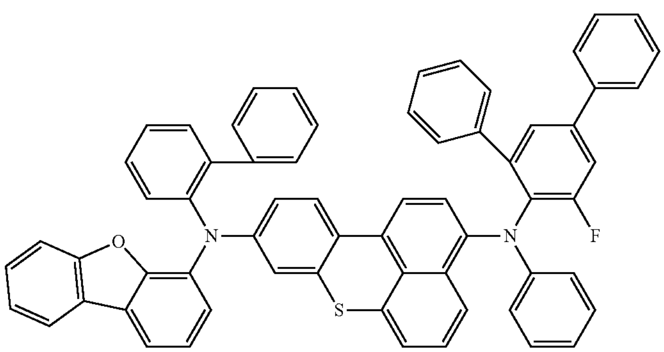
47
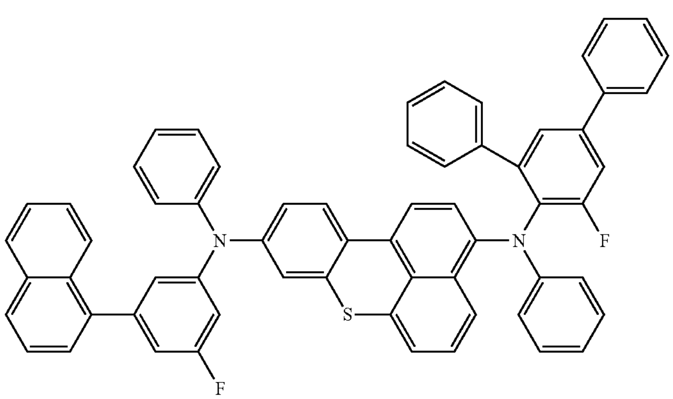

-continued
48
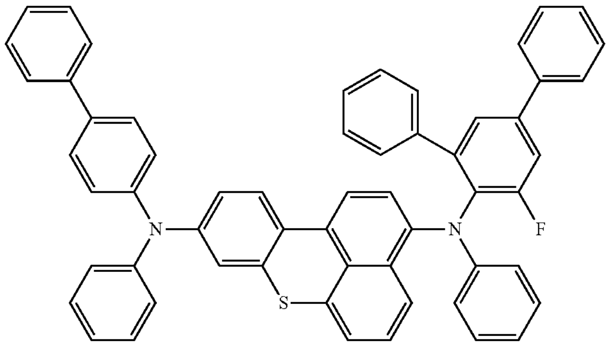
49
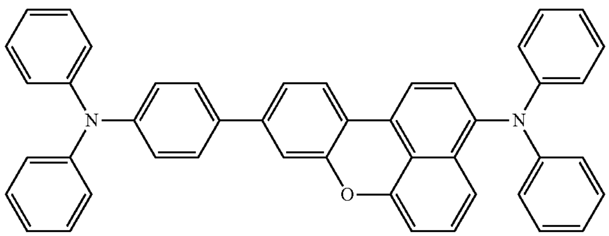
50
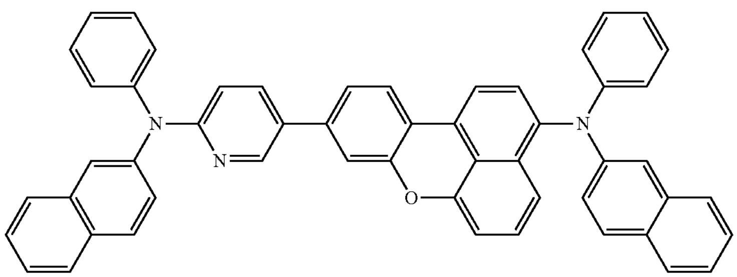
51
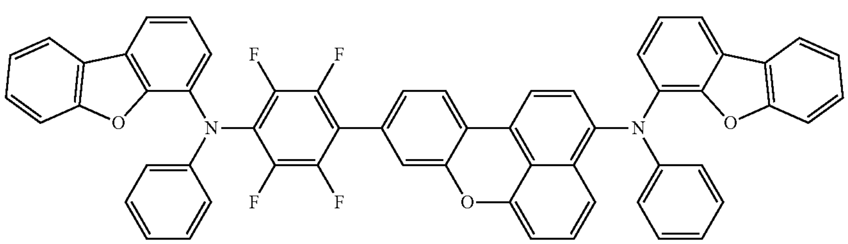
52
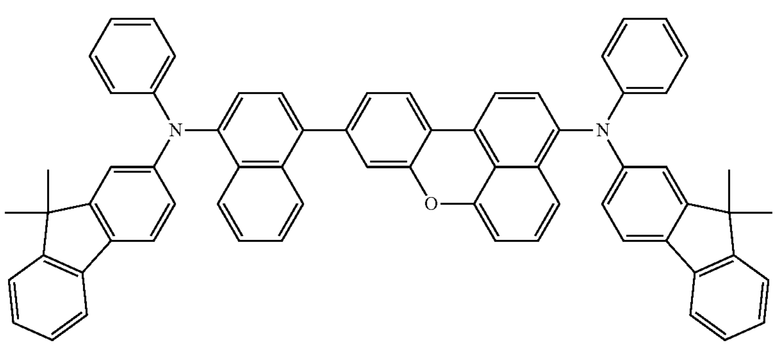

-continued
53
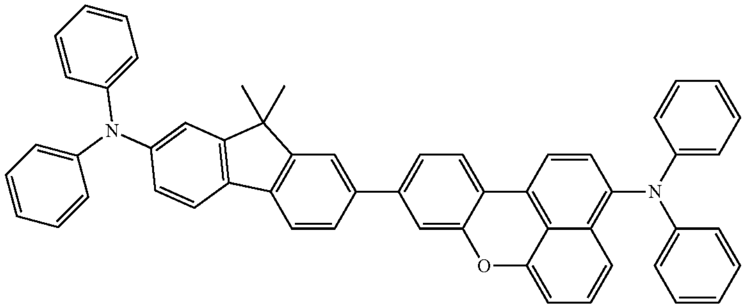
54
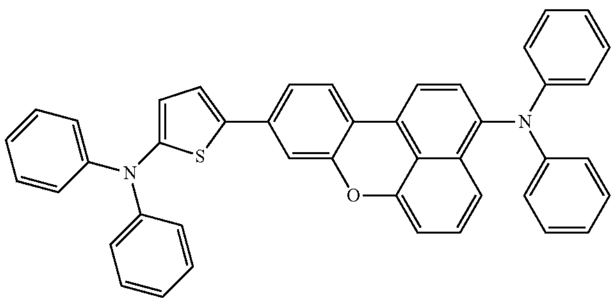
55
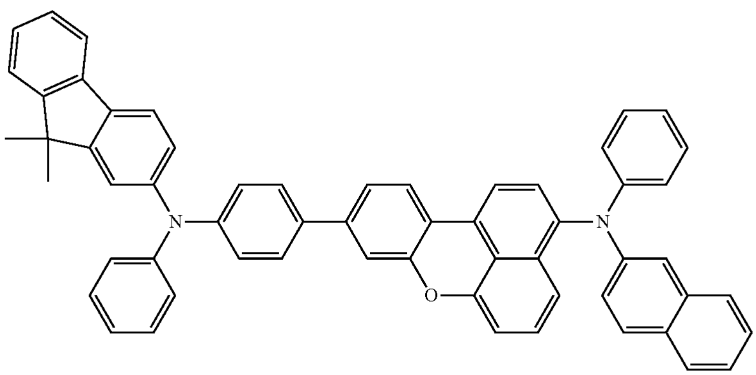
56
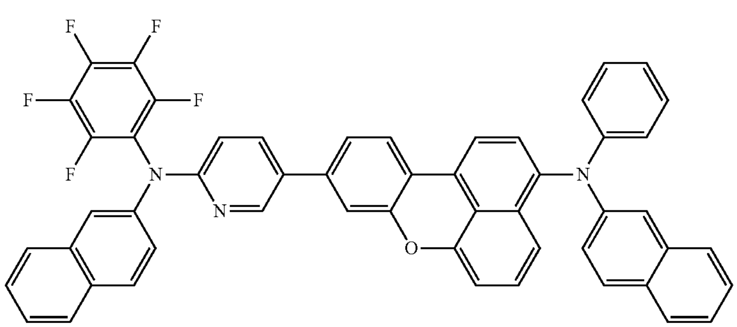
57
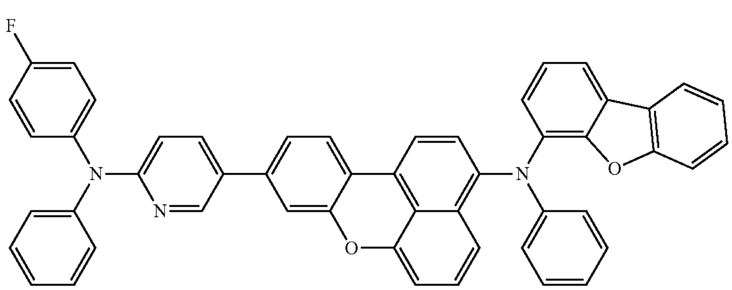

-continued
58
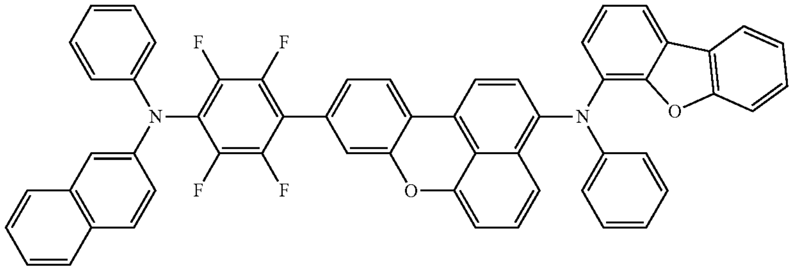
59
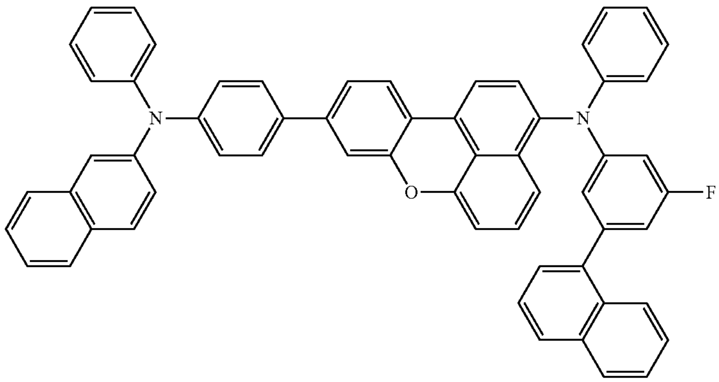
60
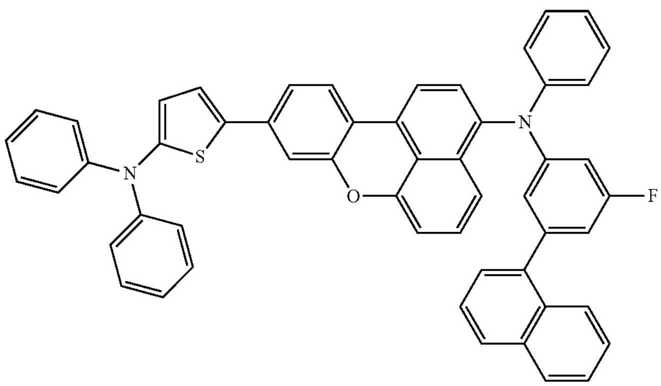
61
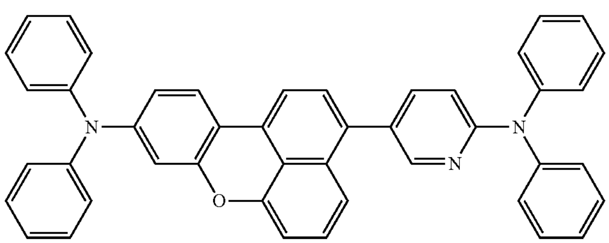
62
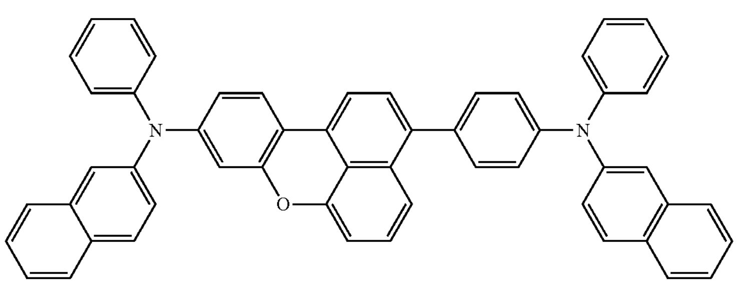

-continued
63
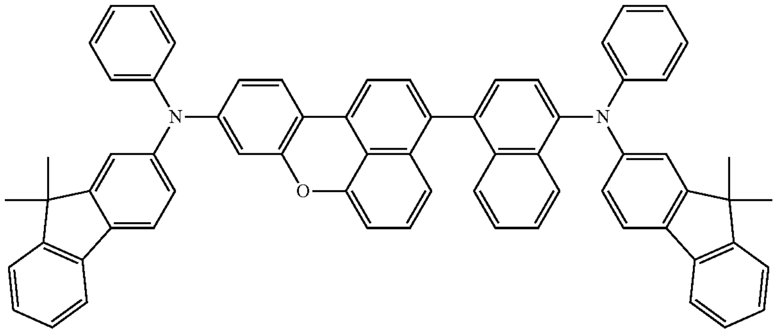
64
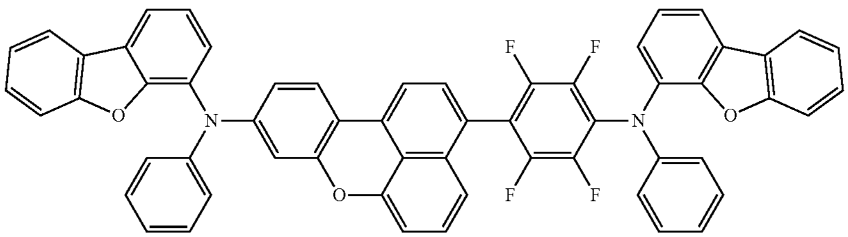
65
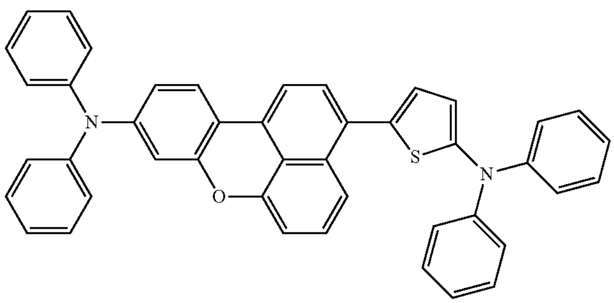
66
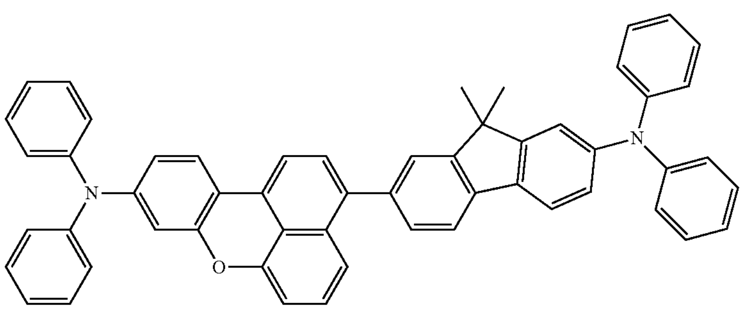
67
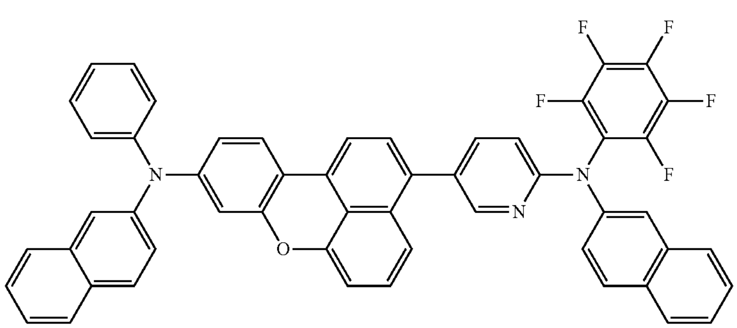

-continued
68
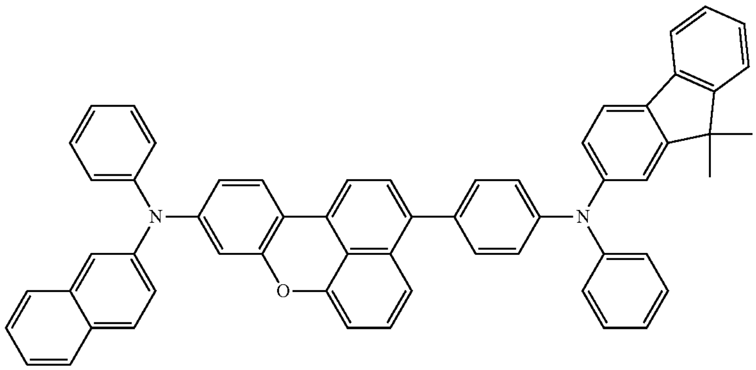
69
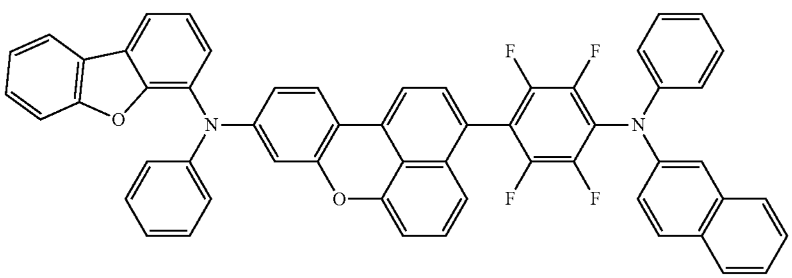
70
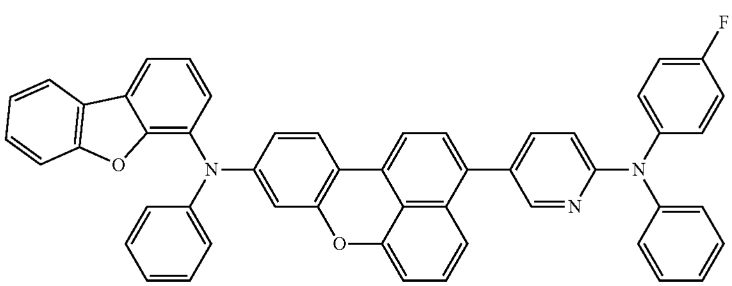
71
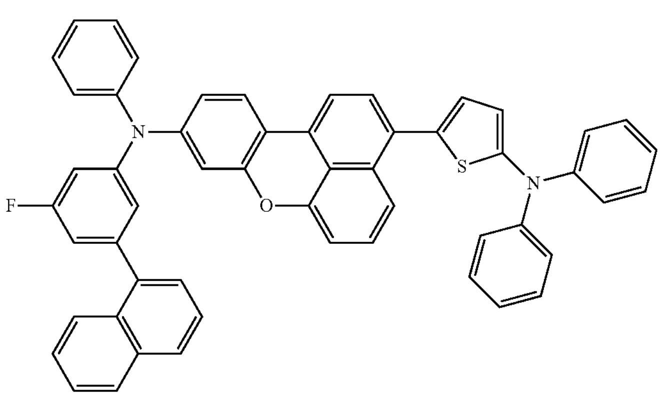

-continued
72
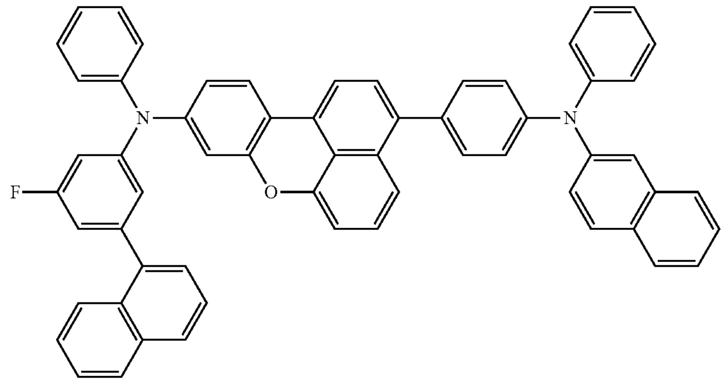
73
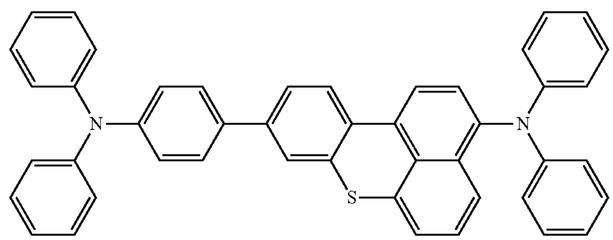
74
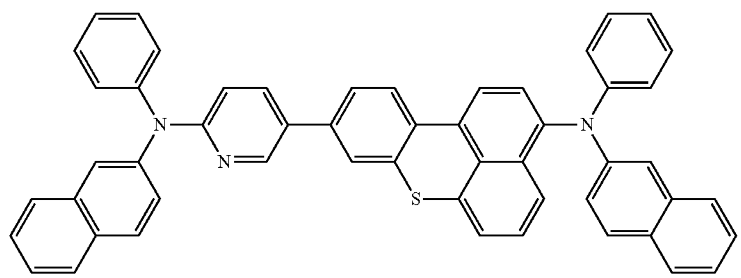
75
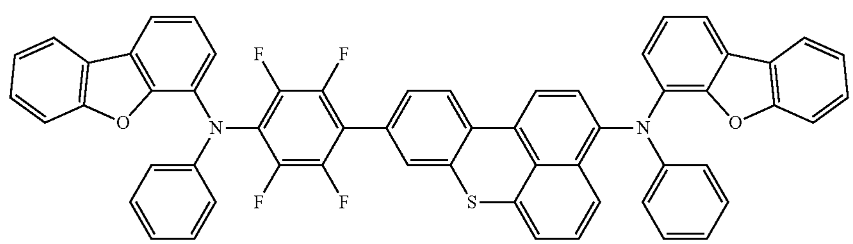
76
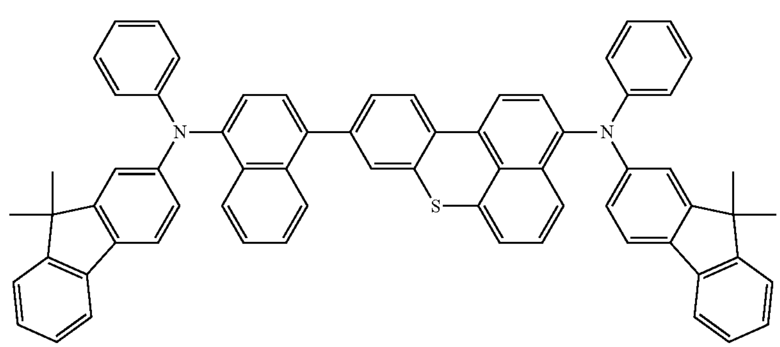

-continued
77
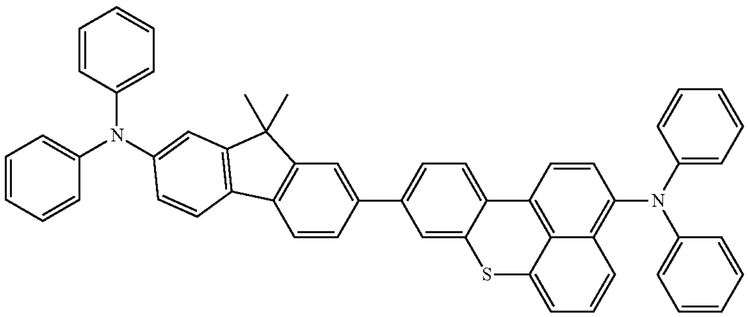
78
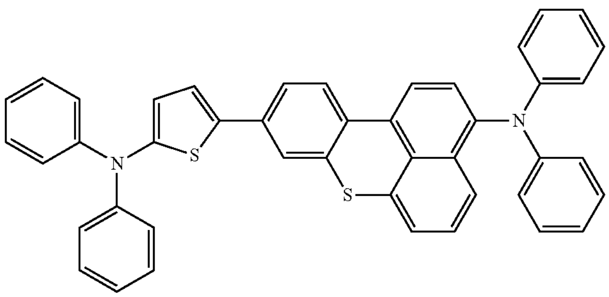
79
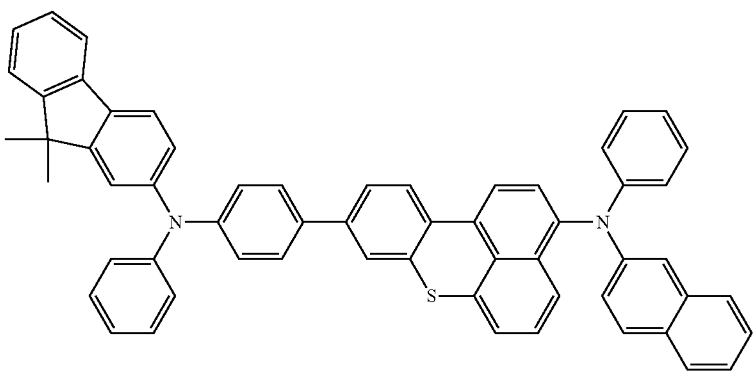
80
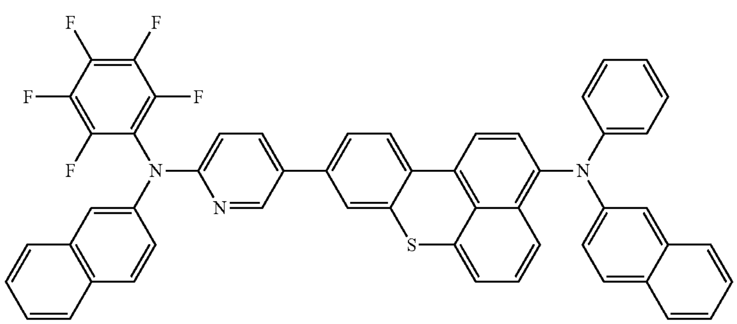
81
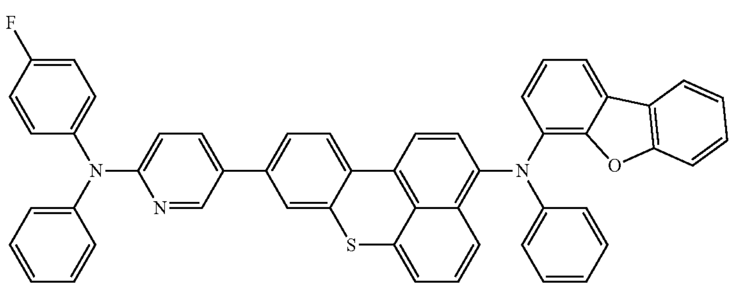

-continued
82
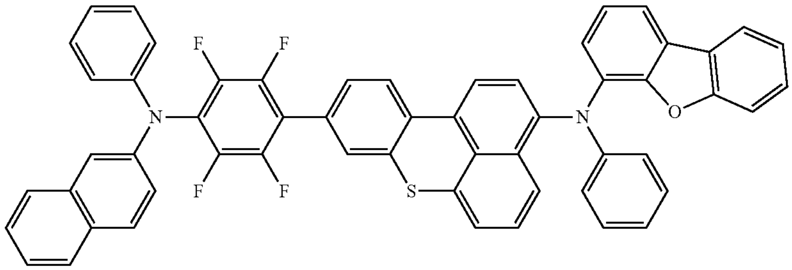
83
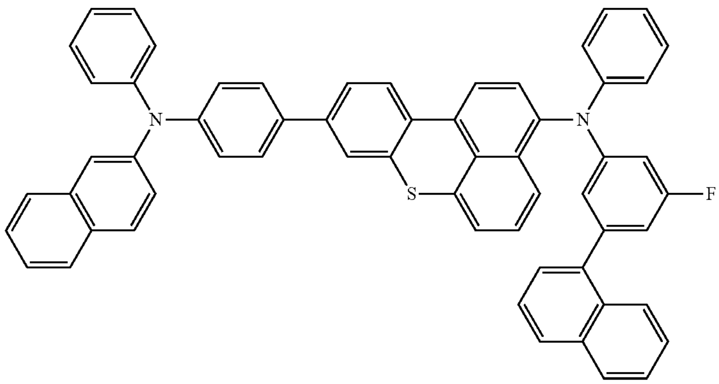
84
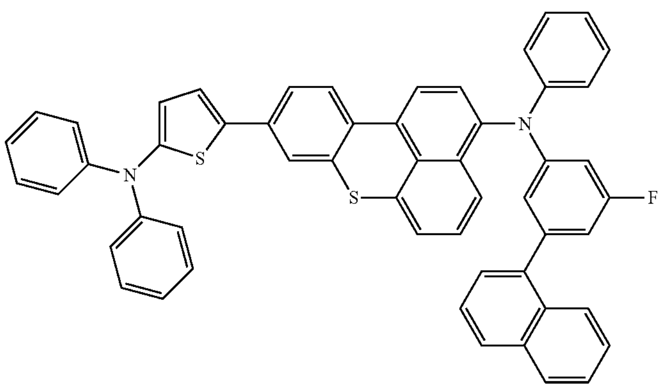
85
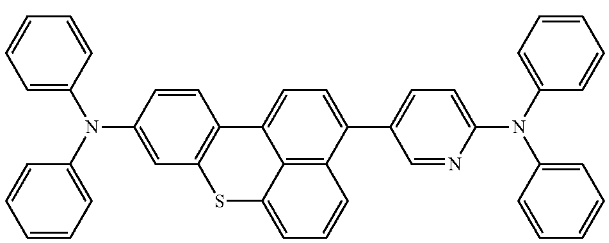
86
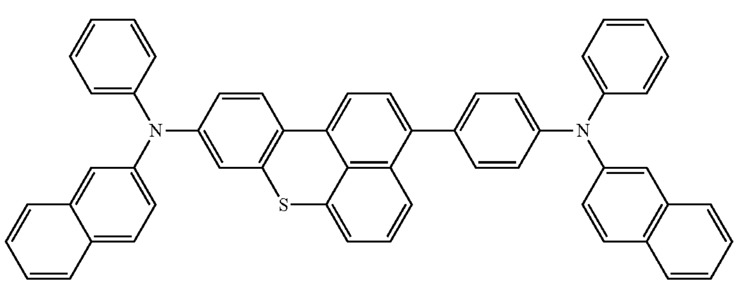

-continued
87
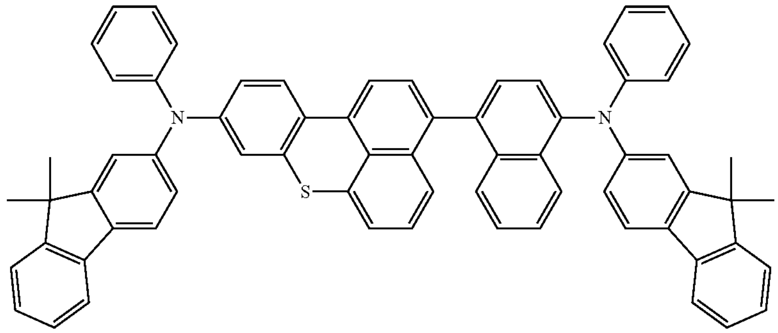
88
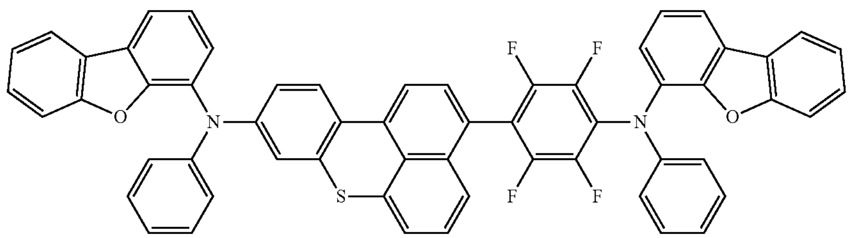
89
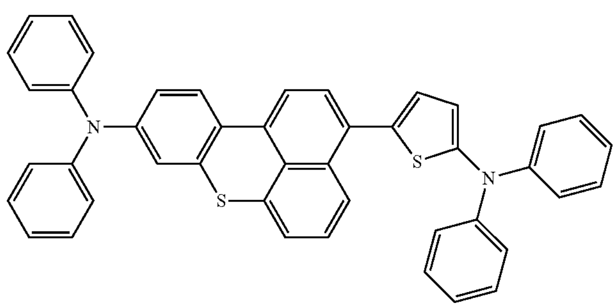
90
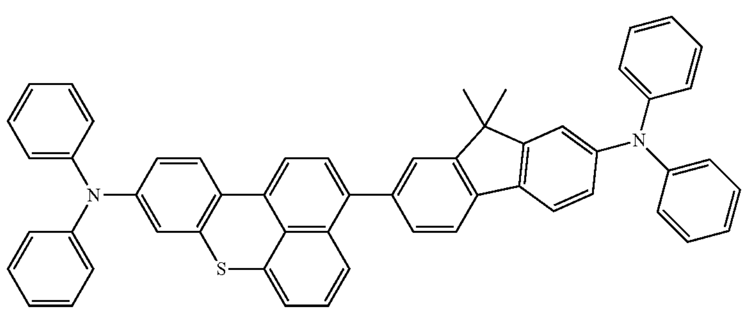
91
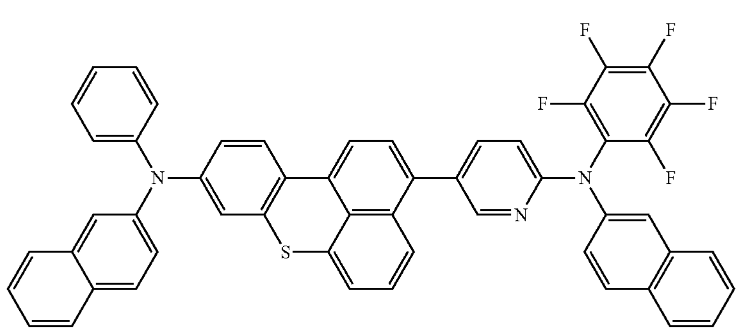

-continued
92
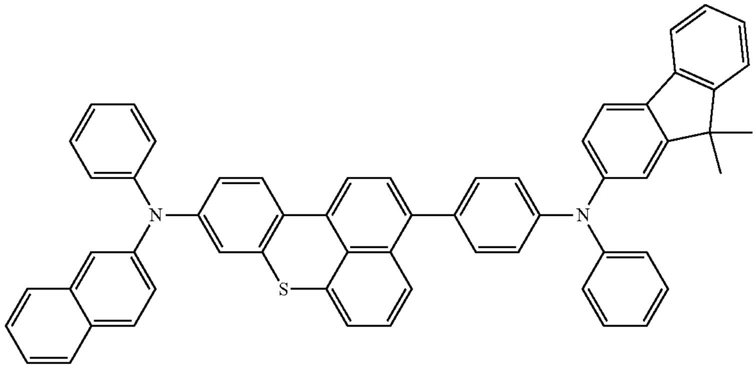
93
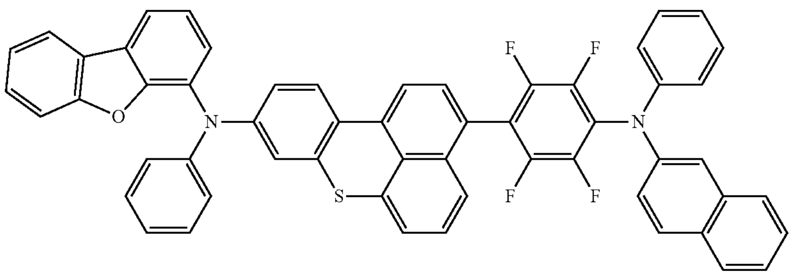
94
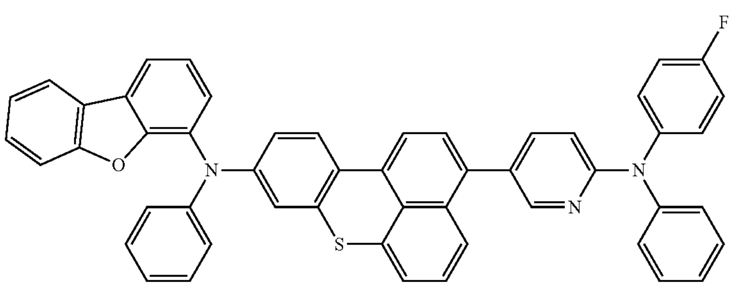
95
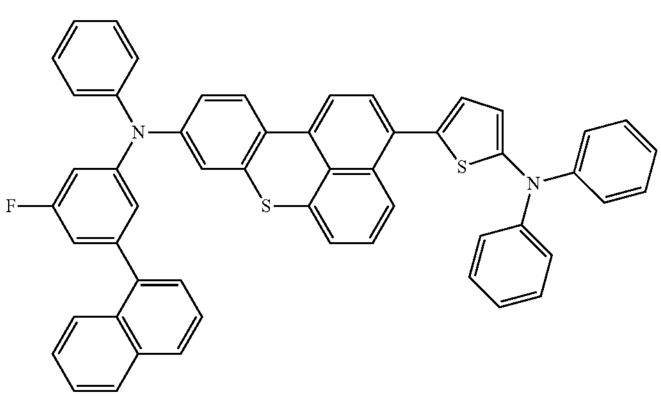

-continued
96
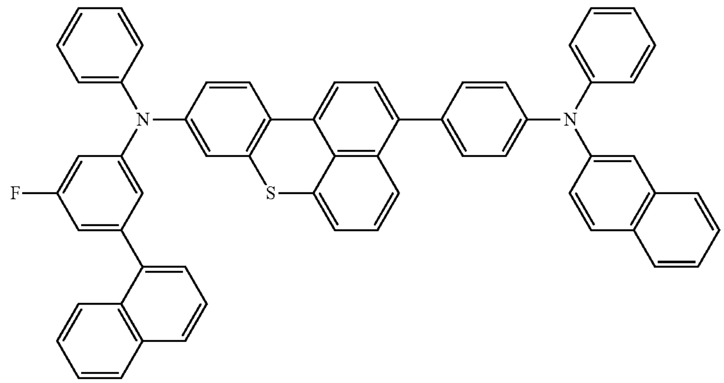
97
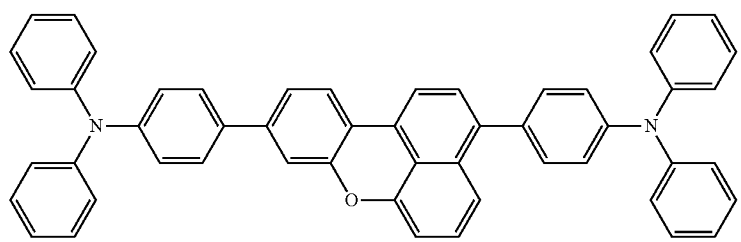
98
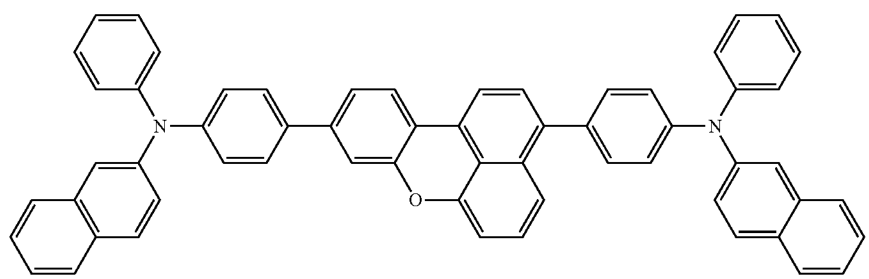
99
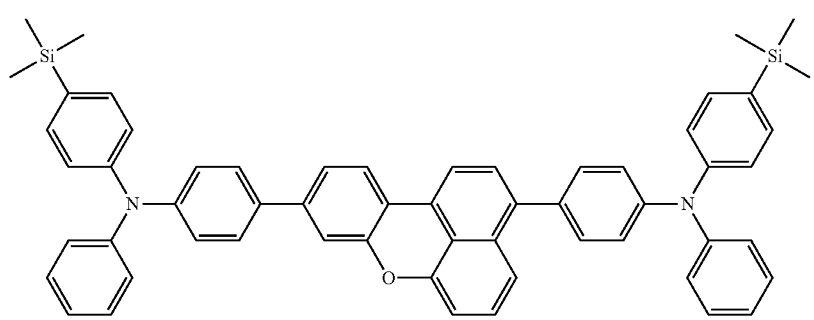
100
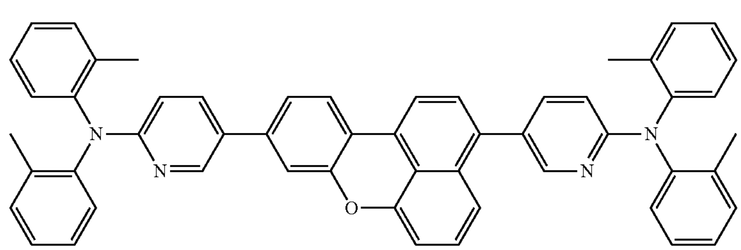

-continued
101
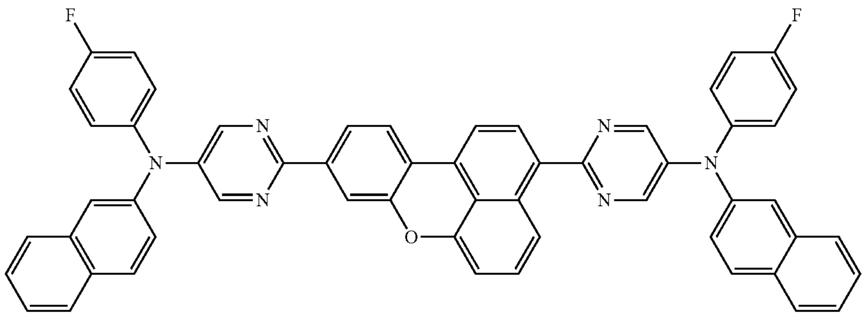
102
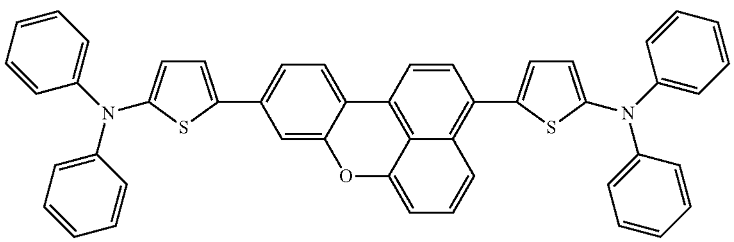
103
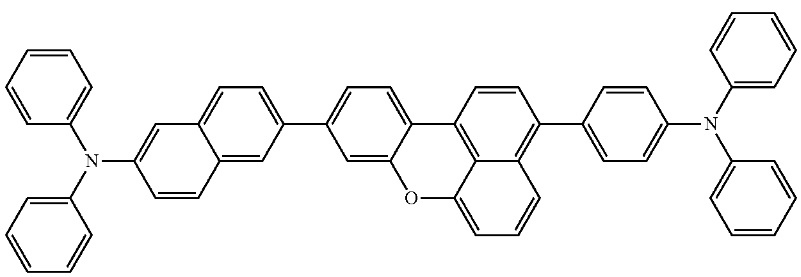
104
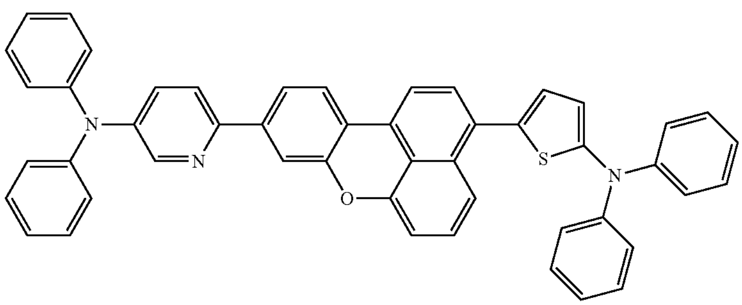
105
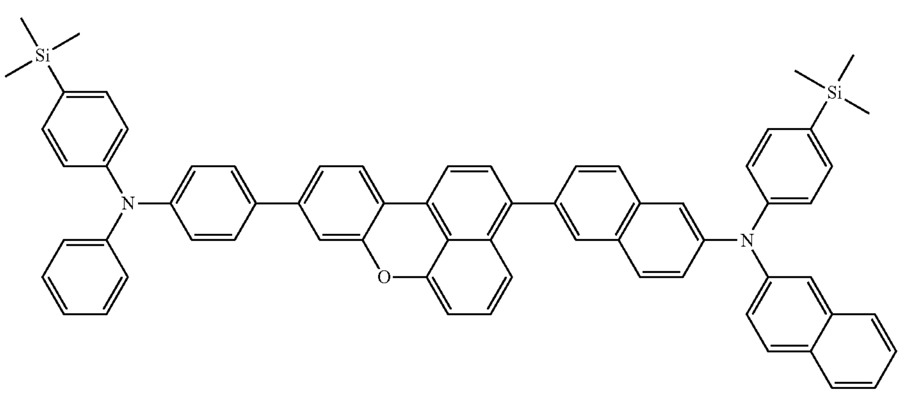

-continued
106
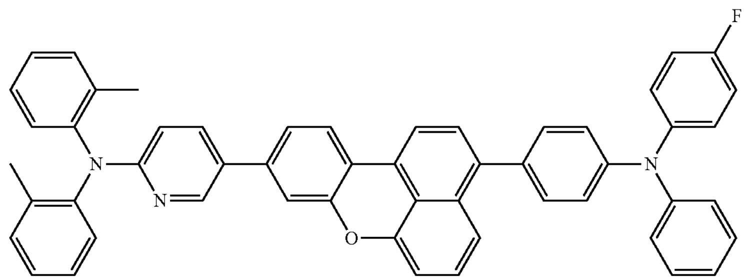
107
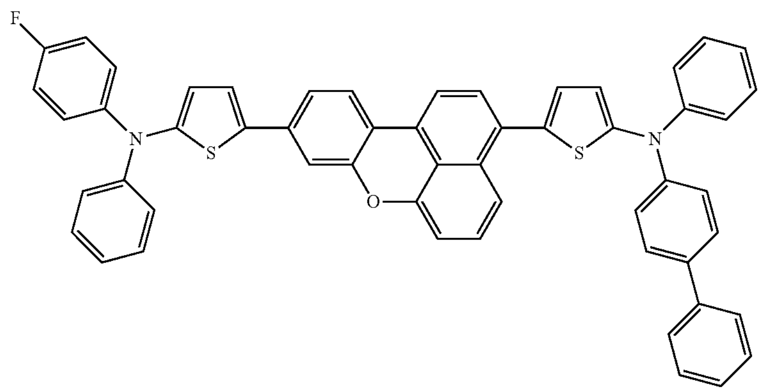
108
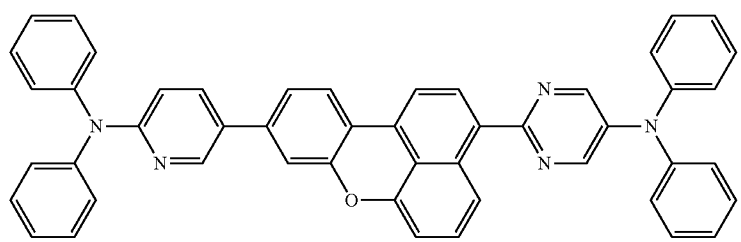
109
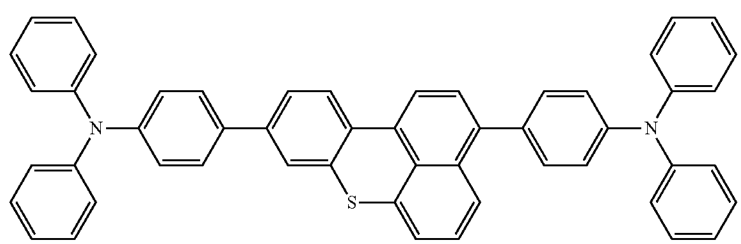
110
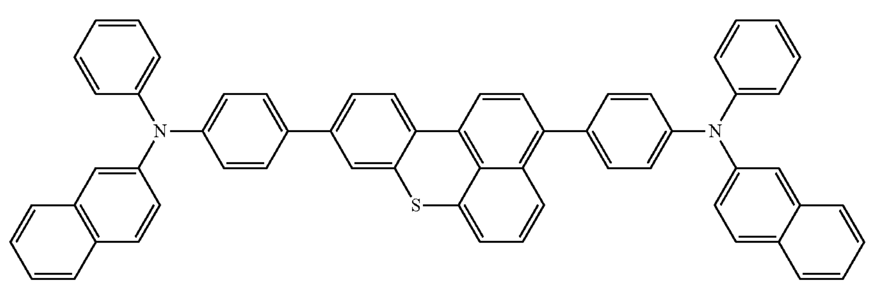

-continued
111
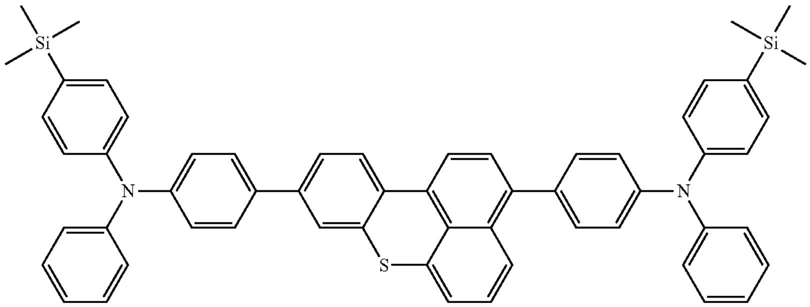
112
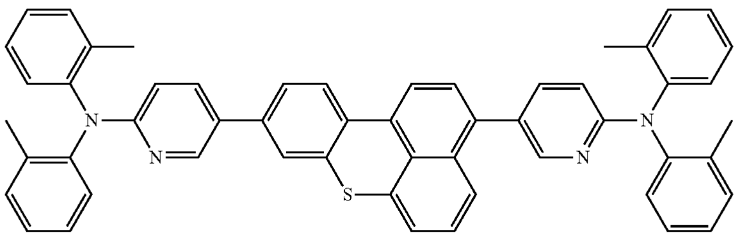
113
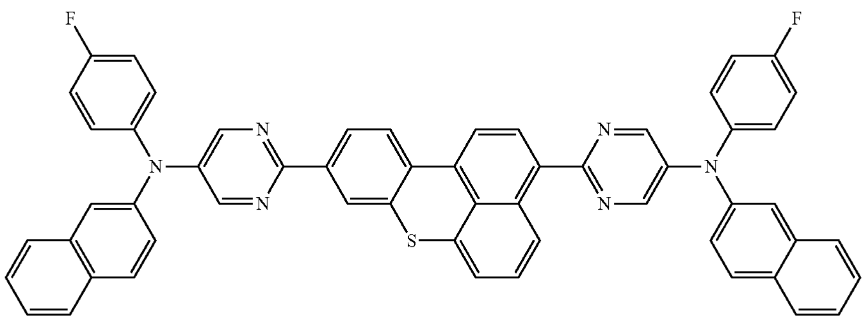
114
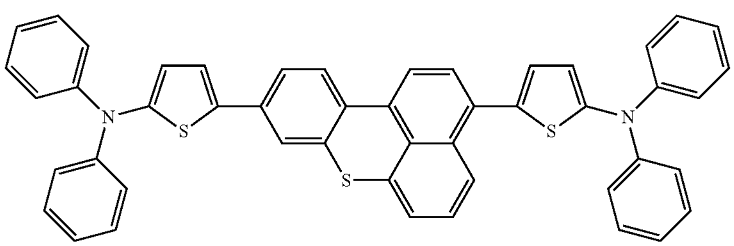
115
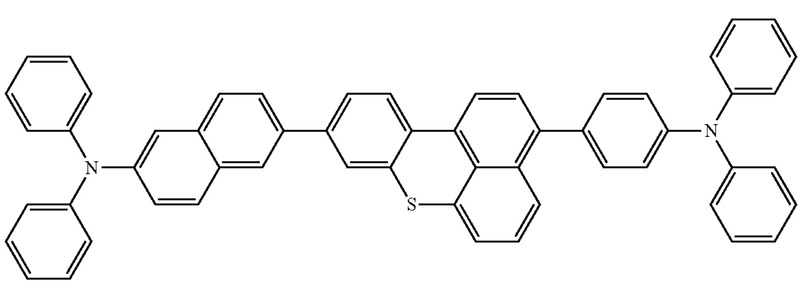

-continued
116
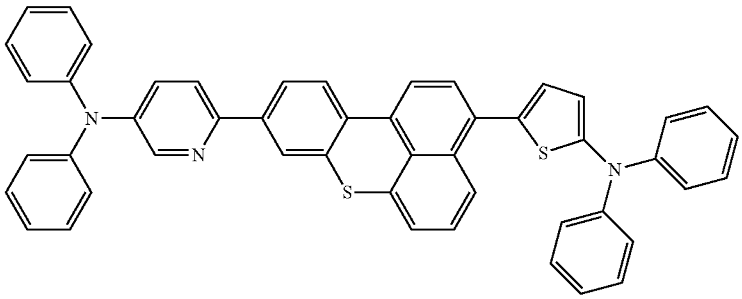
117
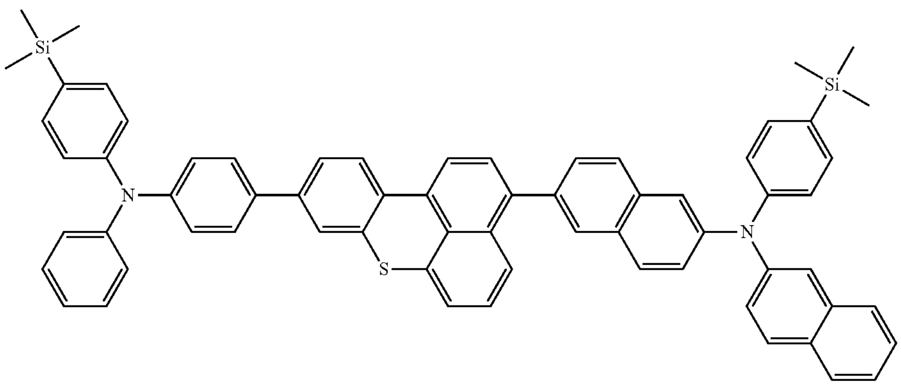
118
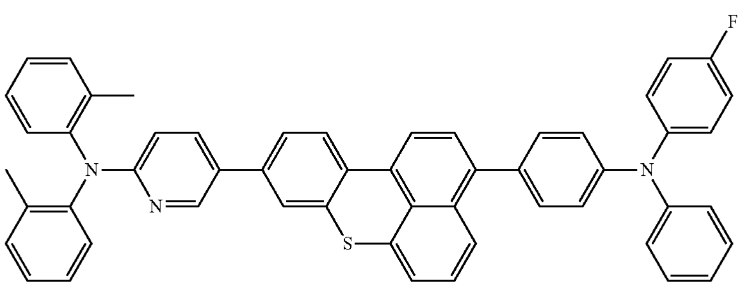
119
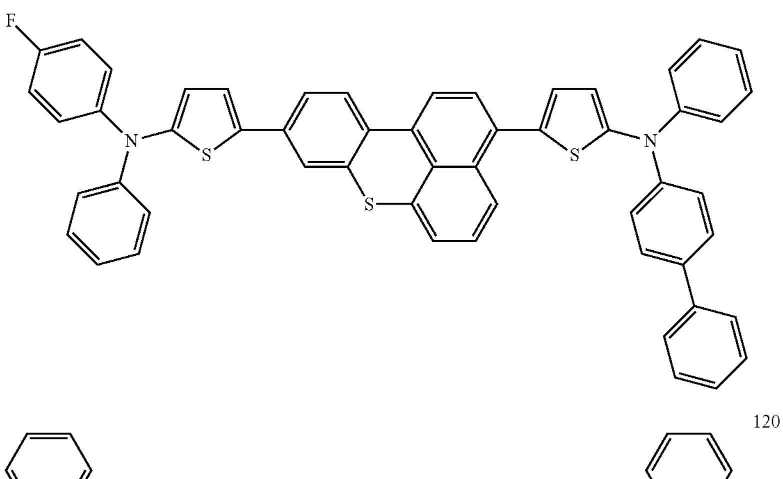
120
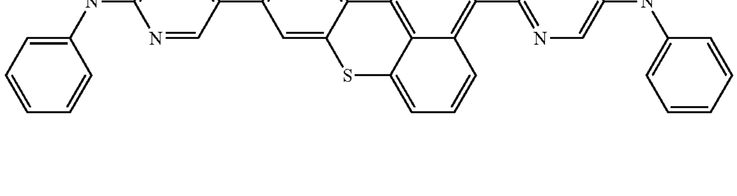

-continued
121
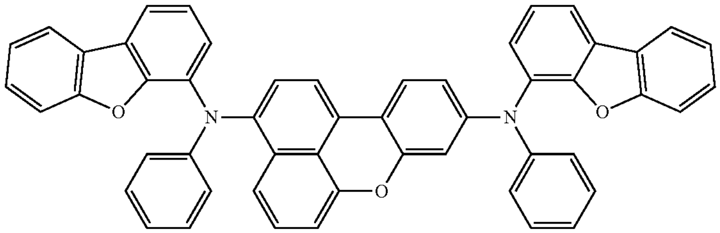
122
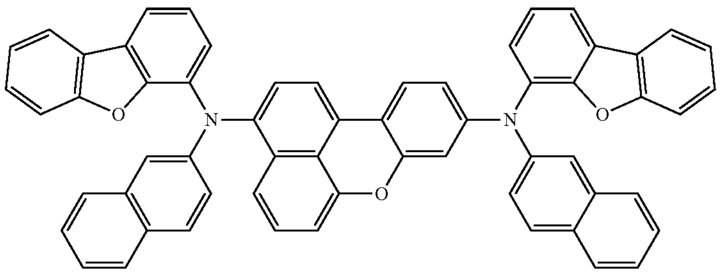
123
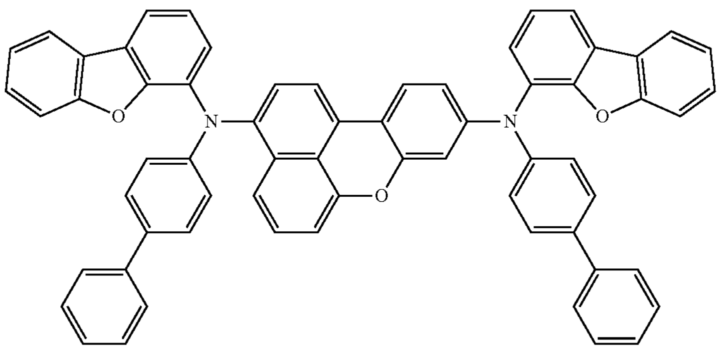
124
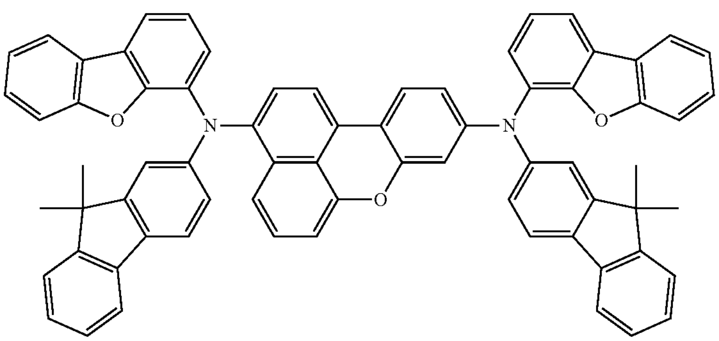
125
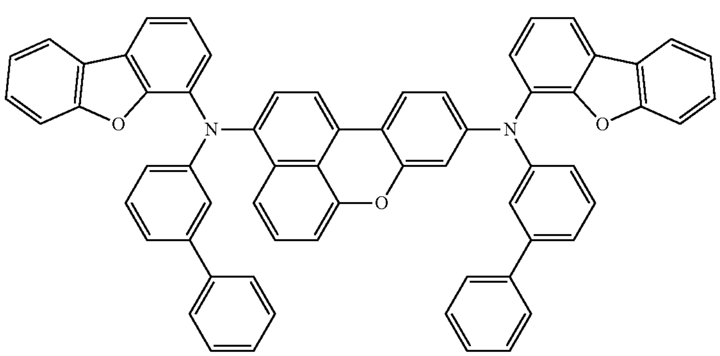

-continued
126
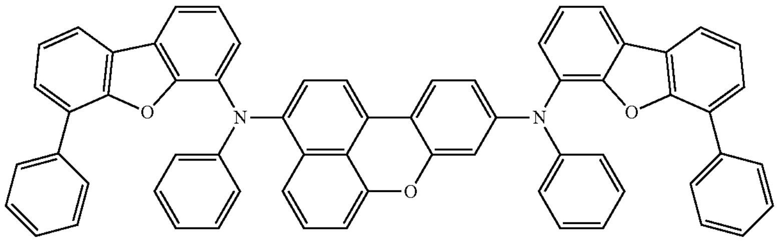
127
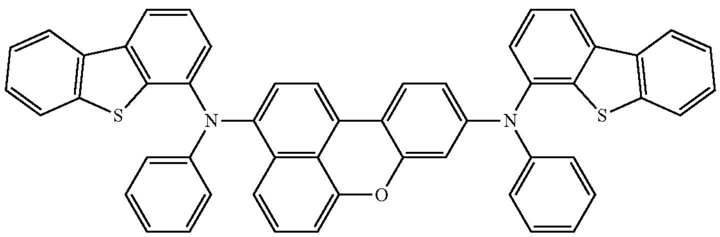
128
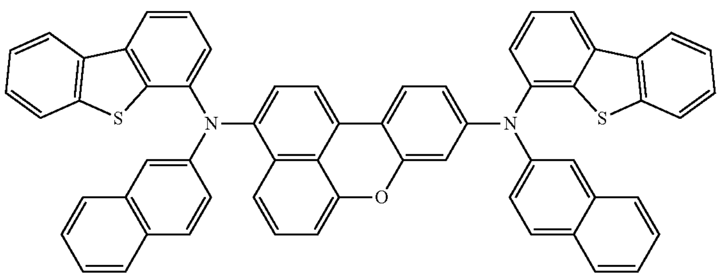
129
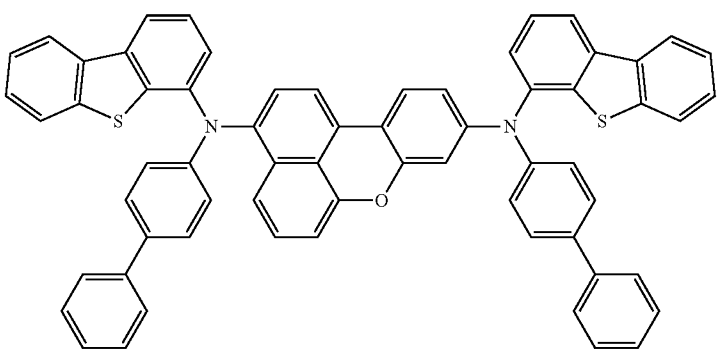
130
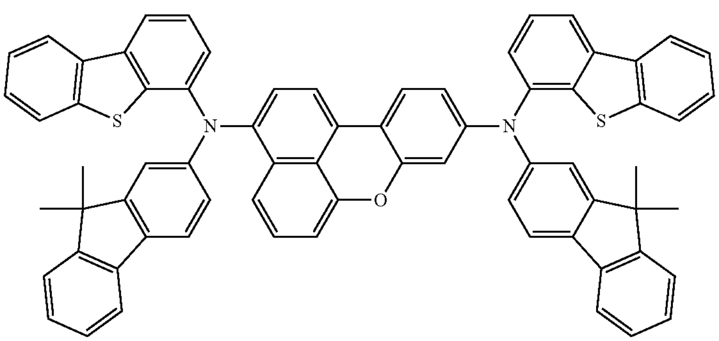

-continued
131
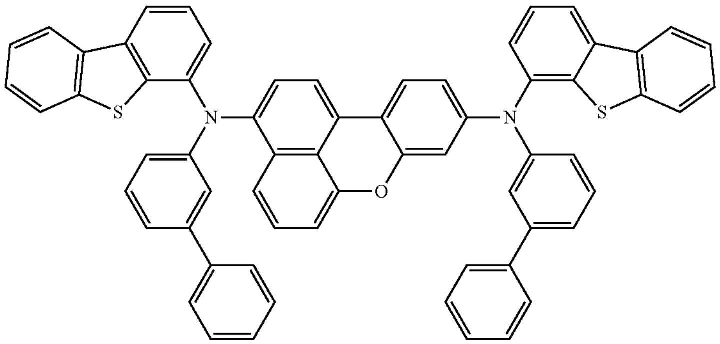
132
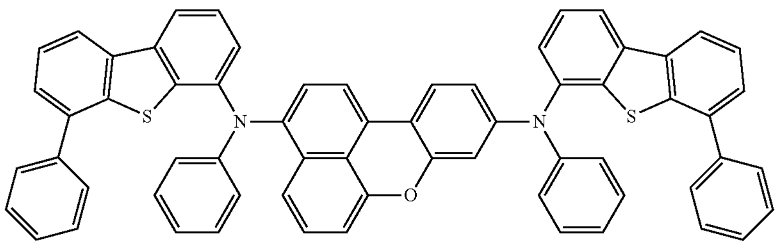
133
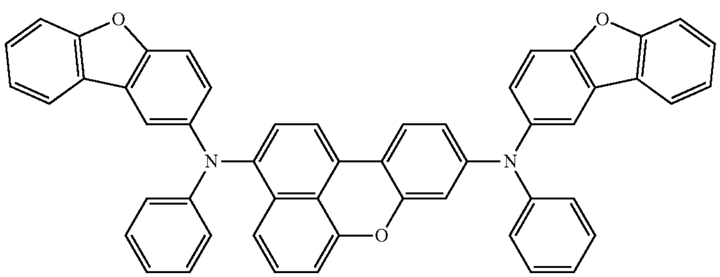
134
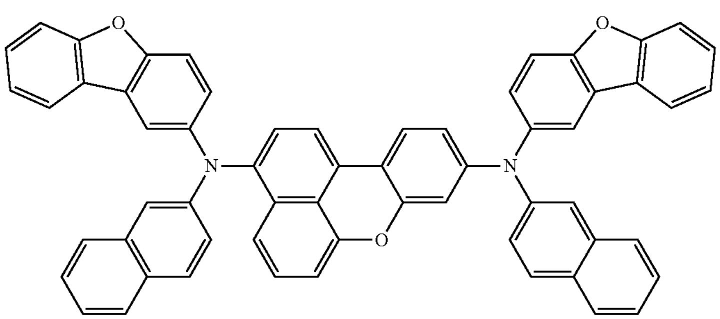
135
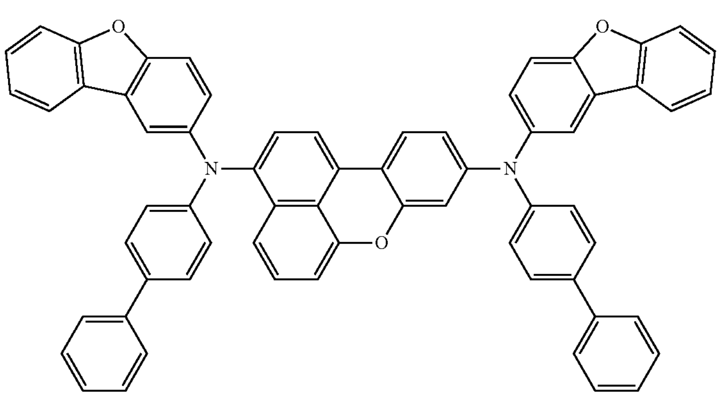

-continued
136
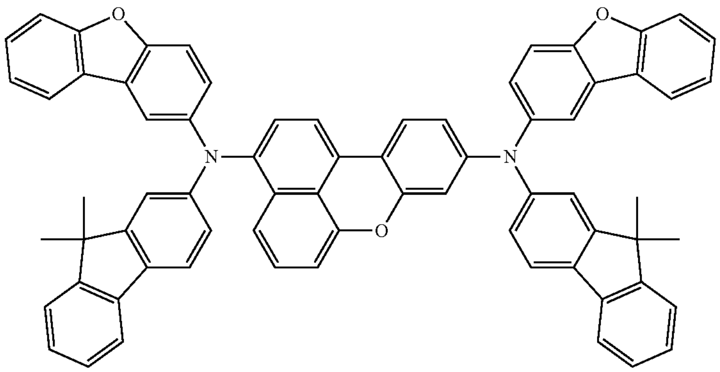
137
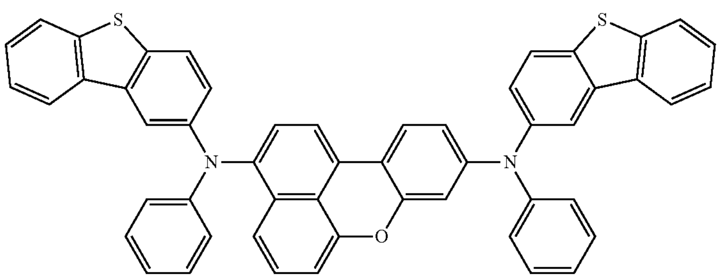
138
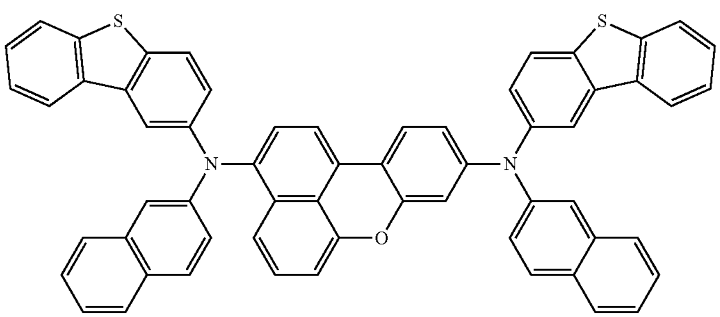
139
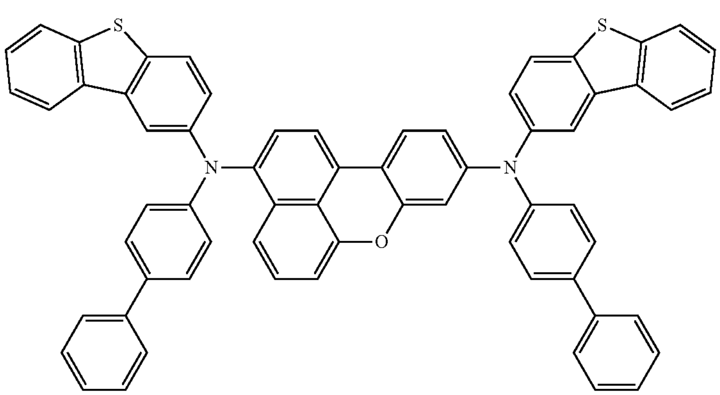

-continued
140
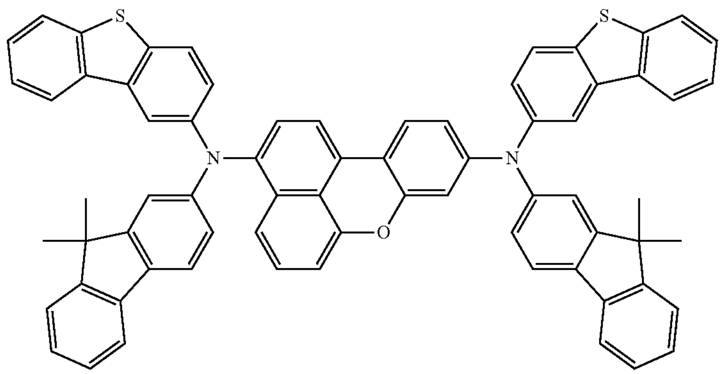
141
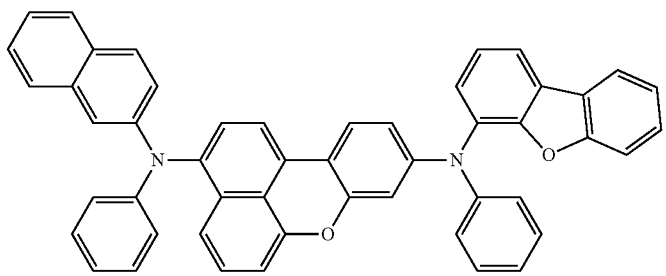
142
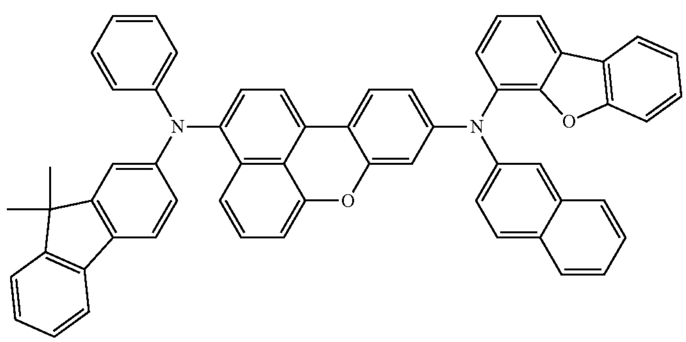
143
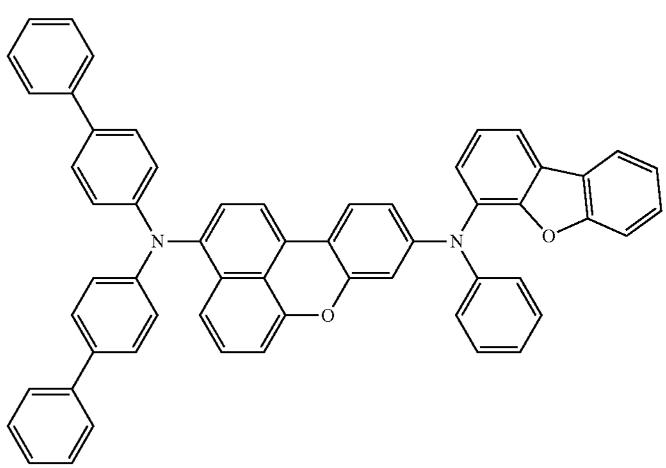

-continued
144
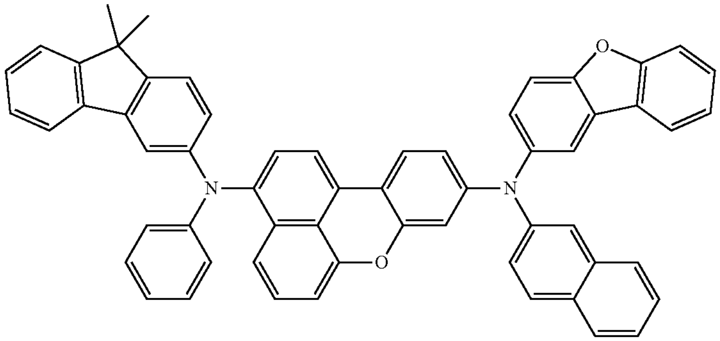
145
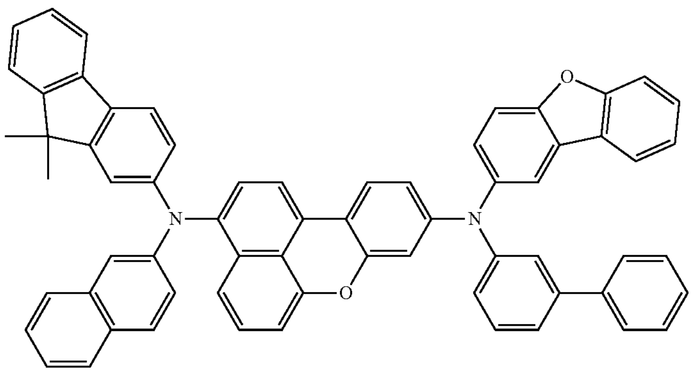
146
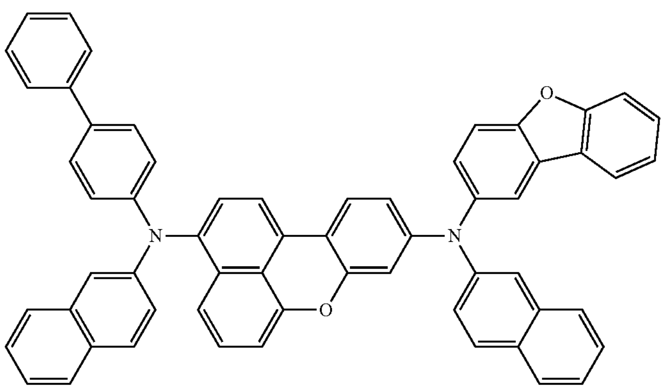
147
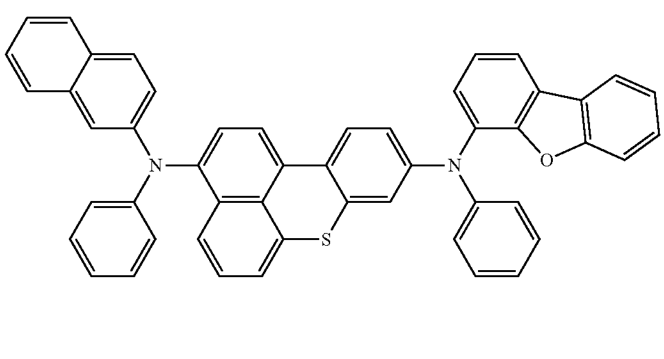

-continued
148
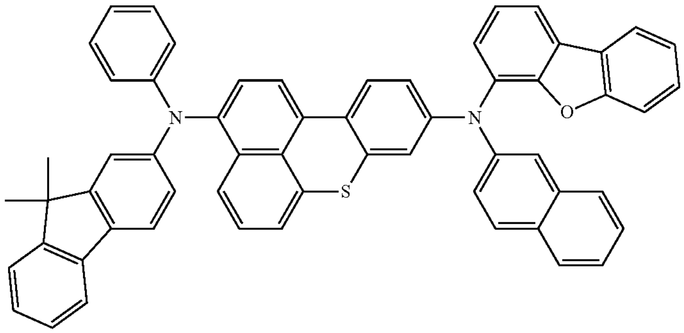
149
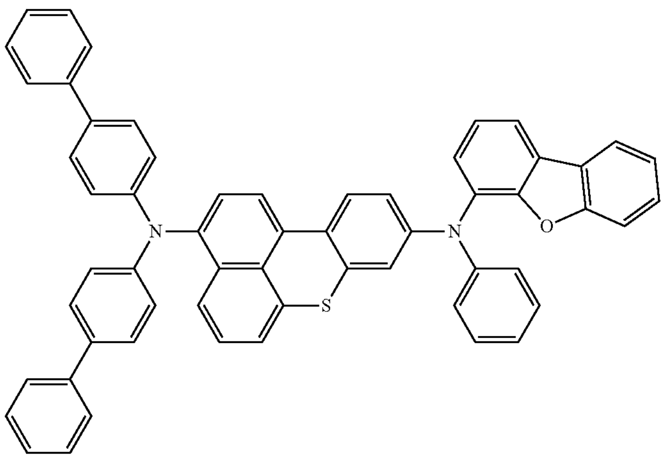
150
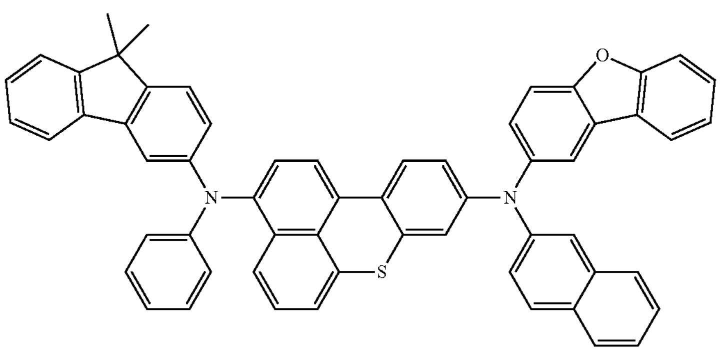
151
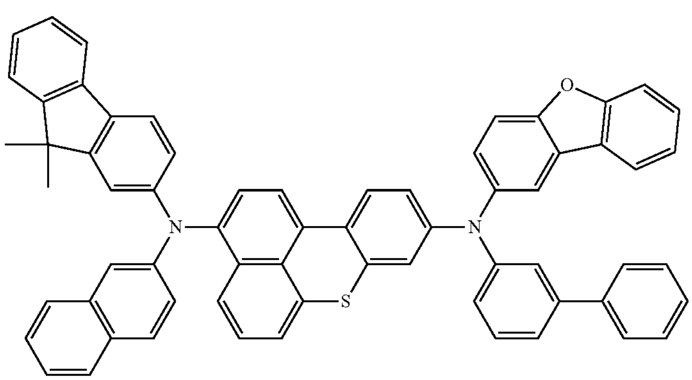

-continued

152

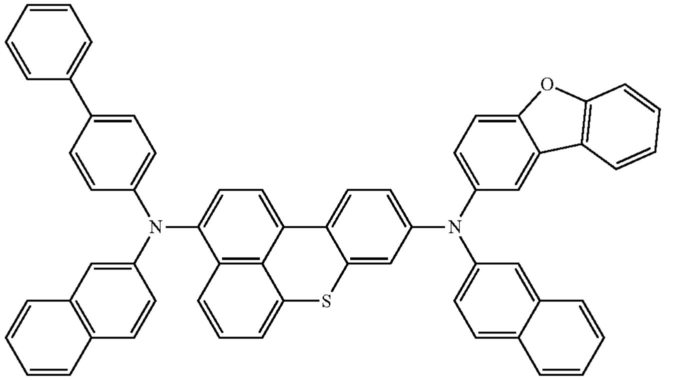

16. An organic light-emitting device comprising:
a first electrode;
a second electrode; and
an organic layer comprising the condensed cyclic compound of claim 1, the organic layer between the first electrode and the second electrode and comprising an emission layer, a hole transport region between the first electrode and the emission layer and an electron transport region between the emission layer and the second electrode.

17. The organic light-emitting device of claim 16, wherein:
the hole transport region includes at least one layer selected from a hole injection layer, a hole transport layer, a functional layer having a hole injection capability and a hole transport capability, a buffer layer, or an electron blocking layer; and
the electron transport region includes at least one layer selected from a hole blocking layer, an electron transport layer, or an electron injection layer.

18. The organic light-emitting device of claim 16, wherein the condensed cyclic compound is included in the emission layer as a dopant, and the emission layer further includes a host.

19. The organic light-emitting device of claim 17, wherein the condensed cyclic compound is included in the electron transport region.

20. The organic light-emitting device of claim 17, wherein the condensed cyclic compound is included in the hole transport region.

* * * * *